US012745461B2

(12) United States Patent
Hou et al.

(10) Patent No.: US 12,745,461 B2

(45) Date of Patent: Sep. 22, 2026

(54) TRANSISTOR CONTACTS AND METHODS OF FORMING THEREOF

(71) Applicant: Taiwan Semiconductor Manufacturing Co., Ltd., Hsinchu (TW)

(72) Inventors: Yung-Chin Hou, Taipei (TW); Lee-Chung Lu, Taipei (TW); Jiann-Tyng Tzeng, Hsinchu (TW); Wei-Cheng Lin, Taichung (TW); Chun-Yen Lin, Hsinchu (TW); Ching-Yu Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 440 days.

(21) Appl. No.: 18/345,070

(22) Filed: Jun. 30, 2023

(65) Prior Publication Data

US 2024/0304685 A1 Sep. 12, 2024

Related U.S. Application Data

(60) Provisional application No. 63/488,999, filed on Mar. 8, 2023.

(51) Int. Cl.

*H10D 88/00* (2026.01)
*H10D 30/62* (2025.01)

(Continued)

(52) U.S. Cl.

CPC ......... *H10D 88/00* (2025.01); *H10D 30/6219* (2025.01); *H10D 30/6729* (2025.01);

(Continued)

(58) Field of Classification Search

CPC .... H10D 88/00; H10D 30/014; H10D 30/024; H10D 30/43; H10D 30/6211;

(Continued)

(56) References Cited

U.S. PATENT DOCUMENTS

| | | | | |
|---|---|---|---|---|
| 9,837,414 | B1 * | 12/2017 | Balakrishnan | H10D 84/0172 |
| 11,610,805 | B2 * | 3/2023 | Huang | H10D 62/121 |

(Continued)

FOREIGN PATENT DOCUMENTS

| | | | |
|---|---|---|---|
| KR | 20220144304 | A | 10/2022 |
| KR | 20220145238 | A | 10/2022 |
| KR | 20220157289 | A | 11/2022 |

*Primary Examiner* — Earl N Taylor

(74) *Attorney, Agent, or Firm* — Slater Matsil, LLP

(57) ABSTRACT

A device includes a first transistor layer comprising a first gate electrode and a second transistor layer comprising a second gate electrode that is stacked with the first transistor layer. n intermetal structure comprising a conductive line is disposed between the first transistor layer and the second transistor layer. A first gate contact extends along a sidewall of the first gate electrode from a top surface of the first gate electrode to the conductive line 48G. A second gate contact extends along a sidewall of the second gate electrode from a top surface of the second gate electrode to the conductive line. The first gate electrode is electrically connected to the second gate electrode by the first gate contact, the second gate contact, and the conductive line.

20 Claims, 174 Drawing Sheets

(51) Int. Cl.

| | |
|---|---|
| ***H10D 30/67*** | (2025.01) |
| ***H10D 62/10*** | (2025.01) |
| ***H10D 64/01*** | (2025.01) |
| ***H10D 64/23*** | (2025.01) |
| ***H10D 84/01*** | (2026.01) |
| ***H10D 84/03*** | (2025.01) |
| ***H10D 84/83*** | (2025.01) |
| ***H10D 84/85*** | (2025.01) |

(52) U.S. Cl.
CPC ......... *H10D 62/121* (2025.01); *H10D 64/017* (2025.01); *H10D 64/254* (2025.01); *H10D 84/0149* (2025.01); *H10D 84/017* (2025.01); *H10D 84/038* (2025.01); *H10D 84/832* (2025.01); *H10D 84/853* (2025.01)

(58) Field of Classification Search
CPC ........... H10D 30/6219; H10D 30/6729; H10D 30/6735; H10D 30/6757; H10D 62/121; H10D 64/017; H10D 64/254; H10D 84/0149; H10D 84/017; H10D 84/038; H10D 84/832; H10D 84/853; H10D 84/0186; H10D 84/83; H10D 30/62; H10D 84/834; H01L 23/5283; H01L 23/53242; H01L 23/535; H01L 29/41733; H01L 21/823814; H01L 27/0924; H01L 29/0673; H01L 29/41791; H01L 29/42392; H01L 29/66439; H01L 29/66545; H01L 29/66795; H01L 29/775; H01L 29/7851; H01L 29/78696
See application file for complete search history.

(56) References Cited

U.S. PATENT DOCUMENTS

| | | | | |
|---|---|---|---|---|
| 11,664,433 | B2 * | 5/2023 | Hong | H10D 30/43 257/288 |
| 12,051,697 | B2 | 7/2024 | Hong et al. | |
| 12,262,560 | B2 | 3/2025 | Yim et al. | |
| 12,396,254 | B2 * | 8/2025 | O'Brien | H10D 64/258 |
| 2013/0122672 | A1 * | 5/2013 | Or-Bach | H10D 84/0165 438/455 |
| 2019/0393214 | A1 * | 12/2019 | Lilak | B82Y 10/00 |
| 2019/0393307 | A1 * | 12/2019 | Reznicek | H01L 21/02532 |
| 2020/0098859 | A1 * | 3/2020 | Reboh | H10D 30/014 |
| 2021/0366907 | A1 * | 11/2021 | Liao | H10D 84/8311 |
| 2022/0123023 | A1 * | 4/2022 | Peng | H10D 86/441 |
| 2022/0336456 | A1 * | 10/2022 | Hong | H10D 84/038 |
| 2022/0344481 | A1 * | 10/2022 | Hong | H10D 30/43 |
| 2023/0036597 | A1 * | 2/2023 | Smith | H10D 30/014 |
| 2023/0085628 | A1 * | 3/2023 | Xie | H10D 64/017 257/369 |
| 2023/0178435 | A1 * | 6/2023 | Huang | H10D 30/43 257/351 |
| 2023/0377998 | A1 * | 11/2023 | Smith | H01L 23/5286 |
| 2023/0420544 | A1 * | 12/2023 | Mertens | H10D 84/0186 |
| 2024/0021586 | A1 * | 1/2024 | Li | H10D 84/85 |
| 2024/0355824 | A1 * | 10/2024 | Hong | H10D 30/6735 |

* cited by examiner 130U
90U
134U
114
134U
114
134U
90U
250
66U
134U
108U
108U
98U
134U
66U
98U
134U
134U
58B
58
58A
40
48D
46
98L
44
66L
108L
98L
42
66L
142L
252
108L
90L
134L
144L
134L
148L
134L
130L
152
158L
154
158L
170
206A
206
206B
204

TRANSISTOR CONTACTS AND METHODS OF FORMING THEREOF

PRIORITY CLAIM AND CROSS-REFERENCE

This application claims the benefit of U.S. Provisional Application No. 63/488,999, filed on Mar. 8, 2023, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
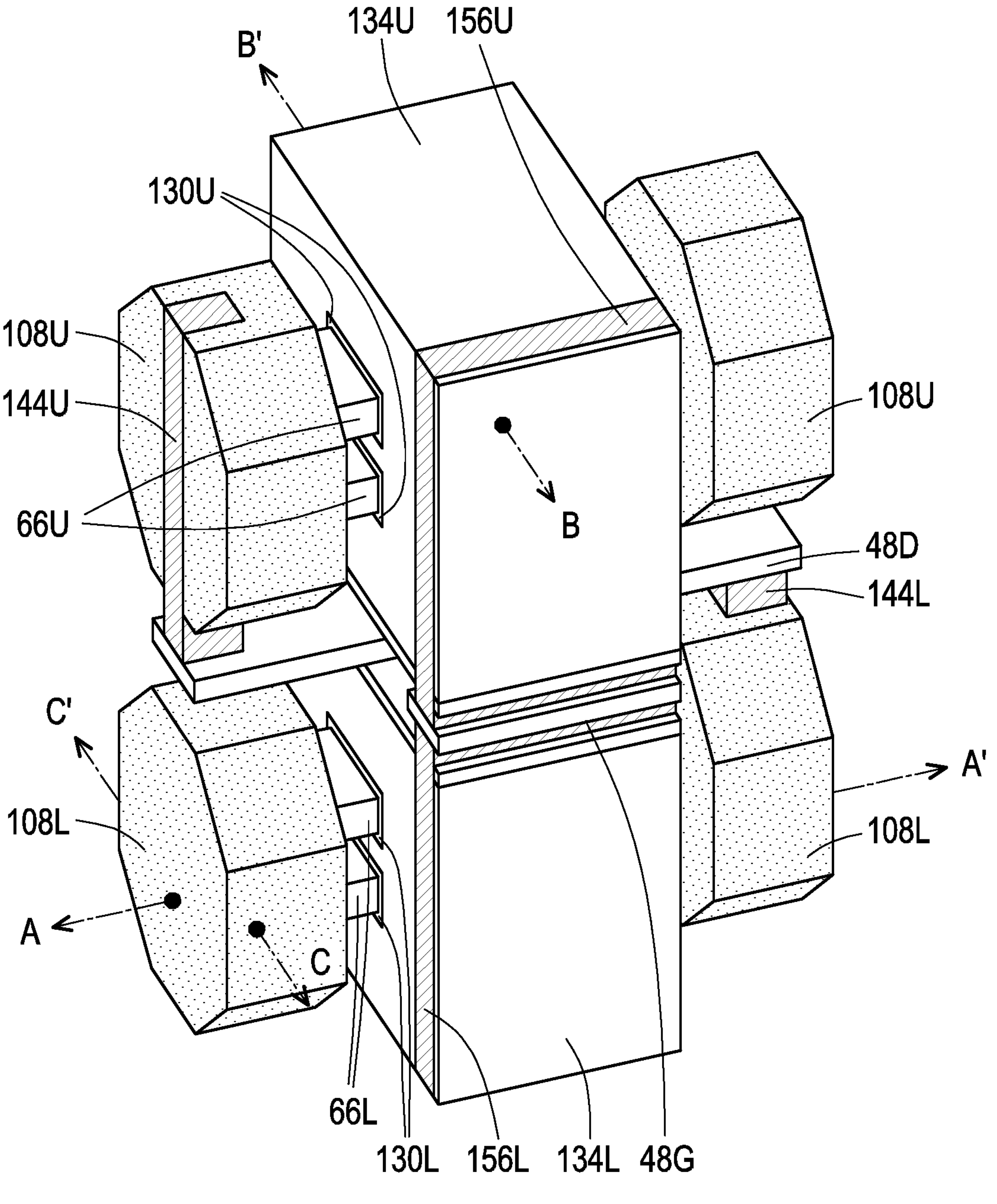
FIGS. 1, 2A, 2B, 3, 4A, 4B, 5, 6, 7A, 7B, 7C, 8A, 8B, 9A, 9B, 9C, 10A, 10B, 10C, 11A, 11B, 12A, 12B, 13A, 13B, 13C, 14A, 14B, 14C, 15A, 15B, 15C, 16A, 16B, 16C, 17A, 17B, 17C, 18A, 18B, 18C, 19A, 19B, 20, 21A, 21B, 22A, 22B, 22C, 22D, 22E, 22F, 23A, 23B, 23C, 23D, 23E, 23F, 24A, 24B, 24C, 25A, 25B, 25C, 26A, 26B, 26C, 27A, 27B, 27C, 28A, 28B, 28C, 29A, 29B, 30A, 30B, 30C, 31A, 31B, 31C, 32A, 32B, 32C, 33A, 33B, 34, 35A, 35B, 36A, 36B, 36C, 36D, 36E, 36F, 37A, 37B, 37C, 37D, 37E, 37F, 38A, 38B, 38C, 39A, 39B, 40A, 40B, 40C, 40D, 40E, 41A, 41B, 41C, 42A, 42B, 42C, 43A, 43B, 43C, 44A, 44B, 45A, 45B, 45C, 45D, 45E, 46A, 46B, and 46C illustrate various views of intermediary stages of manufacturing a CFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, complementary field effect transistors (CFETs) are formed. A CFET includes a n-type transistor and a p-type transistor that are vertically stacked together. An intermetal structure is formed between the n-type transistor and the p-type transistor to facilitate electrical connections between the stacked transistors. Specifically, gate contacts may be formed through gates of the n-type transistor and the p-type transistor, and a conductive line in the intermetal structure may electrically connect the gate contacts together. Likewise, source/drain contacts may be formed through source/drain regions of the n-type transistor and the p-type transistor, and a conductive line in the intermetal structure may electrically connect the source/drain contacts together. In this manner, routing distance between gates and/or source/drain regions of the stacked transistors can be reduced, and contact resistance can be reduced. The gate and/or source/drain contacts can be made of a low resistance material (e.g., tungsten (W), cobalt (Co), ruthenium (Ru), or the like), which further reduces contact resistance. Further, by forming contacts that extend directly through each of the gate electrodes or source/drain regions of the stacked devices, high aspect ratio connections (and accompanying deep via induced layout penalties) can be avoided. Still further, certain circuit related layout penalties can also be avoided. For example, the channel widths of the transistor devices are not limited by a minimum size of the source/drain contact for meeting drain voltage (DV) design specifications. Various embodiments provide reduced contact resistance and increased manufacturing and design ease.

In some embodiments, the n-type transistors and the p-type transistors are sequentially formed from bonded semiconductor layers. Various embodiments mitigate thermal budget concerns in sequentially formed, stacked transistors by delaying certain process steps until other features are made. For example, source/drain contacts and silicide regions for the n-type and p-type transistors are formed after the high-k gate dielectric layers are formed in both the n-type and p-type transistors. As another example, work function metals in the n-type and p-type transistors are formed after the high-k gate dielectric layers are formed in both the n-type and p-type transistors. By delaying the formation of certain features until after forming the high-k gate dielectric layers, the risk of damage (e.g., threshold voltage shift or silicide diffusion) during high-k gate dielectric annealing is reduced. As a result, high quality high-k gate dielectrics may be formed without damaging other device elements (e.g., the source/drain contacts and/or work function metal layers), and device performance of the resulting CFETs can be improved.

FIG. 1 illustrates an example of a CFET schematic, in accordance with some embodiments. FIG. 1 is a three-dimensional view, where some features of the CFETs are omitted for illustration clarity.

In FIG. 1, the CFETs include multiple vertically stacked nanostructure-FETs (e.g., nanowire FETs, nanosheet FETs, multi bridge channel (MBC) FETs, nanoribbon FETs, gate-all-around (GAA) FETs, or the like). For example, a CFET may include a lower nanostructure-FET of a first device type (e.g., n-type/p-type) and an upper nanostructure-FET of a second device type (e.g., p-type/n-type) that is opposite the first device type. Specifically, the CFET may include a lower PMOS transistor and an upper NMOS transistor, or the CFET may include a lower NMOS transistor and an upper PMOS transistor. For simplicity, various embodiments may be described below in the context of manufacturing a CFET with a lower PMOS transistor and an upper NMOS transistor. However, it should be appreciated that various embodiments may also be applied to CFETs having a lower NMOS transistor and an upper PMOS transistor.

Each of the nanostructure-FETs include semiconductor nanostructures 66 (labeled lower semiconductor nanostructures 66L and upper semiconductor nanostructures 66U), where the semiconductor nanostructures 66 act as channel regions for the nanostructure-FETs. The semiconductor nanostructures 66 may be nanosheets, nanowires, or the like. The lower semiconductor nanostructures 66L are for a lower nanostructure-FET and the upper semiconductor nanostructures 66U are for an upper nanostructure-FET.

Gate dielectrics 130 (including a lower gate dielectric 130L and an upper gate dielectric 130U) are along top surfaces, sidewalls, and bottom surfaces of the semiconductor nanostructures 66. Gate electrodes 134 (including a lower gate electrode 134L and an upper gate electrode 134U) are over the gate dielectrics 130 and around the semiconductor nanostructures 66. Source/drain regions 108 (labeled lower source/drain regions 108L and upper source/drain regions 108U) are disposed at opposing sides of the gate dielectrics 130 and the gate electrodes 134. Source/drain region(s) 108 may refer to a source or a drain, individually or collectively dependent upon the context.

Isolation features may be formed to separate desired ones of the source/drain regions 108 and/or desired ones of the gate electrodes 134. For example, a lower gate electrode 134L may optionally be separated from an upper gate electrode 134U by one or more dielectric layers. Further, the lower source/drain regions 108L may be separated from upper source/drain regions 108U by the one or more dielectric layers. The isolation features between gates and source/drain regions allow for vertically stacked transistors, thereby improving device density. Because of the vertically stacked nature of CFETs, the schematic may also be referred to as stacking transistors or folding transistors.

In some embodiments, an interconnect layer is disposed between the vertically stacked transistors. For example, a conductive line 48G may electrically connect an upper gate contact 156U to a lower gate contact 156L, thereby connecting the upper gate electrode 134U and the lower gate electrode 134L. Further, a conductive line 48D may electrically connect an upper source/drain contact 144U to a lower source/drain contact 144L, thereby connecting an upper source/drain region 108U to a lower source/drain region 108L. In this manner, routing distance between the upper and lower device can be relatively short, a contact resistance can be reduced.

FIG. 1 further illustrates reference cross-sections that are used in later figures. Cross-section A-A' is parallel to a longitudinal axis of the semiconductor nanostructures 66 of a CFET and in a direction of, for example, a current flow between the source/drain regions 108 of the CFET. Cross-section B-B' is perpendicular to cross-section A-A' and along a longitudinal axis of a gate electrode 134 of a CFET. Cross-section C-C' is parallel to cross-section B-B' and extends through the source/drain regions 108 of the CFETs. Subsequent figures refer to these reference cross-sections for clarity.

FIGS. 2A-46C are views of intermediate stages in the manufacturing of CFETs, in accordance with some embodiments. FIGS. 2A, 2B, 3, 4A, 4B, 5, and 6 are cross-sectional views taken along any cross-section of FIG. 1. FIGS. 7A, 8A, 9A, 10A, 11A, 12A, 13A, 14A, 15A, 16A, 17A, 18A, 22C, 23C, 24A, 25A, 26A, 27A, 28A, 29A, 30A, 31A, 32A, 33A, 36C, 37C, 38A, 40C, 41A, 42A, 43C, 45C, and 46A illustrate cross-sectional views along a similar cross-section as reference cross-section A-A' in FIG. 1. FIGS. 7B, 8B, 9B, 10B, 11B, 12B, 13B, 14B, 15B, 16B, 17B, 18B, 19B, 21B, 22D, 22F, 23D, 23F, 24B, 25B, 26B, 27B, 28B, 29B, 30B, 31B, 32B, 33B, 35B, 36D, 36F, 37D, 37F, 38B, 40D, 41B, 42B, 43B, 45D, and 46B illustrate cross-sectional views along a similar cross-section as reference cross-section B-B' in FIG. 1. FIGS. 7C, 9C, 10C, 13C, 14C, 15C, 16C, 17C, 18C, 22E, 23E, 24C, 25C, 26C, 27C, 28C, 30C, 31C, 32C, 36E, 37E, 38C, 40E, 41C, 42C, 43C, 45E, and 46C illustrate cross-sectional views along a similar cross-section as reference cross-section C-C' in FIG. 1.

Figure 2A:
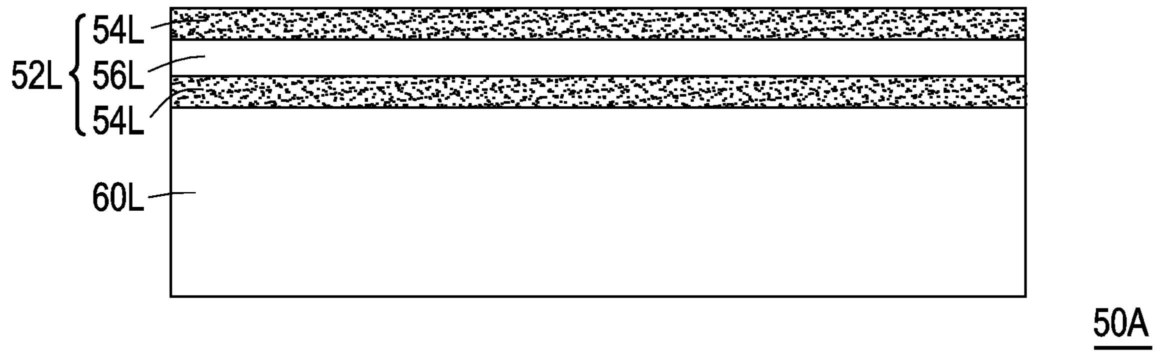
Figure 2B:
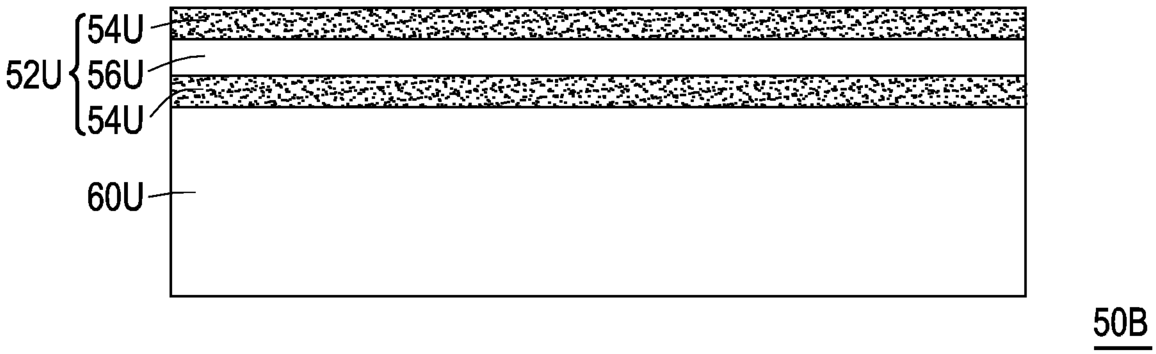

In FIGS. 2A and 2B, two substrates 60L and 60U are separately provided. FIG. 2A illustrates a substrate 60L, and FIG. 2B illustrates a substrate 60U. In subsequent processes, the substrate 60U may be bonded over the substrate 60L (see FIG. 5). As such, the substrate 60L may be referred to as a lower substrate 60L, and the substrate 60U may also be referred to as an upper substrate 60U. Each of the substrates 60L and 60U may be a semiconductor substrate, such as a bulk semiconductor, a semiconductor-on-insulator (SOI) substrate, or the like, which may be doped (e.g., with a p-type or an n-type dopant) or undoped. The substrates 60L and 60U may each be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrates 60L and 60U may include silicon; germanium; a compound semiconductor including carbon-doped silicon, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

A multi-layer stack 52L and a multi-layer stack 52U are formed over the substrate 60L and the substrate 60U, respectively. The multi-layer stack 52L includes alternating dummy semiconductor layers 54L and semiconductor layers 56L, and the multi-layer stack 52U includes alternating dummy semiconductor layers 54U and semiconductor layers 56U. After the substrates 60U and 60L are subsequently bonded together, the dummy semiconductor layers 54L and the semiconductor layers 56L are disposed below the dummy semiconductor layers 54L and the semiconductor layers 56U (see FIG. 5). As such, the layers 54L and 56L may also be referred to as lower dummy semiconductor layers 54L and lower semiconductor layers 56L, respectively, and the layers 54U and 56U may be also be referred to as upper dummy semiconductor layers 54U and upper semiconductor layers 56U, respectively. As subsequently described in greater detail, the dummy semiconductor layers 54L and 54U will be removed and the semiconductor layers 56L and 56U will be patterned to form channel regions of CFETs. Specifically, the lower semiconductor layers 56L will be patterned to form channel regions of the lower nanostructure-FETs of the CFETs, and the upper semiconductor layers 56U will be patterned to form channel regions of the upper nanostructure-FETs of the CFETs.

The multi-layer stacks 52L and 52U are each illustrated as including a specific number of the dummy semiconductor layers 54L/54U and the semiconductor layers 56L/56U. It should be appreciated that the multi-layer stacks 52L and 52U may include any number of the dummy semiconductor layers 54L/54U and/or the semiconductor layers 56L/56U, and the multi-layer stacks 52L and 52U may have a same or different number of semiconductor layers. Each layer of the multi-layer stacks 52L and 52U may be grown by a process such as vapor phase epitaxy (VPE) or molecular beam epitaxy (MBE), deposited by a process such as chemical vapor deposition (CVD) or atomic layer deposition (ALD), or the like.

Figure 3:
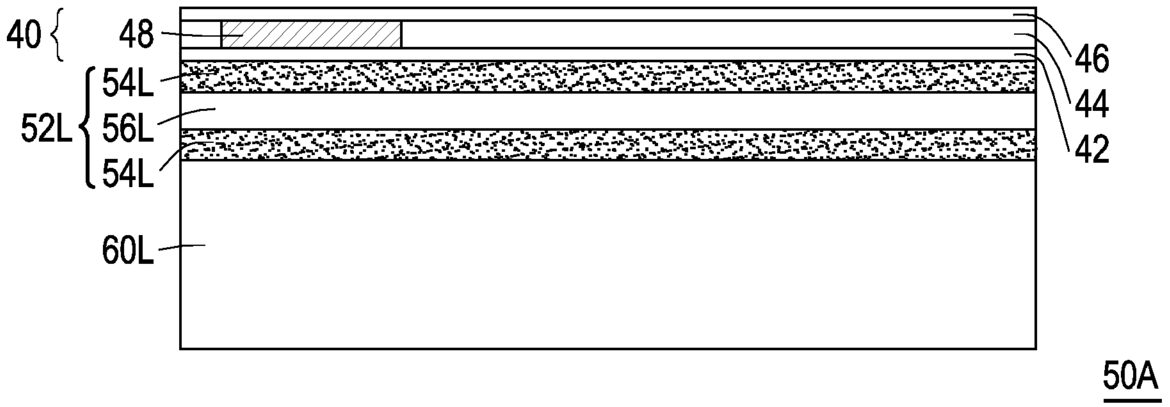

In FIG. 3, an intermetal structure 40 is formed over one of the multi-layers stacks 52, such as the lower multi-layer stack 52L. In other embodiments, the intermetal structure 40 may be formed over the upper multi-layer stack 52U instead. The intermetal structure 40 includes an etch stop layer 42, an intermetal dielectric layer 44 over the etch stop layer 42, conductive features 48 in the dielectric layer 44, and an etch stop layer 46 over the intermetal dielectric layer 44.

The etch stop layer 42, the dielectric layer 44, and the etch stop layer 46 may be sequentially deposited by any suitable deposition process, such as chemical vapor deposition (CVD), atomic layer deposition (ALD), physical vapor deposition (PVD), or the like. The etch stop layers 42 and 46 may each be formed of a dielectric material having a high etching selectivity from the dielectric layer 44 and features that are subsequently formed on the etch stop layers 42 and 46 (e.g., gate electrodes and/or source/drain regions). Suitable materials for the etch stop layer 42 and 46 include silicon nitride, silicon oxide, silicon oxynitride, or the like.

The dielectric layer 44 may be formed of any dielectric material. Acceptable dielectric materials include silicon oxide, phosphosilicate glass (PSG), borosilicate glass (BSG), boron-doped phosphosilicate glass (BPSG), or the like. The dielectric layers 44 may be formed of a low-k dielectric material having a k-value lower than about 3.0. The dielectric layers 44 may be formed of an extra-low-k (ELK) dielectric material having a k-value of less than about 2.5.

The conductive features 48 may include conductive lines that electrically connect subsequently formed gate contacts and/or source/drain contacts together. As such, the conductive features 48 may also be referred to as intermetal interconnects. For example, the conductive features 48 may include gate interconnectors 48G (see FIG. 1) and source/drain interconnects 48D (see FIG. 1). A pattern of the conductive feature 48 may correspond to providing such interconnections and will be subsequently discussed in greater detail.

The conductive features 48 may be formed by a damascene process, such as a single damascene process, a dual damascene process, or the like. In a damascene process, the dielectric layer 44 is patterned utilizing photolithography and etching techniques to form trenches openings corresponding to the desired pattern of the conductive features 48. The trenches may then be filled with a conductive material. Suitable conductive materials include copper, aluminum, tungsten, cobalt, gold, combinations thereof, or the like, which may be formed by electroplating or the like. A planarization process may then be performed to remove excess conductive material and to level top surfaces of the dielectric layer 44 and the conductive features 48.

Figure 4A:
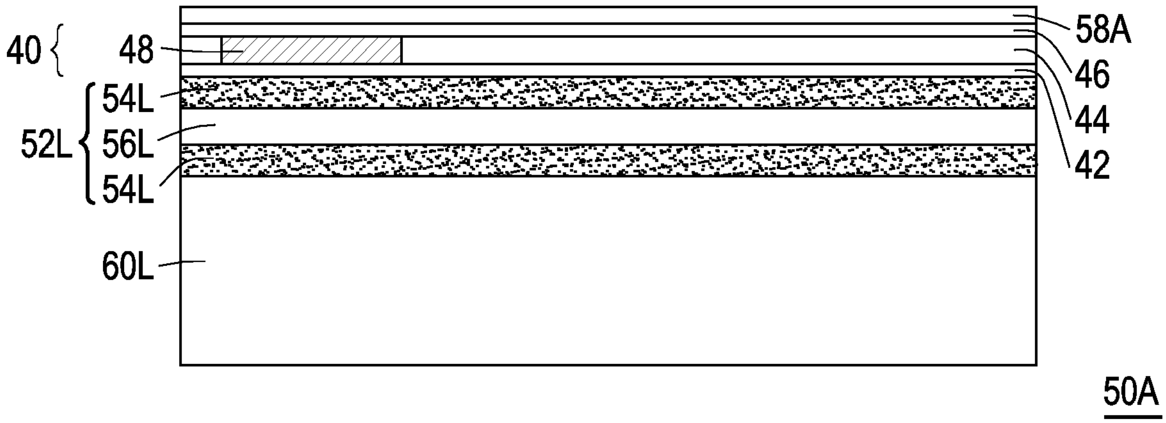
Figure 4B:
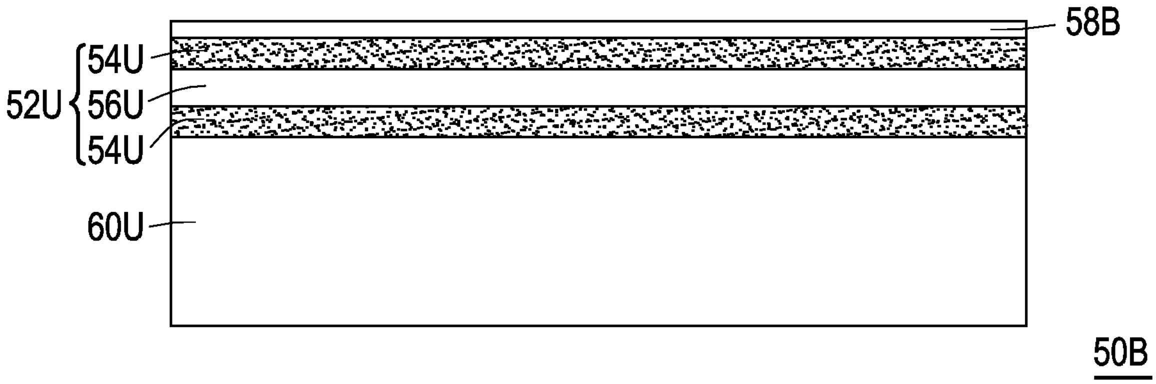

In FIGS. 4A and 4B, insulating bonding layers 58A and 58B are deposited over the multi-layer stacks 52L and 52U, respectively. FIG. 4A illustrates a cross-sectional view of the substrate 60L, the multi-layer stack 52L (including the dummy semiconductor layers 54L and the semiconductor layers 56L), the intermetal structure 40, and the bonding layer 58A; and FIG. 4B illustrates a cross-sectional view of the substrate 60U, the multi-layer stack 52U (including the dummy semiconductor layers 54U and the semiconductor layers 56U), and the bonding layer 58B. The bonding layers 58A and 58B may be deposited by any suitable process, such as PVD, CVD, ALD, or the like. The bonding layers 58A and 58B may facilitate the bonding of the lower substrate 60L to the upper substrate 60U in subsequent processes (see FIG. 5). The bonding layers 58A and 58B may each comprise an insulating material that is suitable for a subsequent dielectric-to-dielectric bonding process. Example materials for the bonding layers 58A and 58B include silicon oxide (e.g., $SiO_2$), silicon nitride, silicon oxynitride, silicon carbonitride, silicon oxycarbonitride, or the like. A material composition of the bonding layer 58A may be the same or different than a material composition of the bonding layer 58B.

Figure 5:
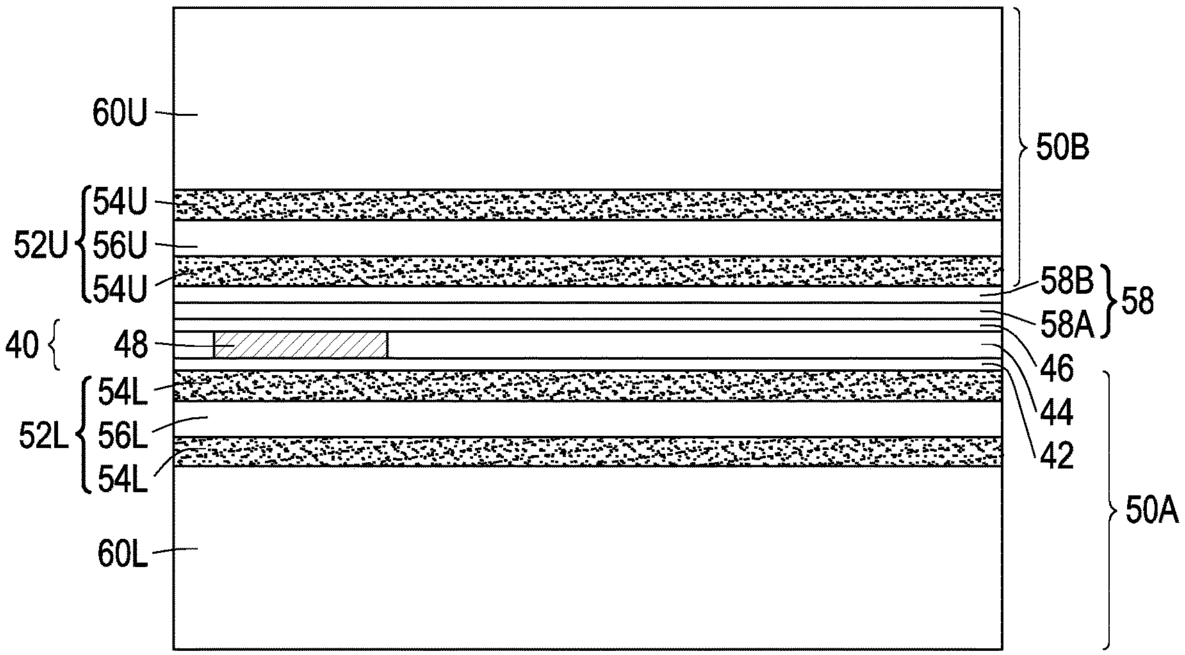

In FIG. 5, the upper substrate 60U, having the multi-layer stack 52U disposed thereon, is placed over and bonded to the lower substrate 60L, having the multi-layer stack 52L and intermetal structure 40 disposed thereon. The bonded structure includes the lower substrate 60L; the lower multi-layer stack 52L over the lower substrate 60L; the intermetal structure 40 over the lower multi-layer stack 52L; the bonding layers 58A and 58B over the intermetal structure 40; the upper multi-layer stack 52U over the bonding layers 58A and 58B; and the upper substrate 60U over the upper multi-layer stack 52U. The upper substrate 60U may be bonded to the lower substrate 60L by the bonding layers 58A and 58B. Specifically, the bonding layers 58A and 58B may be bonded together using a suitable technique, such as dielectric-to-dielectric bonding, or the like. After bonding, the lower bonding layer 58A and the upper bonding layer 58B may be collectively referred to as a bonded layer 58. The bonded layer 58 may or may not have an interface disposed therein where the bonding layer 58A meets the bonding layer 58B.

In some embodiments, the dielectric-to-dielectric bonding process includes applying a surface treatment to one or more of the bonding layers 58A or 58B to form hydroxyl (OH) groups at bonding surfaces of the bonding layers 58A and 58B. The surface treatment may include a plasma treatment, such as a nitrogen ($N_2$) plasma treatment. After the plasma treatment, the surface treatment may further include a cleaning process that may be applied to one or more of the bonding layers 58A and 58B. The bonding layer 58B may then be placed over and aligned to the bonding layer 58A. The two bonding layers 58A and 58B are then pressed against each other to initiate a pre-bonding of the upper substrate 60U to the lower substrate 60L. The pre-bonding be performed at room temperature (e.g., in a range of 20° C. to 28° C.). After the pre-bonding, an annealing process may be applied by, for example, heating the substrates 60L and 60U to a temperature of in a range of 300° C. to 500° C. The annealing process drives triggers the formation of covalent bonds between the bonding layers 58A and 58B.

Figure 6:
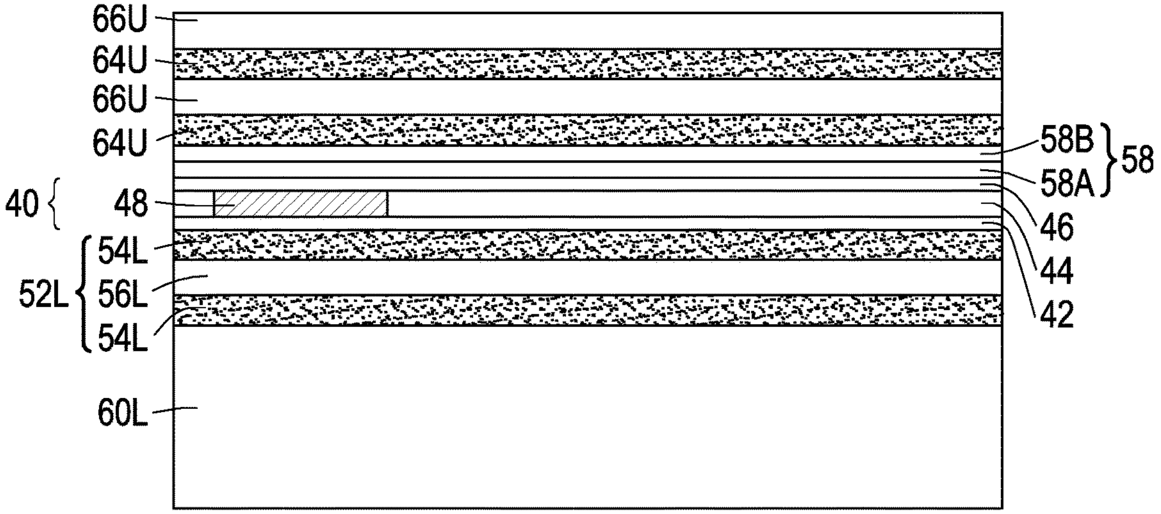

In FIG. 6, a thinning process is applied to reduce a thickness of the upper substrate 60U to a desired thickness. The thinning process may include a grinding process, a chemical mechanical polish (CMP), an etch back process, combination thereof, or the like. The thinning process may reduce a thickness of the upper substrate 60U to match a thickness of each of the semiconductor layers 56U. In subsequent process steps, the upper substrate 60U may be patterned to provide a nanostructure (e.g., channel region) for an upper nanostructure-FETs of the CFETs.

Figure 7A:
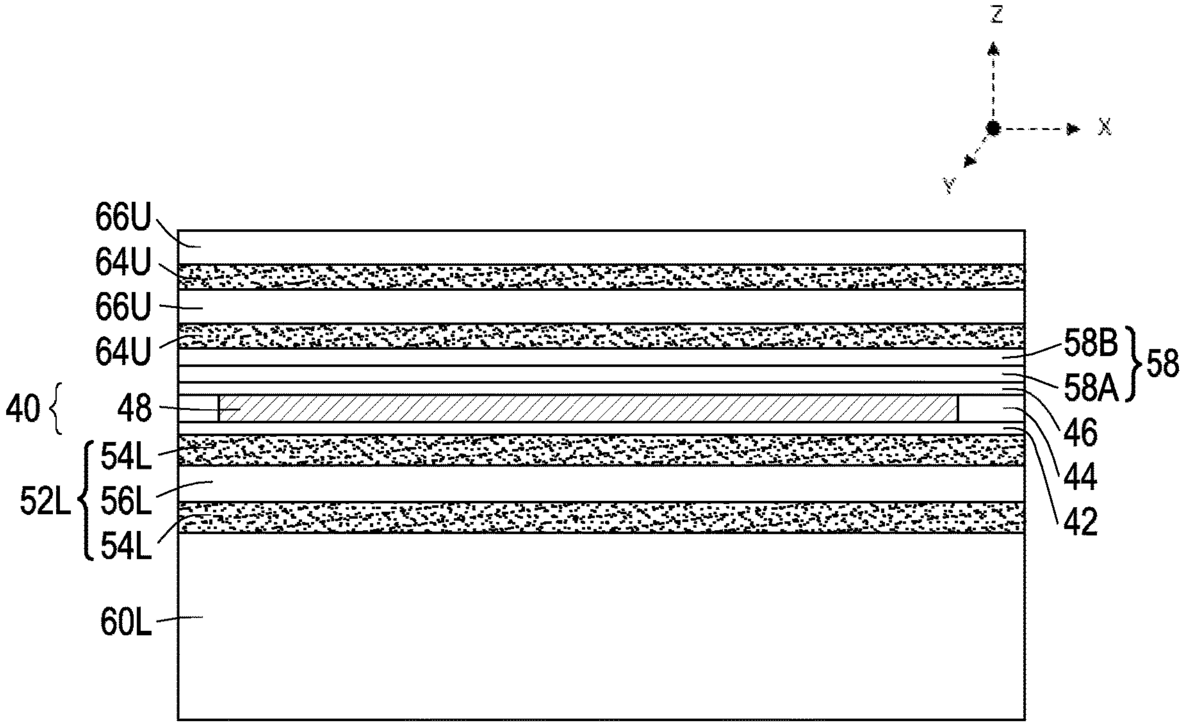
Figure 7B:
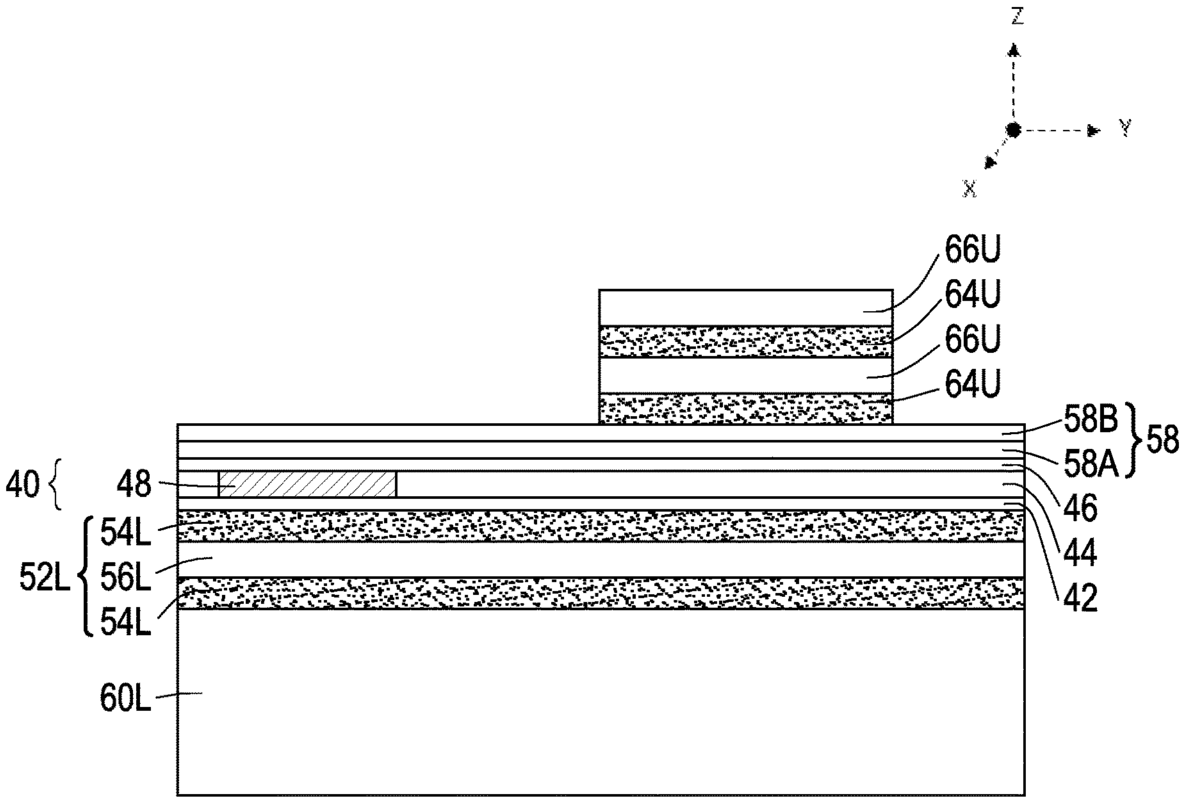
Figure 7C:
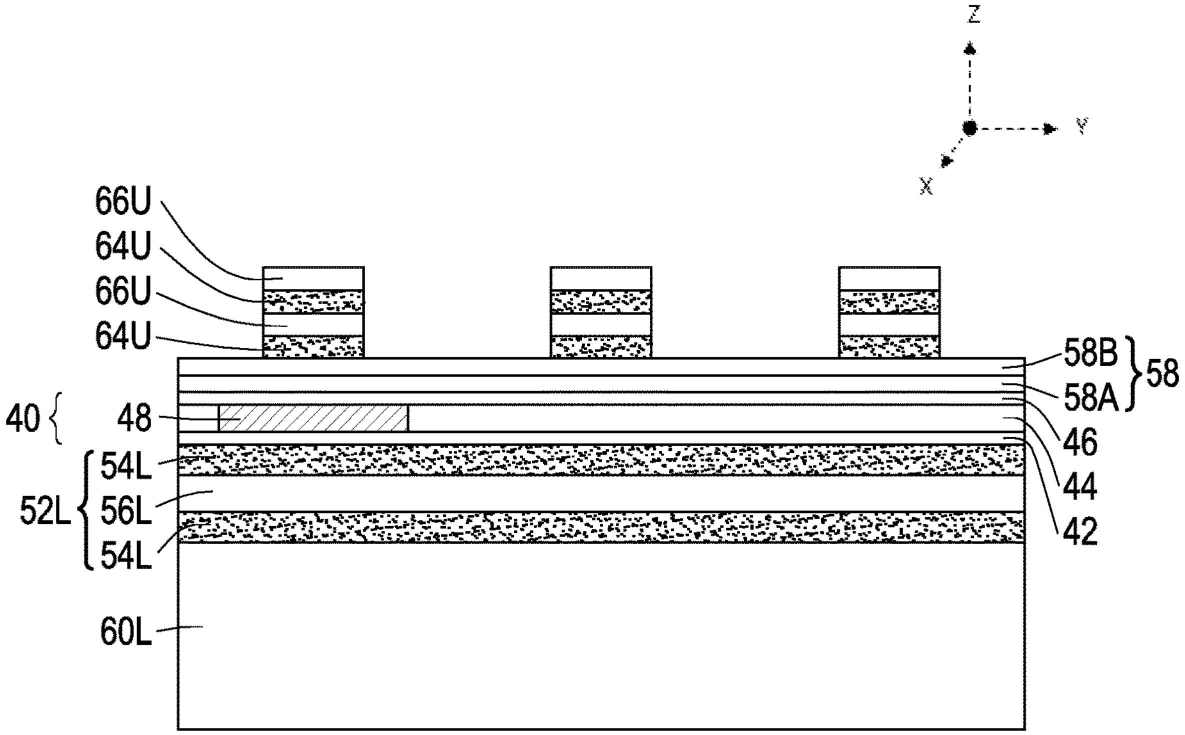

In FIGS. 7A-7C, upper nanostructures 64U, 66U (including upper dummy nanostructures 64U and upper semiconductor nanostructures 66U) are formed in the upper substrate 60U and the upper multi-layer stack 52U. In some embodiments, the upper nanostructures 64U, 66U are patterned by etching trenches in the upper substrate 60U and the upper multi-layer stack 52U. The etching may be any acceptable etch process, such as a reactive ion etch (RIE), neutral beam etch (NBE), the like, or a combination thereof. The etching may be anisotropic. Forming the upper nanostructures 64U, 66U may define the upper dummy nanostructure 64U from the upper dummy semiconductor layers 54U and the upper semiconductor nanostructures 66U from the upper substrate 60U and the upper semiconductor layers 56U. The upper semiconductor nanostructures 66U will act as channel regions for upper nanostructure-FETs of the CFETs.

The upper substrate 60U and the upper multi-layer stack 52U may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the upper nanostructures 64U, 66U.

Although each of the upper nanostructures 64U, 66U are illustrated as having a constant width throughout, in other embodiments, the upper nanostructures 64U, 66U may have tapered sidewalls such that a width of each of the upper nanostructures 64U, 66U continuously increases in a direction towards the lower substrate 60L. In such embodiments, each of the upper nanostructures 64U, 66U may have a different width and be trapezoidal in shape.

Further, appropriate wells (not separately illustrated) may be formed in the upper semiconductor nanostructures 66U. For example, an n-type impurity implant and/or a p-type impurity implant may be performed, or the semiconductor materials may be in situ doped during growth. The n-type impurities may be phosphorus, arsenic, antimony, or the like at a concentration in a range from $10^{17}$ atoms/cm$^3$ to $10^{19}$ atoms/cm$^3$. The p-type impurities may be boron, boron fluoride, indium, or the like at a concentration in a range from $10^{17}$ atoms/cm$^3$ to $10^{19}$ atoms/cm$^3$. The wells in the upper semiconductor nanostructures 66U have a conductivity type opposite from a conductivity type of upper source/drain regions that will be subsequently formed adjacent the upper semiconductor nanostructures 66U.

Figure 8A:
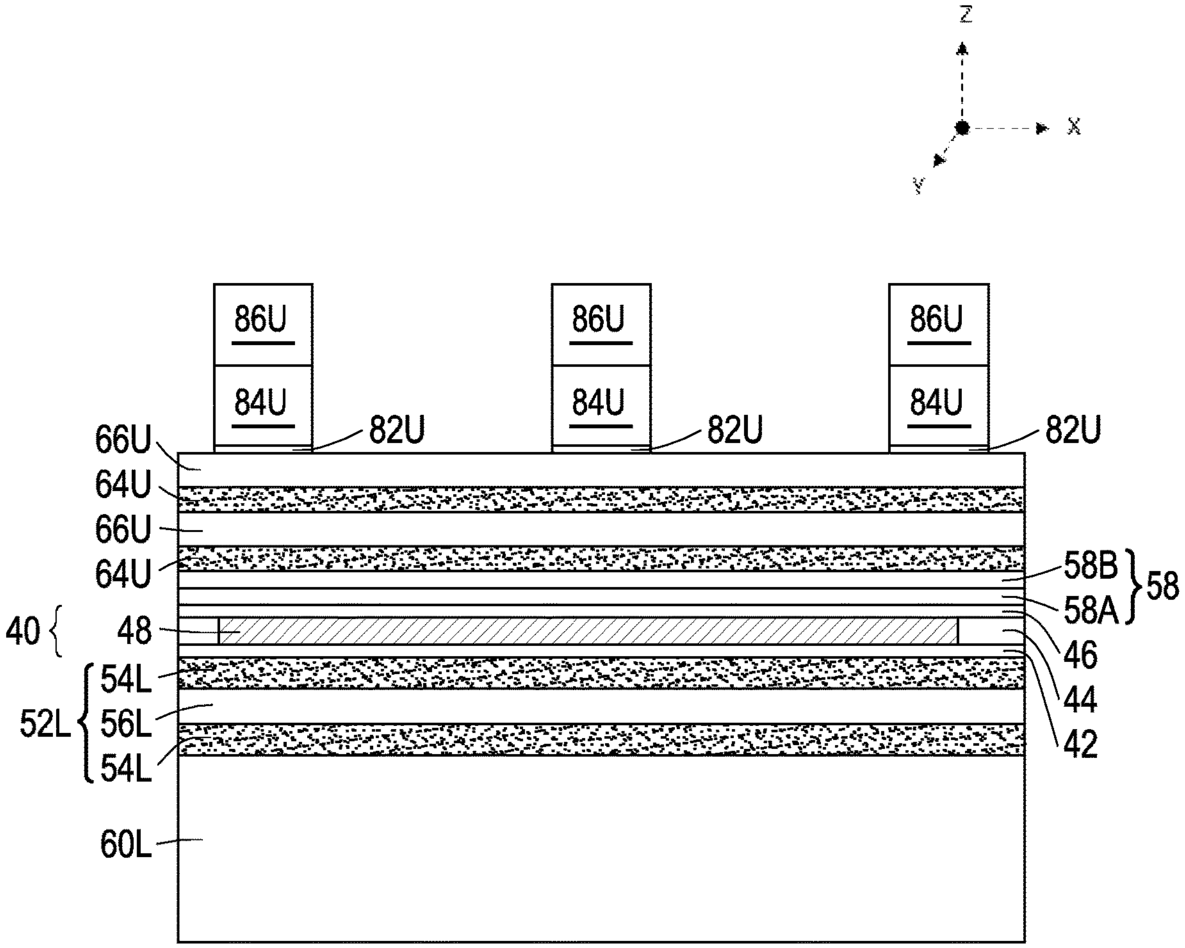
Figure 8B:
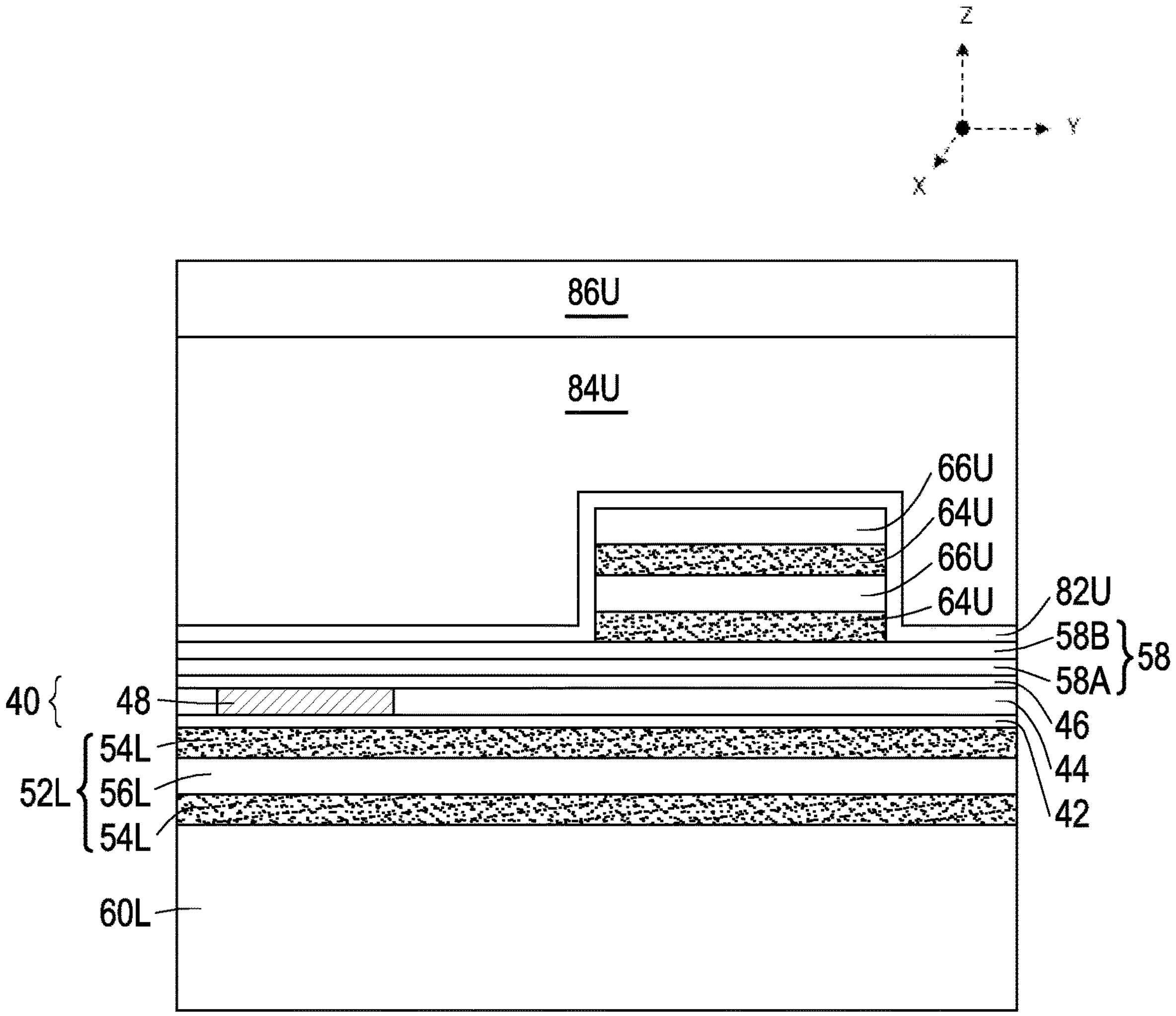

In FIGS. 8A-8B, upper dummy gate stacks are formed over the upper nanostructures 64U, 66U. Forming the upper dummy gate stacks includes forming an upper dummy dielectric 82U on top surfaces and sidewalls of the upper nanostructures 64U, 66U and/or the bonding layer 58. The upper dummy dielectric 82U may be, for example, silicon oxide, silicon nitride, a combination thereof, or the like, and may be deposited or thermally grown according to acceptable techniques. An upper dummy gate 84U is then formed over the upper dummy dielectric 82U, and a mask 86U is formed over the upper dummy gate 84U. The upper dummy gate 84U may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The upper dummy gate 84U may be deposited by physical vapor deposition (PVD), CVD, sputter deposition, or other techniques for depositing the selected material. The mask 86U may include, for example, silicon nitride, silicon oxynitride, or the like. In the illustrated embodiment, the upper dummy dielectric layer 82U covers the bonding layer 58, such that the upper dummy dielectric layer 82U extends between the upper dummy gate 84U and the bonding layers 58. In another embodiment, the upper dummy dielectric layer 82U covers only the upper nanostructures 64U, 66U.

After the layers of the upper dummy gate stacks are deposited, the mask 86U may be patterned using acceptable photolithography and etching techniques. The pattern of the mask 86U then may be transferred to the upper dummy gates 84U and the upper dummy dielectrics 82U. The upper dummy gates 84U cover respective channel regions of the upper nanostructures 64U, 66U. The upper dummy gates 84U may have a lengthwise direction substantially perpendicular to the lengthwise direction of respective upper nanostructures 64U, 66U. The masks 86U can optionally be removed after patterning, such as by any acceptable etching technique.

Figure 9A:
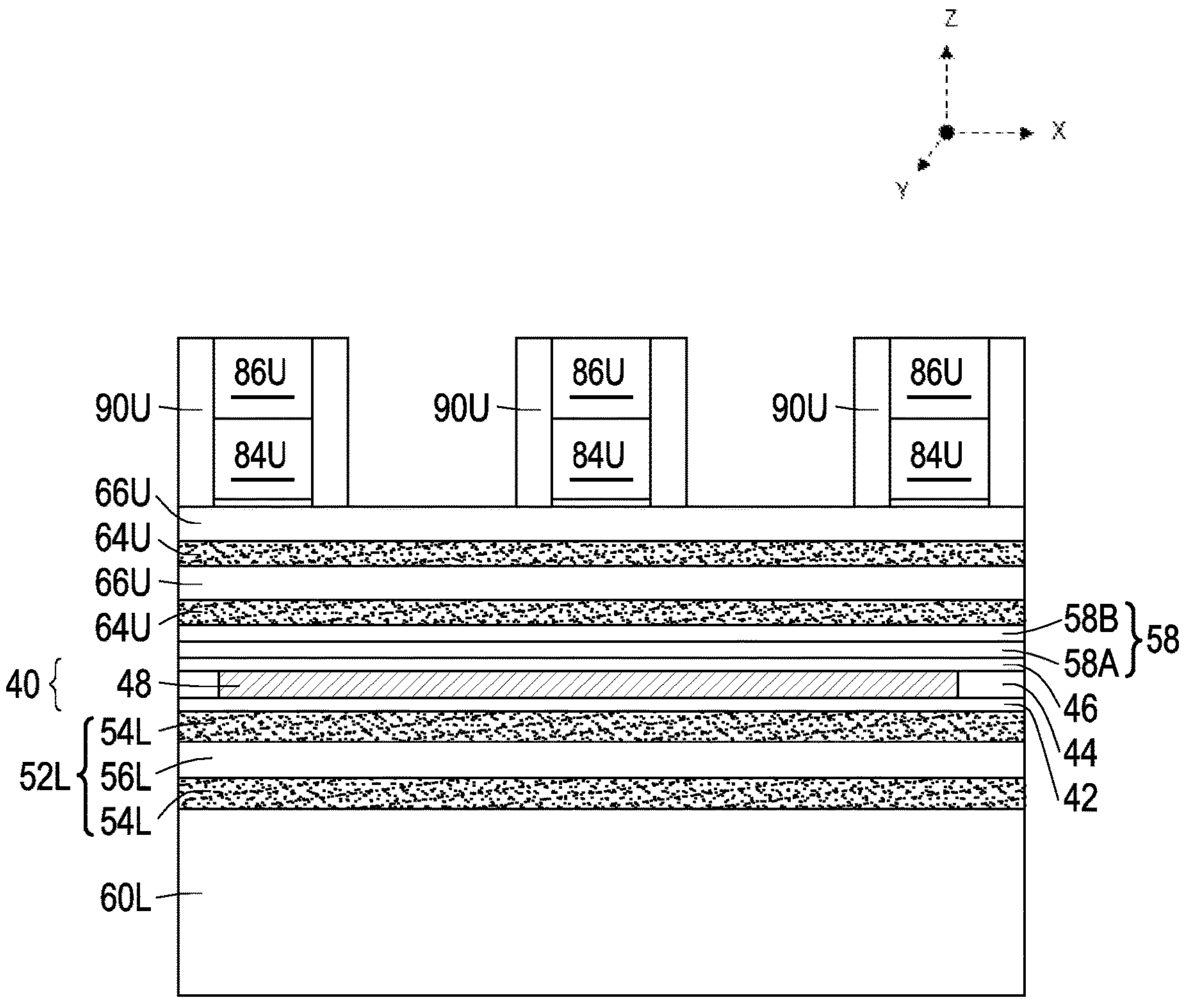
Figure 9B:
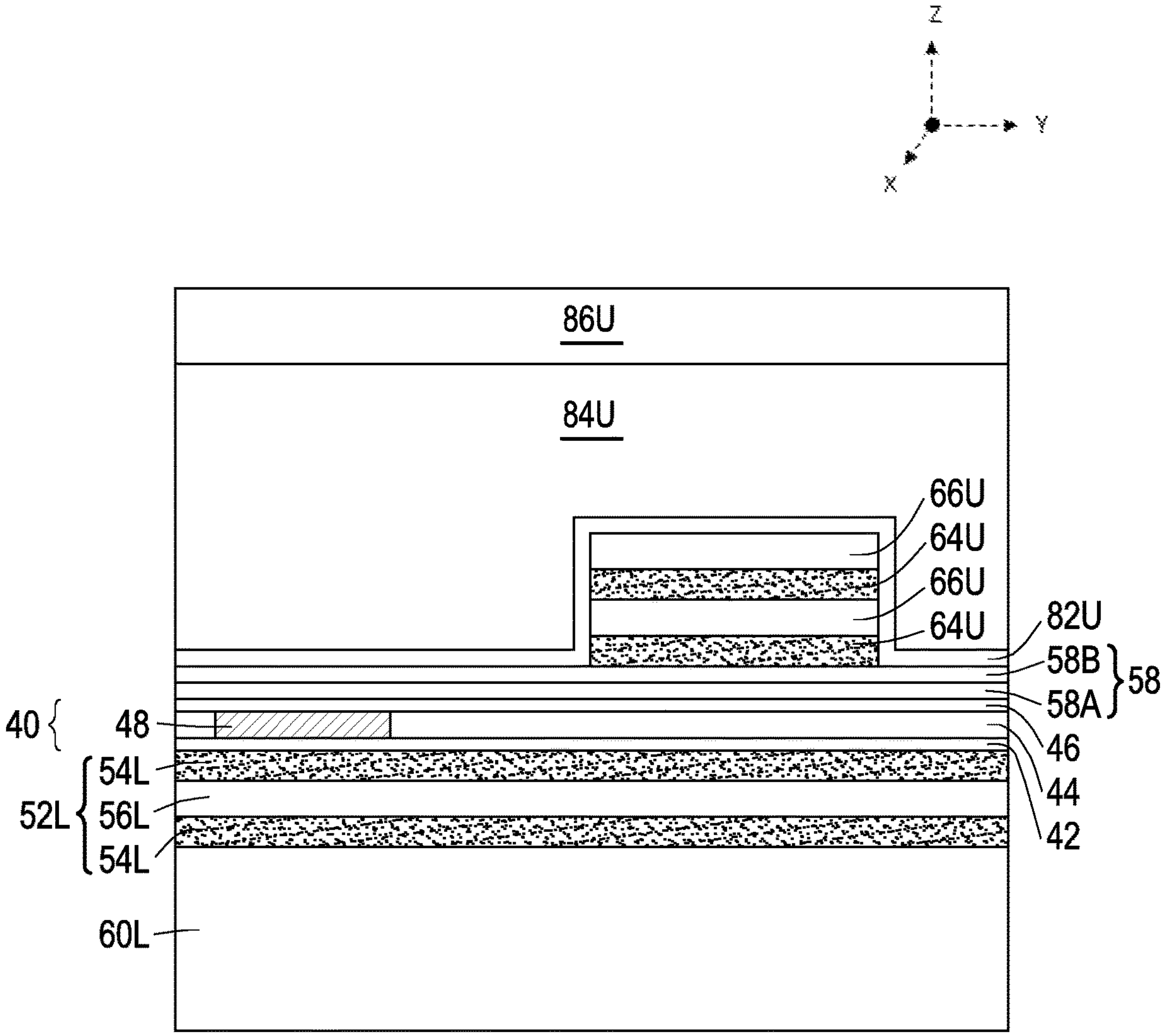
Figure 9C:
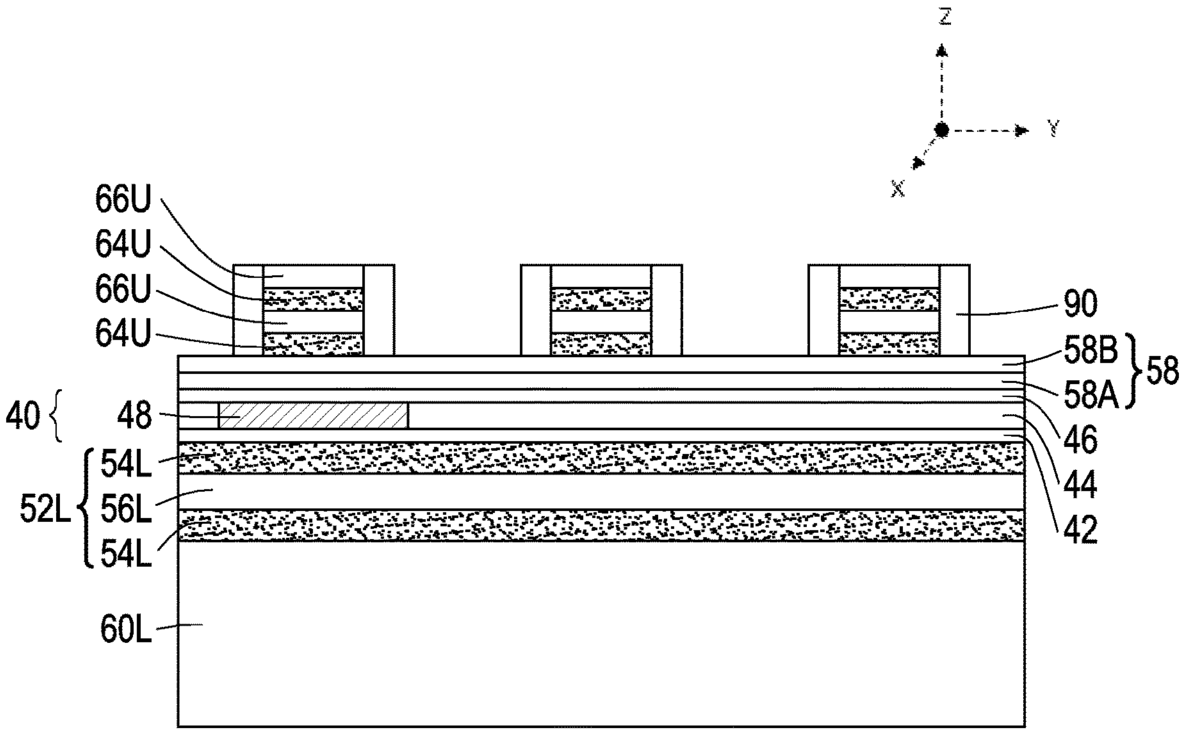

In FIGS. 9A-9C, upper gate spacers 90U are formed over the upper nanostructures 64U, 66U and on exposed sidewalls of the masks 86U (if present), the upper dummy gates 84U, and the upper dummy dielectrics 82U. The upper gate spacers 90U may be formed by conformally forming one or more dielectric material(s) and subsequently etching the dielectric material(s). Acceptable dielectric materials may include silicon oxide, silicon nitride, silicon oxynitride, silicon oxycarbonitride, or the like, which may be formed by a deposition process such as chemical vapor deposition (CVD), atomic layer deposition (ALD), or the like. Other dielectric materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the upper dummy gates 84U (thus forming the upper gate spacers 90U). As will be subsequently described in greater detail, the dielectric material(s), when etched, may also have portions left on the sidewalls of the upper nanostructures 64U, 66U (thus forming upper fin spacers 92U, see FIG. 9C).

Further, implants for lightly doped source/drain (LDD) regions (not separately illustrated) may be performed. The LDD implants may be performed before the gate spacers 90U are formed. Appropriate type impurities may be implanted into the nanostructures 64U, 66U to a desired depth. The LDD regions may have a same conductivity type as a conductivity type of source/drain regions that will be subsequently formed adjacent the semiconductor nanostructures 66U. The impurities in the upper semiconductor nanostructures 66U may be n-type or p-type. The n-type impurities may be the any of the n-type impurities previously discussed, and the p-type impurities may be the any of the p-type impurities previously discussed. The lightly doped source/drain regions may have a concentration of impurities in a range from $10^{17}$ atoms/cm$^3$ to $10^{20}$ atoms/cm$^3$. An anneal may be used to repair implant damage and to activate the implanted impurities. In some embodiments, the grown materials of the upper nanostructures 64U, 66U may be in situ doped during growth, which may obviate the implantations, although in situ and implantation doping may be used together.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like.

Figure 10A:
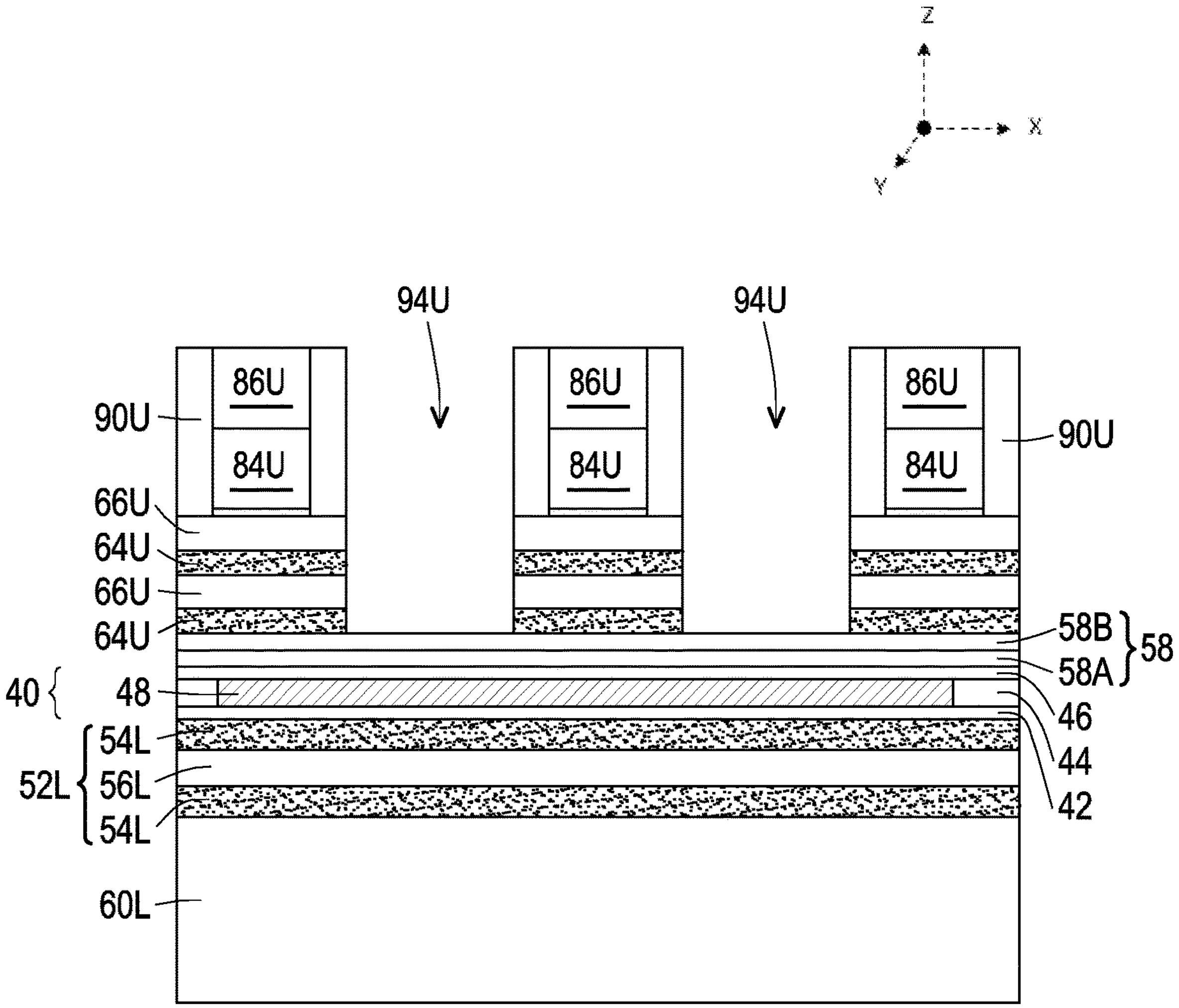
Figure 10B:
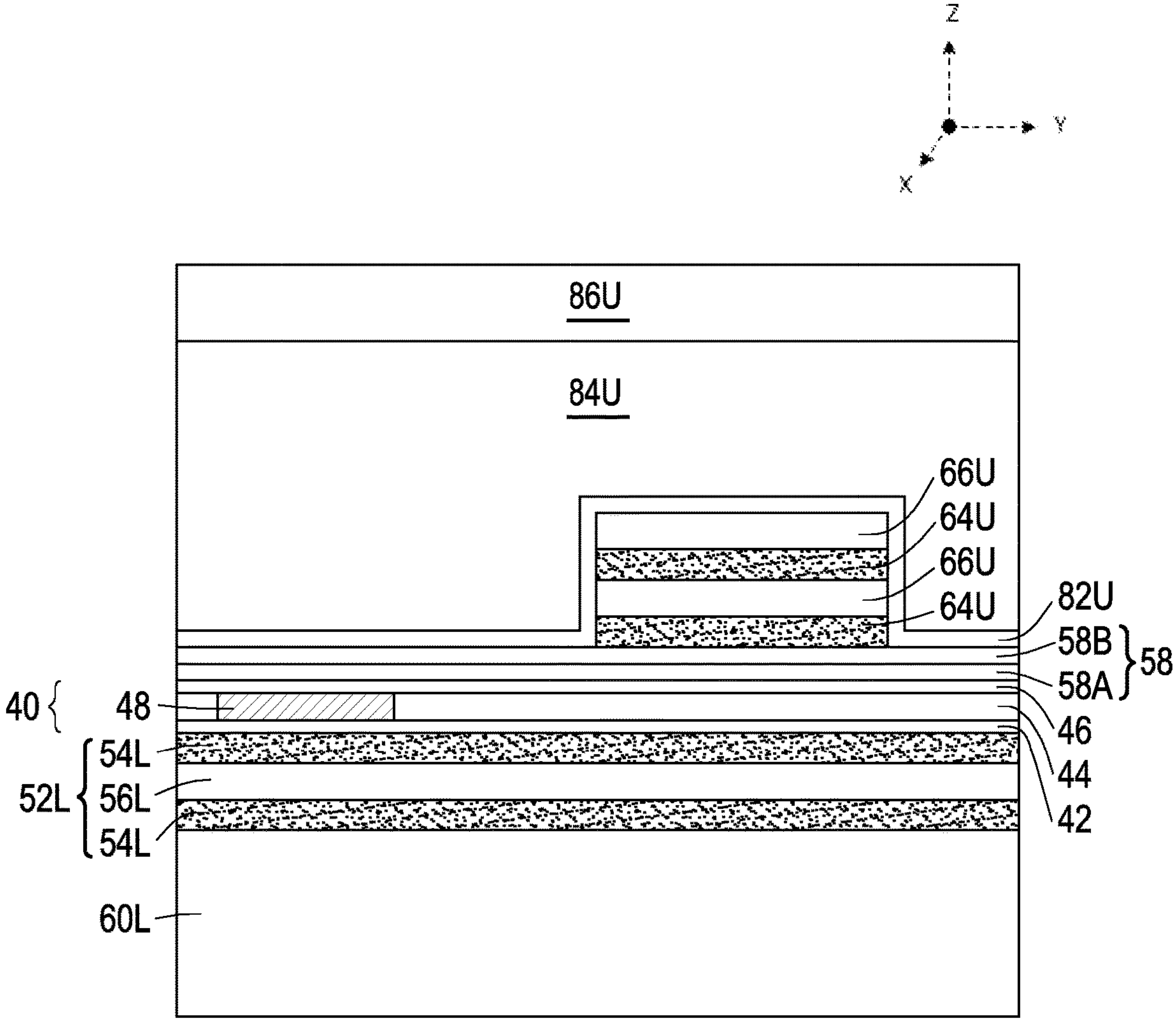
Figure 10C:
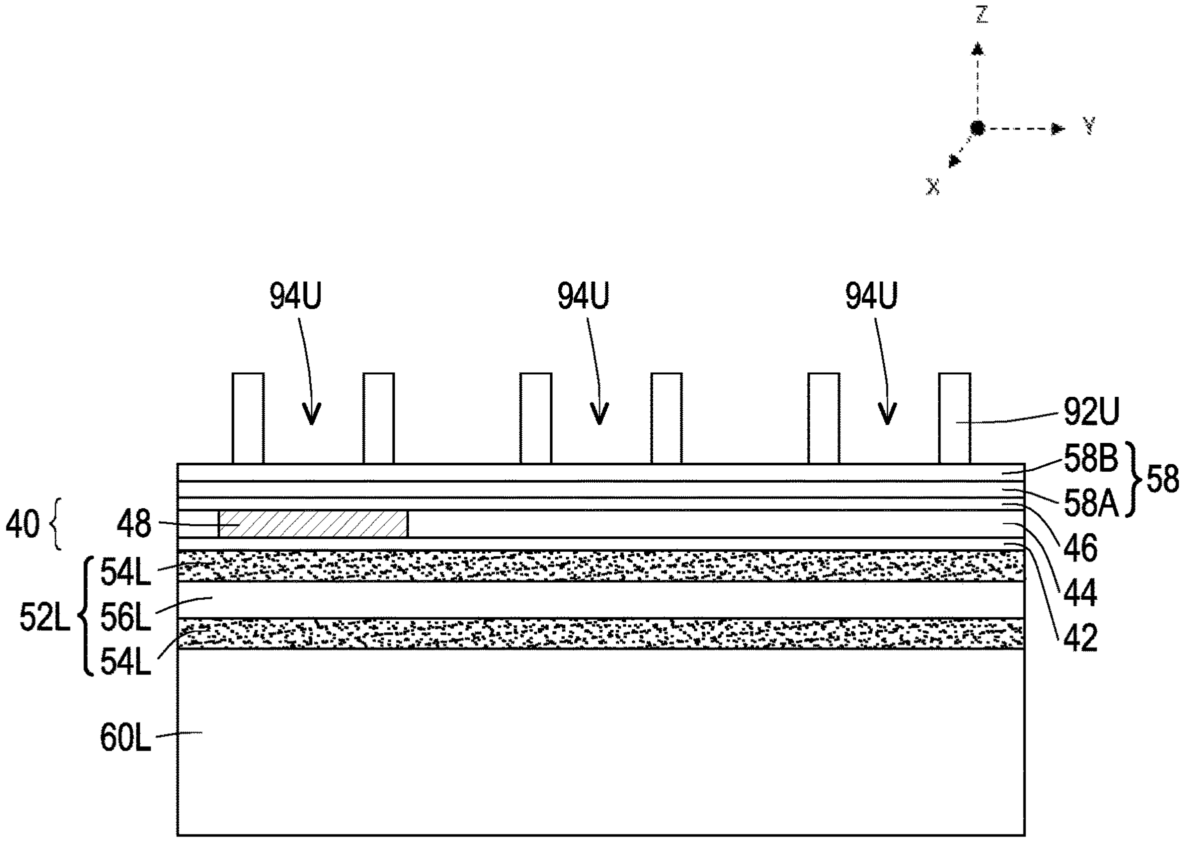

In FIGS. 10A-10C, upper source/drain recesses 94U are formed in the upper nanostructures 64U, 66U. Epitaxial source/drain regions will be subsequently formed in the upper source/drain recesses 94U. In some embodiments, the upper source/drain recesses 94U may extend completely through the upper nanostructures 64U, 66U to expose underlying insulating layers (e.g., the bonding layer 58). The upper source/drain recesses 94U may be formed by etching the upper nanostructures 64U, 66U using anisotropic etching processes, such as RIE, NBE, or the like. The gate spacers 90U and the dummy gates 84U mask portions of the upper nanostructures 64U, 66U during the etching processes used to form the upper source/drain recesses 94U. A single etch process or multiple etch processes may be used to etch each layer of the upper nanostructures 64U, 66U.

Figure 11A:
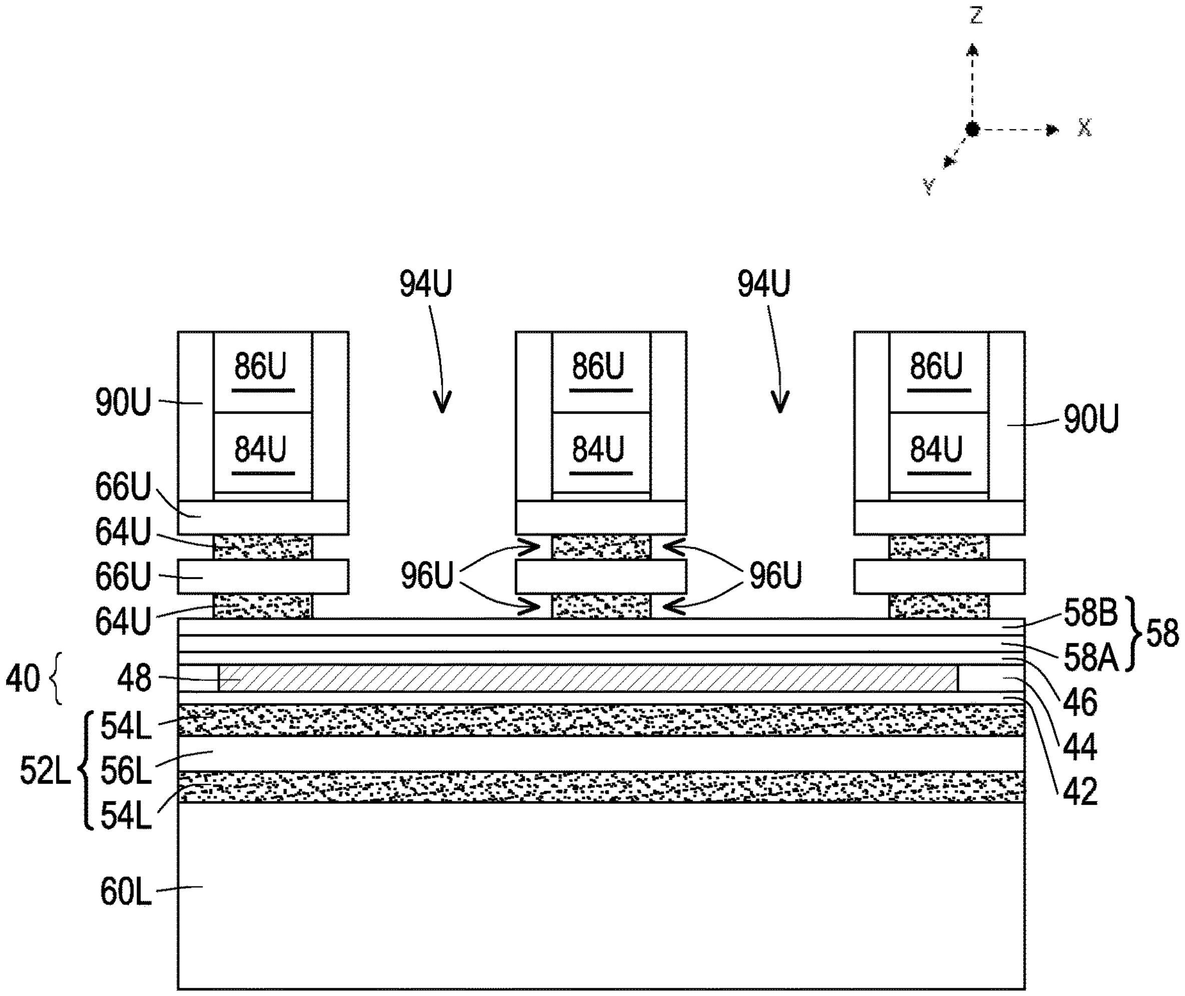
Figure 11B:
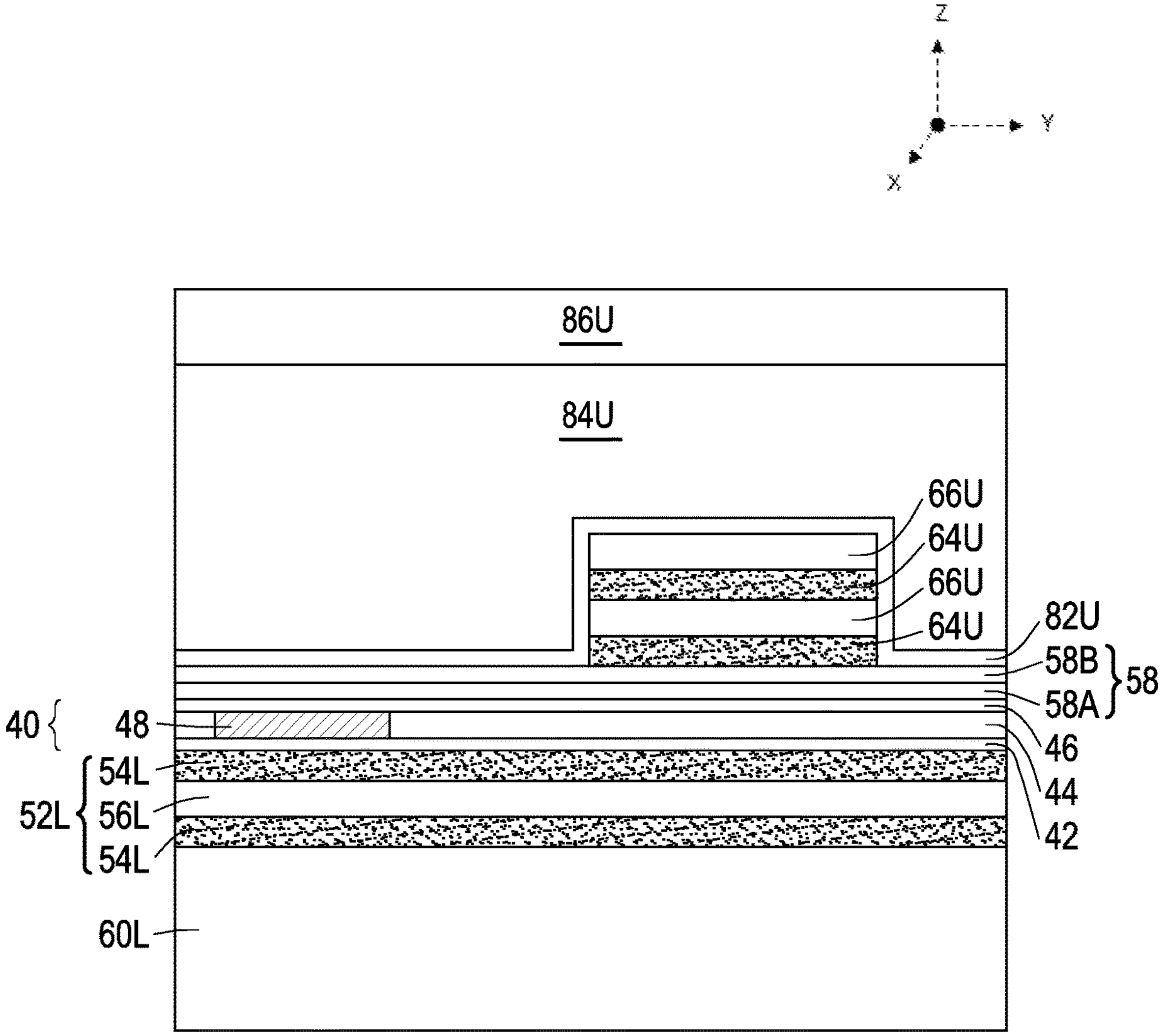

In FIGS. 11A-11B, portions of the sidewalls of the upper dummy nanostructures 64U exposed by the upper source/drain recesses 94U are recessed to form sidewall recesses 96U. The sidewall recesses 96U will subsequently be filled with spacers. The sidewall recesses 96U may be formed by recessing the sidewalls of the upper dummy nanostructures 64U with any acceptable etch process. The etching is selective to the material of the upper dummy nanostructures 64U (e.g., selectively etches the material of the dummy nanostructures 64U at a faster rate than the material of the semiconductor nanostructures 66U). The etching may be isotropic. Although sidewalls of the upper dummy nanostructures 64U are illustrated as being straight after the etching, the sidewalls may be concave or convex.

Figure 12A:
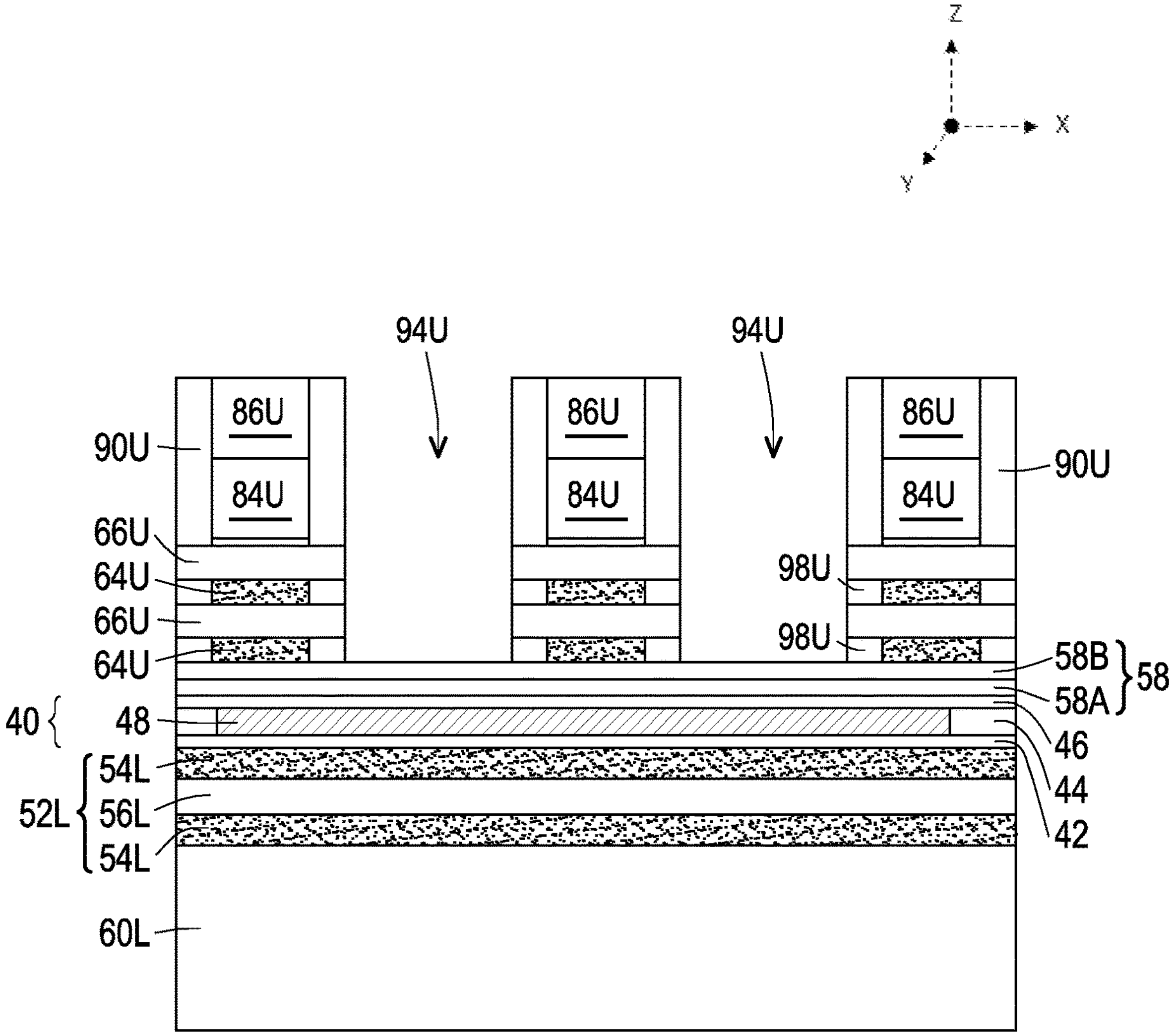
Figure 12B:
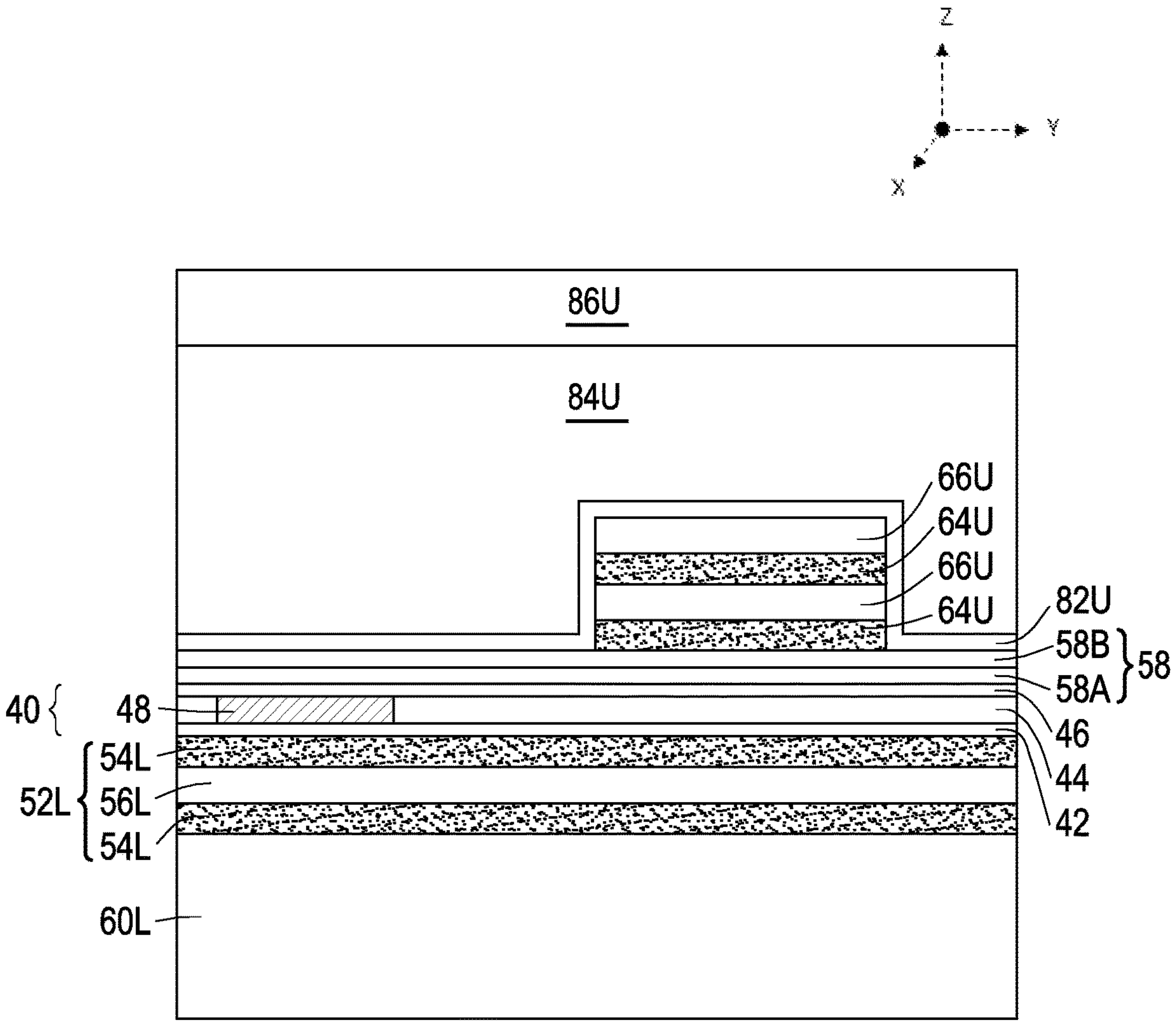

In FIGS. 12A-12B, upper inner spacers 98U are formed in the sidewall recesses 96U. As subsequently described in greater detail, source/drain regions will be subsequently formed in the upper source/drain recesses 94U, and the upper dummy nanostructures 64U will be replaced with corresponding gate structures. The upper inner spacers 98U act as isolation features between the subsequently formed source/drain regions and the subsequently formed gate structures. Further, the upper inner spacers 98U may be used to prevent damage to the subsequently formed source/drain regions by subsequent etch processes, such as etch processes used to form gate structures.

The upper inner spacers 98U may be formed by conformally forming an insulating material in the upper source/drain recesses 94U and the upper sidewall recesses 96U, and then subsequently etching the insulating material. The insulating material may be a hard dielectric material, such as a carbon-containing dielectric material, such as silicon oxycarbonitride, silicon oxycarbide, silicon oxynitride, or the like. Other low-dielectric constant (low-k) materials having a k-value less than about 3.5 may be utilized. The insulating material may be formed by a deposition process, such as ALD, CVD, or the like. The etching of the insulating material may be anisotropic. For example, the etch process may be a dry etch such as a RIE, a NBE, or the like. The insulating material, when etched, has portions remaining in the sidewall recesses 96U (thus forming the upper inner spacers 98U).

Although outer sidewalls of the upper inner spacers 98U are illustrated as being flush with sidewalls of the upper semiconductor nanostructures 66U, the outer sidewalls of the upper inner spacers 98U may extend beyond or be recessed from sidewalls of the upper semiconductor nanostructures 66U. In other words, the upper inner spacers 98U may partially fill, completely fill, or overfill the sidewall recesses 96U. Moreover, although the sidewalls of the upper inner spacers 98U are illustrated as being straight, those sidewalls may be concave or convex.

Figure 13A:
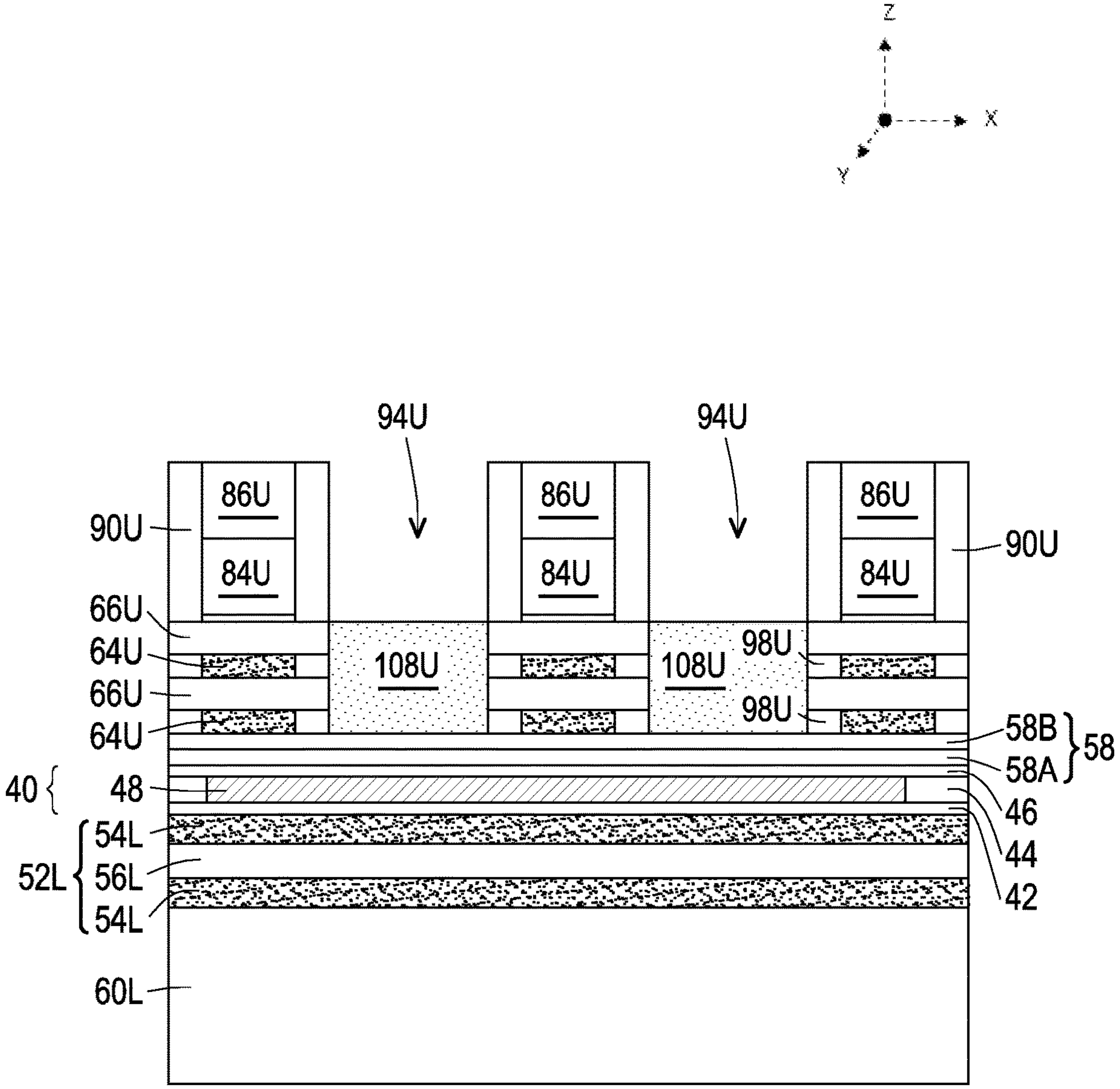
Figure 13B:
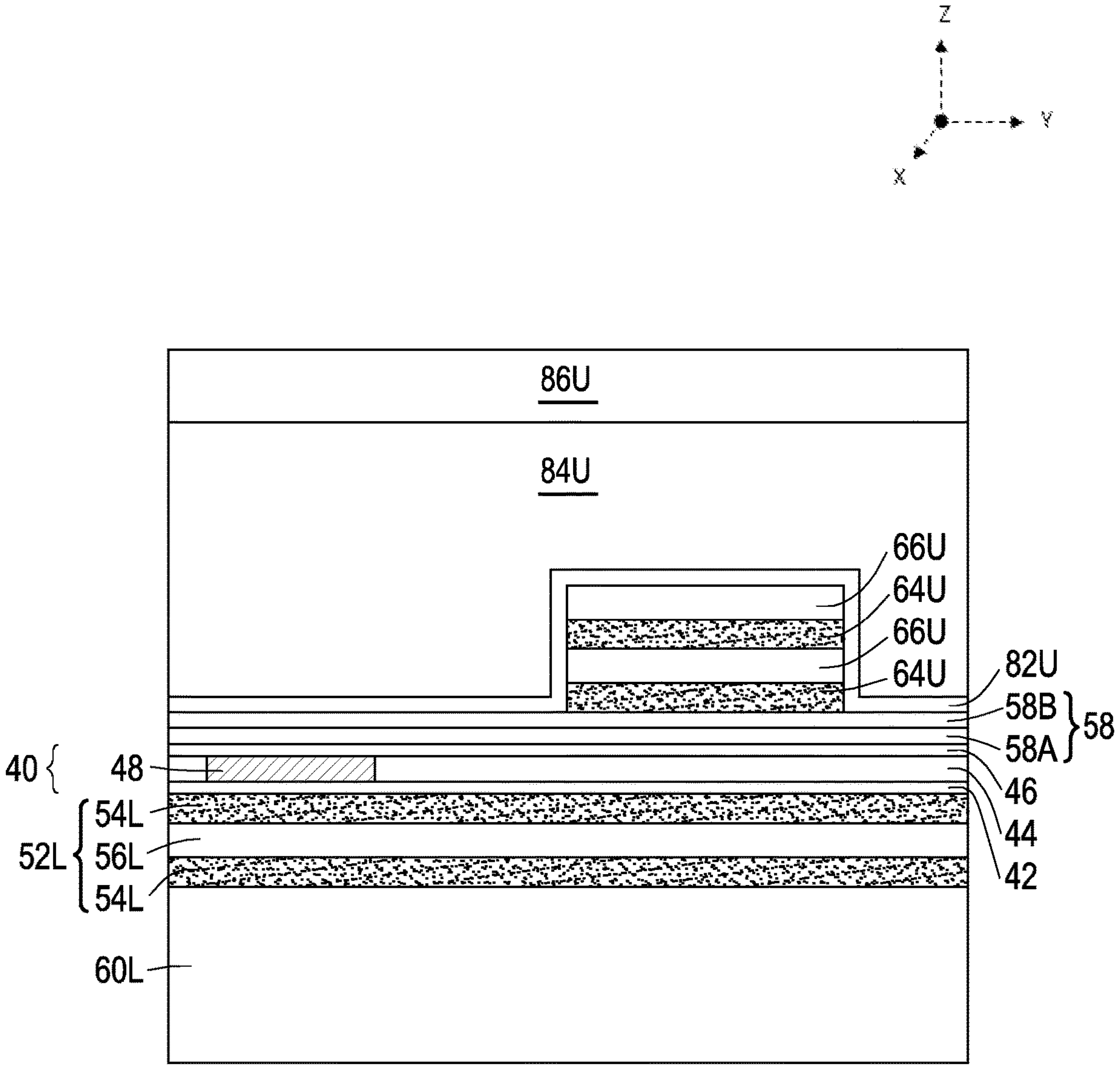
Figure 13C:
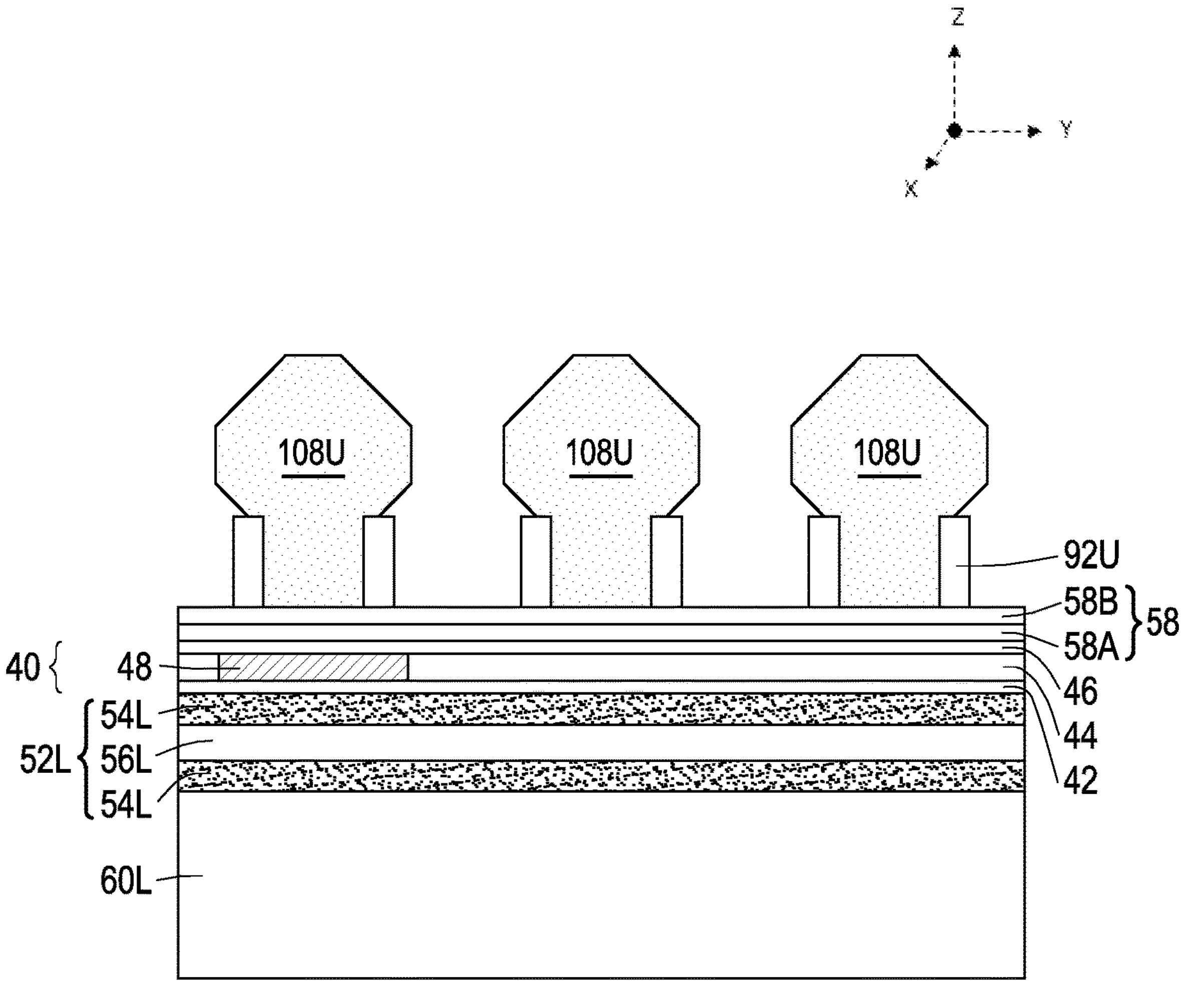

In FIGS. 13A-13C, upper epitaxial source/drain regions 108U are formed in the upper source/drain recesses 94U. In some embodiments, the upper epitaxial source/drain regions 108U exert stress in the respective channel regions of the upper semiconductor nanostructures 66U, thereby improving performance. The upper epitaxial source/drain regions 108U are formed in the upper source/drain recesses 94U such that each stack of the upper semiconductor nanostructures 66U is disposed between respective neighboring pairs of the upper epitaxial source/drain regions 108U. In some embodiments, the upper inner spacers 98U are used to separate the upper epitaxial source/drain regions 108U from the upper dummy nanostructures 64U by an appropriate lateral distance so that the upper epitaxial source/drain regions 108U do not short out with subsequently formed gates of the resulting devices.

The upper epitaxial source/drain regions 108U are epitaxially grown in the upper source/drain recesses 94U. The upper epitaxial source/drain regions 108U have a conductivity type that is suitable for the device type of the upper nanostructure-FETs. In some embodiments, the upper epitaxial source/drain regions 108U are n-type source/drain regions. For example, if the upper semiconductor nanostructures 66U are silicon, the upper epitaxial source/drain regions 108U may include materials exerting a tensile strain on the upper semiconductor nanostructures 66U, such as silicon, carbon-doped silicon, phosphorous-doped and carbon-doped silicon, silicon phosphide, silicon arsenide, or the like. In some embodiments, the upper epitaxial source/drain regions 108U are p-type source/drain regions. For example, if the upper semiconductor nanostructures 66U are silicon, the upper epitaxial source/drain regions 108U may include materials exerting a compressive strain on the upper semiconductor nanostructures 66U, such as silicon-germanium, boron-doped silicon-germanium, boron-doped silicon, germanium, germanium tin, or the like. The upper epitaxial source/drain regions 108U may have surfaces raised from respective upper surfaces of the upper semiconductor nanostructures 66U and may have facets.

The upper epitaxial source/drain regions 108U may be implanted with dopants to form source/drain regions, similar to the process previously discussed for forming lightly-doped source/drain regions, followed by an anneal. The source/drain regions may have an impurity concentration in the range of $10^{19}$ atoms/cm$^3$ and $10^{21}$ atoms/cm$^3$. The n-type and/or p-type impurities for source/drain regions may be any of the impurities previously discussed. In some embodiments, the upper epitaxial source/drain regions 108U are in situ doped during growth.

As a result of the epitaxy processes used to form the upper source/drain regions 108U, upper surfaces of the upper source/drain regions 108LU have facets which expand laterally outward beyond sidewalls of the nanostructures 64U, 66U. In some embodiments, adjacent upper source/drain regions 108U remain separated after the epitaxy process is completed as illustrated by FIG. 13C. In other embodiments, these facets cause adjacent upper source/drain regions 108U of a same nanostructure-FET to merge (not separately illustrated). In the illustrated embodiments, the fin spacers 92U are formed on a top surface of the bonding layer 58, thereby blocking the epitaxial growth. In some other embodiments, the fin spacers 92U may cover portions of the sidewalls of the nanostructures 64U, 66U, further blocking the epitaxial growth. In another embodiment, the spacer etch used to form the gate spacers 90 is adjusted to not form the fin spacers 92U, so as to allow the upper source/drain regions 108U to extend to the surface of the underlying layer (e.g., the bonding layer 58).

Although the upper source/drain regions 108U is illustrated as a single layer, the upper source/drain regions 108U may comprise one or more semiconductor material layers (not explicitly illustrated). Each of the semiconductor material layers may be doped to different dopant concentrations.

Figure 14A:
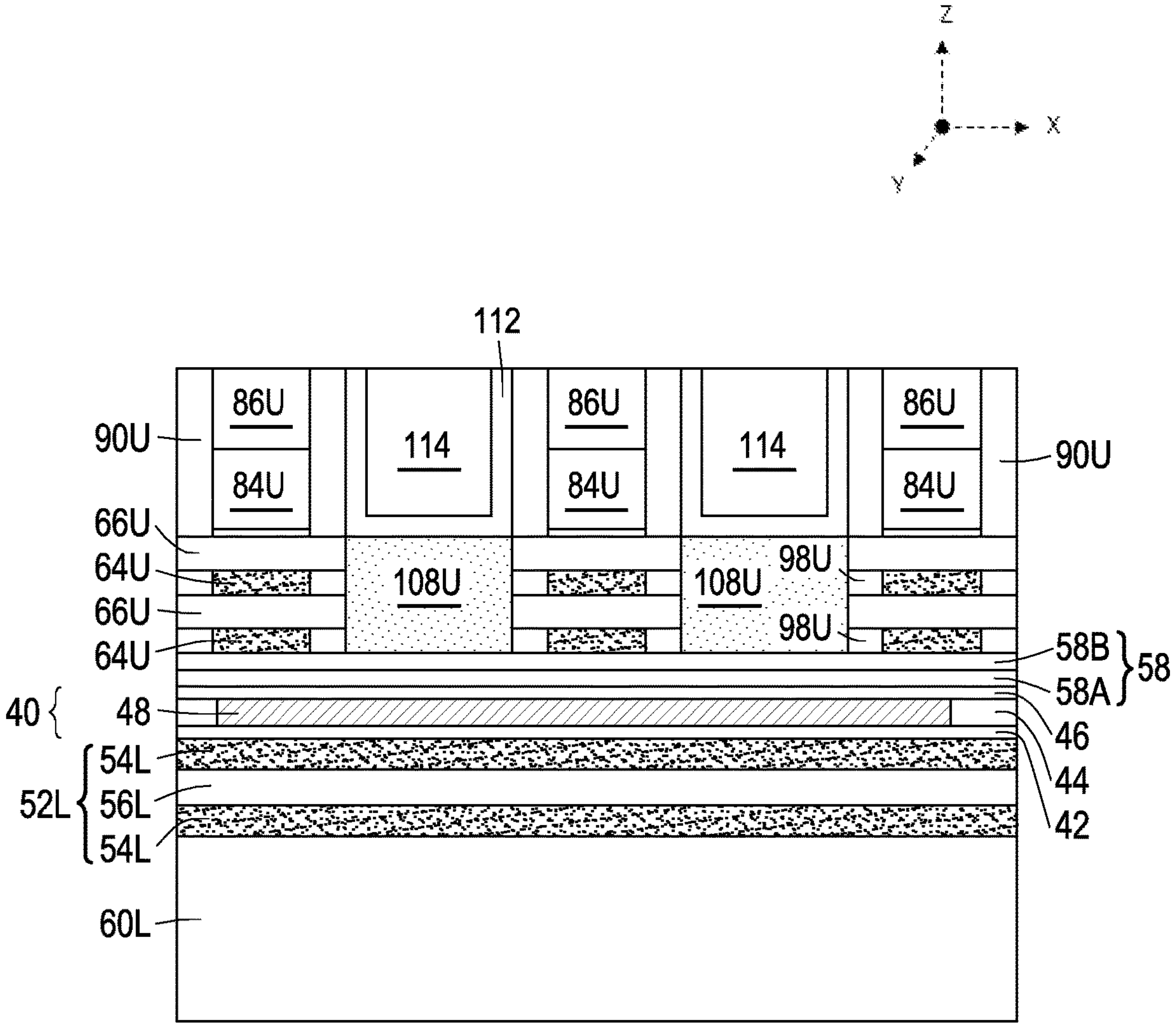
Figure 14B:
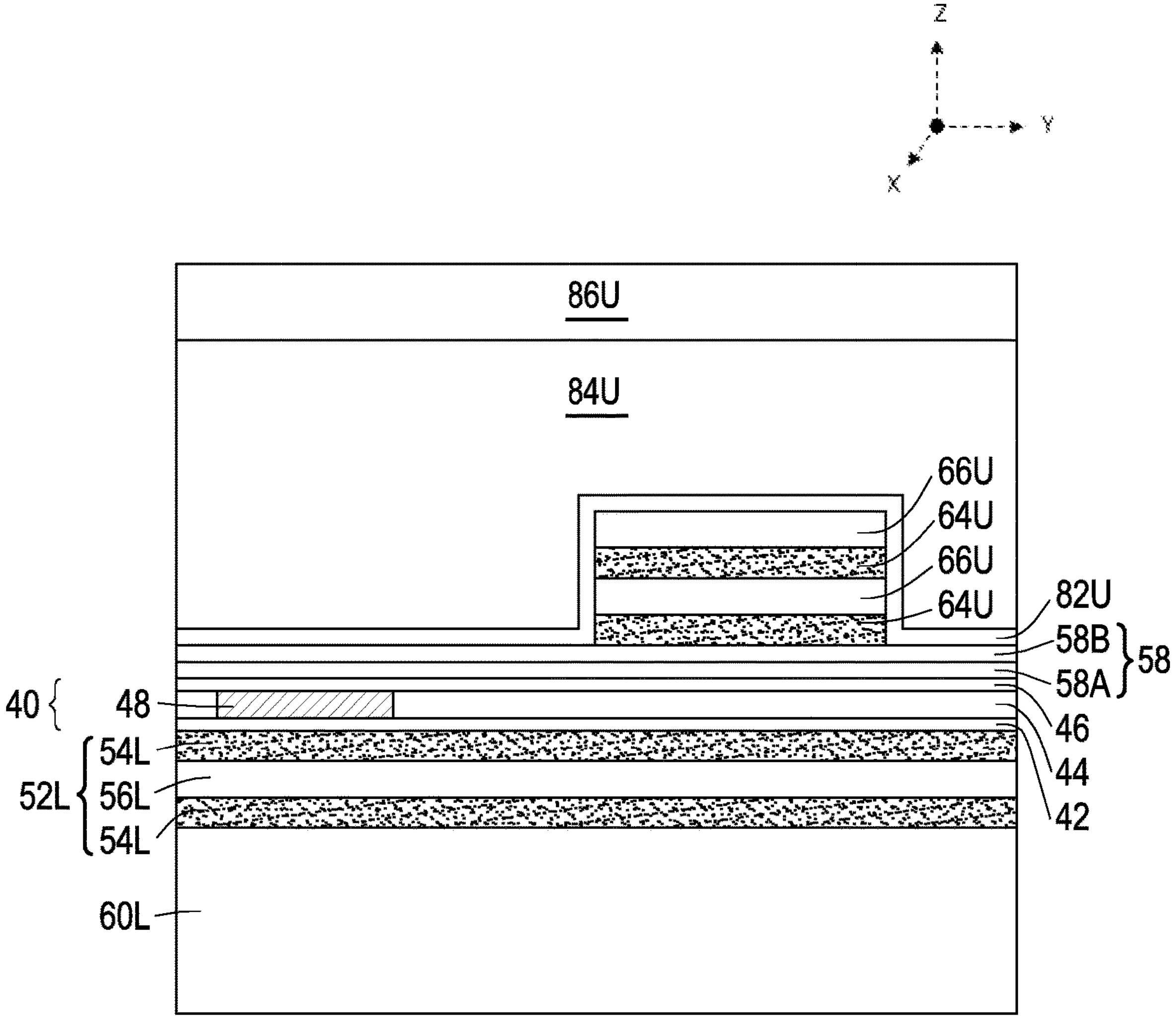
Figure 14C:
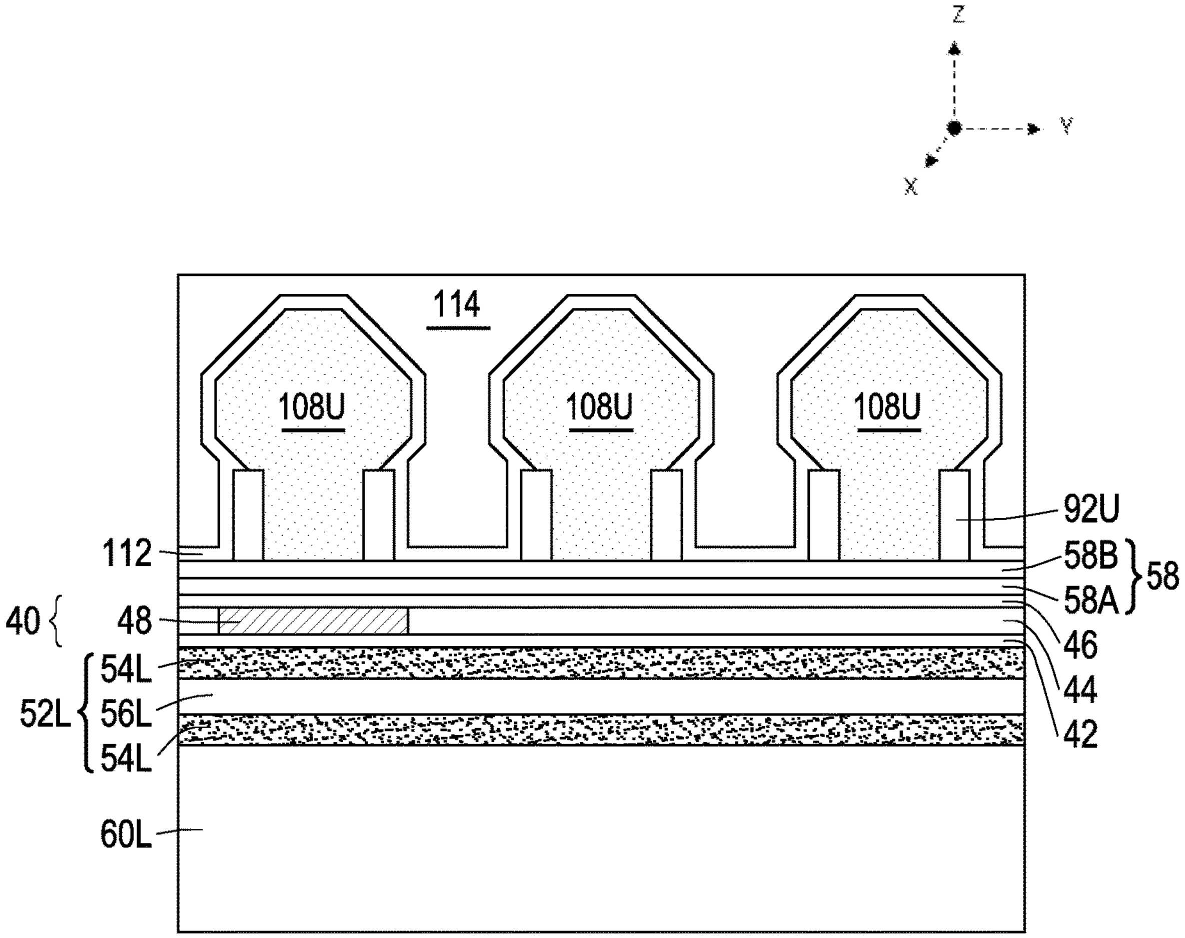

In FIGS. 14A-14C, an interlayer dielectric (ILD) 114 is deposited over the upper epitaxial source/drain regions 108U, the upper gate spacers 90U, and the masks 86U (if present) or the dummy gates 84U. The ILD 114 may be formed of a dielectric material, which may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other dielectric materials formed by any acceptable process may be used.

In some embodiments, a contact etch stop layer (CESL) 112 is formed between the ILD 114 and the upper epitaxial source/drain regions 108U, the upper gate spacers 90U, and the masks 86U (if present) or the upper dummy gates 84U. The CESL 112 may be formed of a dielectric material having a high etching selectivity from the etching of the ILD 114, such as, silicon nitride, silicon oxide, silicon oxynitride, or the like, which may be formed by any suitable deposition process, such as CVD, ALD, or the like.

After the CESL 112 and the ILD 114 are deposited, a removal process is performed to level the top surfaces of the ILD 114 with the top surfaces of the gate spacers 90U and the masks 86U (if present) or the dummy gates 84U. In some embodiments, a planarization process such as a chemical mechanical polish (CMP), an etch-back process, combinations thereof, or the like may be utilized. The planarization process may also remove the masks 86U on the dummy gates 84U, and portions of the gate spacers 90U along sidewalls of the masks 86U. After the planarization process, top surfaces of the ILD 114, the gate spacers 90U, and the masks 86U (if present) or the dummy gates 84U are substantially coplanar (within process variations). Accordingly, the top surfaces of the masks 86 (if present) or the upper dummy gates 84U are exposed through the ILD 114. In the illustrated embodiment, the masks 86U remain after the removal process. In other embodiments, the masks 86U are removed such that the top surfaces of the upper dummy gates 84U are exposed through the ILD 114.

Figure 15A:
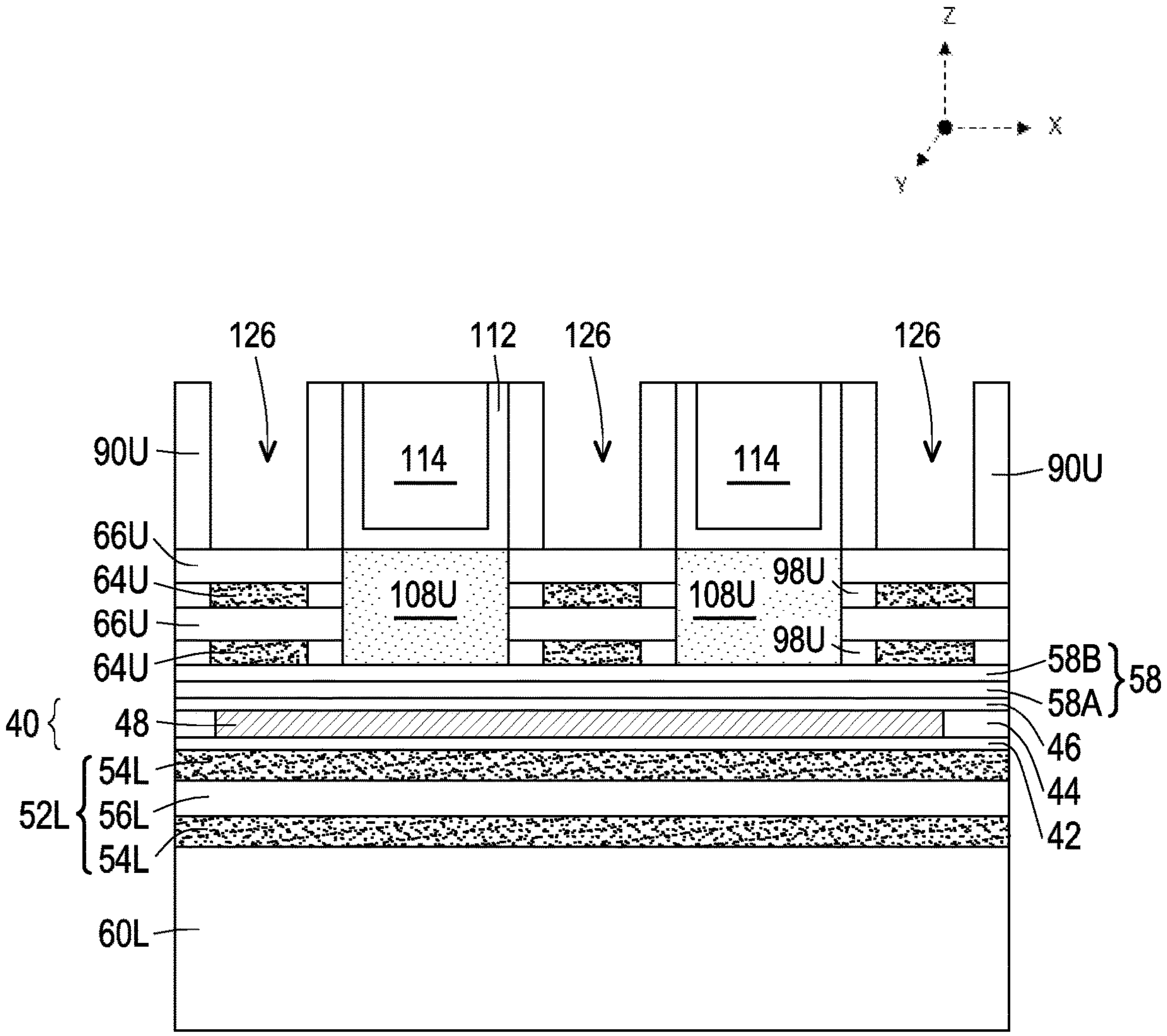
Figure 15B:
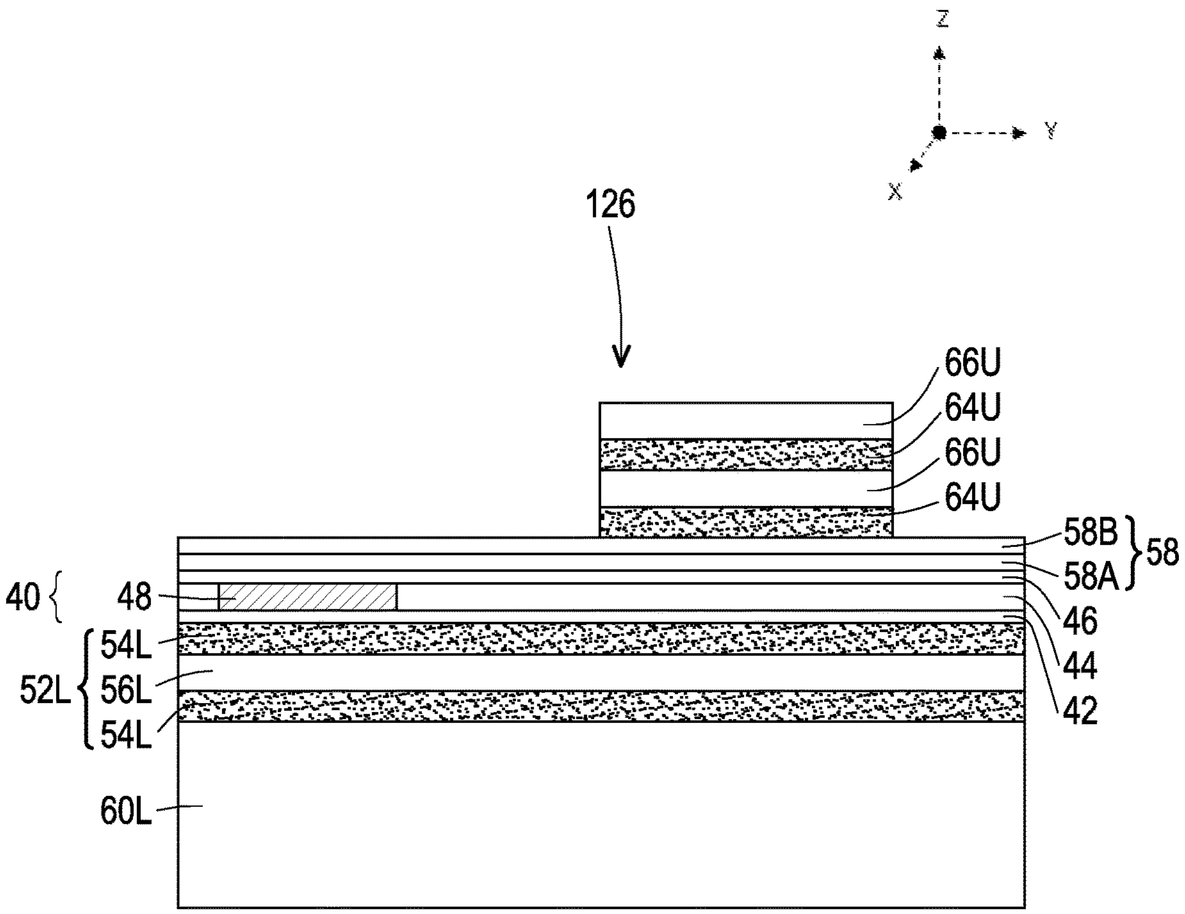
Figure 15C:
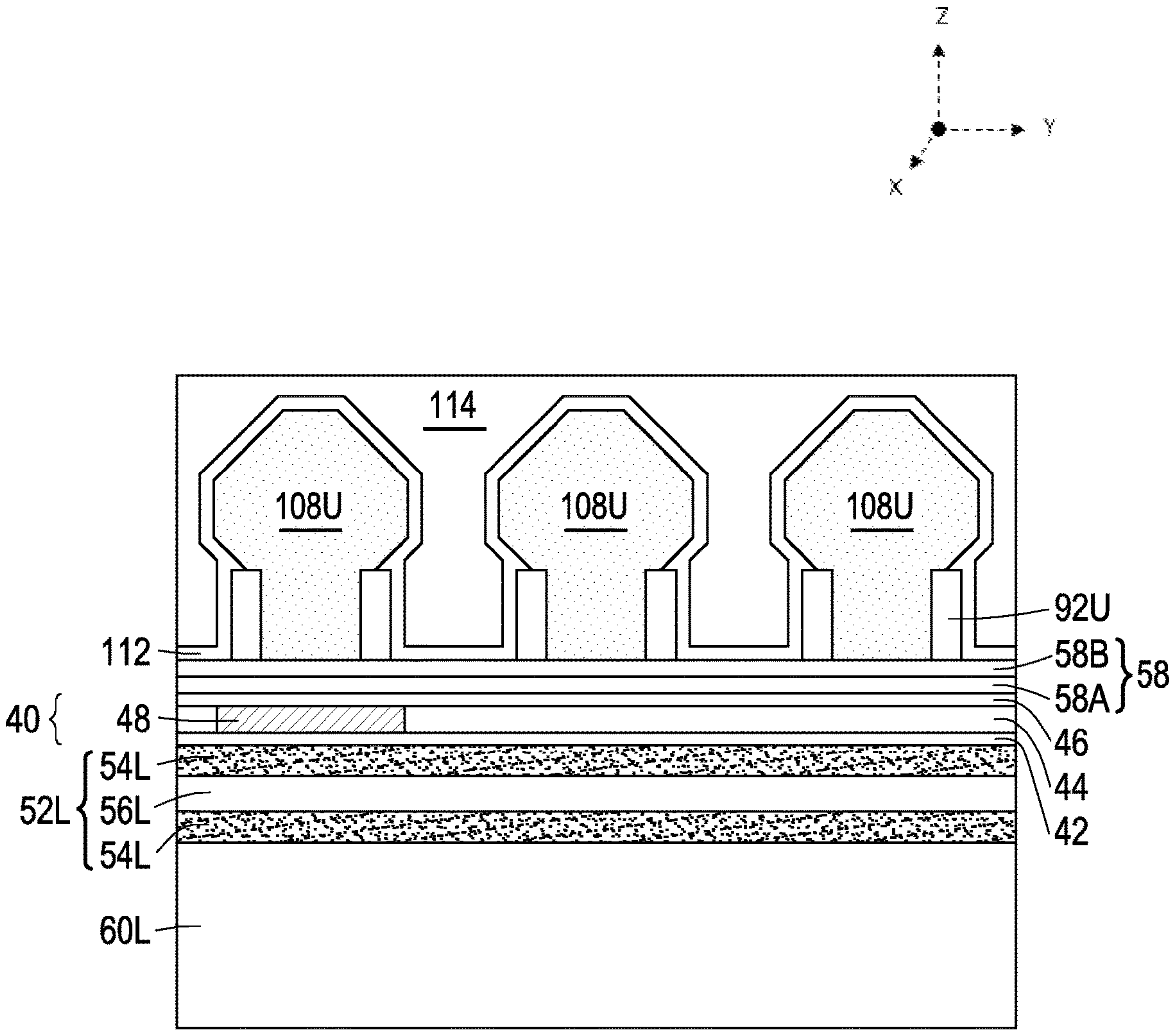

In FIGS. 15A-15C, the dummy gates 84U are removed in one or more etching steps, so that recesses 126 are formed between the upper gate spacers 90U. Portions of the dummy dielectrics 82U in the recesses 126 are also removed. In some embodiments, the upper dummy gates 84U and the upper dummy dielectrics 82U are removed by an anisotropic dry etch process. For example, the etching process may include a dry etch process using reaction gas(es) (e.g., using a chlorine-based etch) that selectively etch the material of the upper dummy gates 84U at a faster rate than the materials of the ILD 114, the inner spacers 98U, and the gate spacers 90U. Each of the recesses 126 exposes portions of upper semiconductor nanostructures 66U which act as the channel regions in the resulting devices. During the removal, the dummy dielectrics 82U may be used as etch stop layers when the dummy gates 84U are etched. The dummy dielectrics 82U may then be removed after the removal of the dummy gates 84U.

Figure 16A:
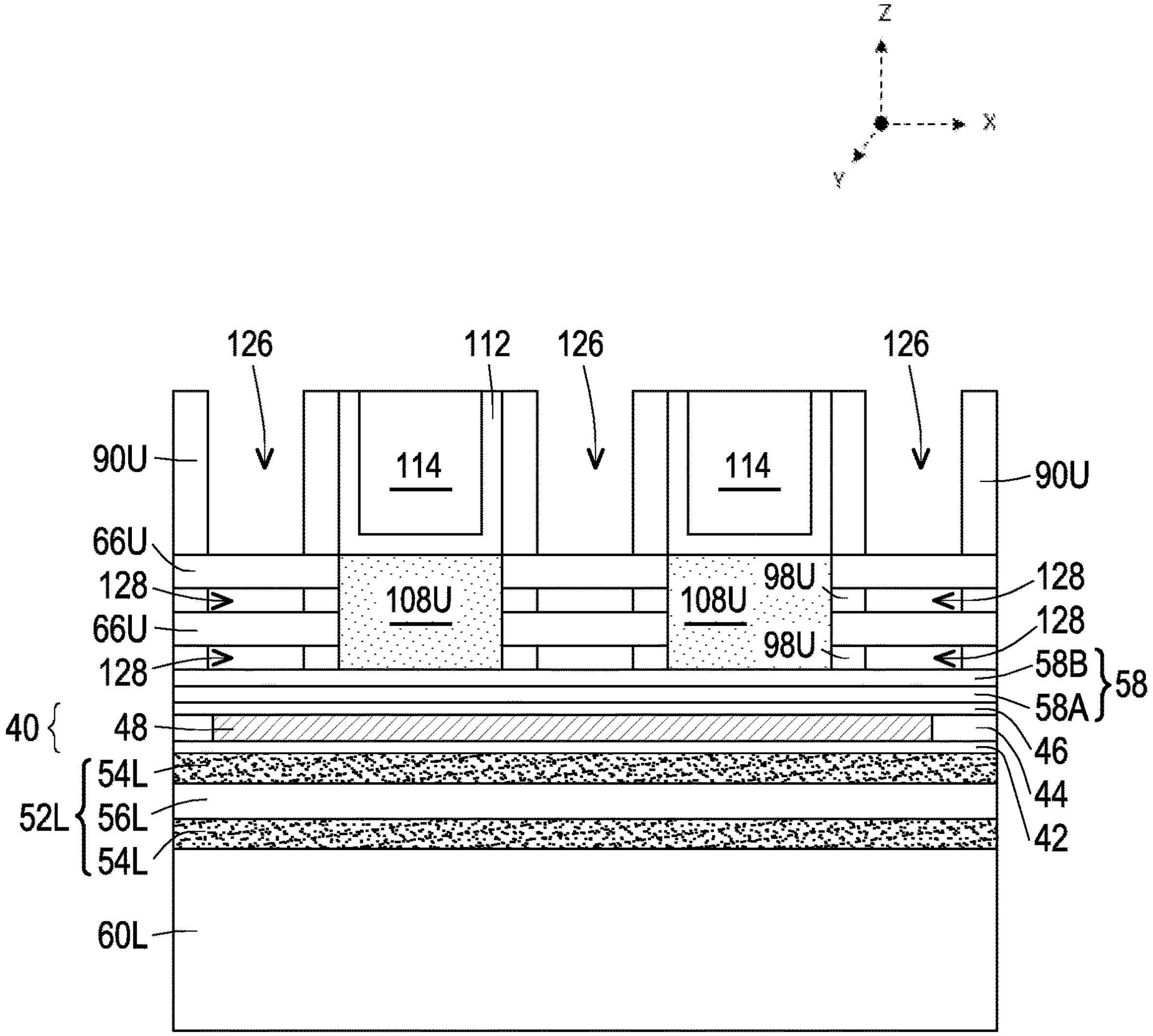
Figure 16B:
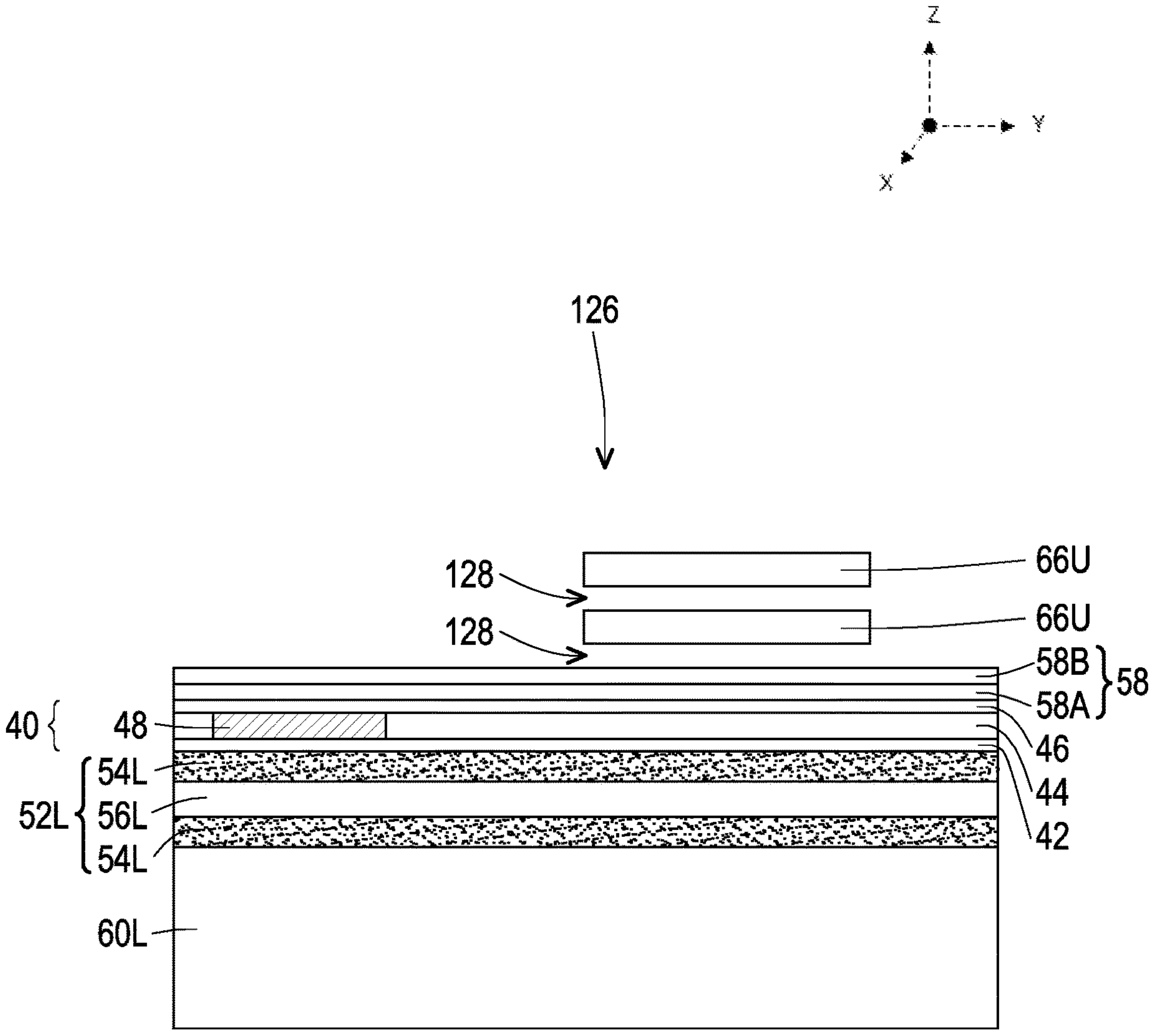
Figure 16C:
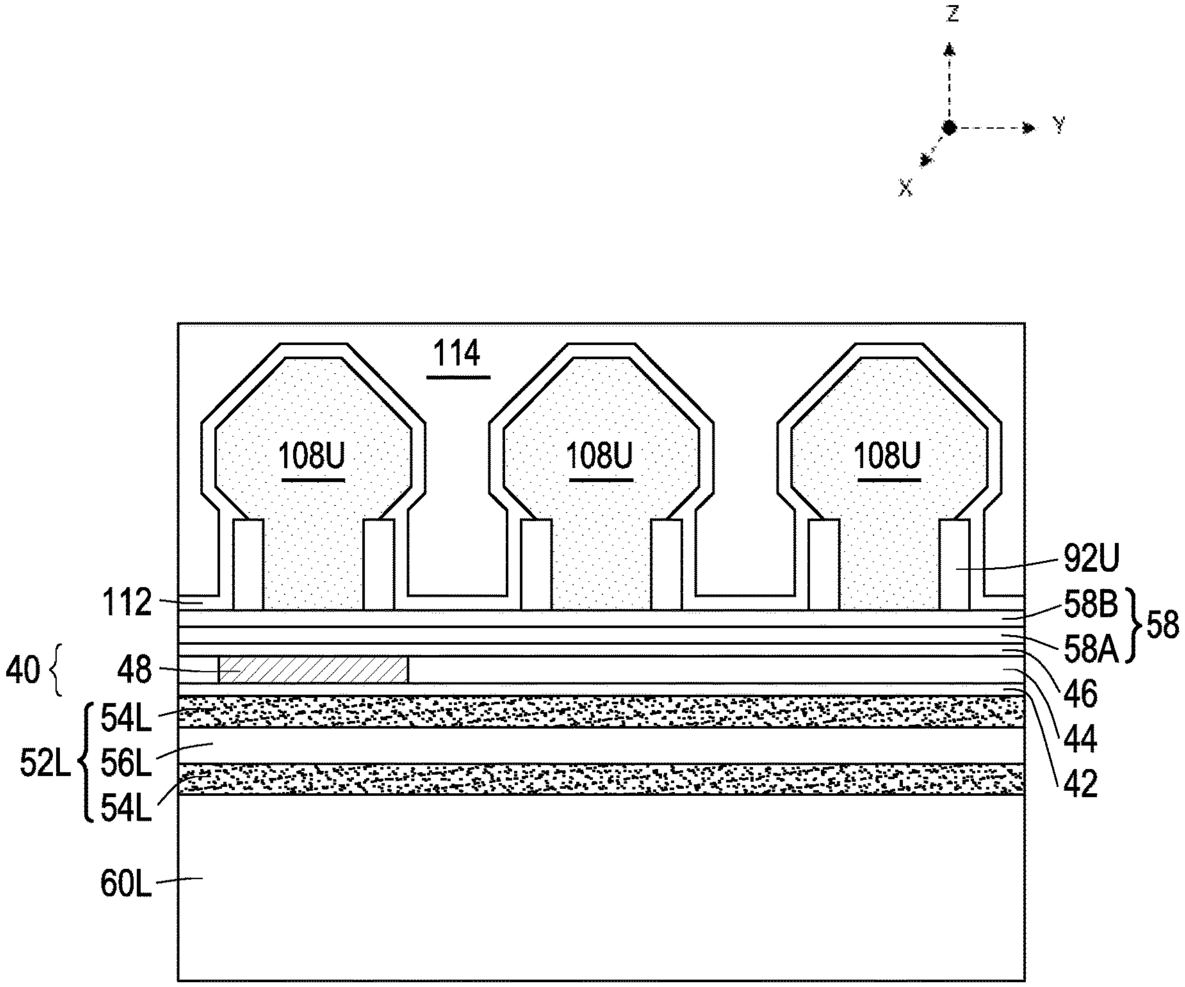

In FIGS. 16A-16C, the remaining portions of the upper dummy nanostructures 64U are then removed to form openings 128 in regions between the upper semiconductor nanostructures 66U. The remaining portions of the upper dummy nanostructures 64U can be removed by any acceptable etch process that selectively etches the material of the upper dummy nanostructures 64U at a faster rate than the materials of the upper semiconductor nanostructures 66U and the inner spacers 98U. The etching may be isotropic. For example, when the dummy nanostructures 64U are formed of silicon-germanium, the semiconductor nanostructures 66U are formed of silicon, and the inner spacers 98U are formed of silicon oxycarbonitride, the etch process may be a wet etch using tetramethylammonium hydroxide (TMAH), ammonium hydroxide ($NH_4OH$), or the like. In some embodiments, a trim process (not separately illustrated) is performed to decrease the thicknesses of the exposed portions of the semiconductor nanostructures 66U and expand the openings 128.

Figure 17A:
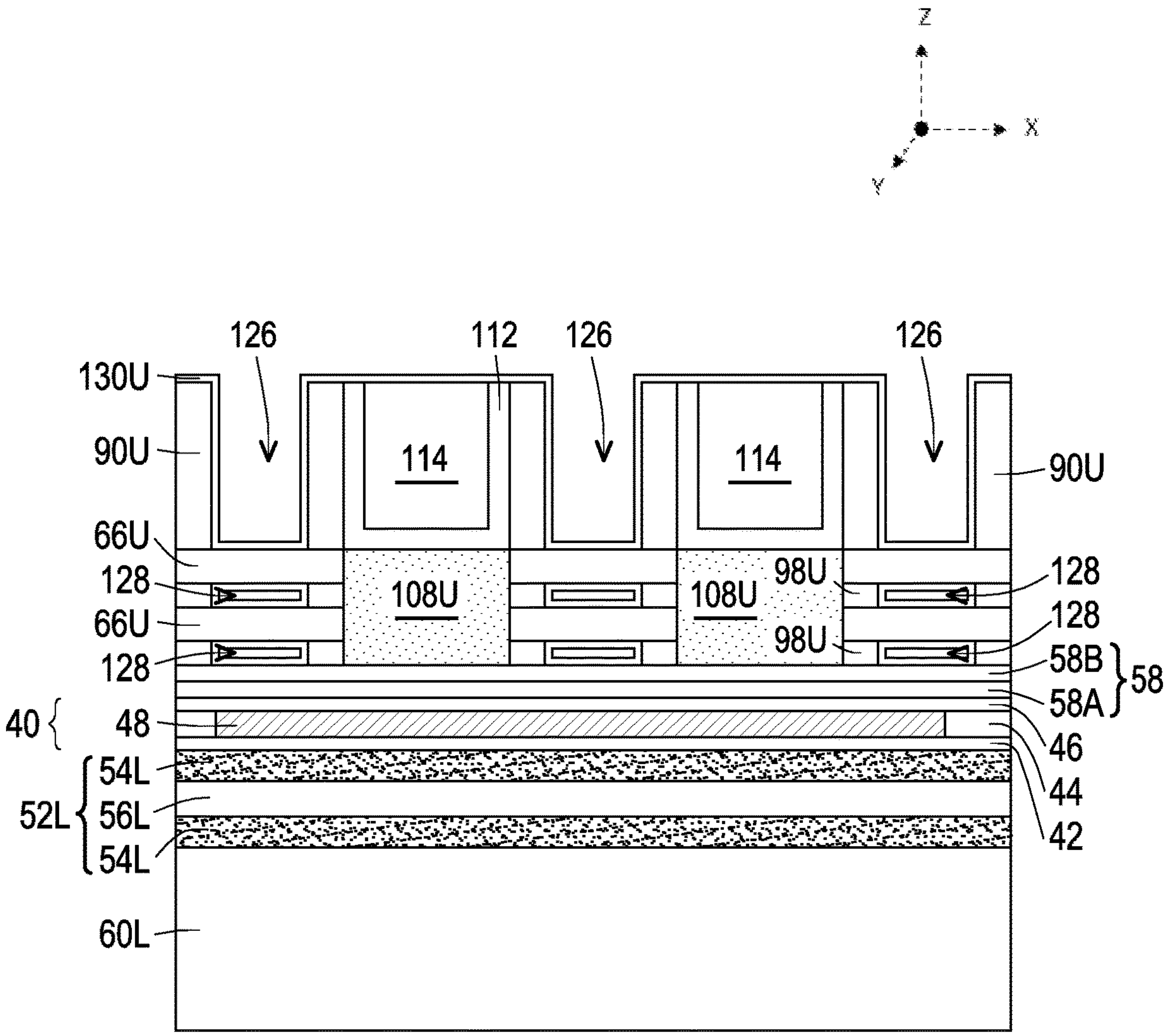
Figure 17B:
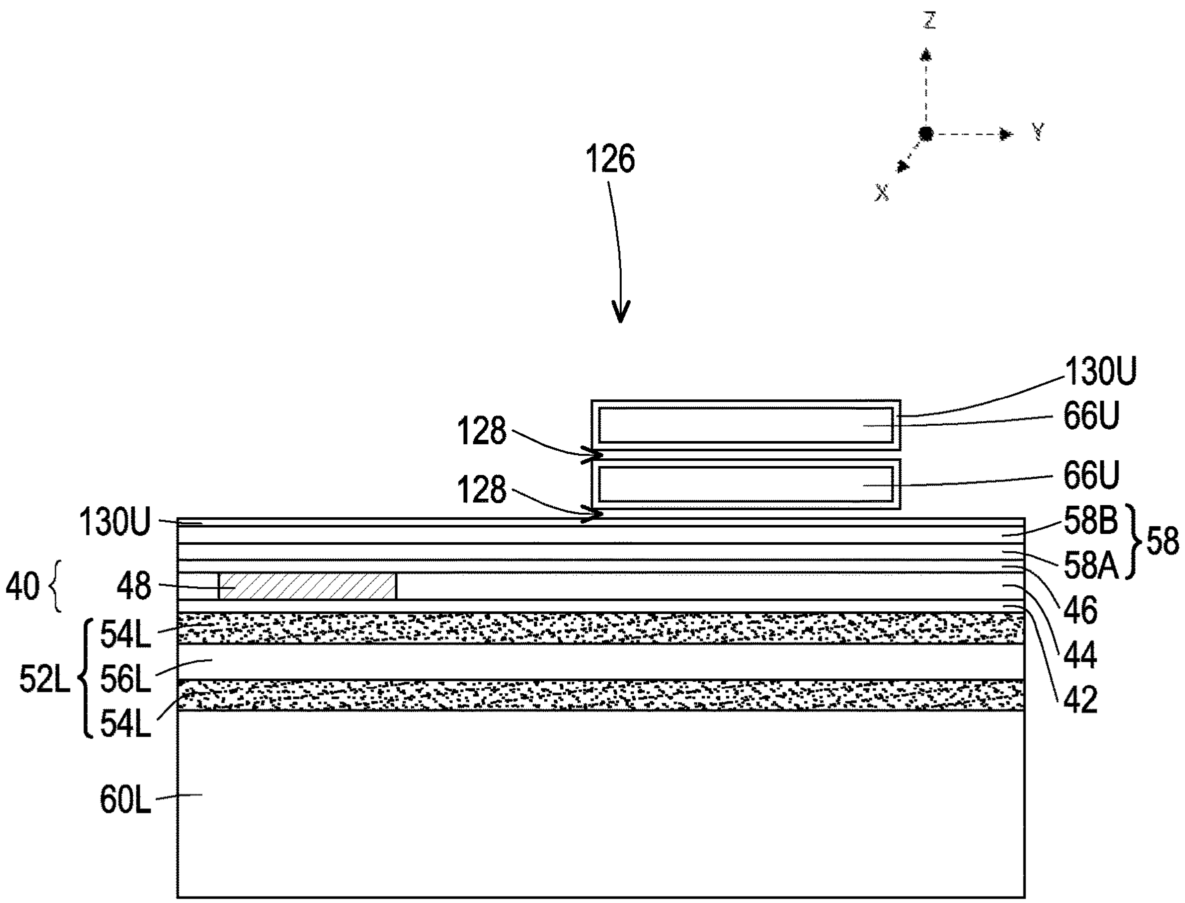
Figure 17C:
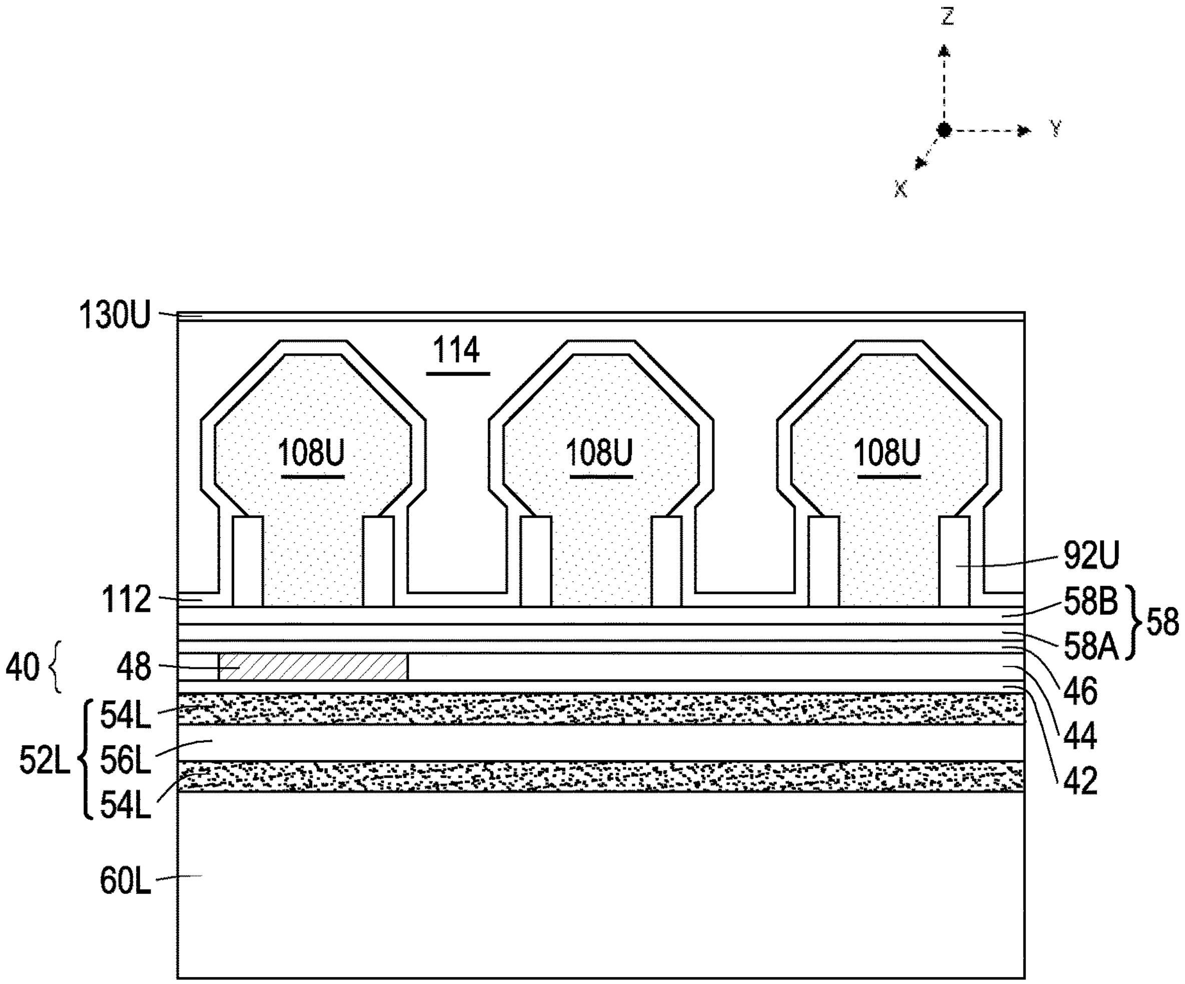

In FIGS. 17A-17C, an upper gate dielectric layer 130U is conformally formed on the channel regions of the semiconductor nanostructures 66U, such that it conformally lines the recesses 126 and the openings 128. Specifically, the upper gate dielectric layer 130U is formed on the top surfaces, the sidewalls, and the bottom surfaces of the upper semiconductor nanostructures 66U and on the sidewalls of the upper gate spacers 90U. The upper gate dielectric layer 130U wraps around all (e.g., four) sides of the upper semiconductor nanostructures 66U. The upper gate dielectric layer 130U may also be formed on the top surfaces of ILD 114 and the gate spacers 90U. The upper gate dielectric layer 130U may include an oxide such as silicon oxide or a metal oxide, a silicate such as a metal silicate, combinations thereof, multilayers thereof, or the like. The upper gate dielectric layer 130U may include a high-dielectric constant (high-k) material having a k-value greater than about 7.0, such as a metal oxide or a silicate of hafnium, aluminum, zirconium, lanthanum, manganese, barium, titanium, lead, and combinations thereof. The formation methods of the upper gate dielectric layer 130U may include molecular-beam deposition (MBD), ALD, PECVD, and the like. After the upper gate dielectric layer 130U is deposited, a relatively high temperature annealing process (e.g., in a range of 800° C. to 900° C.) is performed to improve a film quality of the upper gate dielectric layer 130U, thereby improving device reliability of the resulting CFET device. Although a single-layered upper gate dielectric layer 130U is illustrated, the upper gate dielectric layer 130U may include multiple layers, such as an interfacial layer and an overlying high-k dielectric layer.

Figure 18A:
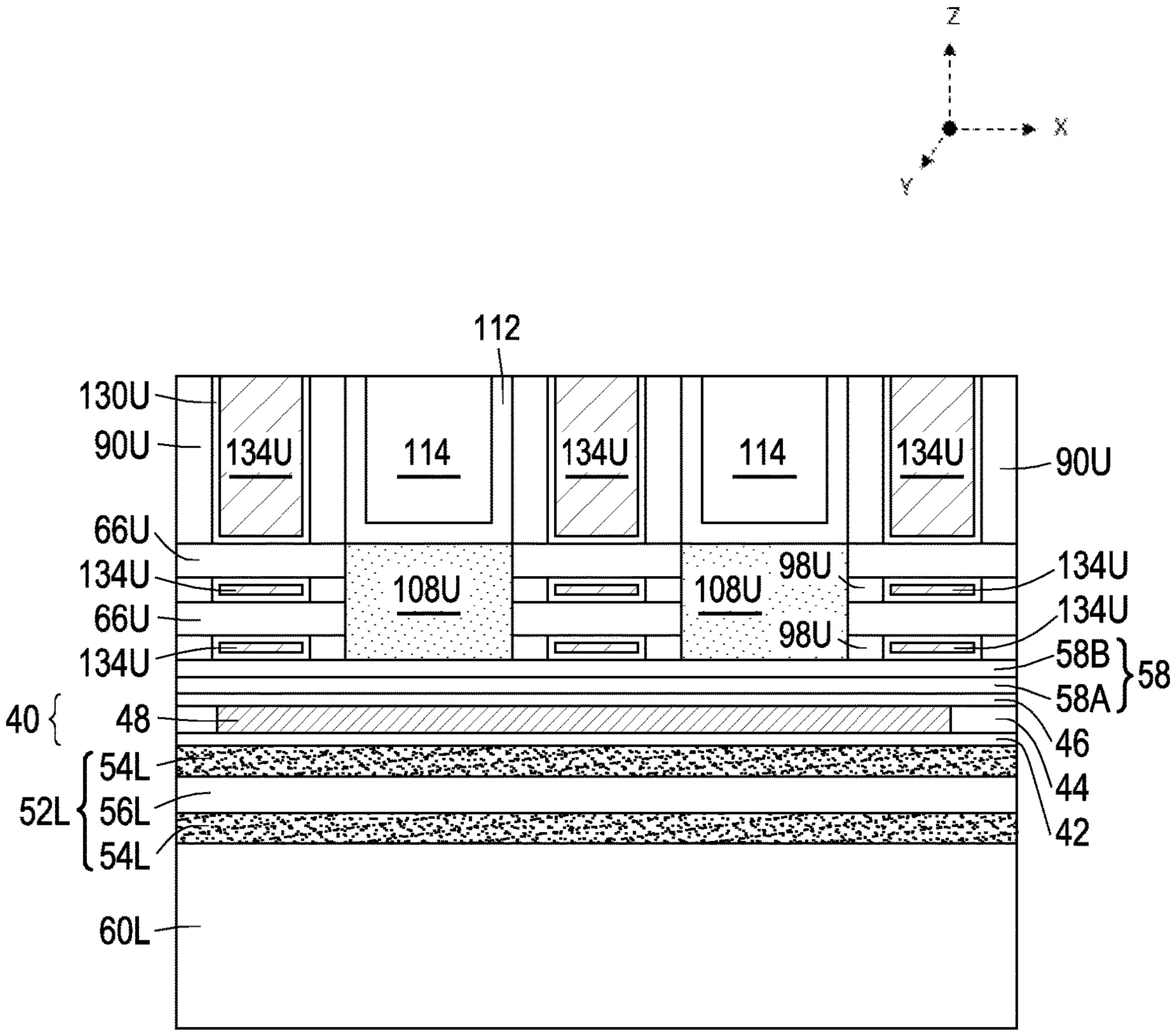
Figure 18B:
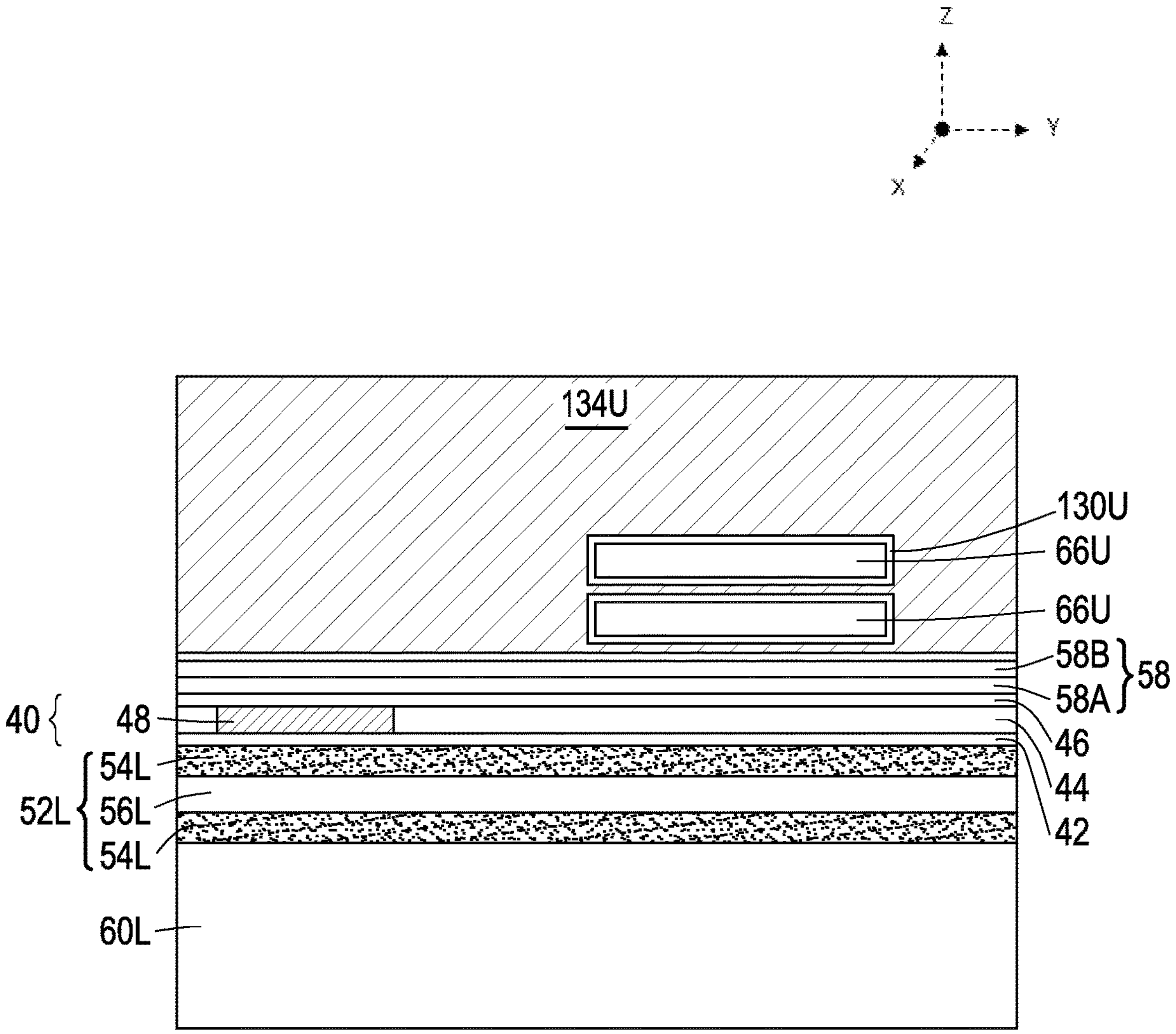
Figure 18C:
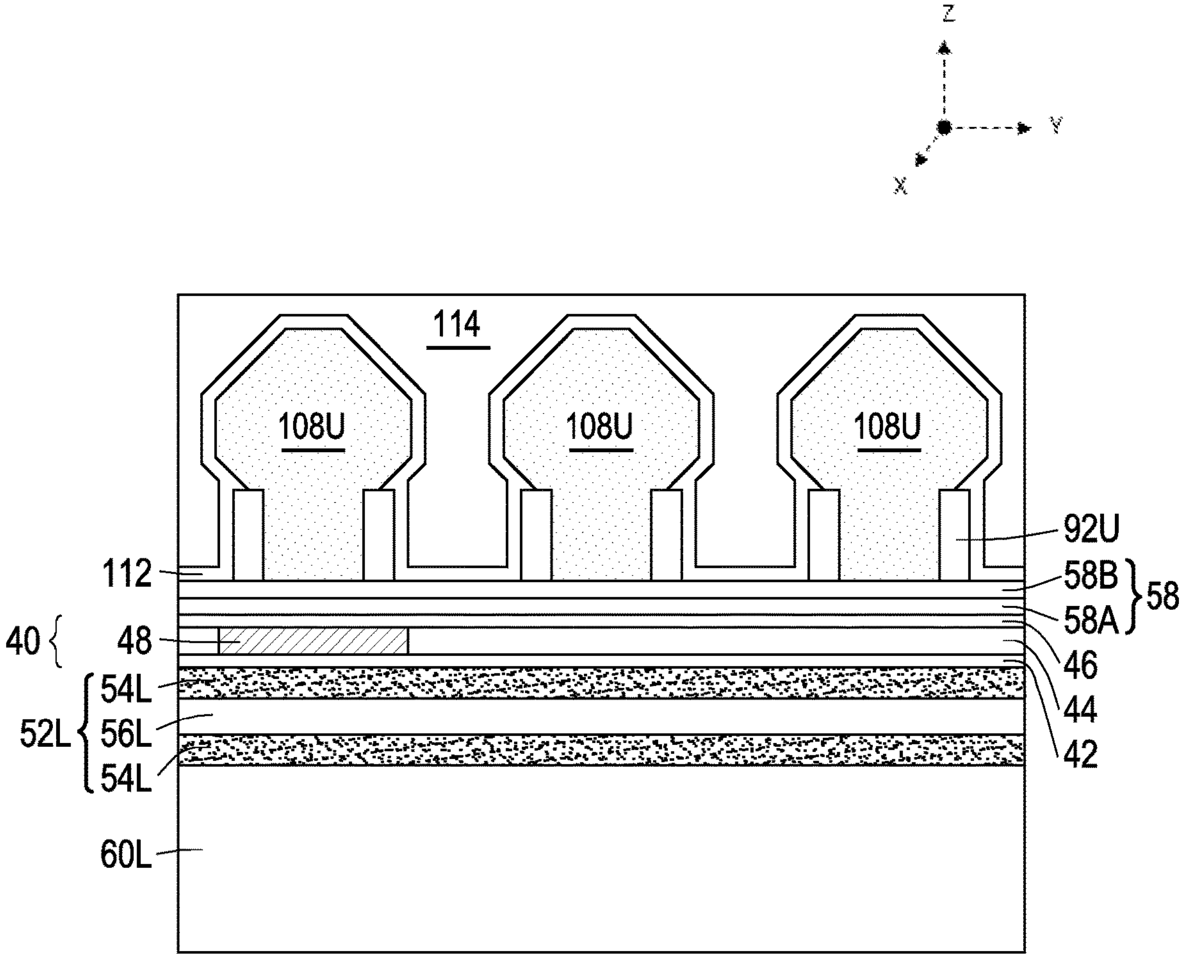

In FIGS. 18A-18C, upper gate electrodes 134U are formed on the upper gate dielectric layer 130U. The upper gate electrodes 134U are disposed in remaining portions of the recesses 126 and in the openings 128 between the upper semiconductor nanostructures 66U. Accordingly, the upper gate electrodes 134U wrap around the upper semiconductor nanostructures 66U. The upper gate electrodes 134U may be formed of a metal-containing material such as tungsten, titanium, titanium nitride, tantalum, tantalum nitride, tantalum carbide, aluminum, ruthenium, cobalt, combinations thereof, multi-layers thereof, or the like. Although single-layered gate electrodes are illustrated, the upper gate electrodes 134U may include any number of work function tuning layers, any number of barrier layers, any number of glue layers, and a fill material.

The upper gate electrodes 134U are formed of material(s) that are suitable for the device type of the upper nanostructure-FETs. For example, the upper gate electrodes 134U may include one or more work function tuning layer(s) formed of material(s) that are suitable for the device type of the lower nanostructure-FETs. In some embodiments, the upper gate electrodes 134U include an n-type work function tuning layer, which may be formed of titanium aluminum, titanium aluminum carbide, tantalum aluminum, tantalum carbide, combinations thereof, or the like. In some embodiments, the upper gate electrodes 134U include a p-type work function tuning layer, which may be formed of titanium nitride, tantalum nitride, combinations thereof, or the like. Additionally or alternatively, the upper gate electrodes 134U may include a dipole-inducing element that is suitable for the device type of the upper nanostructure-FETs. Acceptable dipole-inducing elements include lanthanum, aluminum, scandium, ruthenium, zirconium, erbium, magnesium, strontium, and combinations thereof.

The upper gate electrodes 134U may be formed by conformally depositing one or more gate electrode layer(s) in the recesses 126 and the openings 128 using any acceptable process, such as CVD, ALD, or the like. Then, a removal process is preformed to remove the excess portions of the gate electrode layer(s), which excess portions are over the top surfaces of the gate spacers 90U and the ILD 114. The gate electrode layer(s), after the removal process, have portions left in the upper portions of the recesses 126 and in the openings 128 between the upper semiconductor nanostructures 66U (thus forming the upper gate electrodes 134U). In some embodiments, a planarization process such as a chemical mechanical polish (CMP), an etch-back process, combinations thereof, or the like is utilized.

The removal process (e.g., the planarization process) may further remove excess portions of the upper gate dielectric layer 130U. As a result, the top surfaces of the gate dielectrics 130U, the gate spacers 90U, the ILD 114, and the upper gate electrodes 134U may be substantially level. The gate dielectric layer 130U, after the removal process, has portions left in the recesses 126 and in the openings 128. Each respective pair of a gate dielectric 130U and a gate electrode 134U may be collectively referred to as a “gate structure.” Each gate structure extends along three sides (e.g., a top surface, a sidewall, and a bottom surface) of a channel region of a semiconductor nanostructure 66U.

Figure 19A:
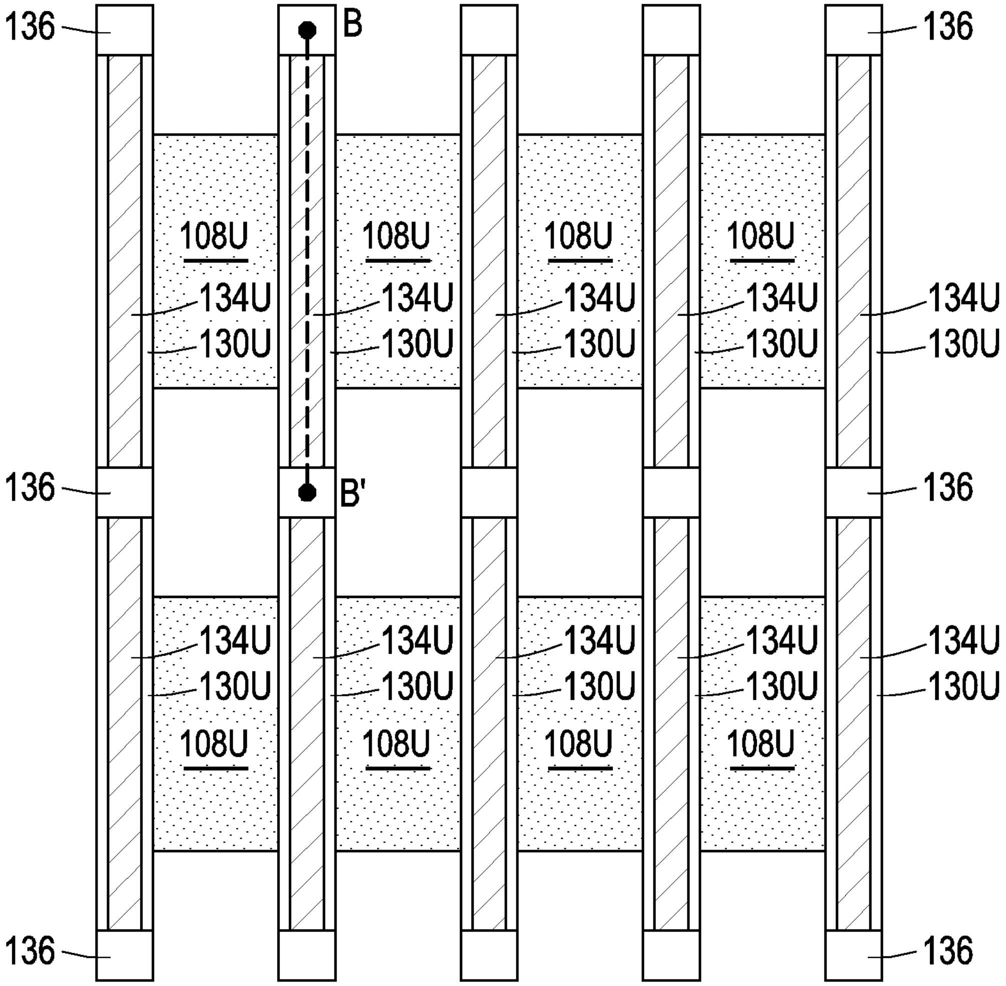
Figure 19B:
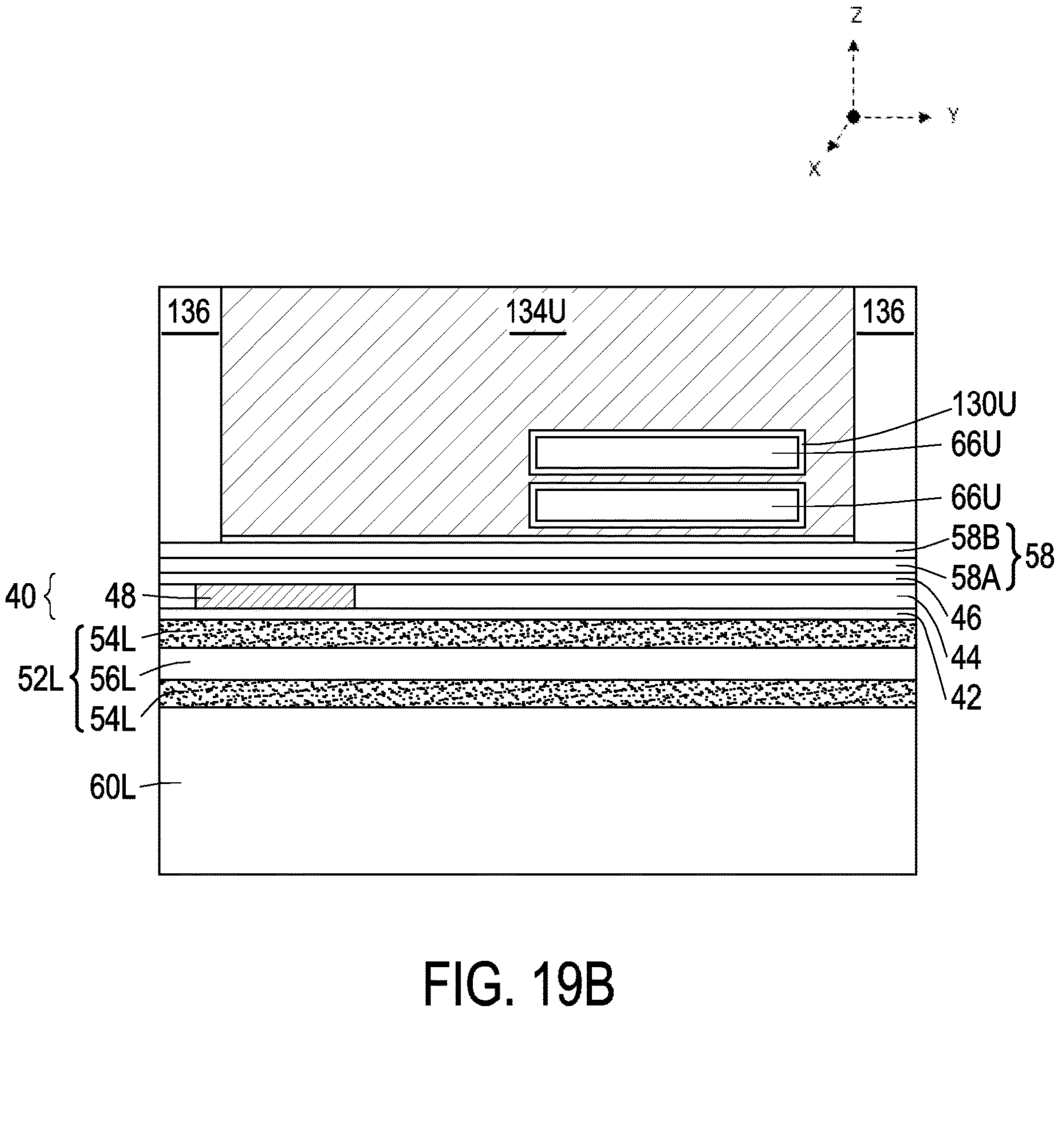

In FIGS. 19A-19B, the gate structures (including the upper gate dielectric 130U and the upper gate electrode 134U) are patterned to separate adjacent gate structures from each other based on a desired layout of the semiconductor chip. FIG. 19A illustrates a top-down view of the gate structures, and FIG. 19B illustrates a cross-sectional view along line B-B' of FIGS. 1 and 19A. Certain features may be omitted from the top-down view of FIG. 19A for clarity. The gate structures may by patterned by any suitable photolithography and etching process(es). The etching process(es) may be selective to a material of the upper gate electrode 134U and the upper gate dielectric 130U, and the etching process(es) may etch the upper gate electrode 134U and the upper gate dielectric 130U at a faster rate than the CESL 112, the ILD 114, and the gate spacers 90U (see FIGS. 18A-18C).

After the gate structures are patterned, a dielectric material 136 (also referred to as a dielectric plug or a cut metal gate (CMG)) may be deposited in the openings extending through the gate structures. The dielectric material 136 may comprise silicon oxide, silicon nitride, or the like that is deposited by any suitable process, such as, CVD, ALD, or the like. The dielectric material 136 electrically insulates adjacent gate structures from each other. Although the CMG process is described as being performed after the replacement gate process to form the gate structures 130U/134U, in other embodiments, the CMG process to form the dielectric material 136 can be performed prior to the replacement gate process. For example, the CMG process may be performed with the dummy gates 84U, and the gate structures 130U/134U can be formed around the dielectric material 136.

Figure 20:
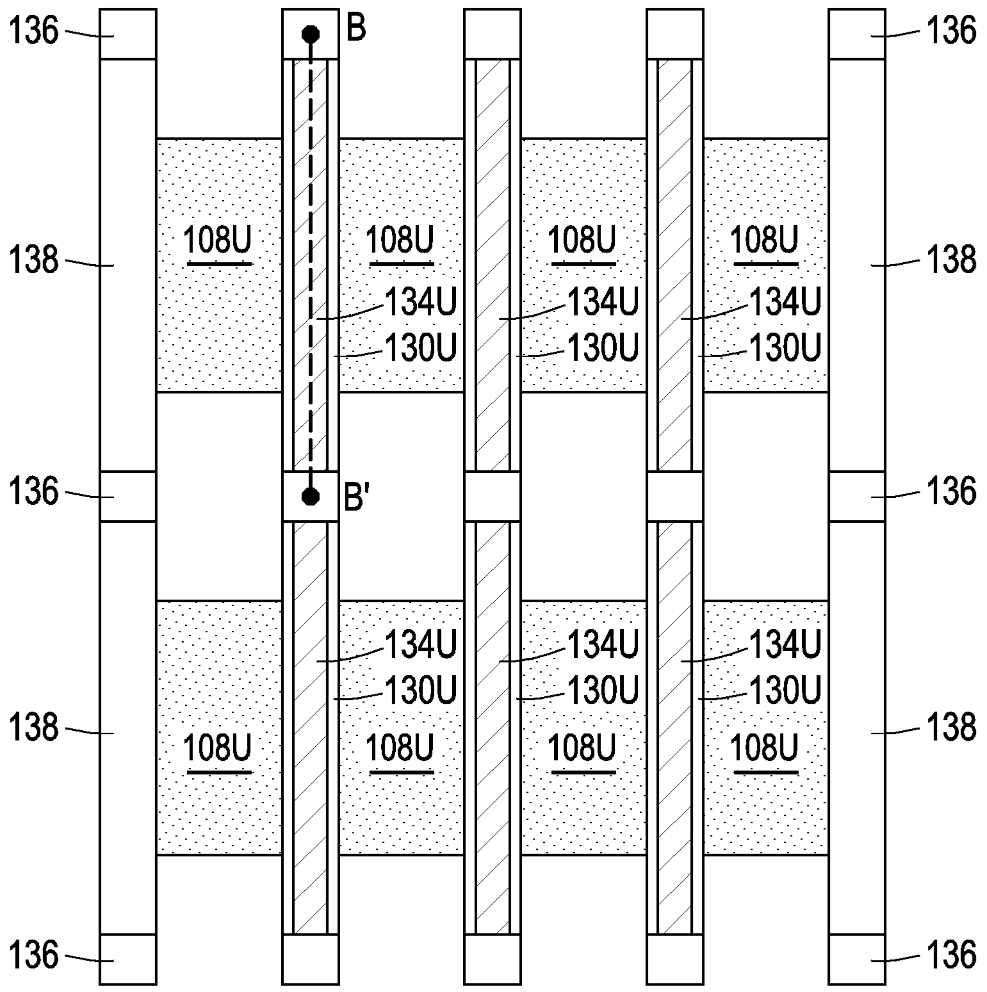

In FIG. 20, excess gate structures (including the upper gate dielectric 130U and the upper gate electrode 134U) are removed based on a desired layout of the semiconductor chip. FIG. 20 illustrates a top-down view of the gate structures. The gate structures may by removed by any suitable photolithography and etching process(es). The etching process(es) may be selective to a material of the upper gate electrode 134U and the upper gate dielectric 130U, and the etching process(es) may etch the upper gate electrode 134U and the upper gate dielectric 130U at a faster rate than the CESL 112, the ILD 114, and the gate spacers 90U (see FIGS. 18A-18C). After the excess gate structures are removed, a dielectric material 138 may be deposited in the openings extending through the ILD 114. The dielectric material 138 may comprise silicon oxide, silicon nitride, or the like that is deposited by any suitable process, such as, CVD, ALD, or the like. The dielectric material 138 may or may not have a same material composition as the dielectric material 136.

Figure 21A:
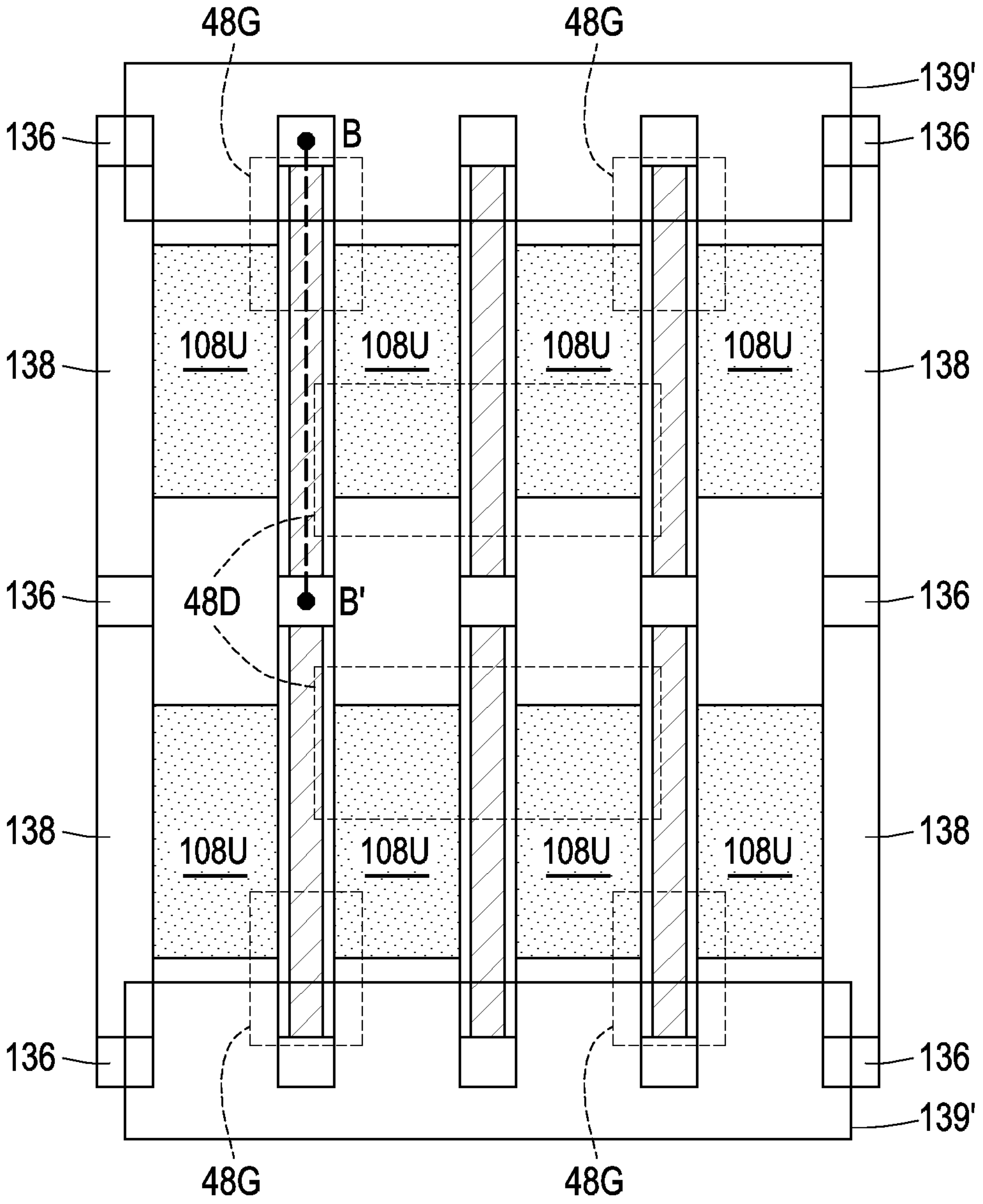
Figure 21B:
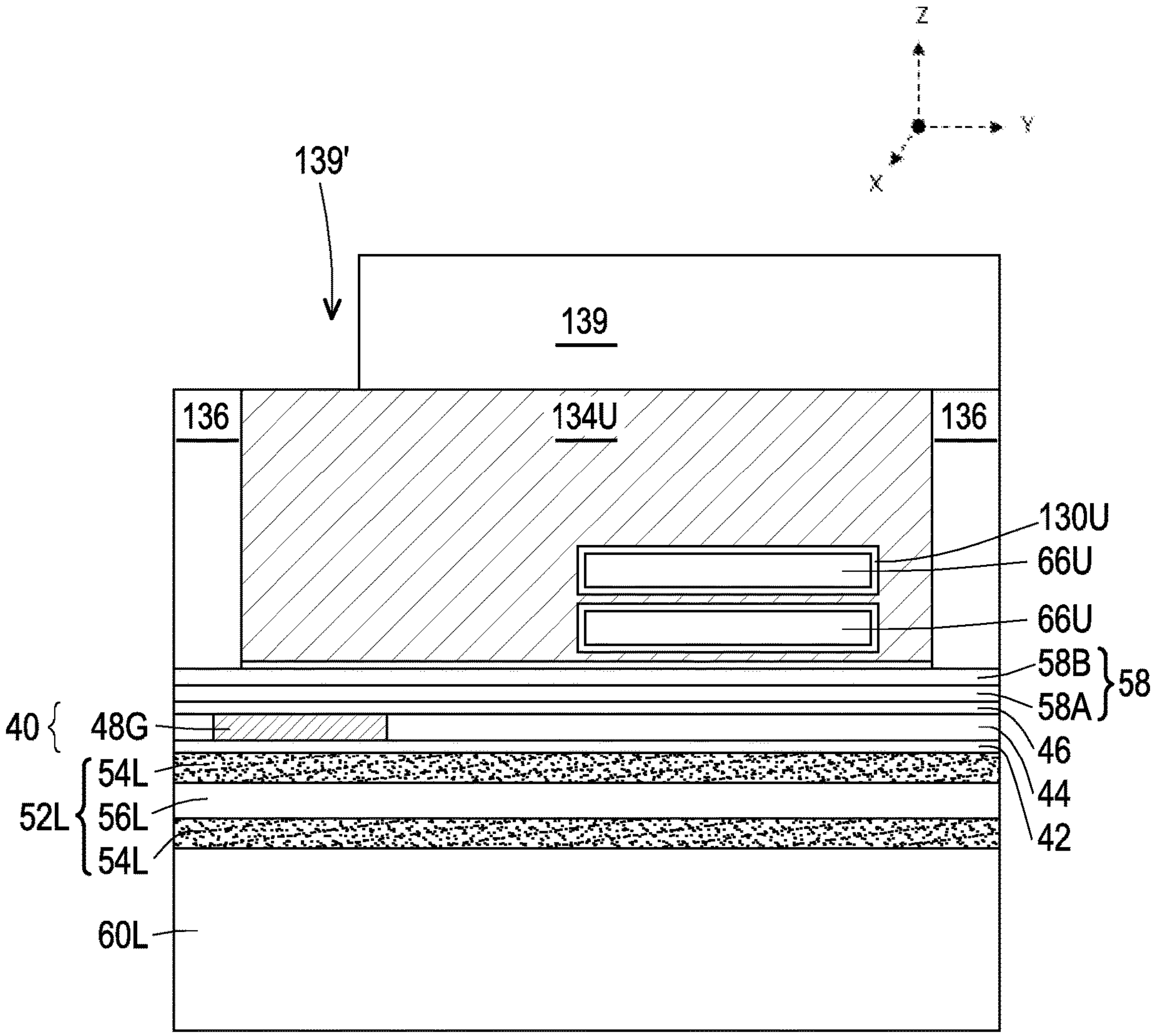

In FIGS. 21A-21B, a mask 139 is formed over the upper gate electrode 134U, the ILD 114, the CESL 112, and the upper gate spacers 90U. FIG. 21A illustrates a top-down view of the gate structures, and FIG. 21B illustrates a cross-sectional view along line B-B' of FIGS. 1 and 21A. In FIG. 21A, the position of underlying conductive lines 48 of the intermetal structure 40 is illustrated in dashed lines. The conductive lines 48 includes conductive lines 48G that interconnect gate contacts of the upper and lower transistors and conductive lines 48D that interconnect source/drain contacts of the upper and lower transistors.

The masks 139 may be deposited by PVD, CVD, sputter deposition, or other techniques for depositing the selected material. The mask 139 may include, for example, silicon nitride, silicon oxynitride, or the like. After deposition, the mask 139 may be patterned using acceptable photolithography and etching techniques to define openings 139' that expose the upper gate stacks 130U/134U. The openings 139' may further overlap with locations of the underlying conductive lines 48G In FIGS. 21A-21B, the openings 139' are slot patterns, and each of the openings 139' exposes a plurality of the upper gate stacks 130U/134U, the ILD 114, and the CESL 112. The openings 139' may further expose portions of the dielectric material 138 in some embodiments. In other embodiments, the openings 139' may not expose any of the dielectric material 138. A pattern of the openings 139' may be defined by photolithography using a 193 nm immersion lithography tool, for example. As will be explained subsequently in greater detail, the slot patterns of the openings 139' may be used in combination with a self-aligned patterning process to form gate contacts in the upper gate stacks 130U/134U.

Figure 22A:
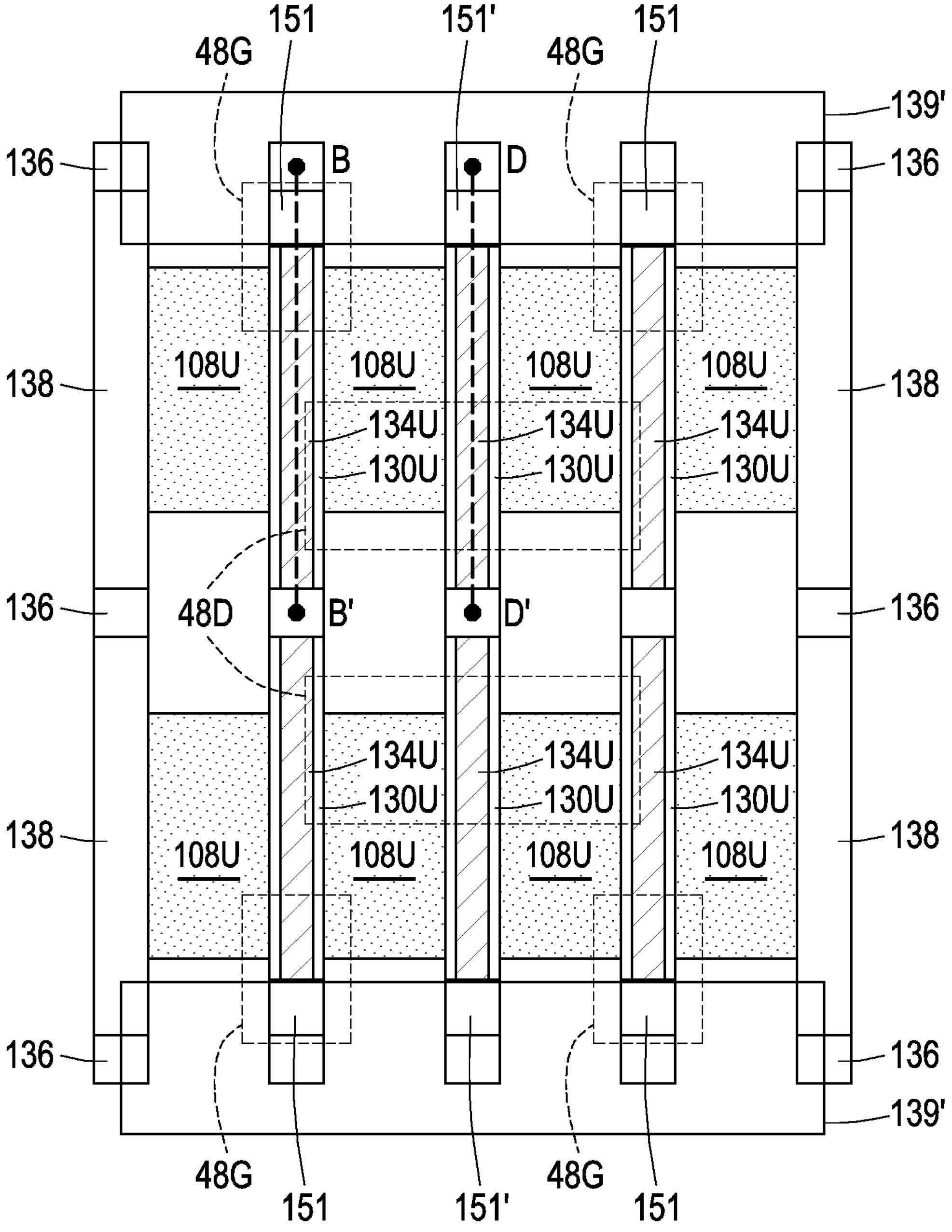
Figure 22B:
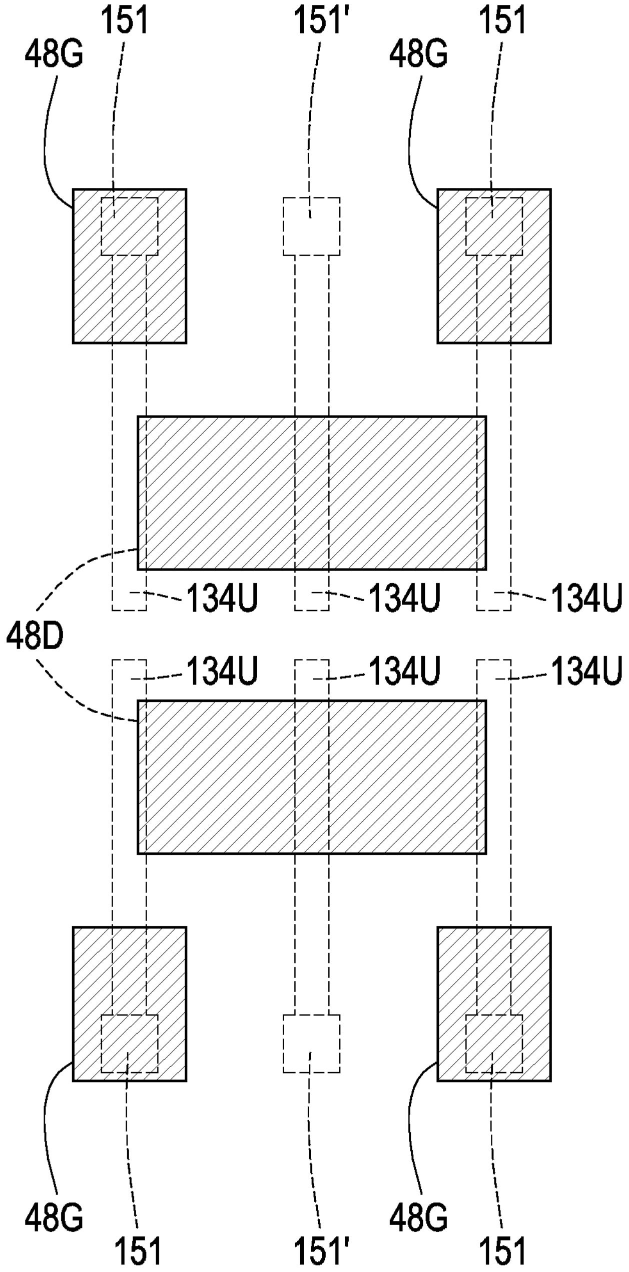
Figure 22C:
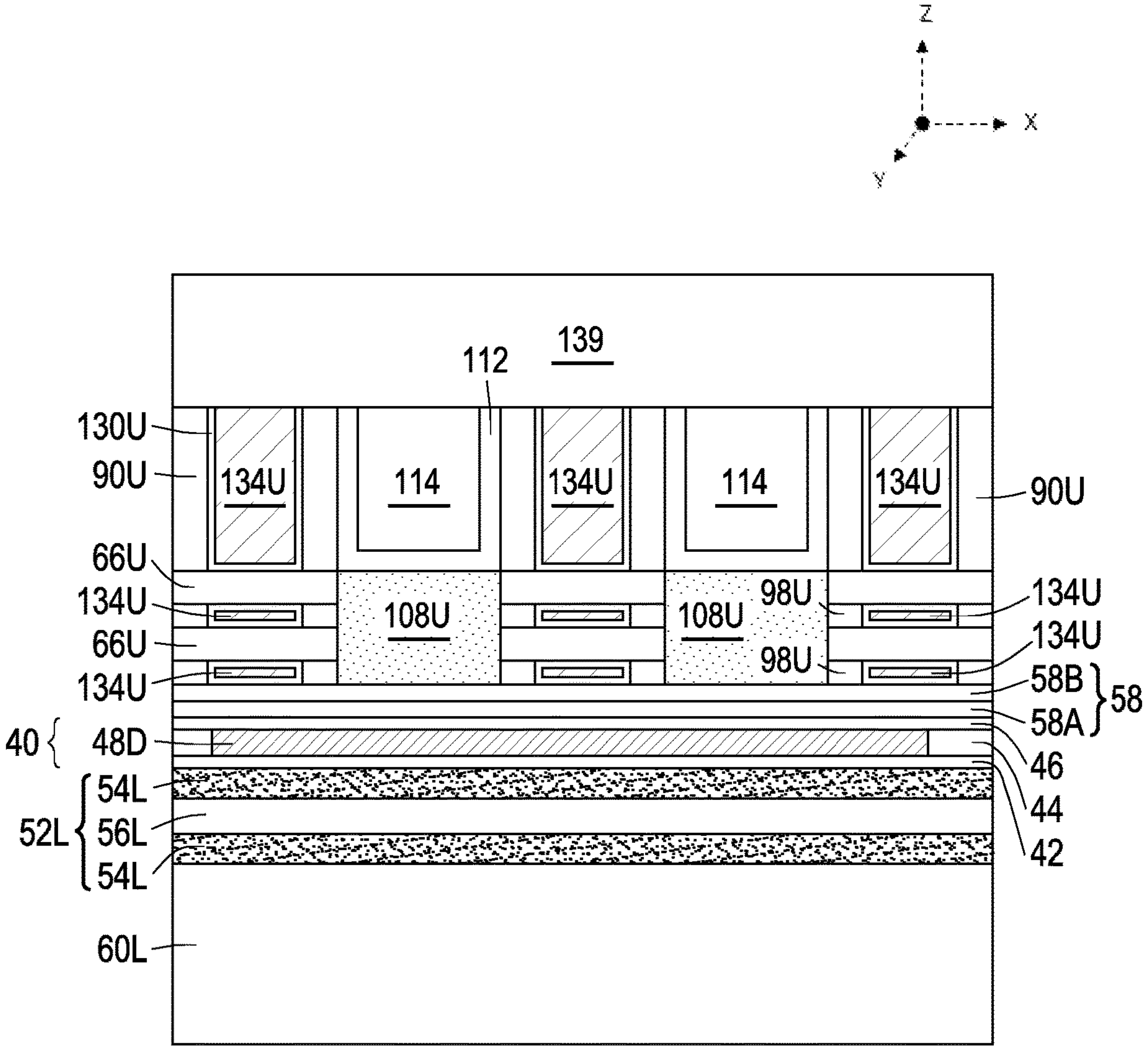
Figure 22D:
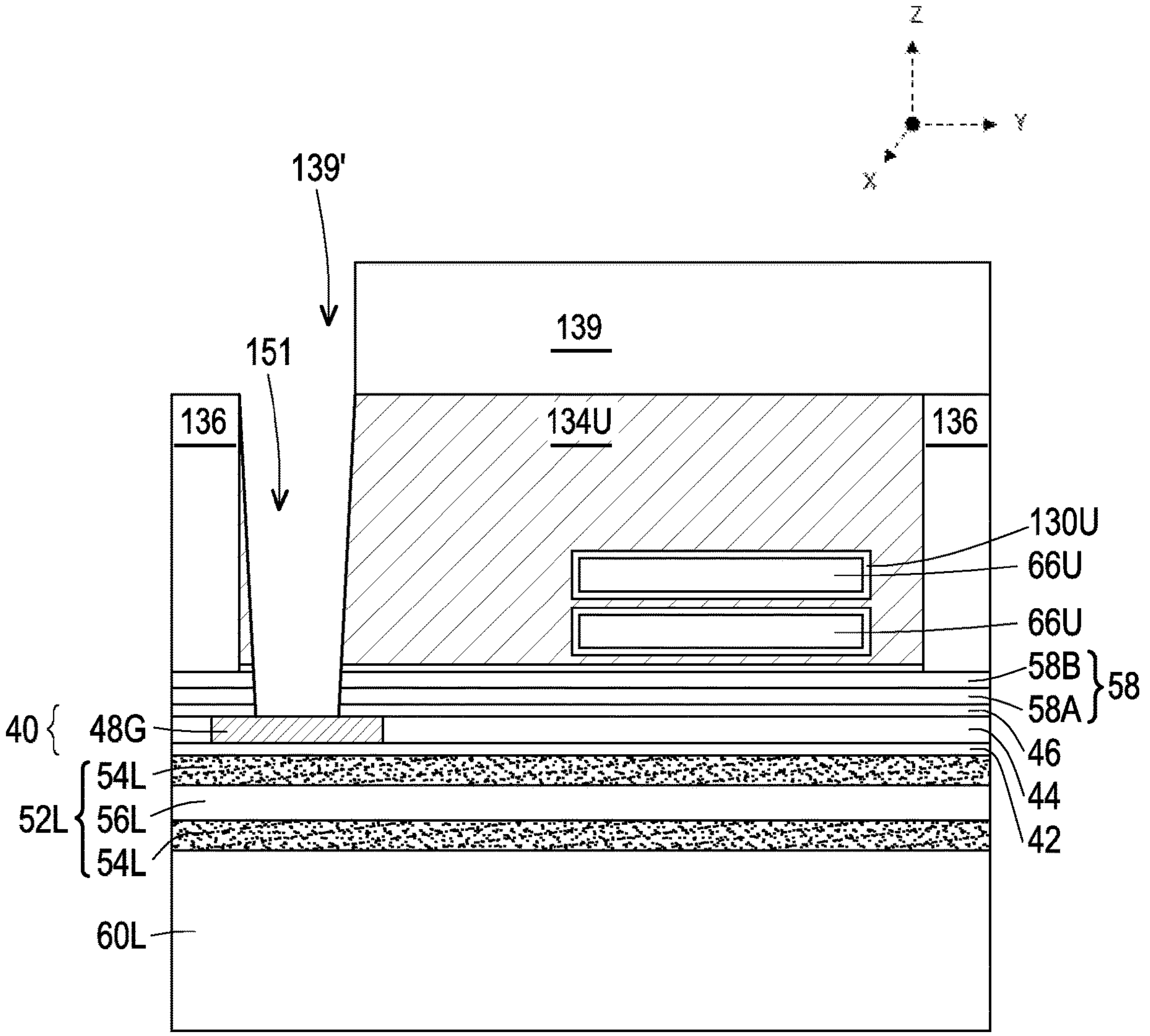
Figure 22E:
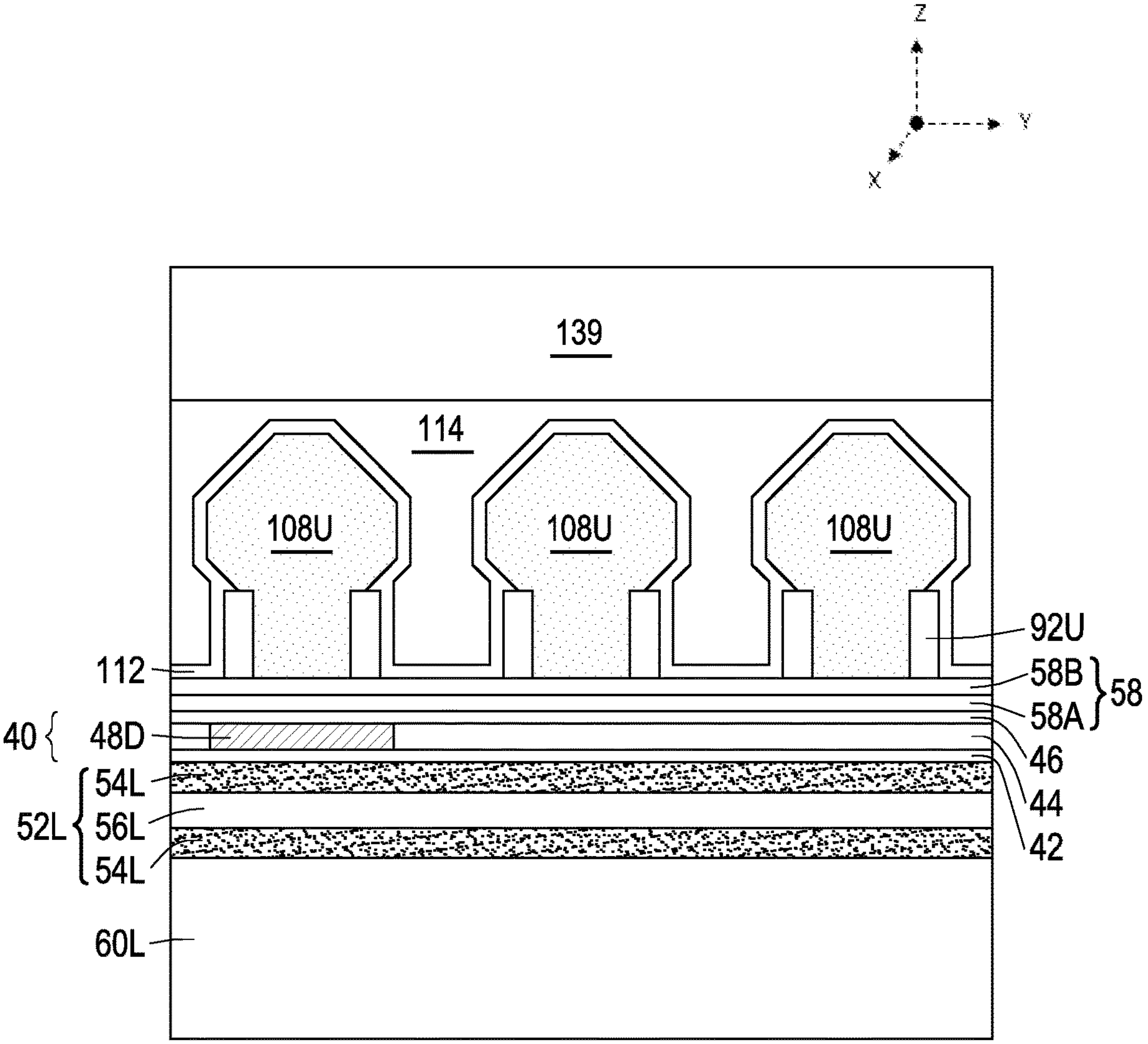
Figure 22F:
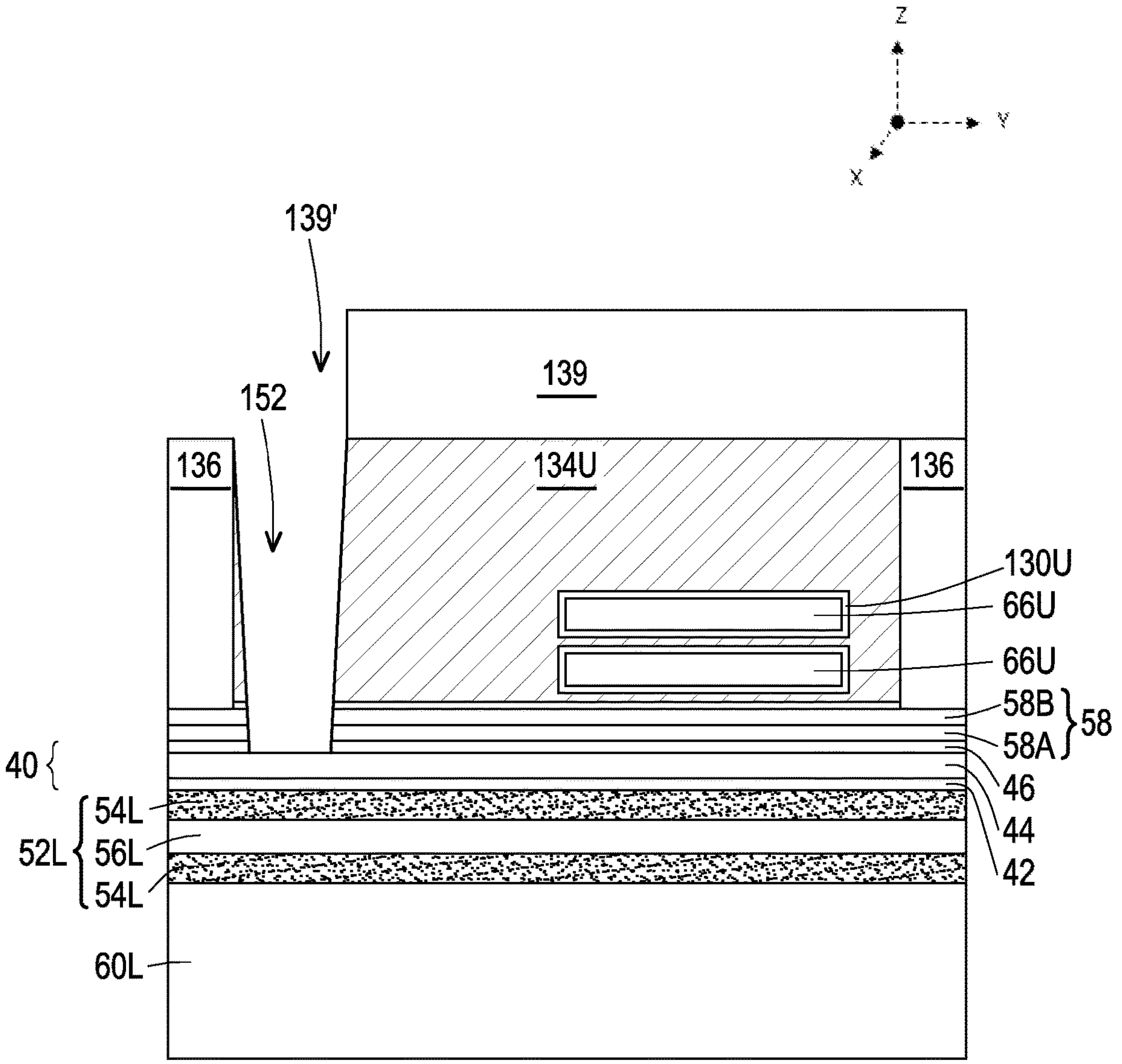

In FIGS. 22A-22F, openings 151 and 151' for upper gate contacts may be formed through the upper gate stacks 130U/134U. FIG. 22A illustrates a top-down view of the gate structures, and FIG. 22B illustrates a top-down view of the conductive lines 48 of the intermetal structure 40. Certain features are omitted from FIGS. 22A and 22B for clarity. In FIG. 22A, the position of underlying conductive lines 48 of the intermetal structure 40 is illustrated in dashed lines, and in FIG. 22B, the positions of overlying gate electrodes 134U and openings 151/151' are illustrated in dashed lines. The conductive lines 48 includes conductive lines 48G that interconnect gate contacts of the upper and lower transistors and conductive lines 48D that interconnect source/drain contacts of the upper and lower transistors. FIG. 22C illustrates a cross-sectional view along line A-A' of FIG. 1; FIG. 22D illustrates a cross-sectional view along line B-B' of FIGS. 1 and 22A; FIG. 22E illustrates a cross-sectional view along line C-C' of FIG. 1; and FIG. 22F illustrates a cross-sectional view along line D-D' of FIG. 22A.

The openings 151 and 151' may be formed using acceptable etching techniques using the mask 139 to define the patterns of the openings 151 and 151'. Specifically, the mask 139 exposes portions of the gate stacks 130U/134U, and one or more etching processes may be applied to etch through the gate stacks 130U/134U. The etching processes may be a selective process that etches the material of the gate electrodes 134U and gate dielectrics 130U at a faster rate than the CESL 112, the ILD 114, the gate spacers 90U, and the dielectric material 136. As a result, the openings 151 and 151' may be selectively formed in the gate stacks even when the openings 139' of the mask 139 also expose the CESL 112, the ILD 114, the gate spacers 90U, and the dielectric material 136.

After the gate stacks 130U/134U are patterned, the openings may be extended through the bonding layer 58 and the etch stop layer 46. The bonding layer 58 and the etch stop layer 46 may be sequentially etched with different etching process. In some embodiments, etching the etch stop layer 46 may be a selective etching process that selectively removes the etch stop layer 46 at a faster rate than the dielectric layer 44.

The openings 151 exposes the conductive lines 48G while bottom surfaces of the openings 151' are completely covered by the dielectric layer 44. FIG. 22D illustrates cross-sectional views of the openings 151, and FIG. 22F illustrates cross-sectional views of the openings 151'. The openings 151 are formed in upper gate stacks 130U/134U that will be electrically connected to a subsequently formed lower gate stacks through the conductive lines 48G (also referred to as a common gate configuration). Further, the openings 151' are formed in upper gate stacks 130U/134U that will be isolated from subsequently formed lower gate stacks (also referred to as a split gate configuration). Hence, the openings 151' do not expose any conductive lines in the intermetal structure 40. Although FIGS. 22A-22B illustrate particular locations for the openings 151 and 151', the specific location of the openings 151 and 151' may vary depending on circuit design.

Figure 23A:
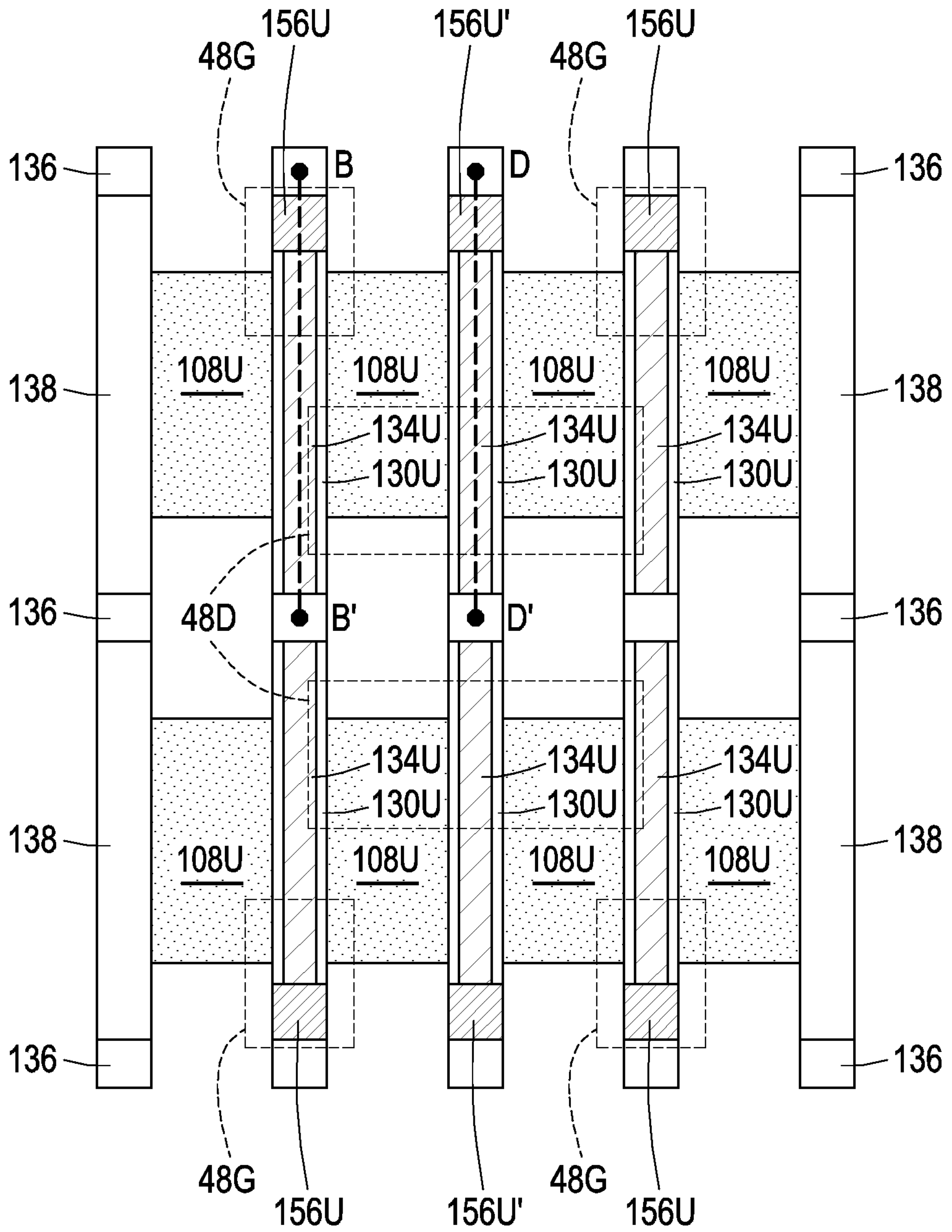
Figure 23B:
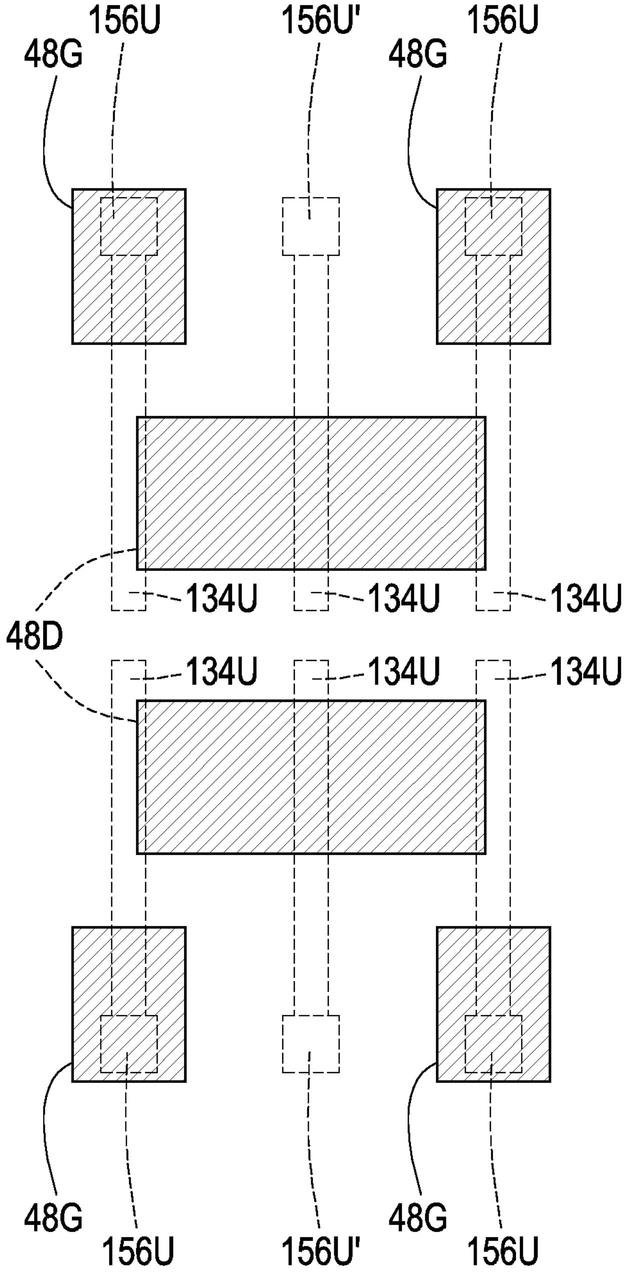
Figure 23C:
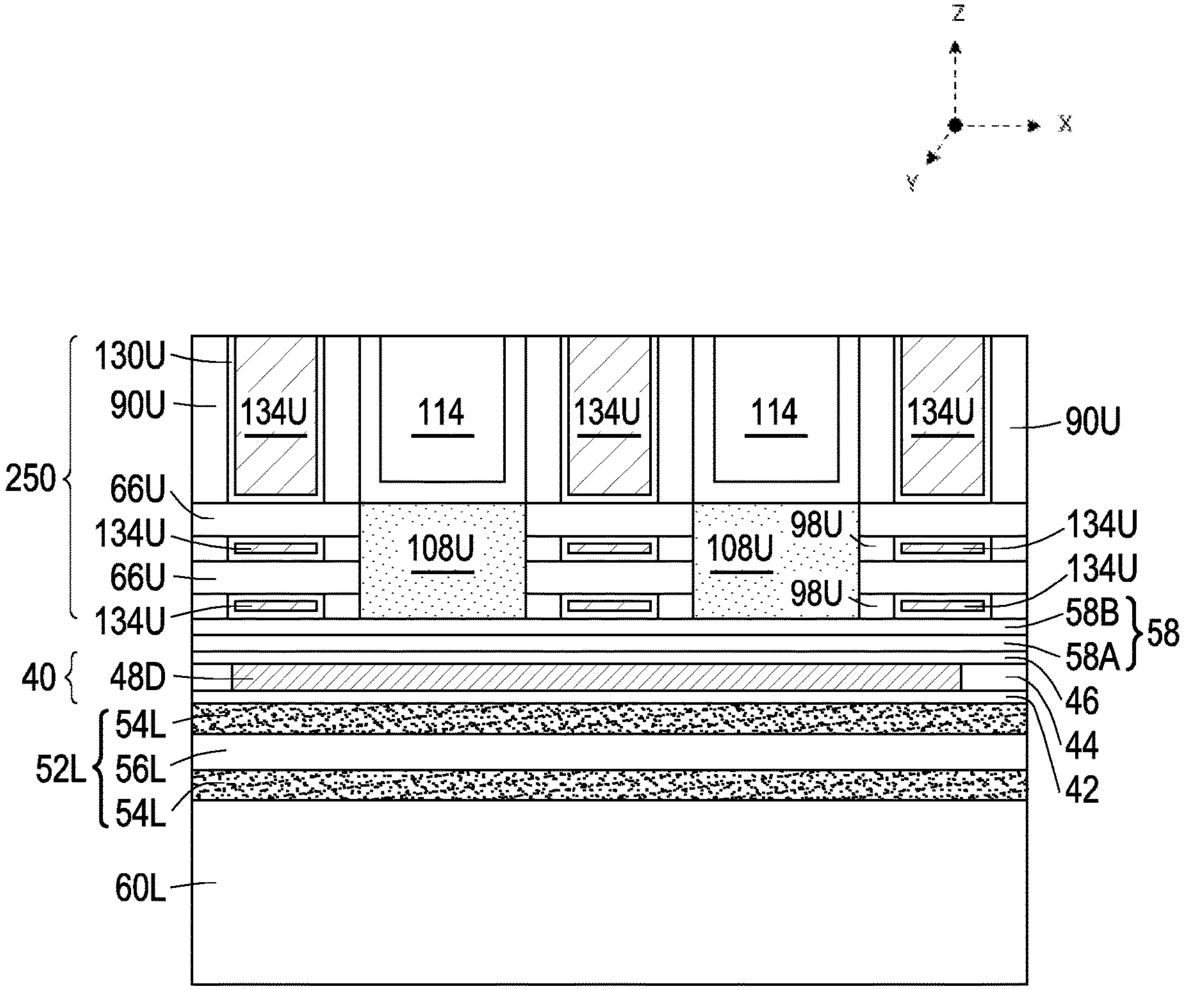
Figure 23D:
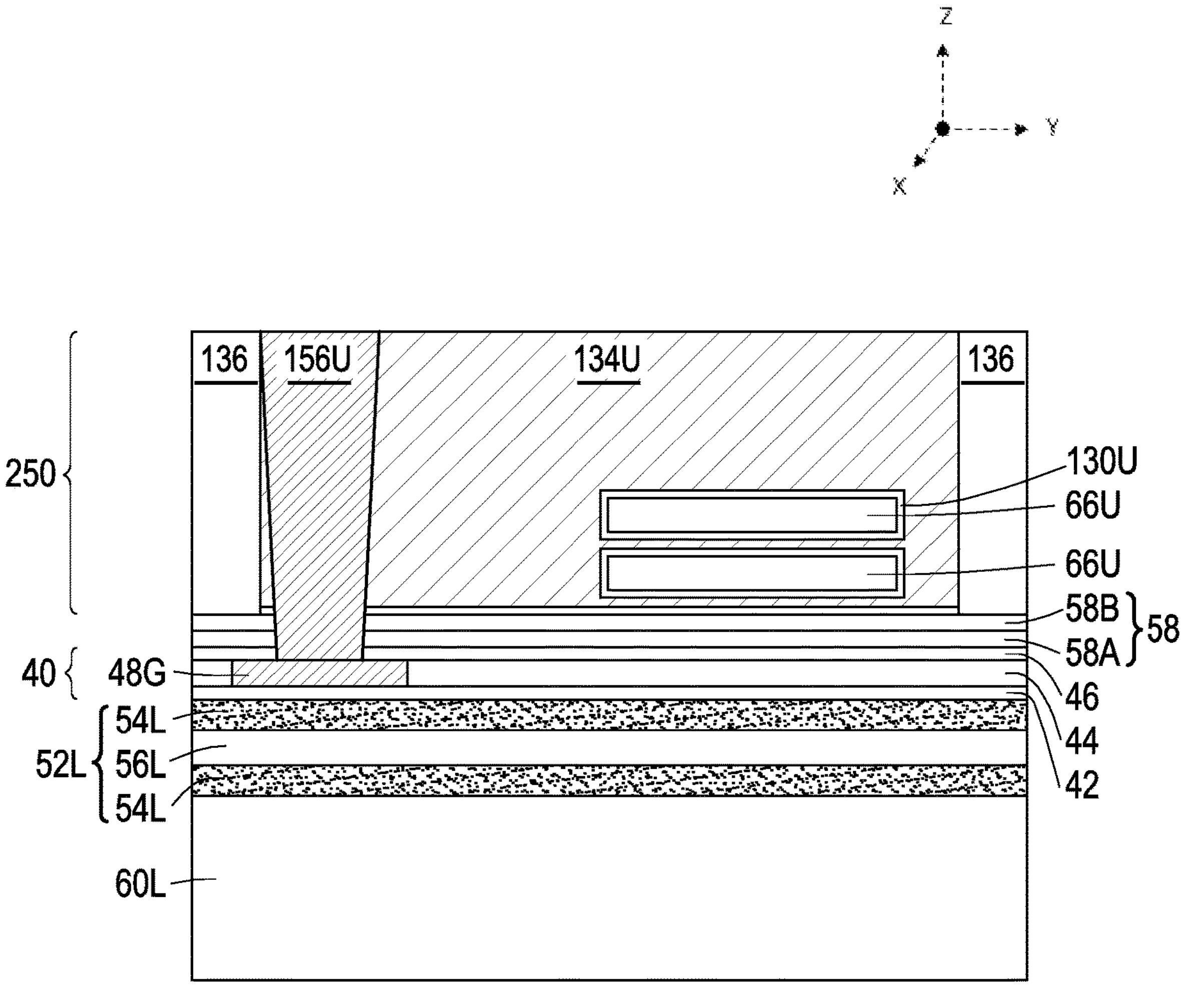
Figure 23E:
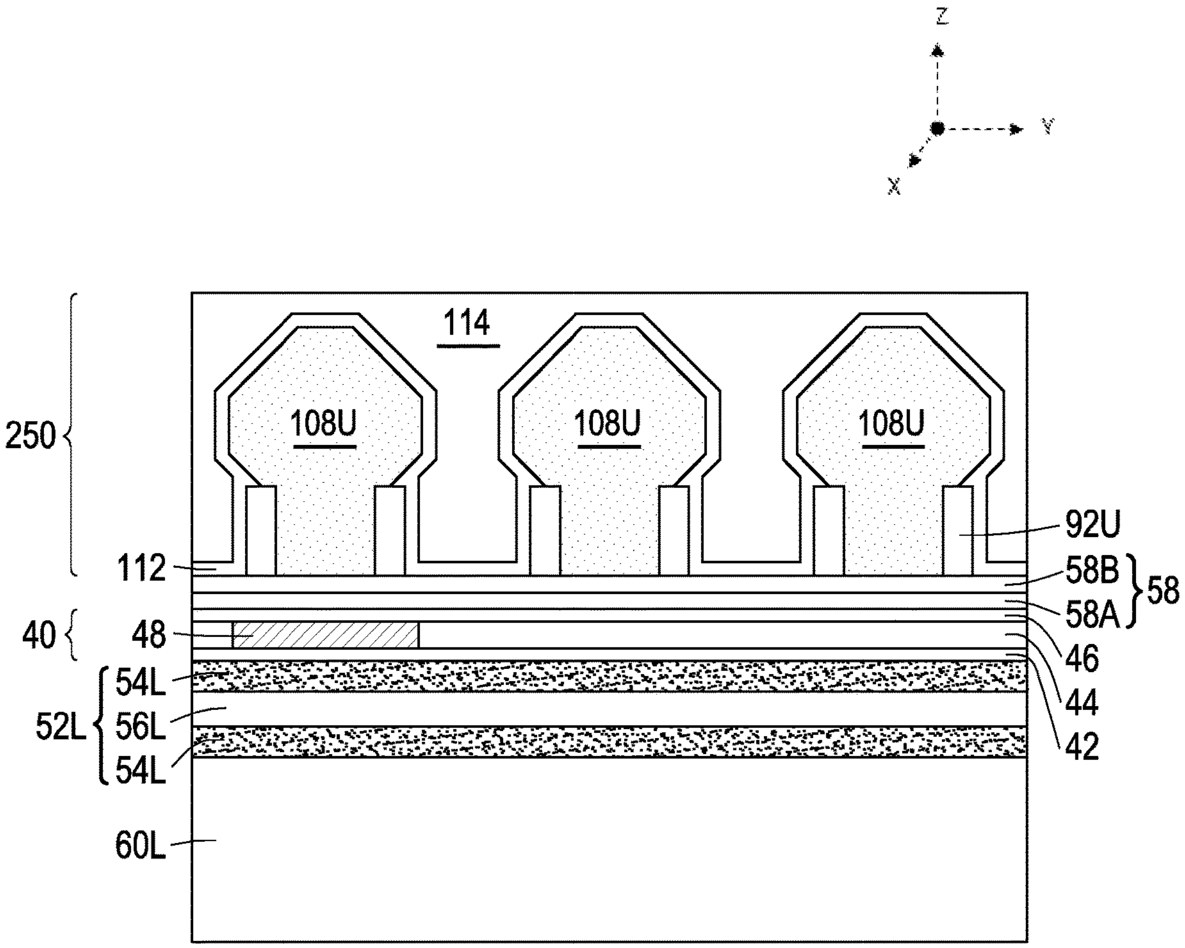
Figure 23F:
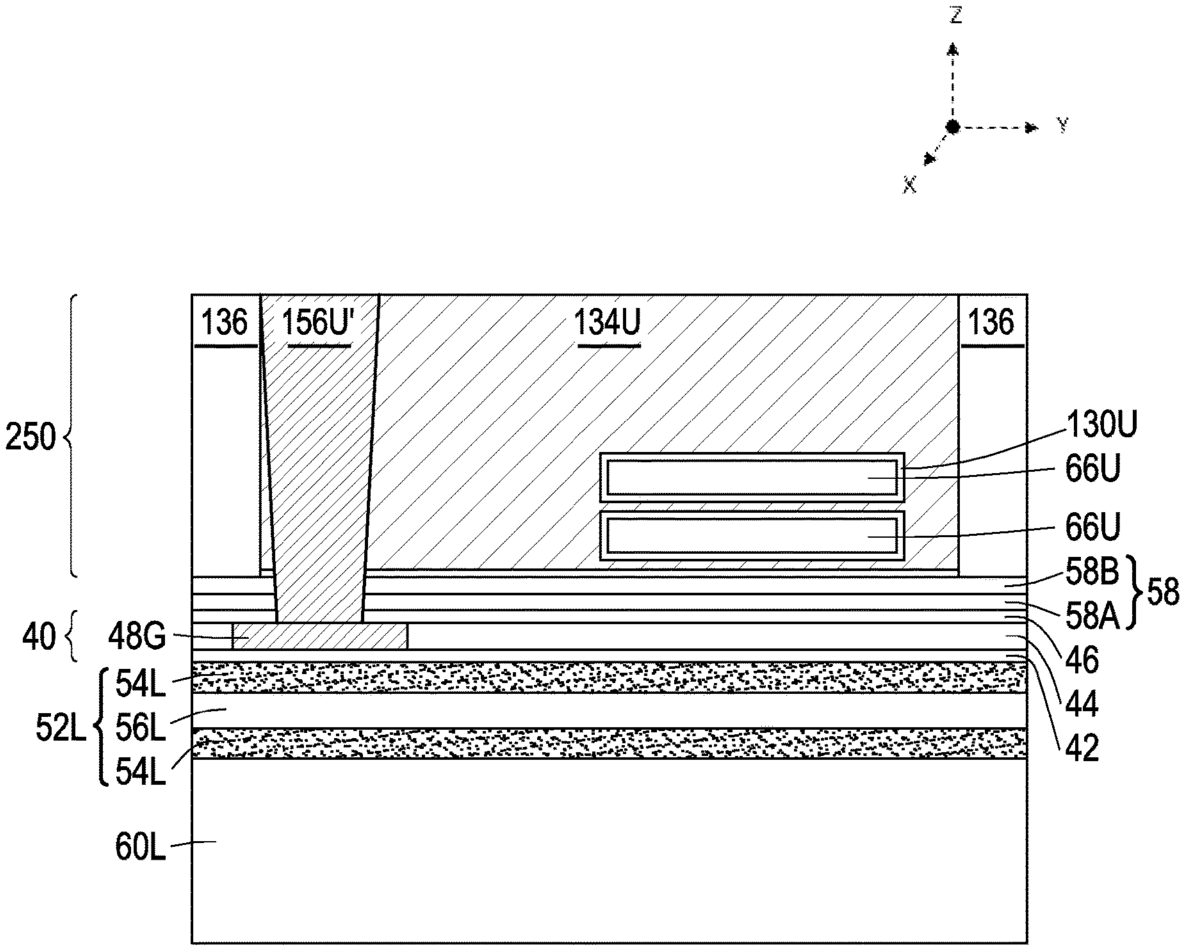

In FIGS. 23A-23F, upper gate contacts 156U and upper gate contacts 156U' are formed in the openings 151 and 151', respectively. The upper gate contacts 156U and 156U' may be formed along sidewalls of the upper gate electrodes 134U from top surfaces of the upper gate electrodes 134U to the conductive line 48G. FIG. 23A illustrates a top-down view of the gate structures, and FIG. 23B illustrates a top-down view of the conductive lines 48 of the intermetal structure 40. Certain features are omitted from FIGS. 23A and 23B for clarity. In FIG. 23A, the position of underlying conductive lines 48 of the intermetal structure 40 is illustrated in dashed lines, and in FIG. 23B, the positions of overlying gate electrodes 134U, the upper gate contacts 156U, and the upper gate contacts 156U' are illustrated in dashed lines. The conductive lines 48 includes conductive lines 48G that interconnect the upper gate contacts 156U of the upper transistors to subsequently formed gate contacts of lower transistors. FIG. 23C illustrates a cross-sectional view along line A-A' of FIG. 1; FIG. 23D illustrates a cross-sectional view along line B-B' of FIGS. 1 and 23A; FIG. 23E illustrates a cross-sectional view along line C-C' of FIG. 1; and FIG. 23F illustrates a cross-sectional view along line D-D' of FIG. 23A.

In some embodiments, a liner (not separately illustrated), such as a diffusion barrier layer, an adhesion layer, or the like, and a conductive material are formed in the openings 151 and 151'. The liner may include titanium, titanium nitride, tantalum, tantalum nitride, or the like, which may be deposited by PVD, CVD, ALD, electroplating or the like. Then, a conductive material is deposited over the liner. The conductive material may be a relatively low resistance material, such as tungsten, cobalt, ruthenium, or the like, which may be deposited by PVD, CVD, ALD, electroplating or the like. A planarization process, such as a CMP, may be performed to remove excess material from the top surfaces of the ILD 114. The planarization process may further remove the mask 139 in some embodiments. The remaining liner and conductive material form the upper gate contacts 156U and the upper gate contacts 156U'. By forming the upper gate contacts 156U of a relatively low resistance material (e.g., tungsten, cobalt, ruthenium, or the like), contact resistance of the gate connection can be advantageously reduced.

The upper gate contacts 156U are electrically connected to the conductive lines 48G. In contrast, the upper gate contacts 156U' are not electrically connected to any features in the intermetal structure 40, and bottom surfaces of the upper gate contacts 156U' are completely covered by the dielectric layer 44. FIG. 23D illustrates cross-sectional views of the upper gate contacts 156U, and FIG. 23F illustrates cross-sectional views of the upper gate contacts 156U'. The upper gate contacts 156U are formed in upper gate stacks 130U/134U that will be electrically connected to a subsequently formed lower gate stacks through the conductive lines 48G (also referred to as a common gate configuration). Further, the upper gate contacts 156U' are formed in upper gate stacks 130U/134U that will be isolated from subsequently formed lower gate stacks (also referred to as a split gate configuration). For example, upper gate contacts 156U' may not be electrically connected to any conductive lines in the intermetal structure 40. Thus, using a combination of selective etching processes and a layout of conductive lines in the intermetal structure 40, the gates of the upper and lower transistors can be electrically interconnected by gate contacts formed by a self-aligned process with slot-type masks. Although FIGS. 22A-22B illustrate particular locations for the gate contacts 156U and 156U', the specific location of the gate contacts 156U and 156U' may vary depending on circuit design.

Thus, using the method described with respect to FIGS. 7A through 24C, an upper transistor layer 250 may be formed. The transistor layer 250 includes a plurality of upper transistors (nanostructure FETs) provided by the upper nanostructures 66U, the upper gate stacks 130U/134U, and the upper source/drain regions 108U. In some embodiments, the upper transistors of the upper transistor layer 250 are n-type transistors. In some embodiments, the upper transistors of the upper transistor layer 250 are p-type transistors.

Figure 24A:
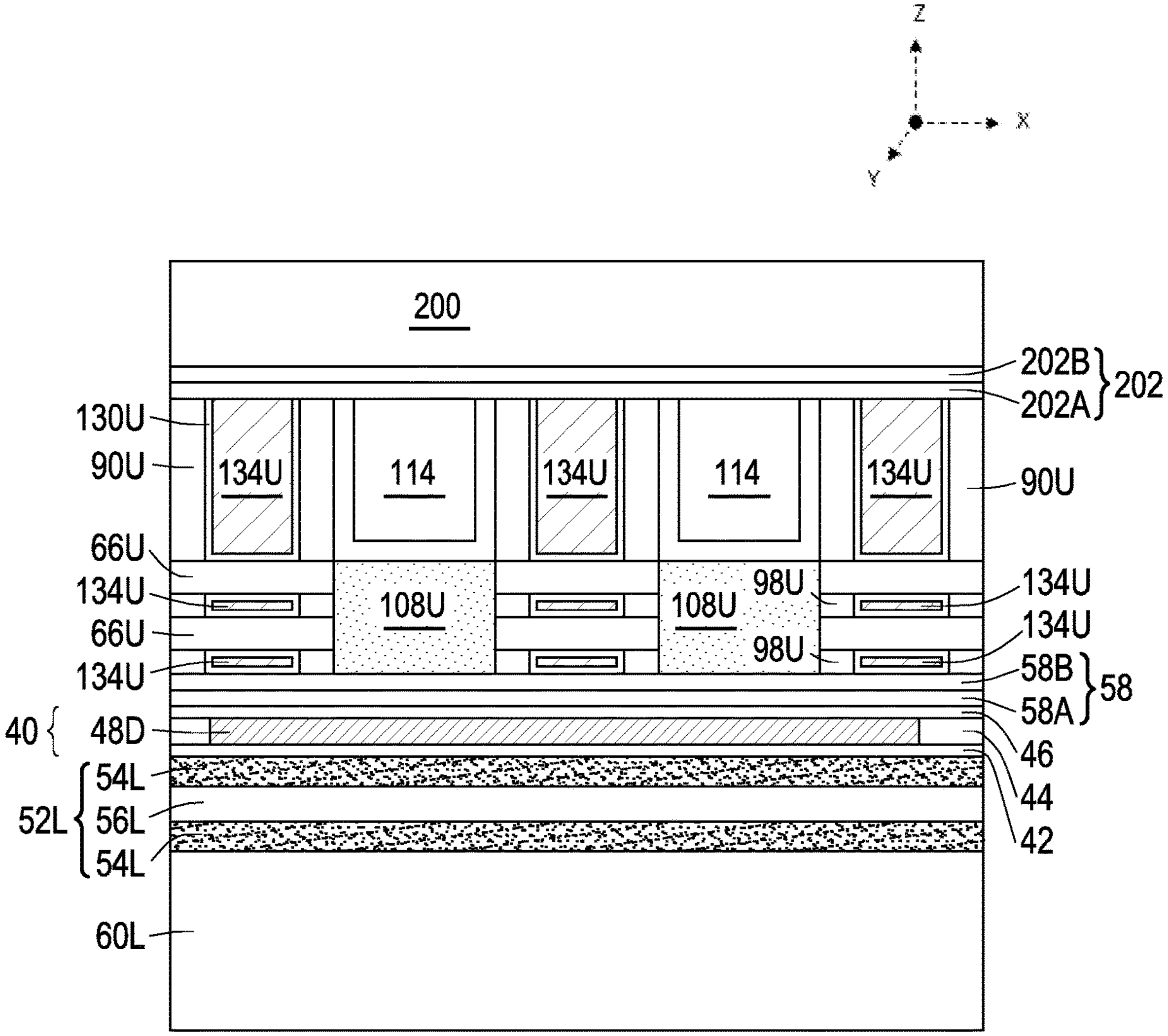
Figure 24B:
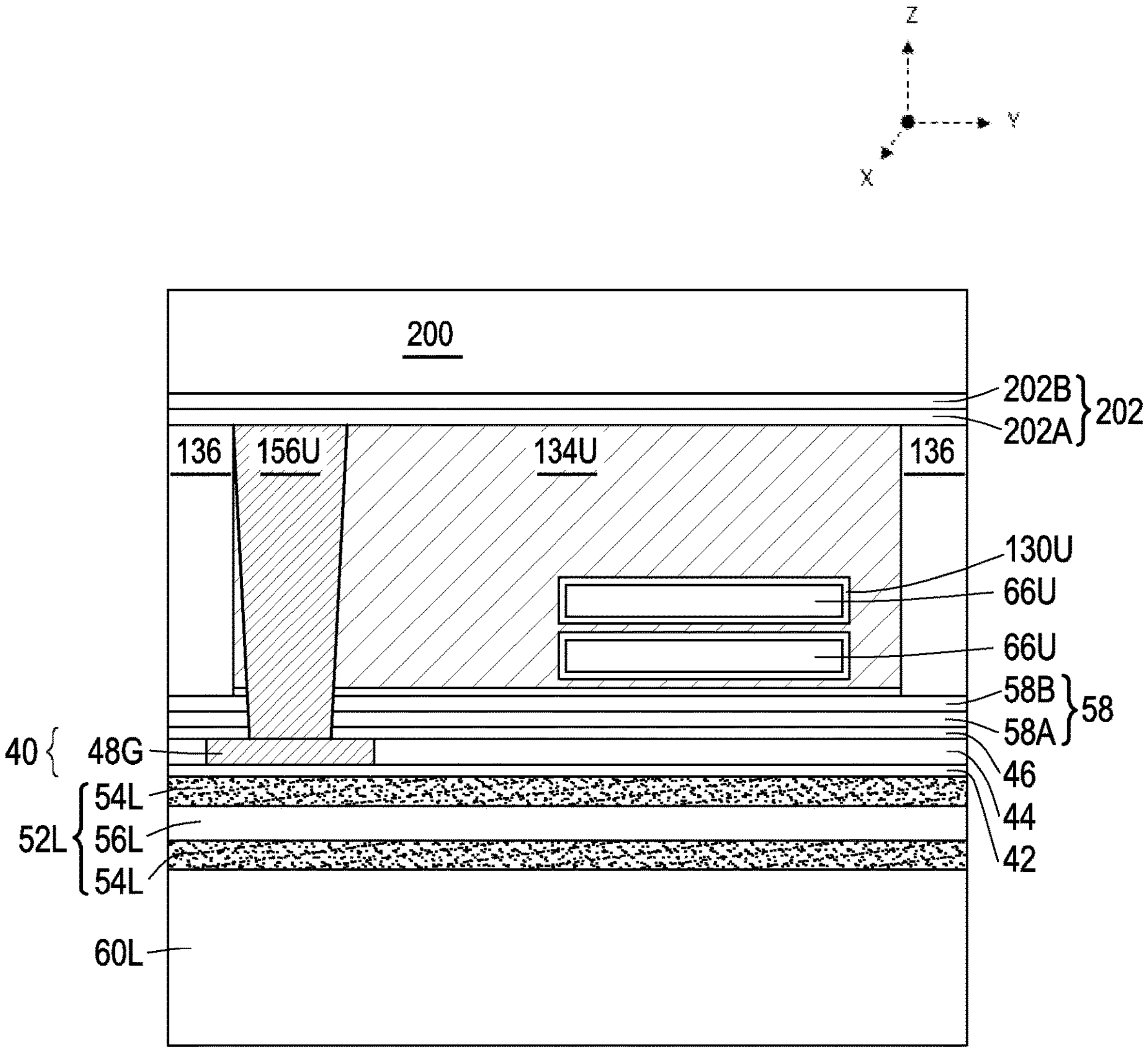
Figure 24C:
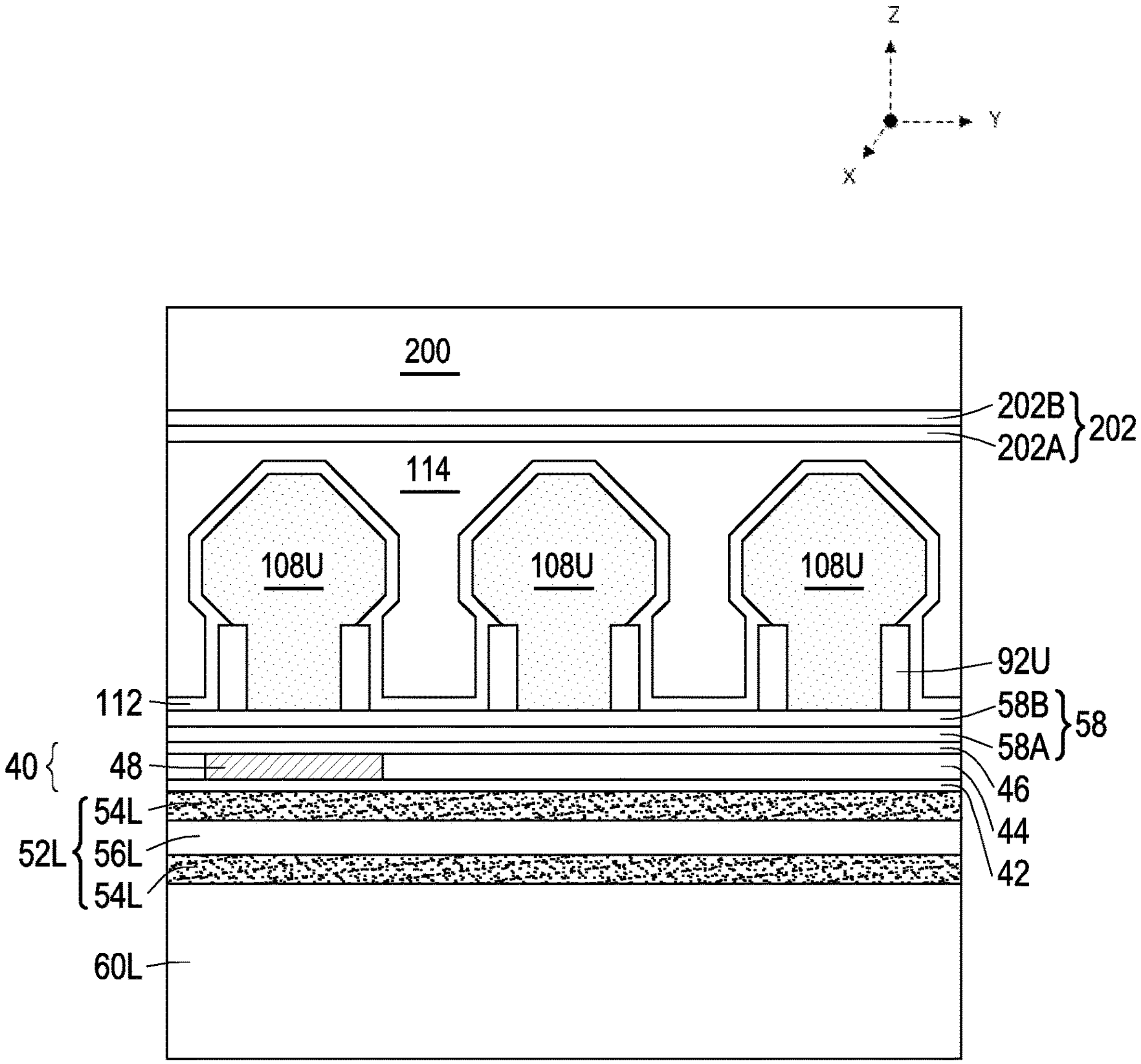

In FIGS. 24A-24C, a carrier substrate 200 is bonded to a top surface of the upper transistor layer 250 by a first bonding layer 202A and a second bonding layer 202B. After bonding, the first bonding layer 202A and the second bonding layer 202B may be collectively referred to as a bonding layer 202. It should be appreciated that the bonding layer 202 may include an internal interface where the first bonding layer 202A and the second bonding layer 202B meet.

The carrier substrate 200 may be a glass carrier substrate, a ceramic carrier substrate, a wafer (e.g., a silicon wafer), or the like. The carrier substrate 200 may provide structural support during subsequent processing steps and in the completed device. The first bonding layer 202A and the second bonding layer 202B may be formed of a similar material using similar processes as those discussed above with respect to the bonding layers 58A and 58B. The first bonding layer 202A and the second bonding layer 202B may be deposited on the upper transistor layer 250 and the carrier substrate 200, respectively. The second bonding layer 202B may have a same or different thickness than the first bonding layer 202A.

After the second bonding layer 202B is deposited on the carrier substrate 200, the carrier substrate 200 may be bonded to the upper transistor layer 250 using a suitable technique, such as dielectric-to-dielectric bonding, or the like. The dielectric-to-dielectric bonding process may be substantially similar to that described above with respect to FIG. 5.

Figure 25A:
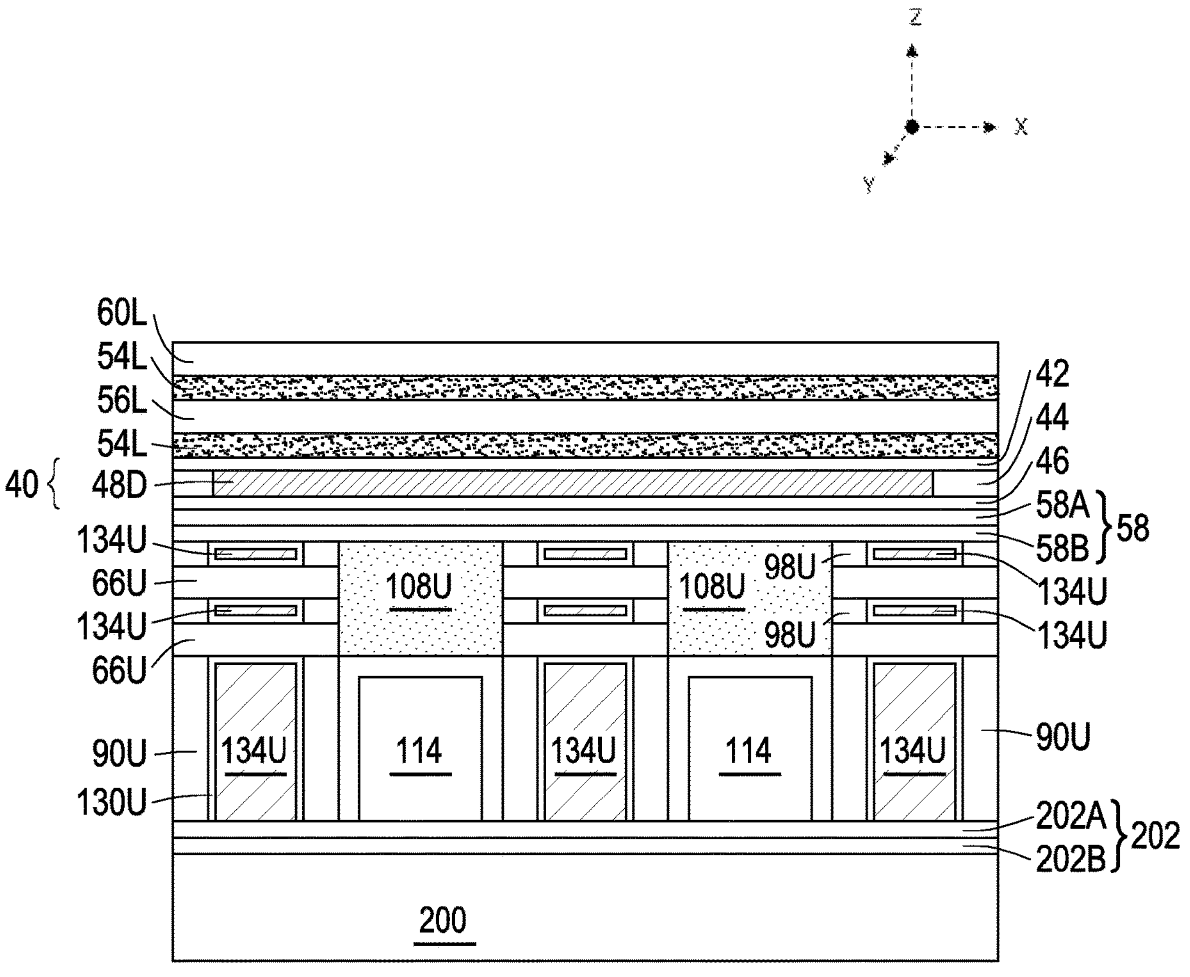
Figure 25B:
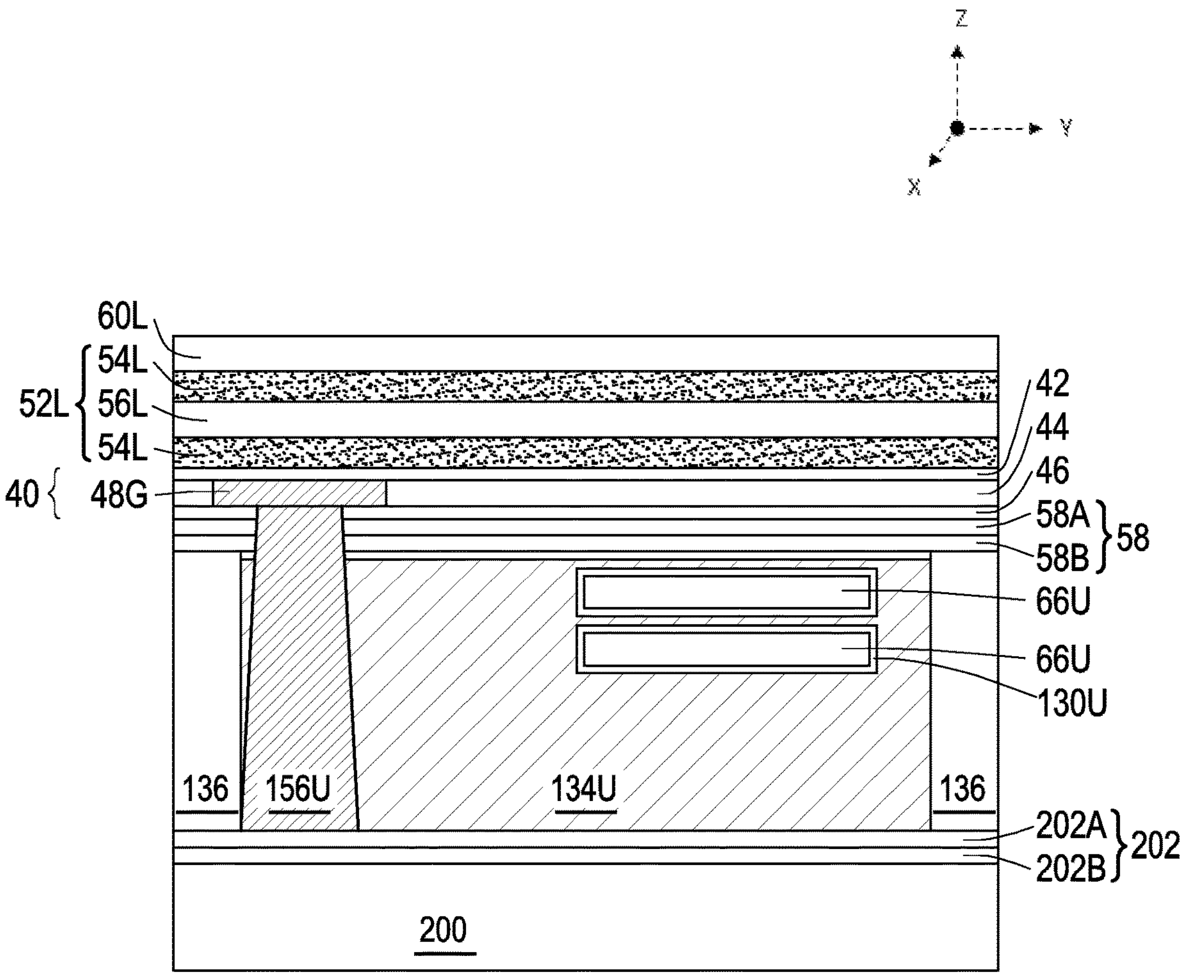
Figure 25C:
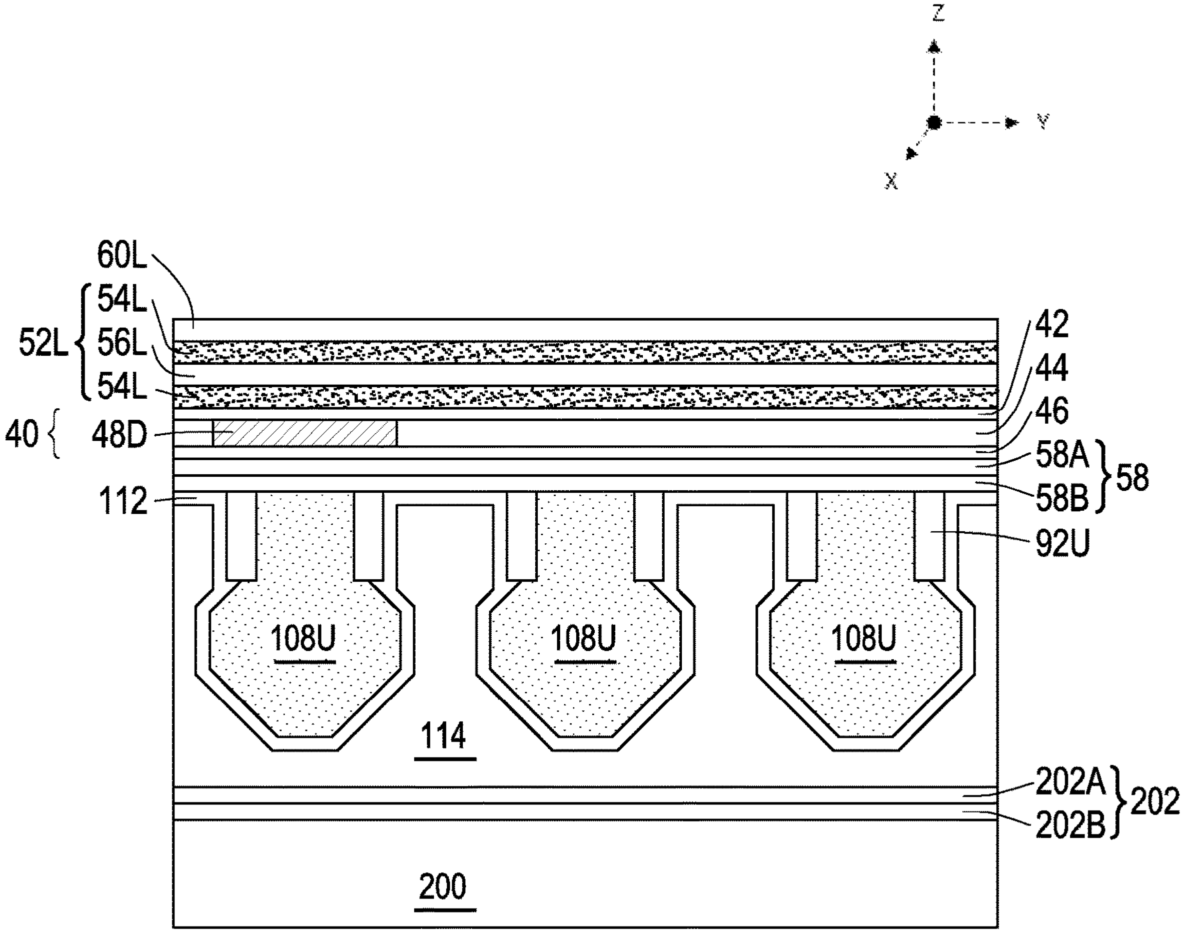
Figure 26A:
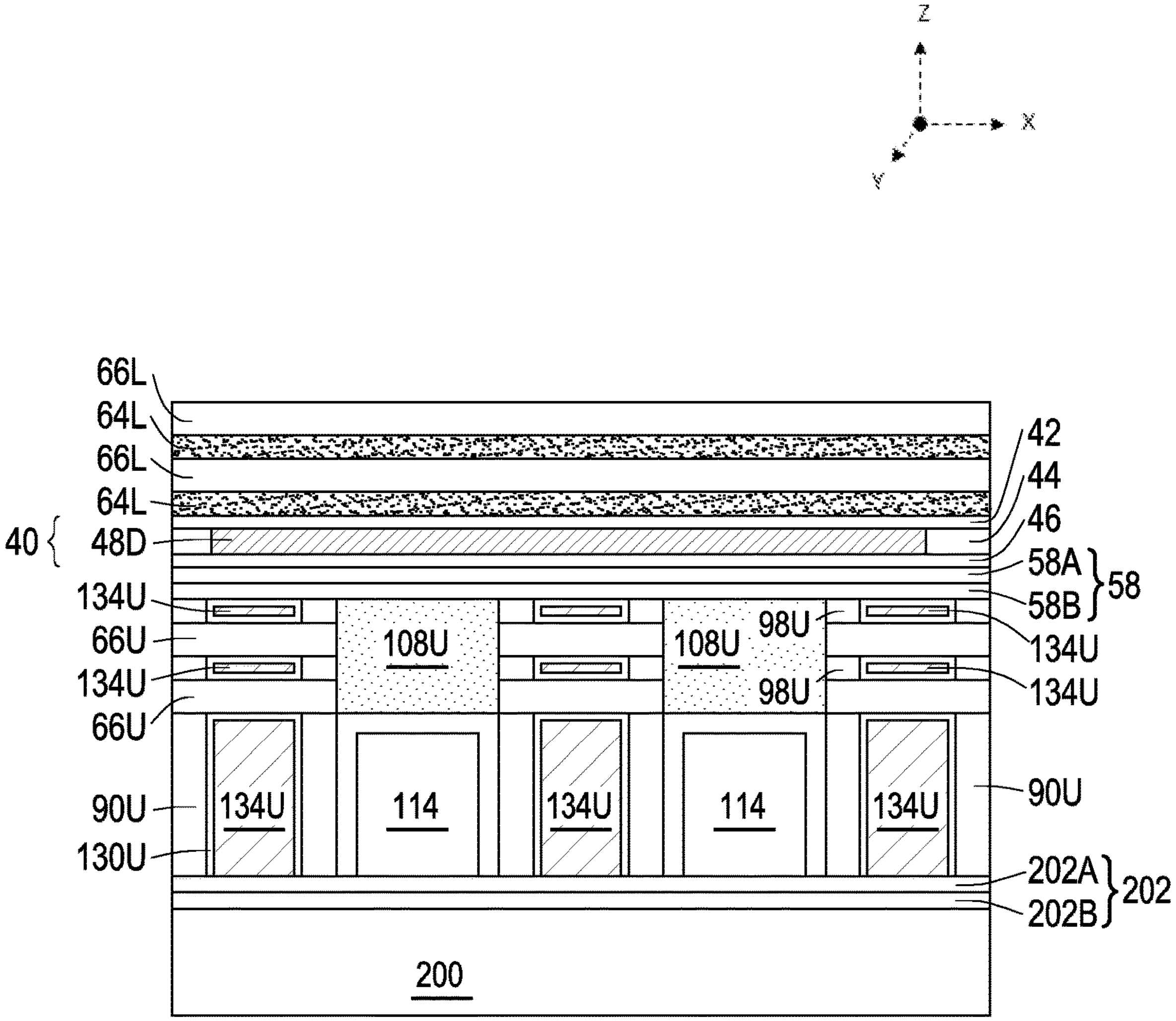
Figure 26B:
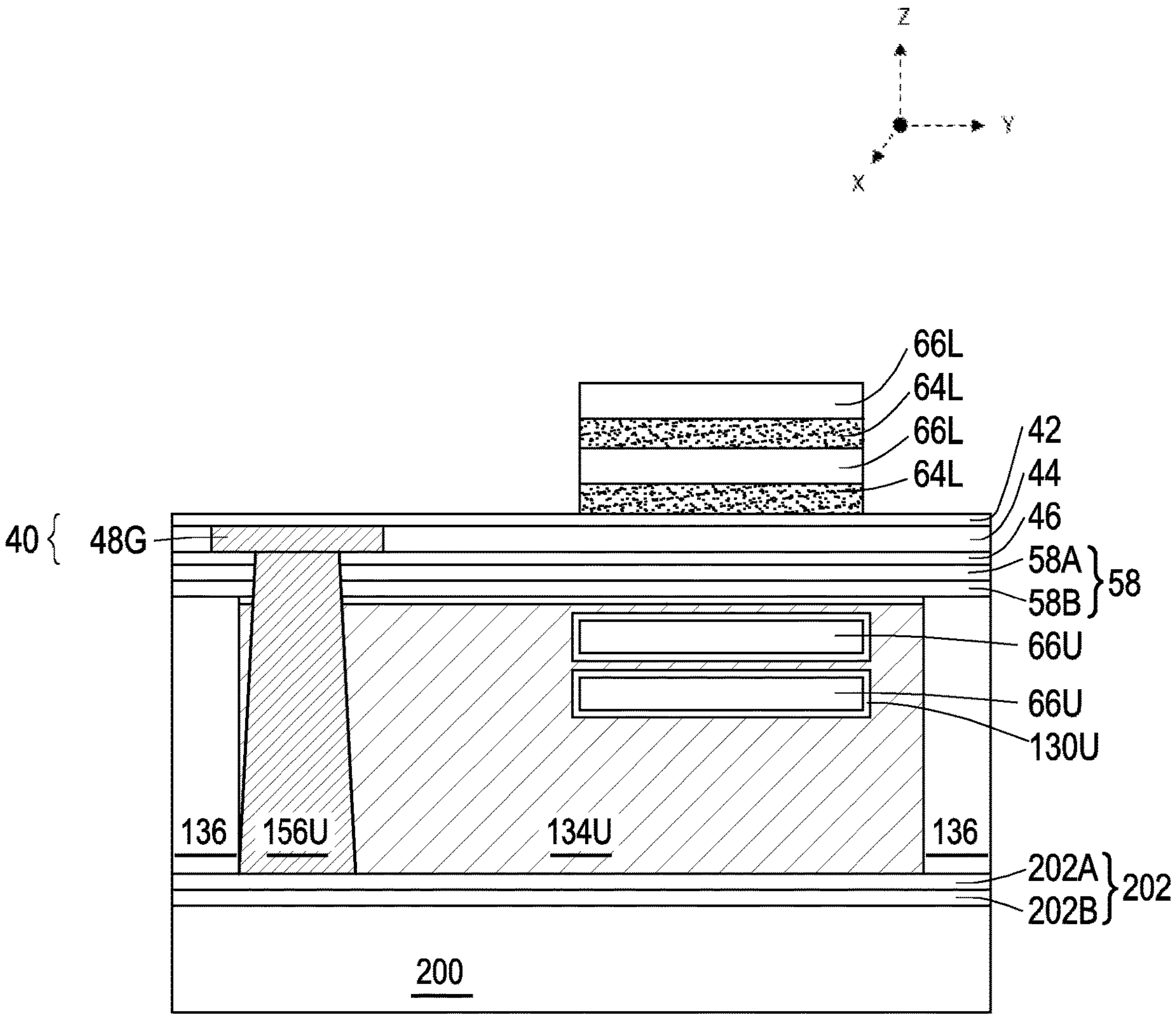
Figure 26C:
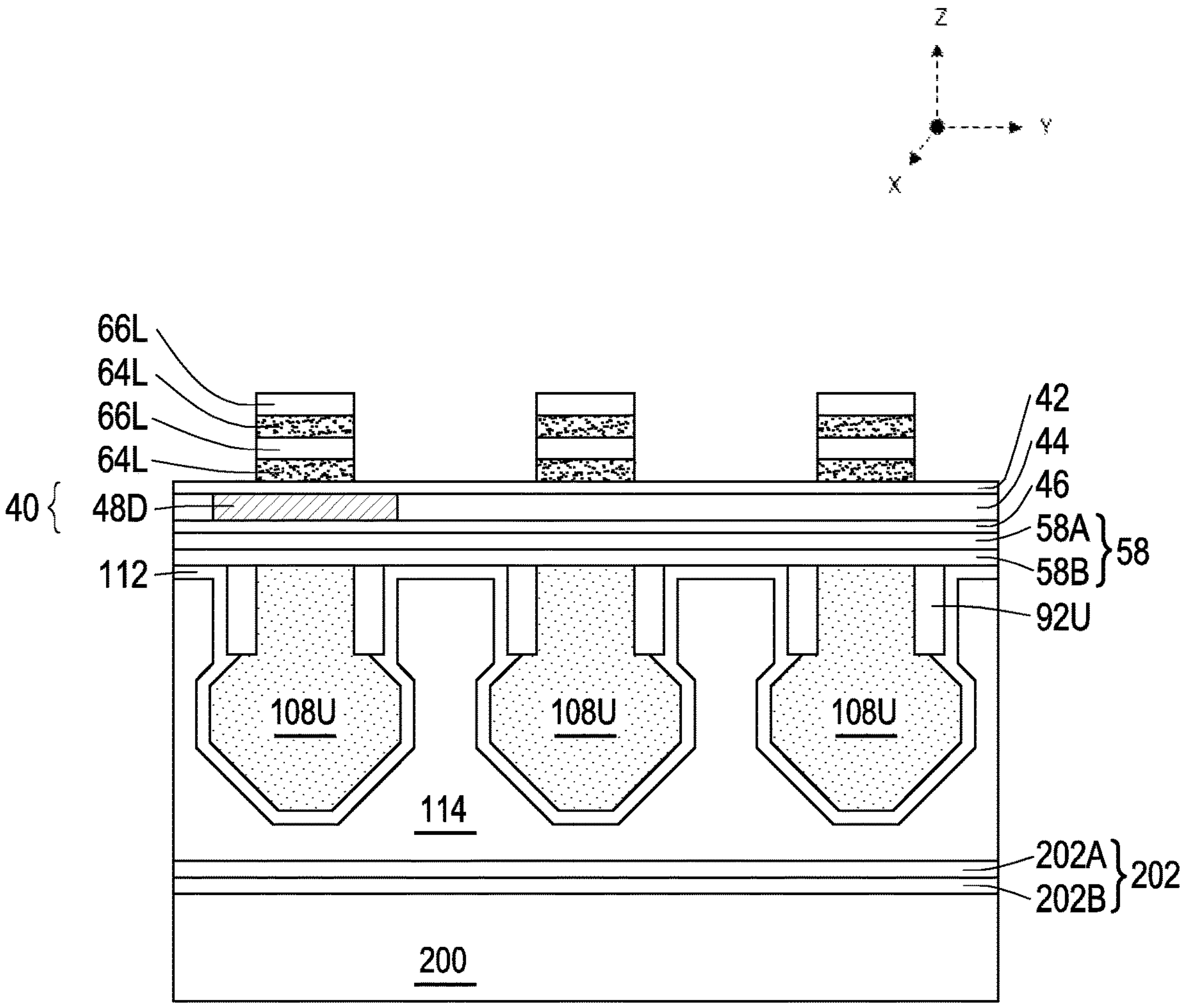

In FIGS. 25A-25C, after the carrier substrate 200 is bonded to the upper transistor layer 250, the device may be flipped such that the lower multi-layer stack 52L and the lower substrate 60L faces upwards. As also illustrated by FIGS. 25A-25C, a thinning process is applied to reduce a thickness of the lower substrate 60L to a desired thickness. The thinning process may include a grinding process, a CMP, an etch back process, combination thereof, or the like. The thinning process may reduce a thickness of the lower substrate 60L to match a thickness of each of the lower semiconductor layers 56L. In subsequent process steps, the lower substrate 60L may be patterned to provide a nanostructure (e.g., channel region) for an lower nanostructure-FETs of the CFETs In FIGS. 26A-26C, lower nanostructures 64L, 66L (including lower dummy nanostructures 64L and lower semiconductor nanostructures 66L) are formed in the lower substrate 60L and the lower multi-layer stack 52L. The lower nanostructures 64L, 66L may be performed using a similar process as discussed above with respect to the upper nanostructures 64U, 66U. Forming the lower nanostructures 64L, 66L may define the lower dummy nanostructure 64L from the lower dummy semiconductor layers 54L and the lower semiconductor nanostructures 66L from the lower substrate 60L and the lower semiconductor layers 56L. The lower semiconductor nanostructures 66L will act as channel regions for lower nanostructure-FETs of the CFETs.

The lower substrate 60L and the lower multi-layer stack 52L may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the lower nanostructures 64L, 66L.

Although each of the lower nanostructures 64L, 66L are illustrated as having a constant width throughout, in other embodiments, the lower nanostructures 64L, 66L may have tapered sidewalls such that a width of each of the lower nanostructures 64L, 66L continuously increases in a direction towards the underlying transistor layer 250. In such embodiments, each of the lower nanostructures 64L, 66L may have a different width and be trapezoidal in shape.

Further, appropriate wells (not separately illustrated) may be formed in the lower semiconductor nanostructures 66L. For example, an n-type impurity implant and/or a p-type impurity implant may be performed, or the semiconductor materials may be in situ doped during growth. The n-type impurities may be phosphorus, arsenic, antimony, or the like at a concentration in a range from $10^{17}$ atoms/$cm^3$ to $10^{19}$ atoms/$cm^3$. The p-type impurities may be boron, boron fluoride, indium, or the like at a concentration in a range from $10^{17}$ atoms/$cm^3$ to $10^{19}$ atoms/$cm^3$. The wells in the lower semiconductor nanostructures 66L have a conductivity type opposite from a conductivity type of lower source/drain regions that will be subsequently formed adjacent the lower semiconductor nanostructures 66L. The wells in the lower semiconductor nanostructures 66L may further have a conductivity type opposite from the conductivity type of the upper semiconductor nanostructures 66U In FIGS. 27A-27C, lower dummy gate stacks are formed over the lower nanostructures 64L, 66L. Forming the lower dummy gate stacks includes forming a lower dummy dielectric 82L on top surfaces and sidewalls of the upper nanostructures 64U, 66U and/or the etch stop layer 42. The lower dummy dielectric 82L may be made of a similar material using a similar process as the upper dummy dielectric 82U described above. A lower dummy gate 84L is then formed over the lower dummy dielectric 82L, and a mask 86L is formed over the lower dummy gate 84L. The lower dummy gate 84L and the mask 86L may be made of a similar material using a similar process as the upper dummy gate 84U and the mask 86U, respectively, described above.

After the layers of the lower dummy gate stacks are deposited, the mask 86L may be patterned using acceptable photolithography and etching techniques. The pattern of the mask 86L then may be transferred to the lower dummy gates 84L and the lower dummy dielectrics 82L. The lower dummy gates 84L cover respective channel regions of the lower nanostructures 64L. 66L. The lower dummy gates 84L may have a lengthwise direction substantially perpendicular to the lengthwise direction of respective lower nanostructures 64L, 66L. The masks 86L can optionally be removed after patterning, such as by any acceptable etching technique.

Figure 27A:
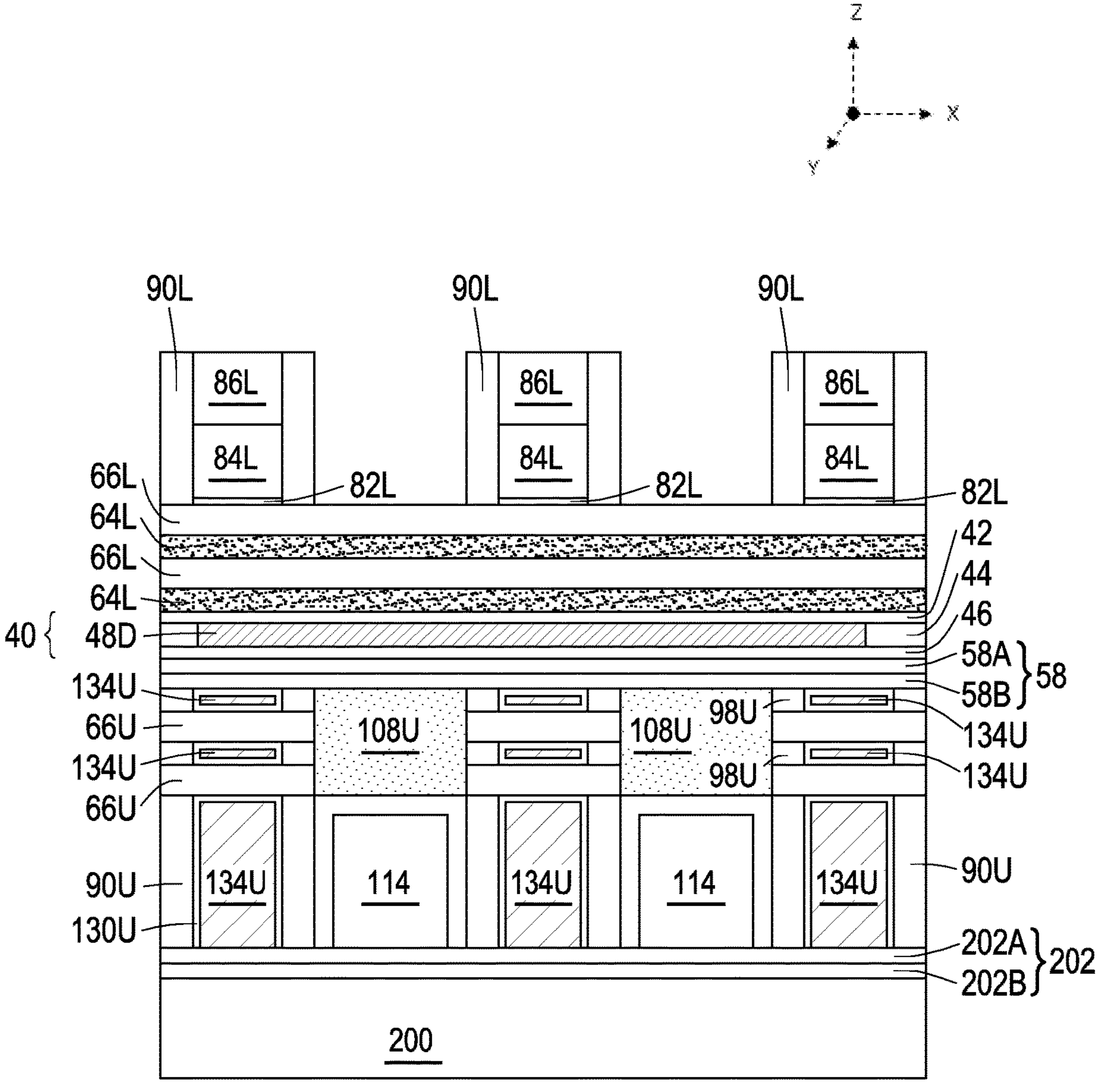
Figure 27B:
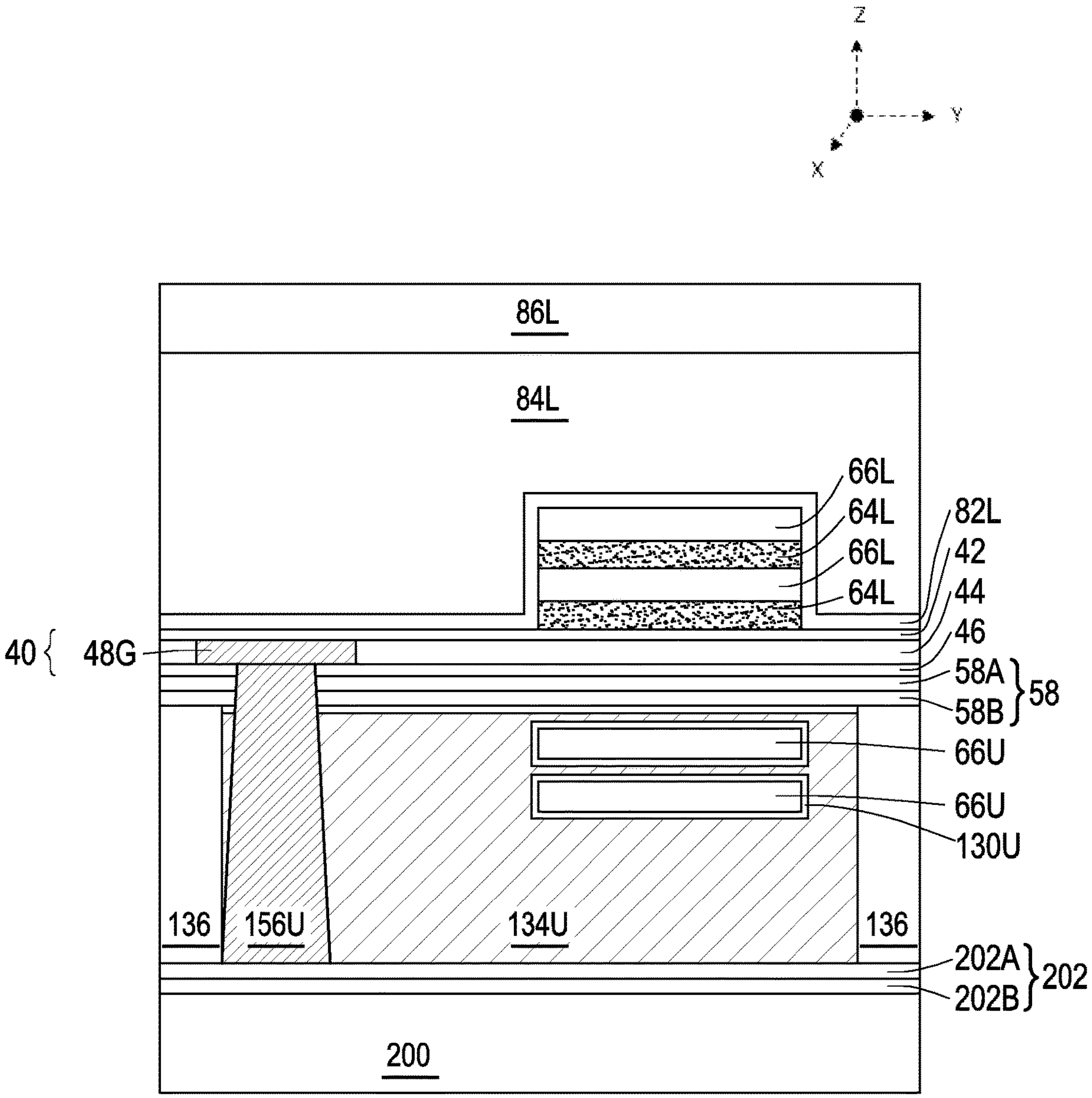
Figure 27C:
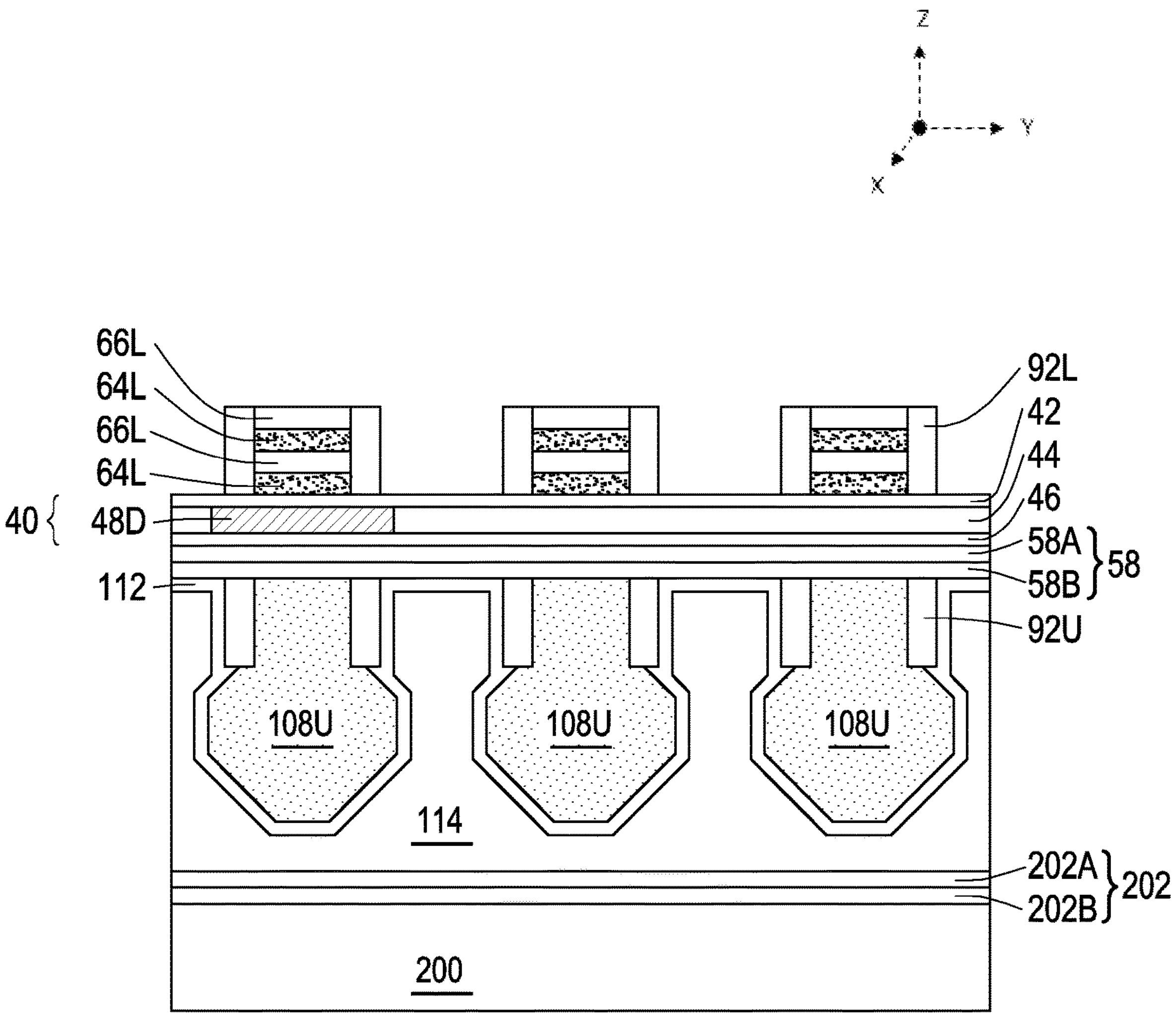

Also illustrated in FIGS. 27A-27C, lower gate spacers 90L are formed over the lower nanostructures 64L, 66L and on exposed sidewalls of the masks 86L (if present), the lower dummy gates 84L, and the lower dummy dielectrics 82L. The lower gate spacers 90L may be made of a similar material using a similar process as the upper gate spacers 90U described above. Forming the lower gate spacers 90L may further form lower fin spacers 92L on sidewalls of the lower nanostructures 64L, 66L (see FIG. 27C).

Further, implants for lightly doped source/drain (LDD) regions (not separately illustrated) may be performed. The LDD implants may be performed before the lower gate spacers 90L are formed. Appropriate type impurities may be implanted into the nanostructures 64L, 66L to a desired depth. The LDD regions may have a same conductivity type as a conductivity type of source/drain regions that will be subsequently formed adjacent the lower semiconductor nanostructures 66L. The impurities in the lower semiconductor nanostructures 66L may be n-type or p-type, and the impurities in the lower semiconductor nanostructures 66L may be of an opposite type as the impurities in the upper semiconductor nanostructures 66U. The n-type impurities may be the any of the n-type impurities previously discussed, and the p-type impurities may be the any of the p-type impurities previously discussed. The lightly doped source/drain regions may have a concentration of impurities in a range from $10^{17}$ atoms/$cm^3$ to $10^{20}$ atoms/$cm^3$. An anneal may be used to repair implant damage and to activate the implanted impurities. In some embodiments, the grown materials of the lower nanostructures 64L, 66L may be in situ doped during growth, which may obviate the implantations, although in situ and implantation doping may be used together.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like.

Figure 28A:
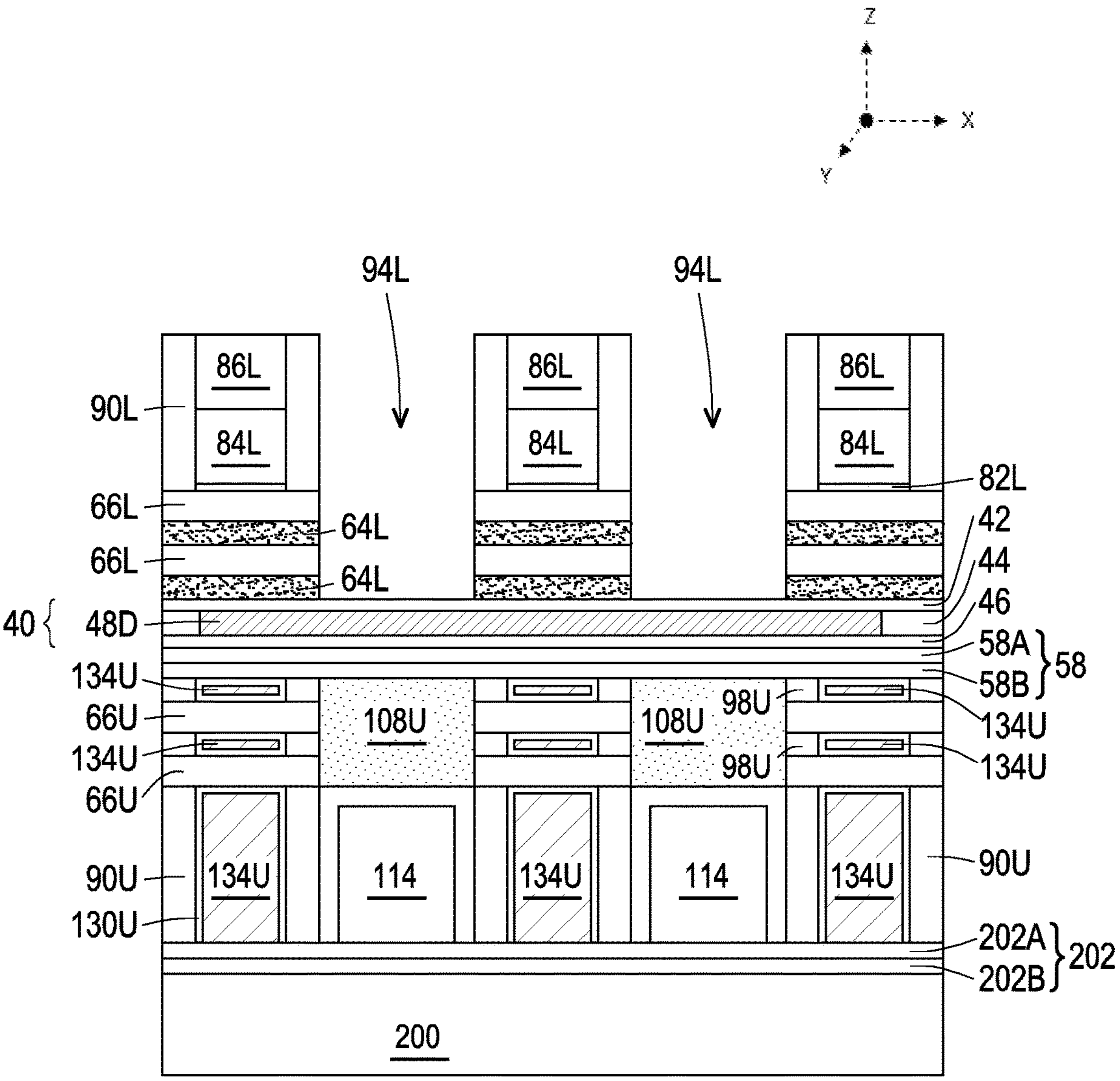
Figure 28B:
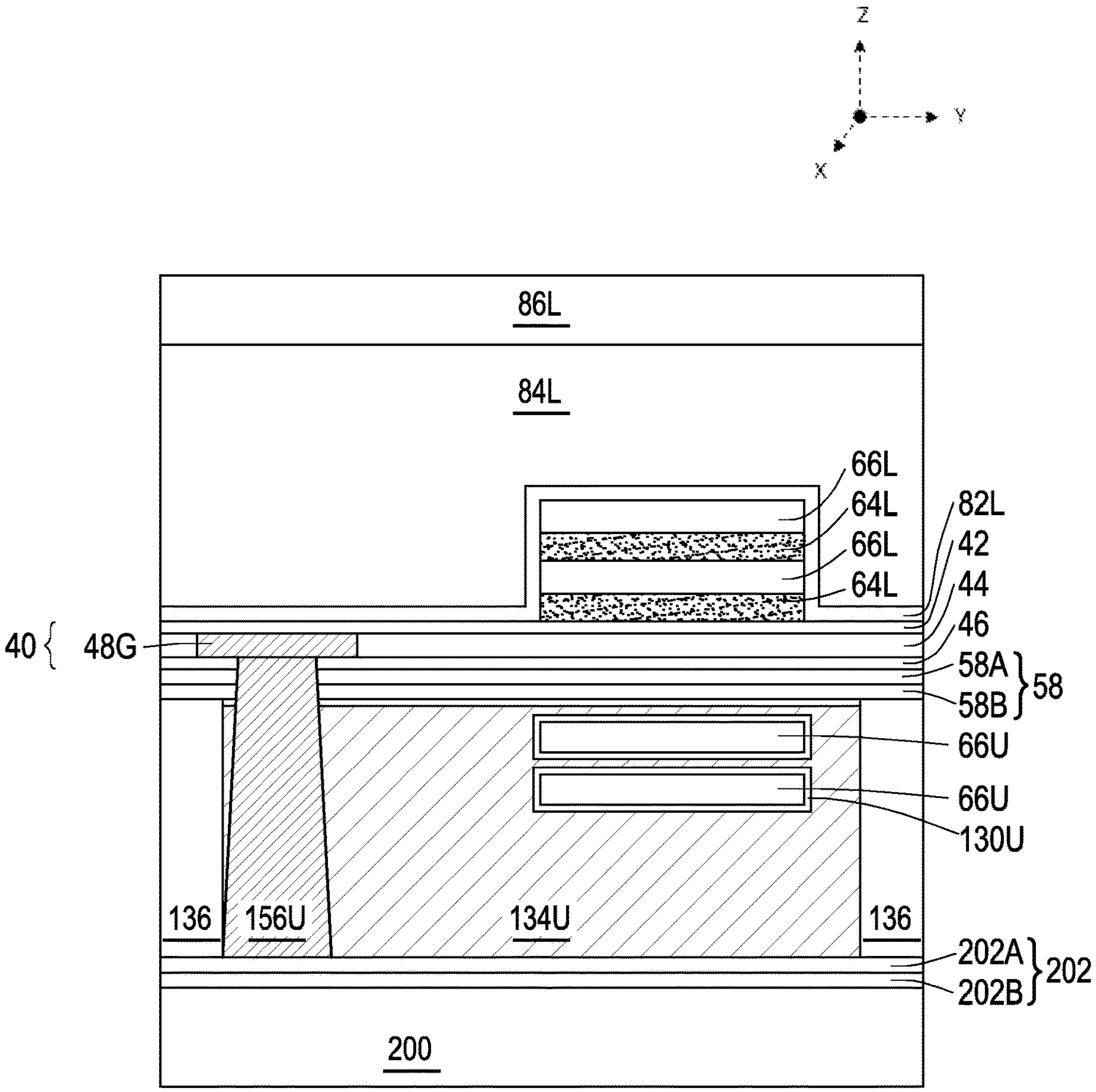
Figure 28C:
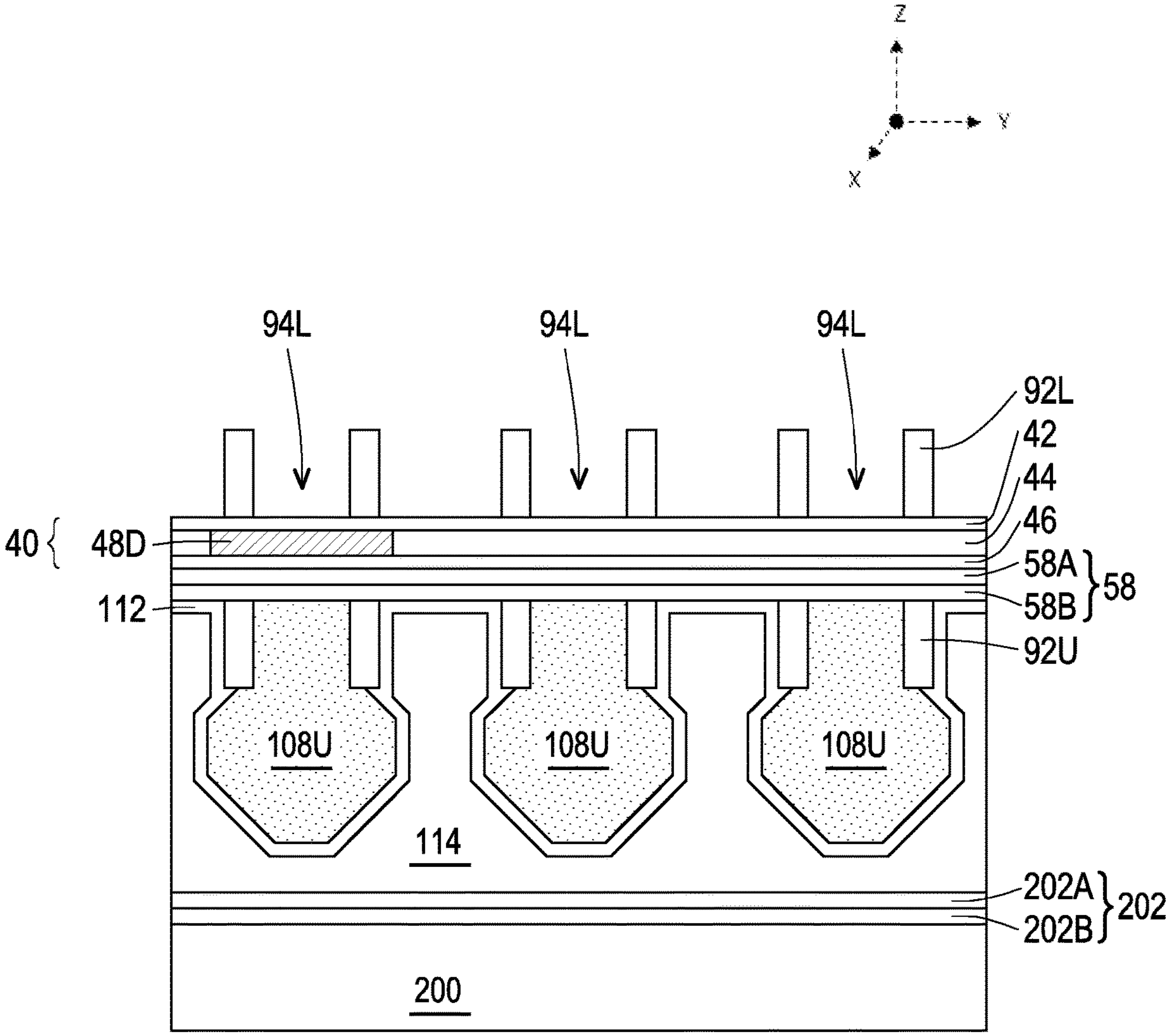

In FIGS. 28A-28C, lower source/drain recesses 94L are formed in the lower nanostructures 64L, 66L. Epitaxial source/drain regions will be subsequently formed in the lower source/drain recesses 94L. In some embodiments, the lower source/drain recesses 94L may extend completely through the lower nanostructures 64L, 66L to expose underlying insulating layers (e.g., the etch stop layer 42). The lower source/drain recesses 94L may be formed by etching the lower nanostructures 64L, 66L using anisotropic etching processes, such as RIE, NBE, or the like. The gate spacers 90L and the dummy gates 84L mask portions of the lower nanostructures 64L, 66L during the etching processes used to form the lower source/drain recesses 94L. A single etch process or multiple etch processes may be used to etch each layer of the lower nanostructures 64L, 66L.

Figure 29A:
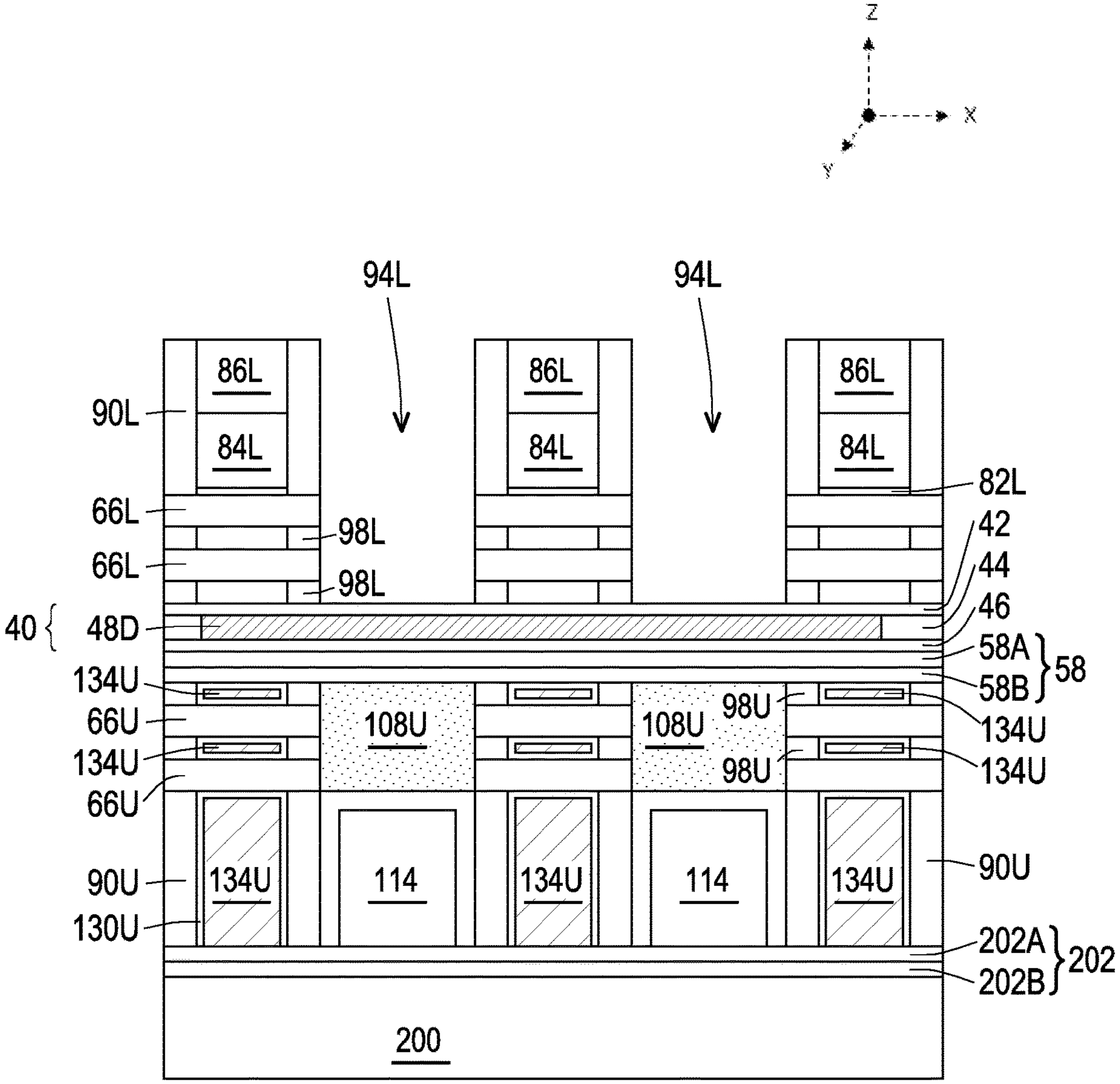
Figure 29B:
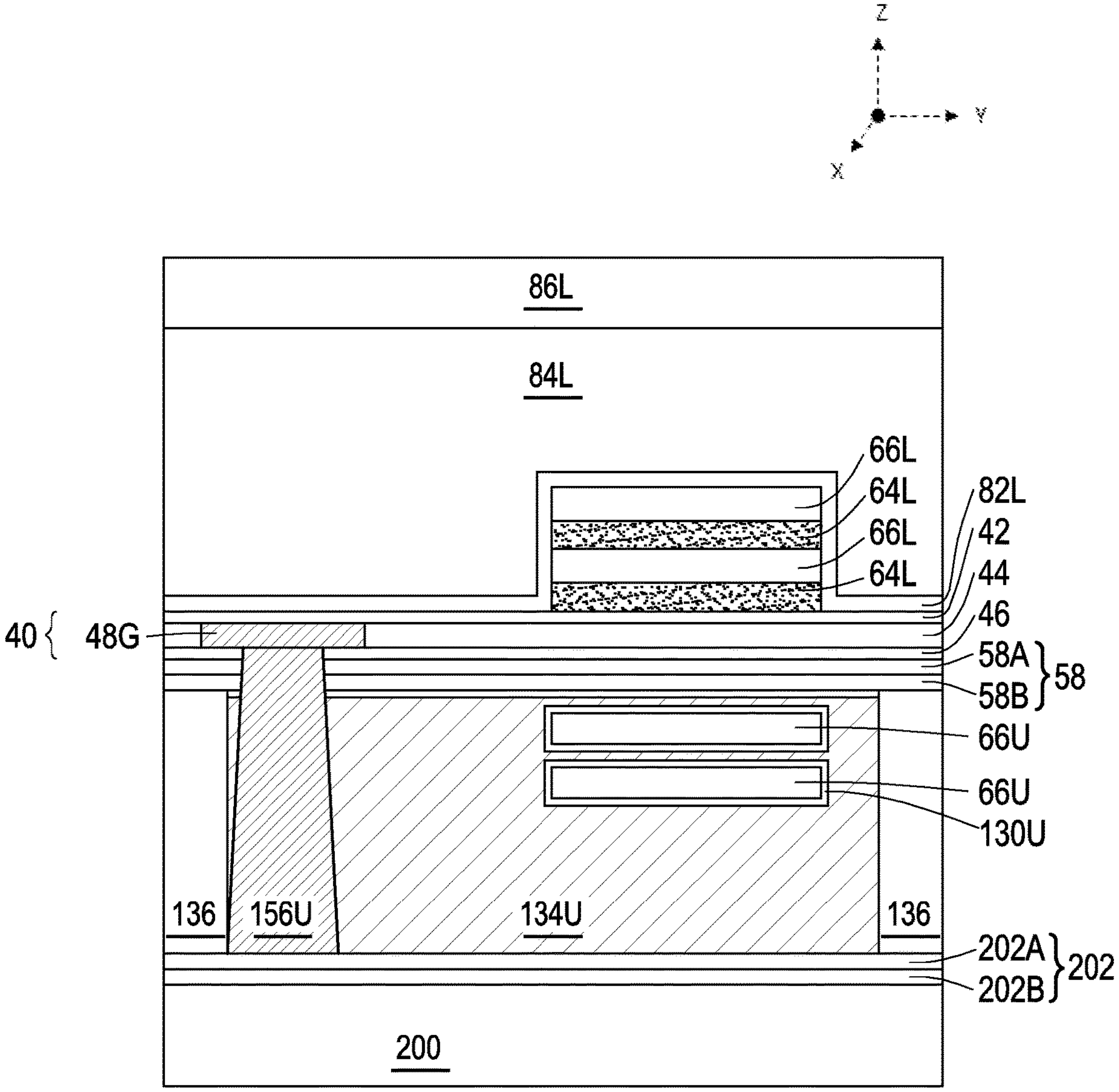

In FIGS. 29A-29B, portions of the sidewalls of the lower dummy nanostructures 64L exposed by the source/drain recesses 94L are recessed, and lower inner spacers 98L are formed on sidewalls of the lower dummy nanostructures 64L. The lower dummy nanostructures 64L may be recessed in a similar manner as the upper dummy nanostructures 64U described above. Further, the lower inner spacers 98L may be formed a similar material and in a similar manner as the upper inner spacers 98U described above.

As subsequently described in greater detail, source/drain regions will be subsequently formed in the lower source/drain recesses 94L, and the lower dummy nanostructures 64L will be replaced with corresponding gate structures. The lower inner spacers 98L act as isolation features between the subsequently formed source/drain regions and the subsequently formed gate structures. Further, the lower inner spacers 98L may be used to prevent damage to the subsequently formed source/drain regions by subsequent etch processes, such as etch processes used to form gate structures. Although outer sidewalls of the lower inner spacers 98L are illustrated as being flush with sidewalls of the lower semiconductor nanostructures 66L, the outer sidewalls of the lower inner spacers 98L may extend beyond or be recessed from sidewalls of the lower semiconductor nanostructures 66L. Moreover, although the sidewalls of the lower inner spacers 98L are illustrated as being straight, those sidewalls may be concave or convex.

Figure 30A:
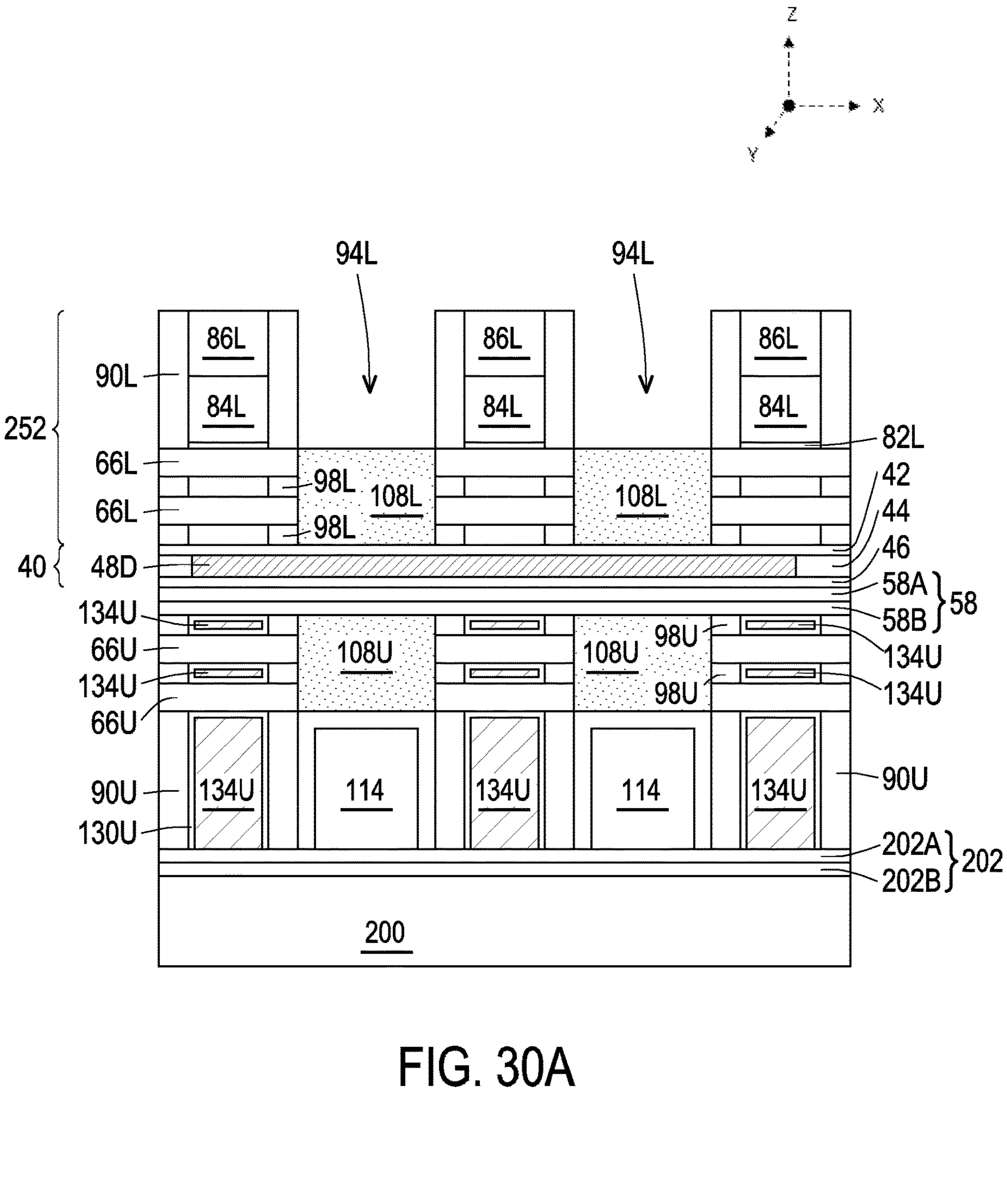
Figure 30B:
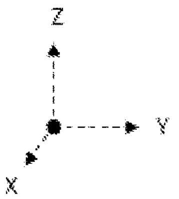
Figure 30B:
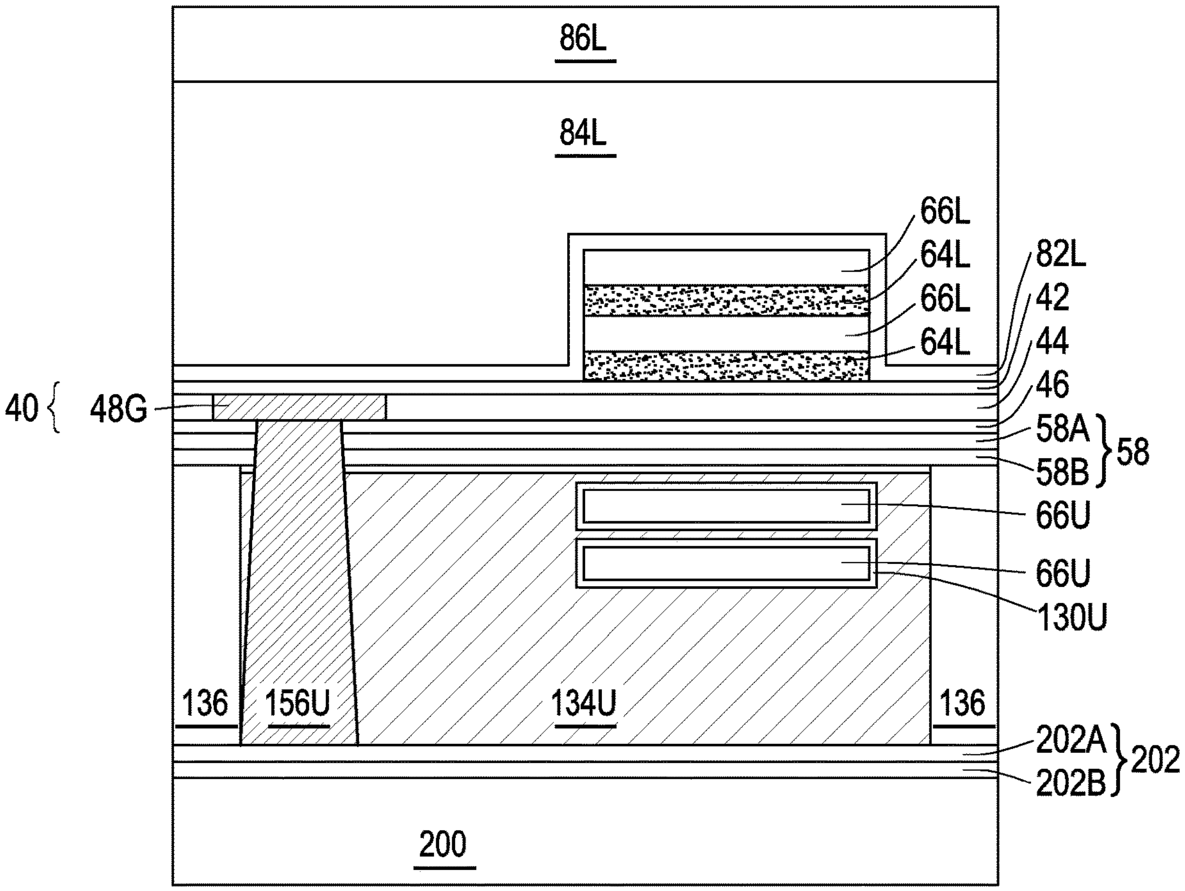
Figure 30C:
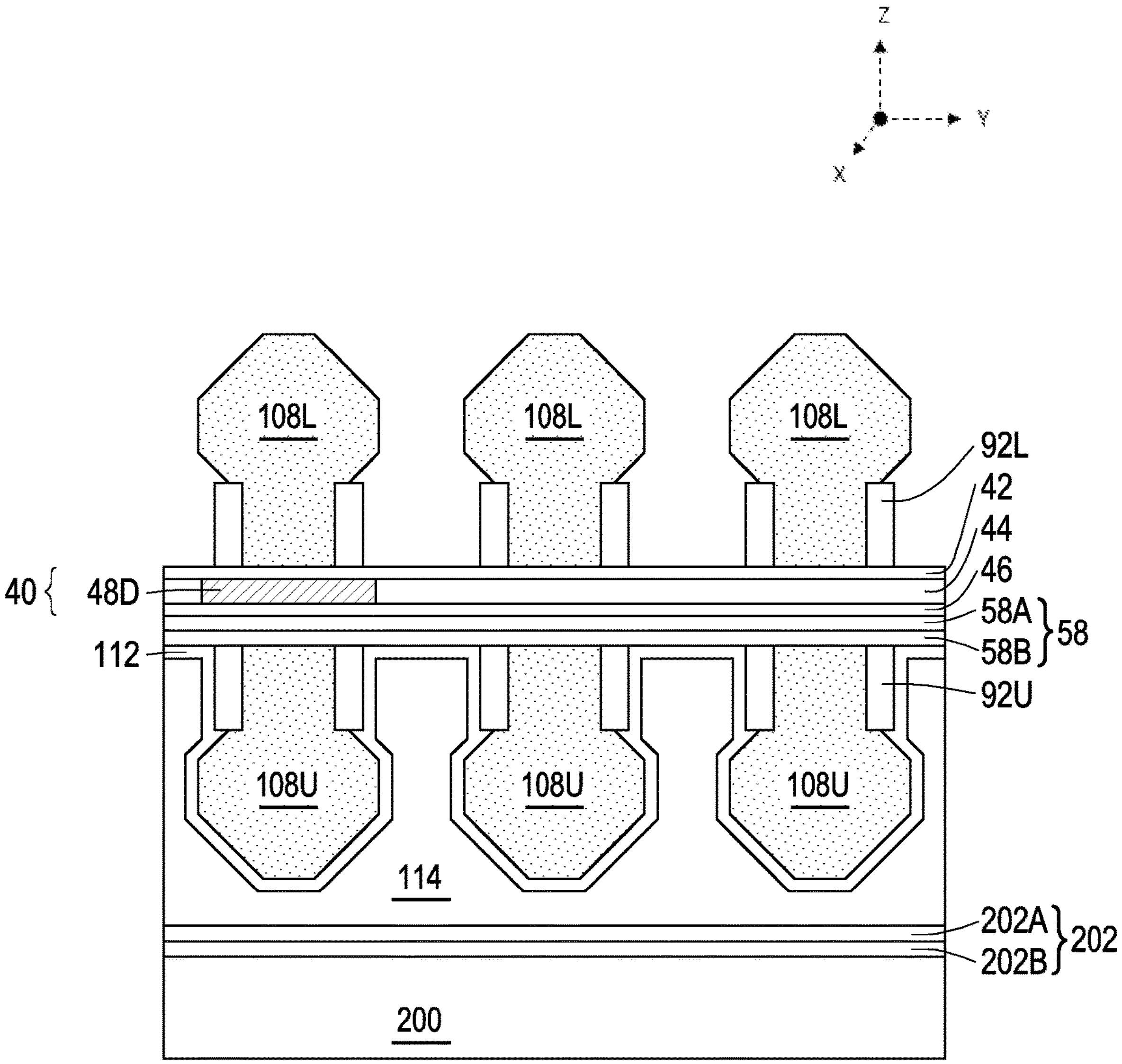

In FIGS. 30A-30C, lower epitaxial source/drain regions 108L are formed in the lower source/drain recesses 94L. In some embodiments, the lower epitaxial source/drain regions 108L exert stress in the respective channel regions of the lower semiconductor nanostructures 66L, thereby improving performance. The lower epitaxial source/drain regions 108L are formed in the lower source/drain recesses 94L such that each stack of the lower semiconductor nanostructures 66L is disposed between respective neighboring pairs of the lower epitaxial source/drain regions 108L. In some embodiments, the lower inner spacers 98L are used to separate the lower epitaxial source/drain regions 108L from the lower dummy nanostructures 64L by an appropriate lateral distance so that the lower epitaxial source/drain regions 108L do not short out with subsequently formed gates of the resulting devices.

The lower epitaxial source/drain regions 108L are epitaxially grown in the lower source/drain recesses 94L. The lower epitaxial source/drain regions 108L have a conductivity type that is suitable for the device type of the lower nanostructure-FETs, and the lower epitaxial source/drain regions 108L have a conductivity type that is opposite to the upper epitaxial source/drain regions 108U. In some embodiments, the lower epitaxial source/drain regions 108L are p-type source/drain regions. For example, if the lower semiconductor nanostructures 66L are silicon, the lower epitaxial source/drain regions 108L may include materials exerting a compressive strain on the lower semiconductor nanostructures 66L, such as silicon-germanium, boron-doped silicon-germanium, boron-doped silicon, germanium, germanium tin, or the like. In some embodiments, the lower epitaxial source/drain regions 108L are n-type source/drain regions. For example, if the lower semiconductor nanostructures 66L are silicon, the lower epitaxial source/drain regions 108L may include materials exerting a tensile strain on the lower semiconductor nanostructures 66L, such as silicon, carbon-doped silicon, phosphorous-doped and carbon-doped silicon, silicon phosphide, silicon arsenide, or the like. The lower epitaxial source/drain regions 108L may have surfaces raised from respective lower surfaces of the lower semiconductor nanostructures 66L and may have facets.

The lower epitaxial source/drain regions 108L may be implanted with dopants to form source/drain regions, similar to the process previously discussed for forming lightly-doped source/drain regions, followed by an anneal. The source/drain regions may have an impurity concentration in the range of $10^{19}$ atoms/cm$^3$ and $10^{21}$ atoms/cm$^3$. The n-type and/or p-type impurities for source/drain regions may be any of the impurities previously discussed. In some embodiments, the lower epitaxial source/drain regions 108L are in situ doped during growth.

As a result of the epitaxy processes used to form the lower source/drain regions 108L, upper surfaces of the lower source/drain regions 108L have facets which expand laterally outward beyond sidewalls of the nanostructures 64L, 66L. In some embodiments, adjacent lower source/drain regions 108L remain separated after the epitaxy process is completed as illustrated by FIG. 30C. In other embodiments, these facets cause adjacent lower source/drain regions 108L of a same nanostructure-FET to merge (not separately illustrated). In the illustrated embodiments, the fin spacers 92L are formed on a top surface of the etch stop layer 42, thereby blocking the epitaxial growth. In some other embodiments, the fin spacers 92L may cover portions of the sidewalls of the nanostructures 64L, 66L, further blocking the epitaxial growth. In another embodiment, the spacer etch used to form the gate spacers 90L is adjusted to not form the fin spacers 92L, so as to allow the lower source/drain regions 108L to extend to the surface of the underlying layer (e.g., the etch stop layer 42).

Although the lower source/drain regions 108L is illustrated as a single layer, the lower source/drain regions 108L may comprise one or more semiconductor material layers (not explicitly illustrated). Each of the semiconductor material layers may be doped to different dopant concentrations.

Figure 31A:
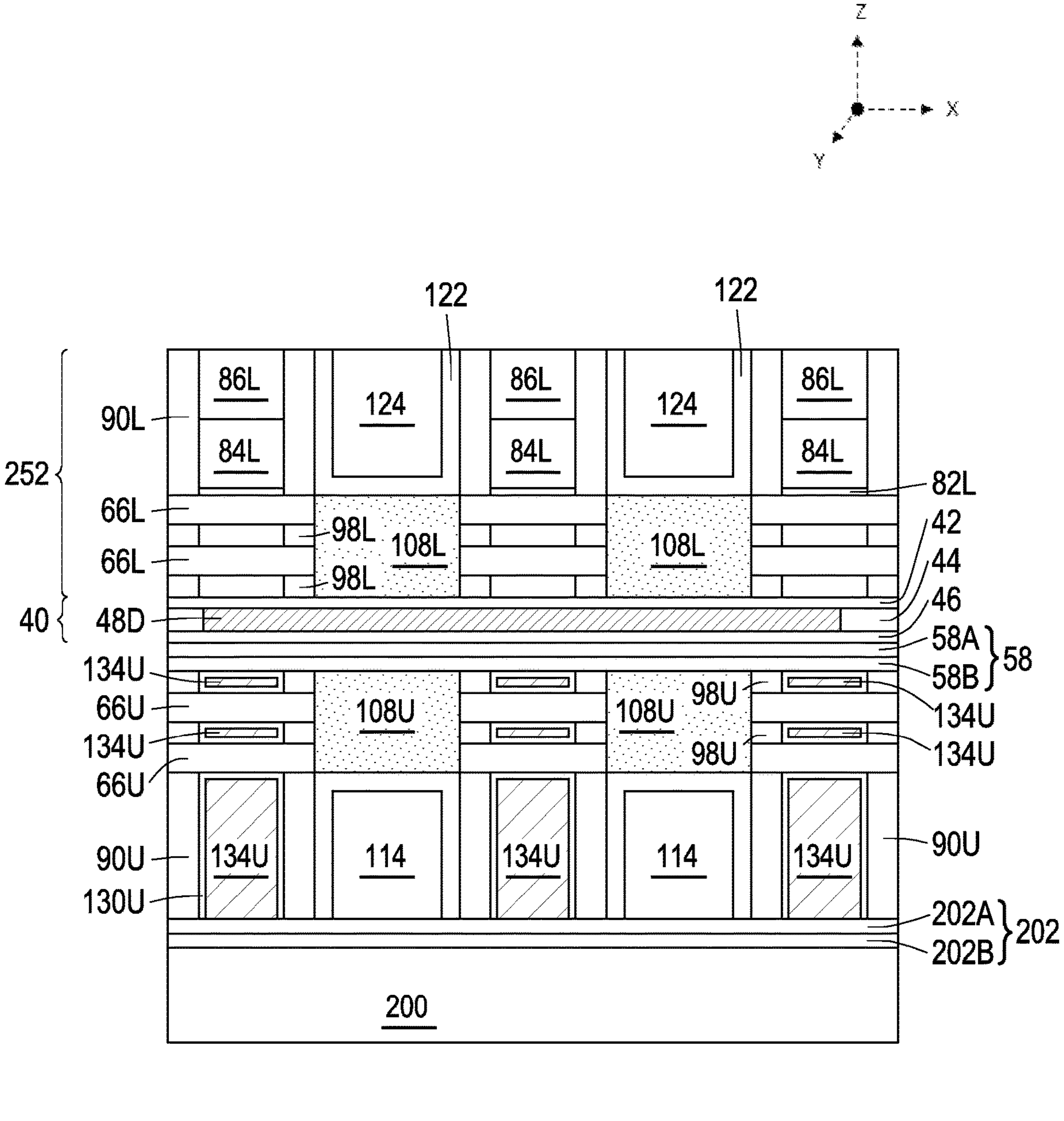
Figure 31B:
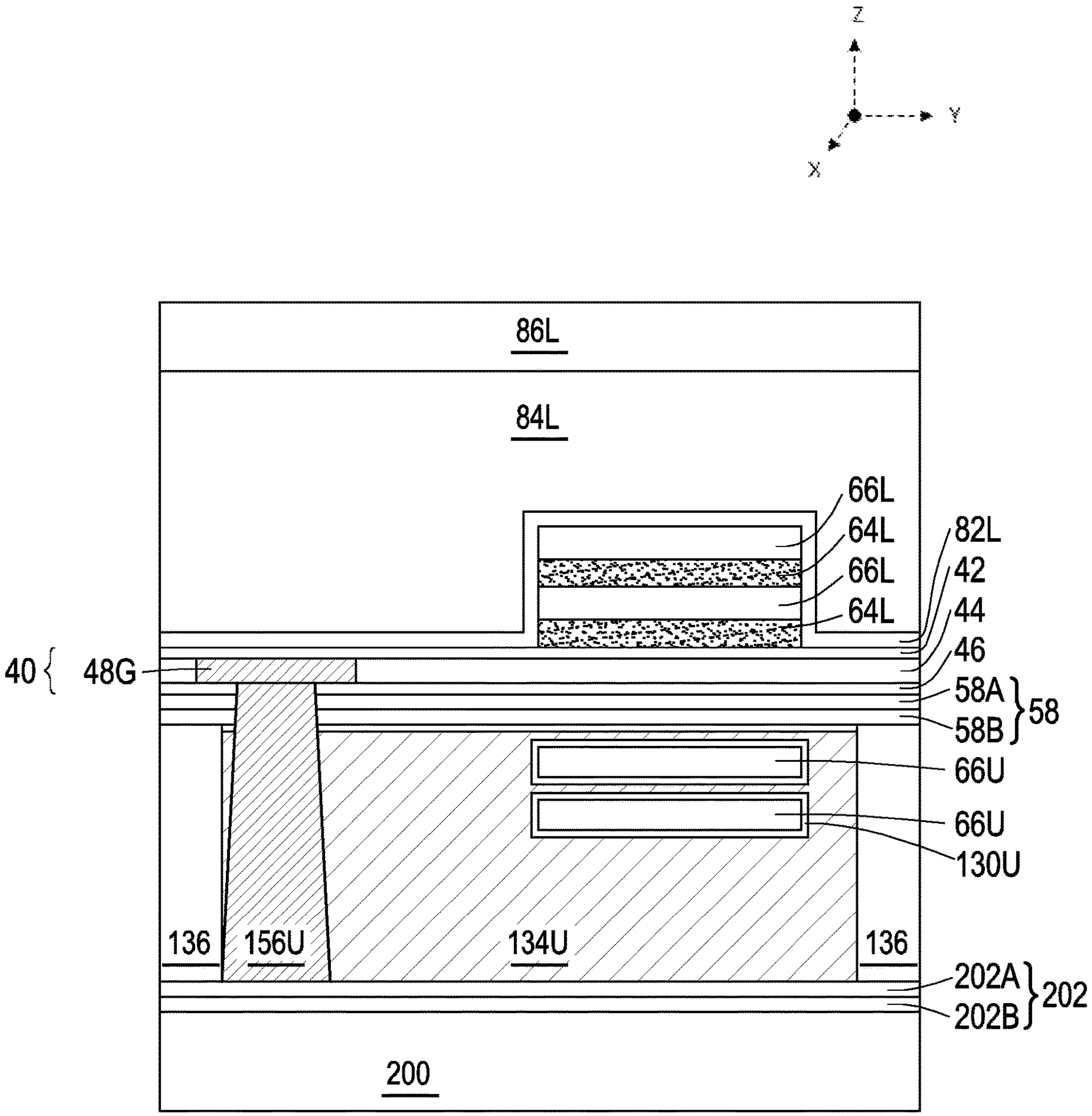
Figure 31C:
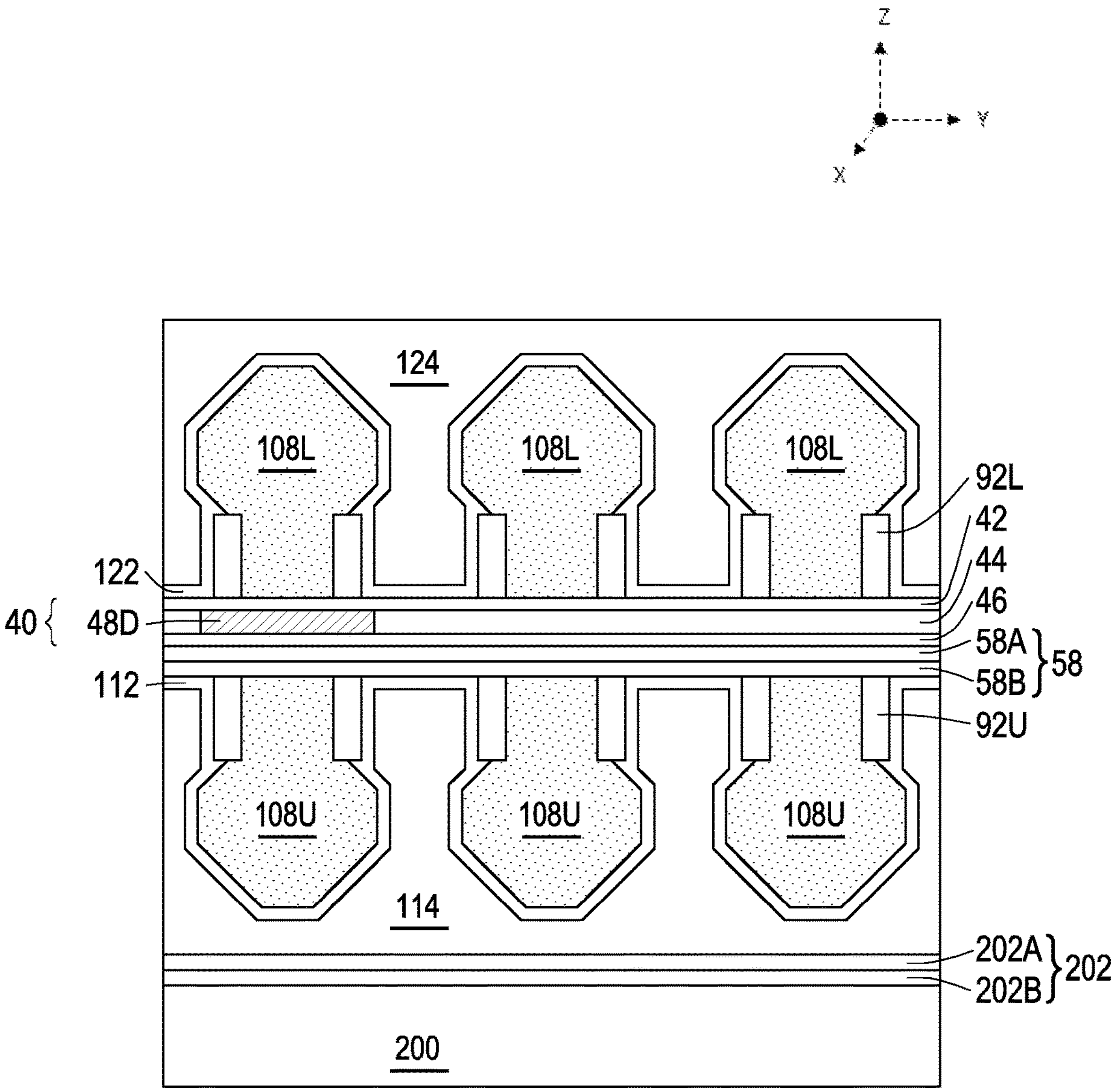

In FIGS. 31A-31C, a CESL 122 is deposited over the lower epitaxial source/drain regions 108L, the lower gate spacers 90L, and the masks 86L (if present) or the dummy gates 84L. An ILD 124 is then deposited over the CESL 122. The ILD 124 and the CESL 122 may be formed of a similar material using a similar method as the ILD 114 and the CESL 112, respectively.

After the CESL 122 and the ILD 124 are deposited, a removal process is performed to level the top surfaces of the ILD 124 with the top surfaces of the gate spacers 90L and the masks 86L (if present) or the dummy gates 84L. In some embodiments, a planarization process such as a CMP, an etch-back process, combinations thereof, or the like may be utilized. The planarization process may also remove the masks 86L on the dummy gates 84L, and portions of the gate spacers 90L along sidewalls of the masks 86L. After the planarization process, top surfaces of the ILD 124, the gate spacers 90L, and the masks 86L (if present) or the dummy gates 84L are substantially coplanar (within process variations). Accordingly, the top surfaces of the masks 86L (if present) or the lower dummy gates 84L are exposed through the ILD 124. In the illustrated embodiment, the masks 86L remain after the removal process. In other embodiments, the masks 86L are removed such that the top surfaces of the lower dummy gates 84L are exposed through the ILD 124

Figure 32A:
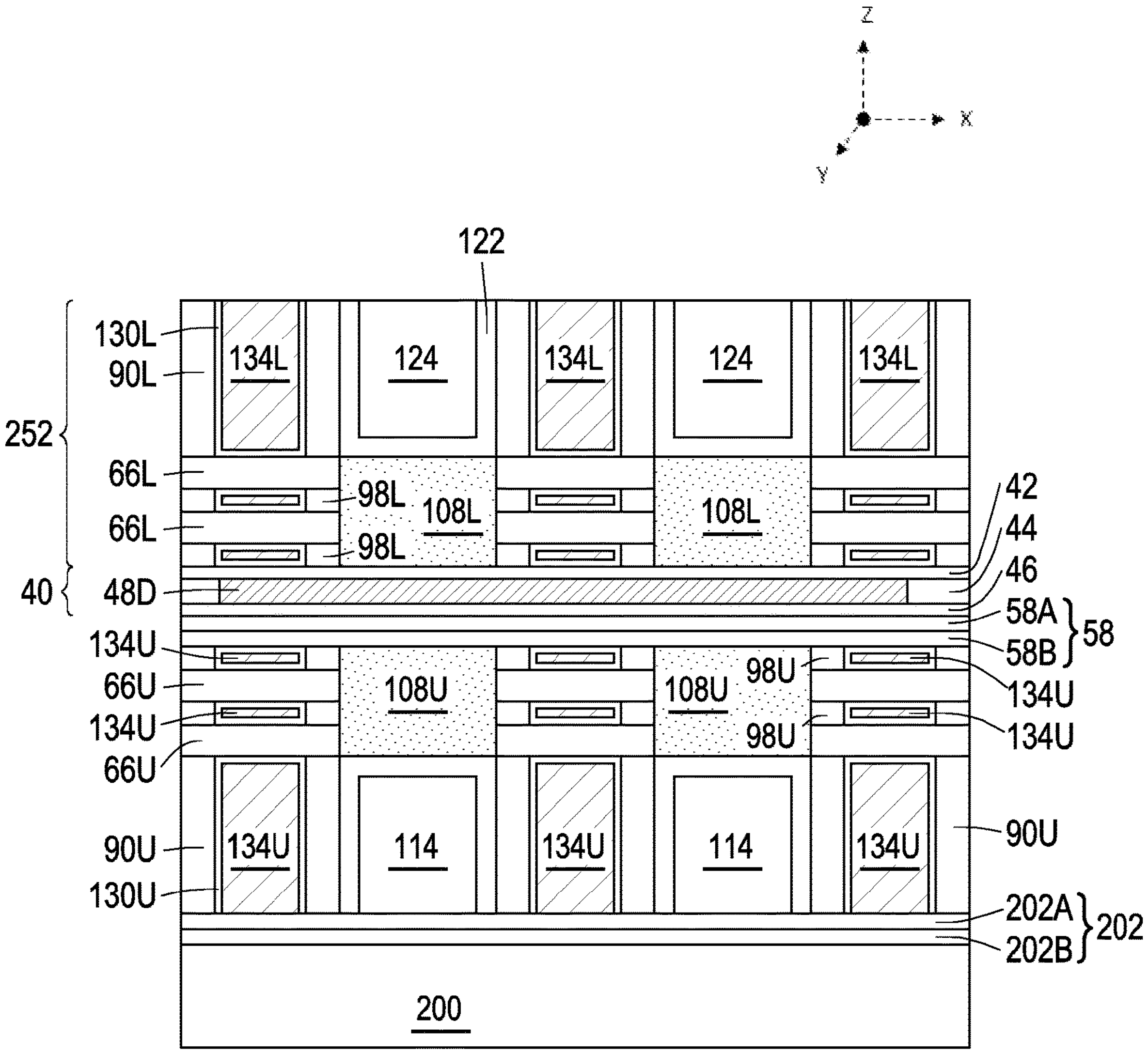
Figure 32B:
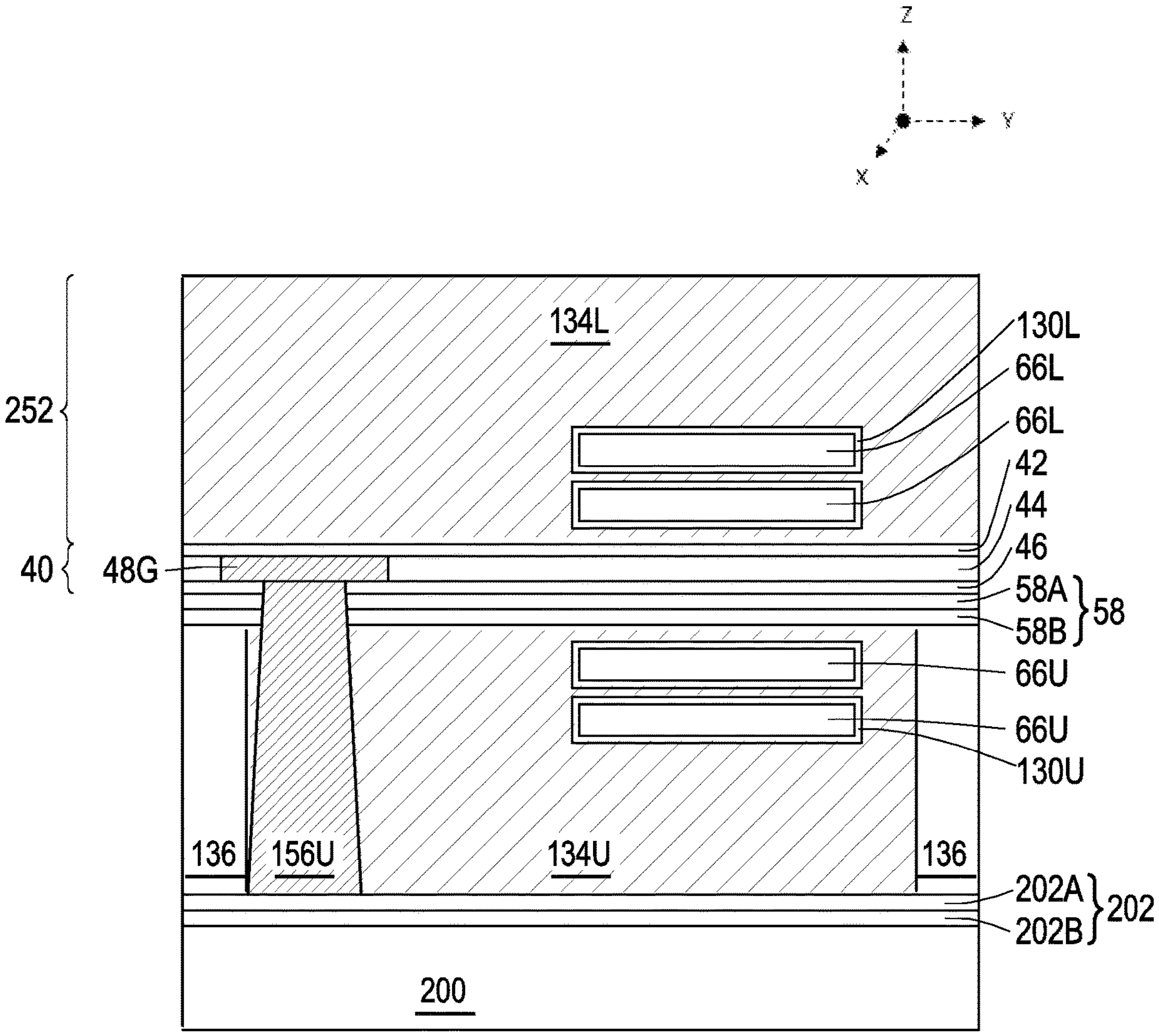
Figure 32C:
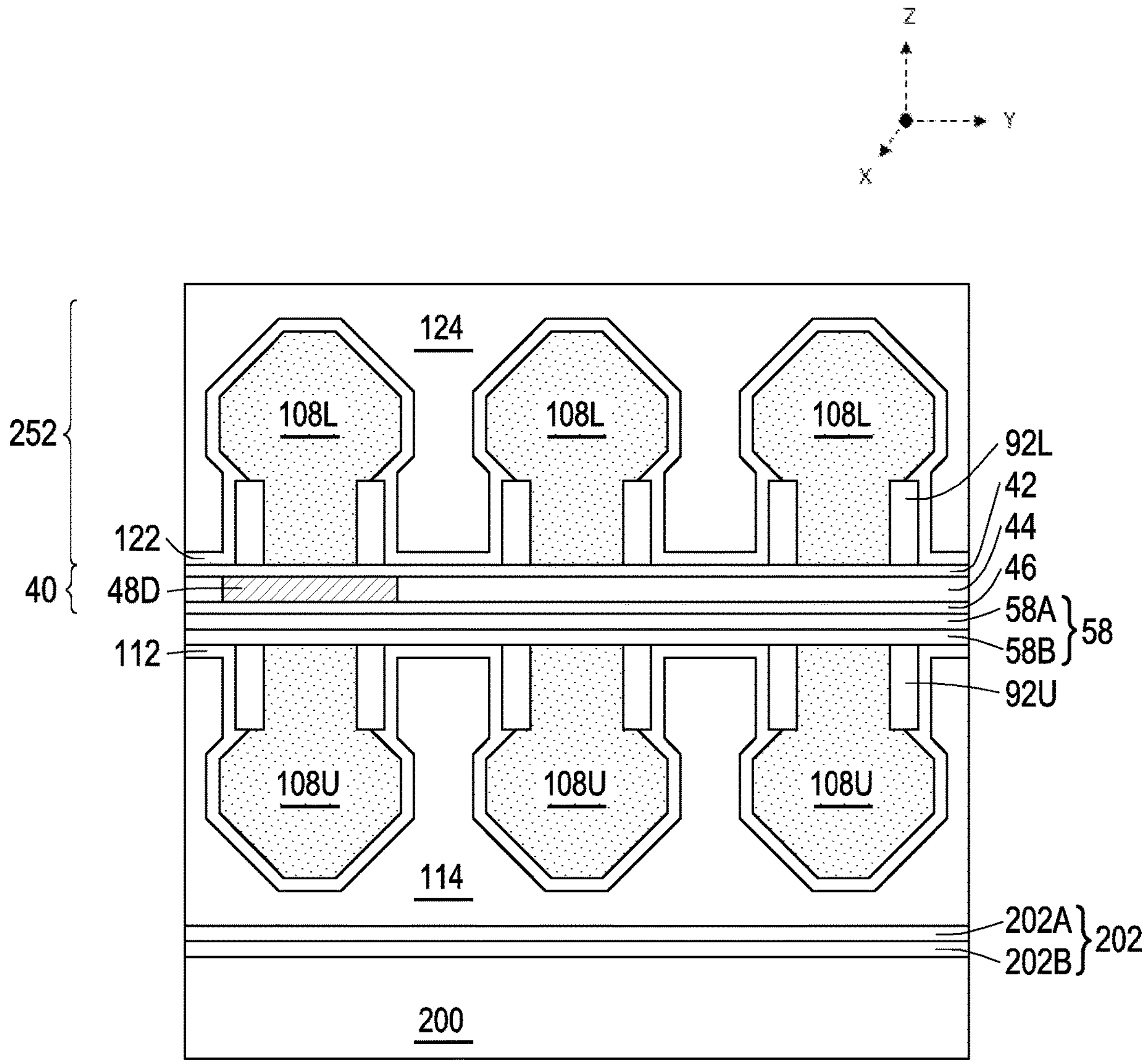

In FIGS. 32A-32C, the dummy gates 84L and the dummy dielectrics 82L are replaced with a functional gate stack (also referred to as a lower gate stack). Each lower gate stack includes a lower gate dielectric 130L and a lower gate electrode 134L. Forming the lower gate stacks may include removing the masks 86L, the lower dummy gates 84L, and the lower dummy dielectrics 82L using a similar process as described above to remove the masks 86U, the upper dummy gates 84U, and the upper dummy dielectrics 82U to define lower gate recesses between the lower gate spacers 90L. Then, the lower dummy nanostructures 64L are removed using a similar process as discussed above to remove the upper dummy nanostructures 64U. Removing the lower dummy nanostructures 64L defines openings between the lower semiconductor nanostructures 66L.

Subsequently, the lower gate dielectrics 130L and the lower gate electrodes 134L are formed in the lower gate recesses and in the recesses between the lower semiconductor nanostructures 66L. The lower gate dielectric layer 130L is conformally formed on the channel regions of the semiconductor nanostructures 66L, such that it conformally lines the lower gate recesses and the openings between the lower semiconductor nanostructures 66L. Specifically, the lower gate dielectric layer 130L is formed on the top surfaces, the sidewalls, and the bottom surfaces of the lower semiconductor nanostructures 66L and on the sidewalls of the lower gate spacers 90L. The lower gate dielectric layer 130L wraps around all (e.g., four) sides of the lower semiconductor nanostructures 66L. The lower gate dielectric layer 130L may also be formed on the top surfaces of ILD 124 and the gate spacers 90L. The lower gate dielectric layer 130L may be made of a similar material that is deposited using a similar process as the upper gate dielectric 130U discussed above. After the lower gate dielectric layer 130L is deposited, a relatively high temperature annealing process (e.g., in a range of 800° C. to 900° C.) is performed to improve a film quality of the lower gate dielectric layer 130L, thereby improving device reliability of the resulting CFET device. Although a single-layered lower gate dielectric layer 130L is illustrated, the lower gate dielectric layer 130L may include multiple layers, such as an interfacial layer and an overlying high-k dielectric layer.

The lower gate electrodes 134L are then formed on the lower gate dielectric layer 130L. The lower gate electrodes 134L are disposed in remaining portions of the lower gate recesses and in the openings between the lower semiconductor nanostructures 66L. Accordingly, the lower gate electrodes 134L wrap around the lower semiconductor nanostructures 66L. The lower gate electrodes 134L may be formed of a metal-containing material such as tungsten, titanium, titanium nitride, tantalum, tantalum nitride, tantalum carbide, aluminum, ruthenium, cobalt, combinations thereof, multi-layers thereof, or the like. Although single-layered gate electrodes are illustrated, the lower gate electrodes 134L may include any number of work function tuning layers, any number of barrier layers, any number of glue layers, and a fill material.

The lower gate electrodes 134L are formed of material(s) that are suitable for the device type of the lower nanostructure-FETs. For example, the lower gate electrodes 134L may include one or more work function tuning layer(s) formed of material(s) that are suitable for the device type of the lower nanostructure-FETs. In some embodiments, the lower gate electrodes 134L include a p-type work function tuning layer, which may be formed of titanium nitride, tantalum nitride, combinations thereof, or the like. In some embodiments, lower gate electrodes 134L include an n-type work function tuning layer, which may be formed of titanium aluminum, titanium aluminum carbide, tantalum aluminum, tantalum carbide, combinations thereof, or the like. Additionally, or alternatively, the lower gate electrodes 134L may include a dipole-inducing element that is suitable for the device type of the lower nanostructure-FETs. Acceptable dipole-inducing elements include lanthanum, aluminum, scandium, ruthenium, zirconium, erbium, magnesium, strontium, and combinations thereof. The lower gate electrodes 134L may have a different composition than the upper gate electrodes 134U.

The lower gate electrodes 134L may be formed by conformally depositing one or more gate electrode layer(s)

using any acceptable process, such as CVD, ALD, or the like. Then, a removal process is preformed to remove the excess portions of the gate electrode layer(s), which excess portions are over the top surfaces of the gate spacers 90L and the ILD 124. The gate electrode layer(s), after the removal process, have portions left in the upper portions of the lower gate recesses and in the openings between the lower semiconductor nanostructures 66L (thus forming the lower gate electrodes 134L). In some embodiments, a planarization process such as a CMP, an etch-back process, combinations thereof, or the like is utilized.

The removal process (e.g., the planarization process) may further remove excess portions of the lower gate dielectric layer 130L. As a result, the top surfaces of the gate dielectrics 130L, the gate spacers 90L, the ILD 124, and the lower gate electrodes 134L may be substantially level. Each respective pair of a gate dielectric 130L and a gate electrode 134L may be collectively referred to as a "gate structure." Each gate structure extends along three sides (e.g., a top surface, a sidewall, and a bottom surface) of a channel region of a semiconductor nanostructure 66L. In this manner, a lower transistor layer 252 is formed comprising a layer of lower transistors. The lower transistors may be made of the lower gate stacks 130L/134, the lower nanostructures 66L, and the lower source/drain regions 108L.

Figure 33A:
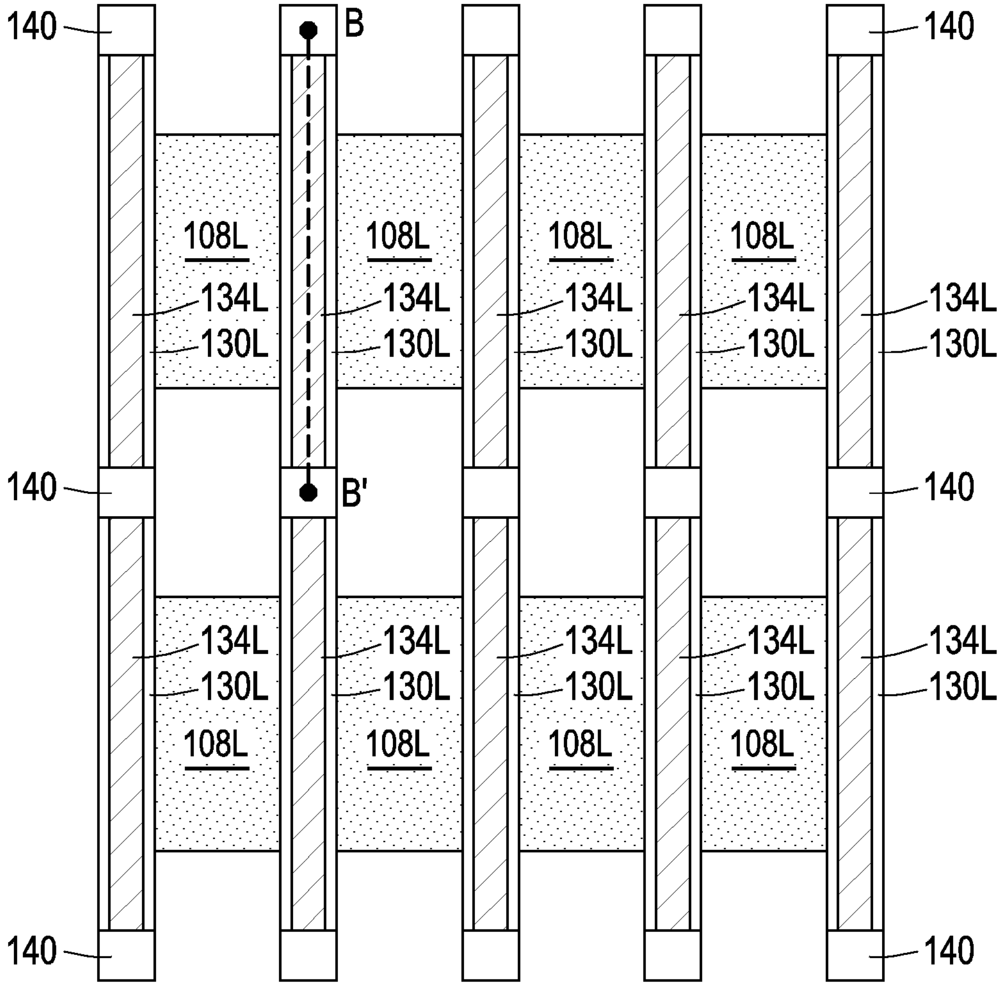
Figure 33B:
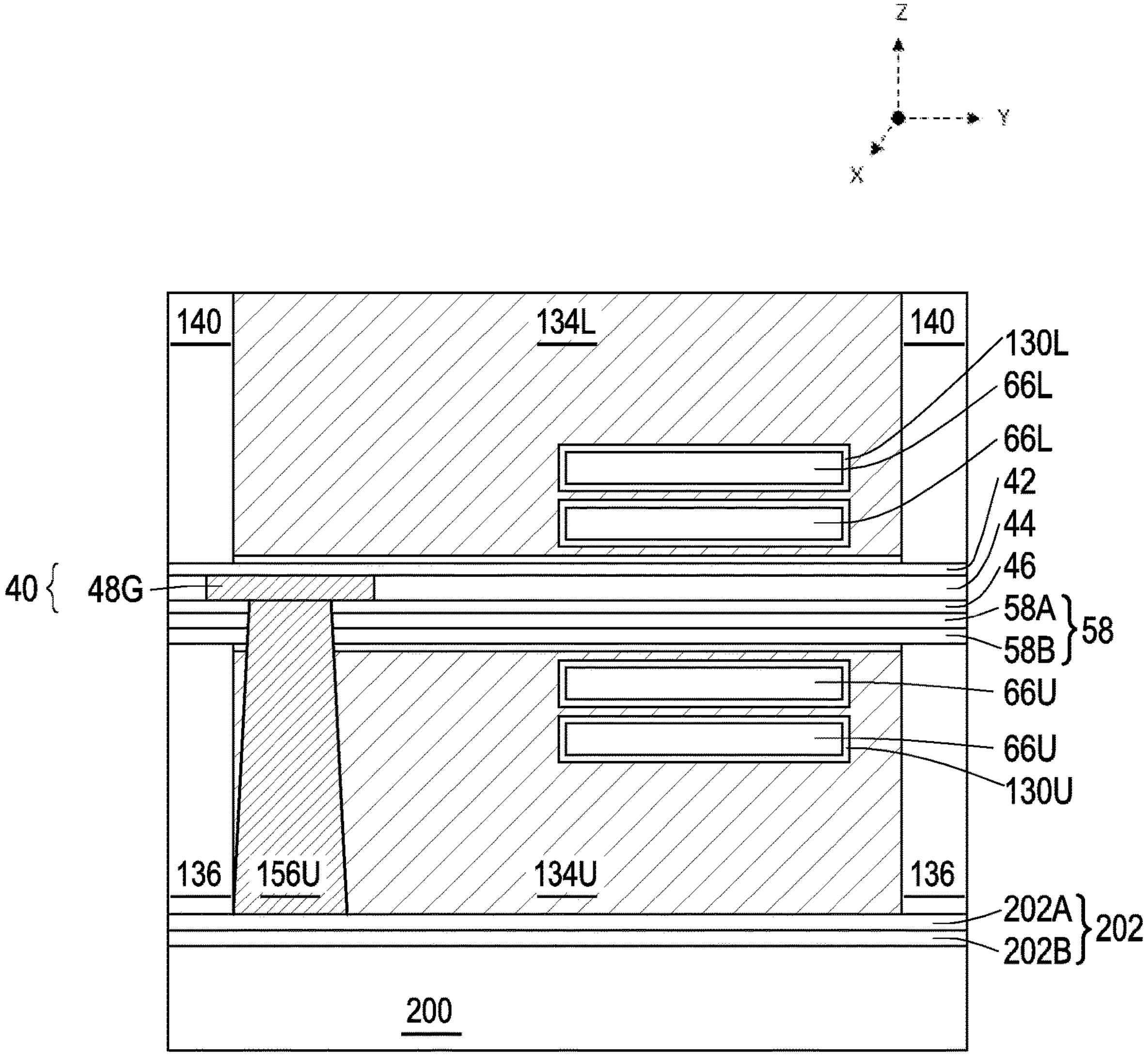

In FIGS. 33A-33B, the gate structures (including the lower gate dielectric 130L and the lower gate electrode 134L) are patterned to separate adjacent gate structures from each other based on a desired layout of the semiconductor chip. FIG. 33A illustrates a top-down view of the gate structures, and FIG. 33B illustrates a cross-sectional view along line B-B' of FIGS. 1 and 33A. Certain features may be omitted from the top-down view of FIG. 33A for clarity. The gate structures may by patterned by any suitable photolithography and etching process(es). The etching process(es) may be selective to a material of the lower gate electrode 134L and the lower gate dielectric 130L, and the etching process(es) may etch the lower gate electrode 134L and the lower gate dielectric 130L at a faster rate than the CESL 122, the ILD 124, and the gate spacers 90L (see FIGS. 32A-32C).

After the gate structures are patterned, a dielectric material 140 (also referred to as a dielectric plug or a CMG) may be deposited in the openings extending through the gate structures 130L/134L. The dielectric material 140 may comprise silicon oxide, silicon nitride, or the like that is deposited by any suitable process, such as, CVD, ALD, or the like. The dielectric material 140 electrically insulates adjacent gate structures from each other. Although the CMG process is described as being performed after the replacement gate process to form the gate structures 130L/134L, in other embodiments, the CMG process to form the dielectric material 140 can be performed prior to the replacement gate process. For example, the CMG process may be performed with the dummy gates 84L, and the gate structures 130L/134L can be formed around the dielectric material 140.

Figure 34:
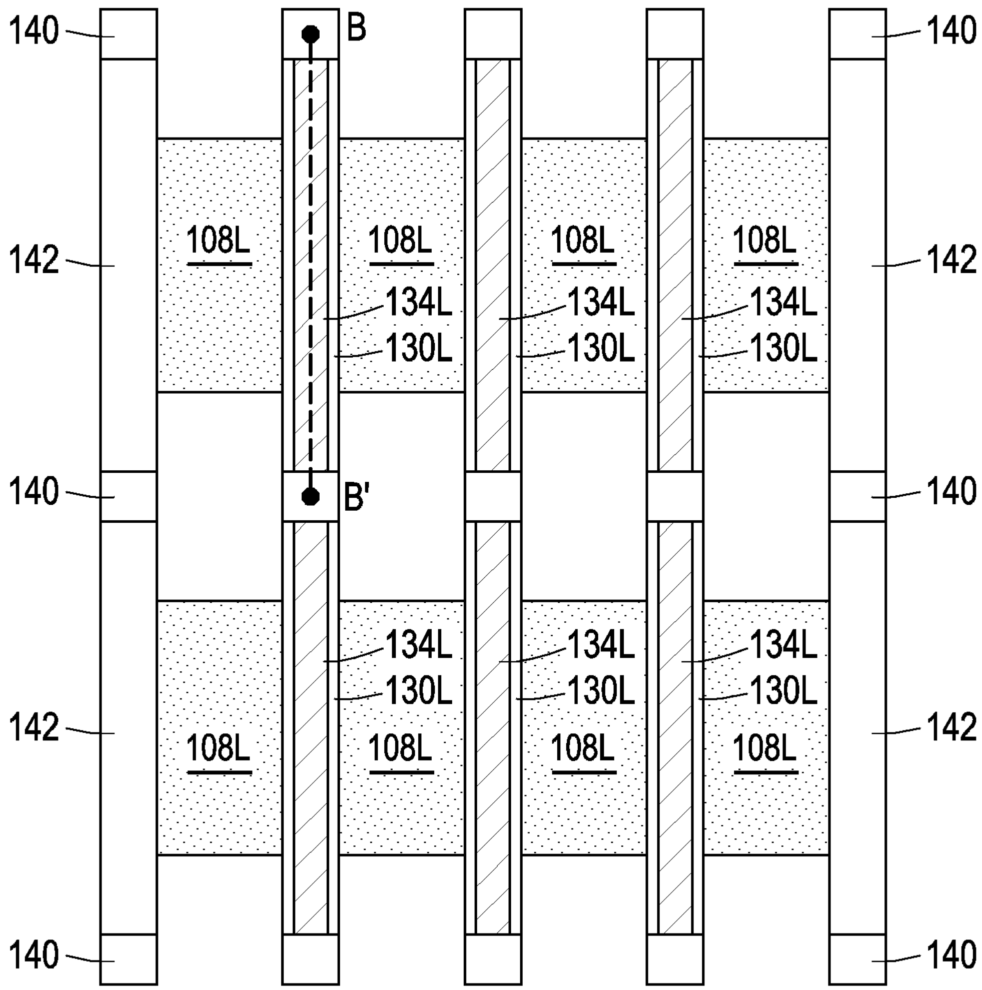

In FIG. 34, excess gate structures 130L/134L are removed based on a desired layout of the semiconductor chip. FIG. 34 illustrates a top-down view of the gate structures. The gate structures may by removed by any suitable photolithography and etching process(es). The etching process(es) may be selective to a material of the lower gate electrode 134L and the lower gate dielectric 130L, and the etching process(es) may etch the lower gate electrode 134L and the lower gate dielectric 130L at a faster rate than the CESL 122, the ILD 124, and the gate spacers 90L (see FIGS. 32A-32C). After the excess gate structures are removed, a dielectric material 140 may be deposited in the openings extending through the ILD 124. The dielectric material 140 may comprise silicon oxide, silicon nitride, or the like that is deposited by any suitable process, such as, CVD, ALD, or the like. The dielectric material 140 may or may not have a same material composition as the dielectric material 138.

Figure 35A:
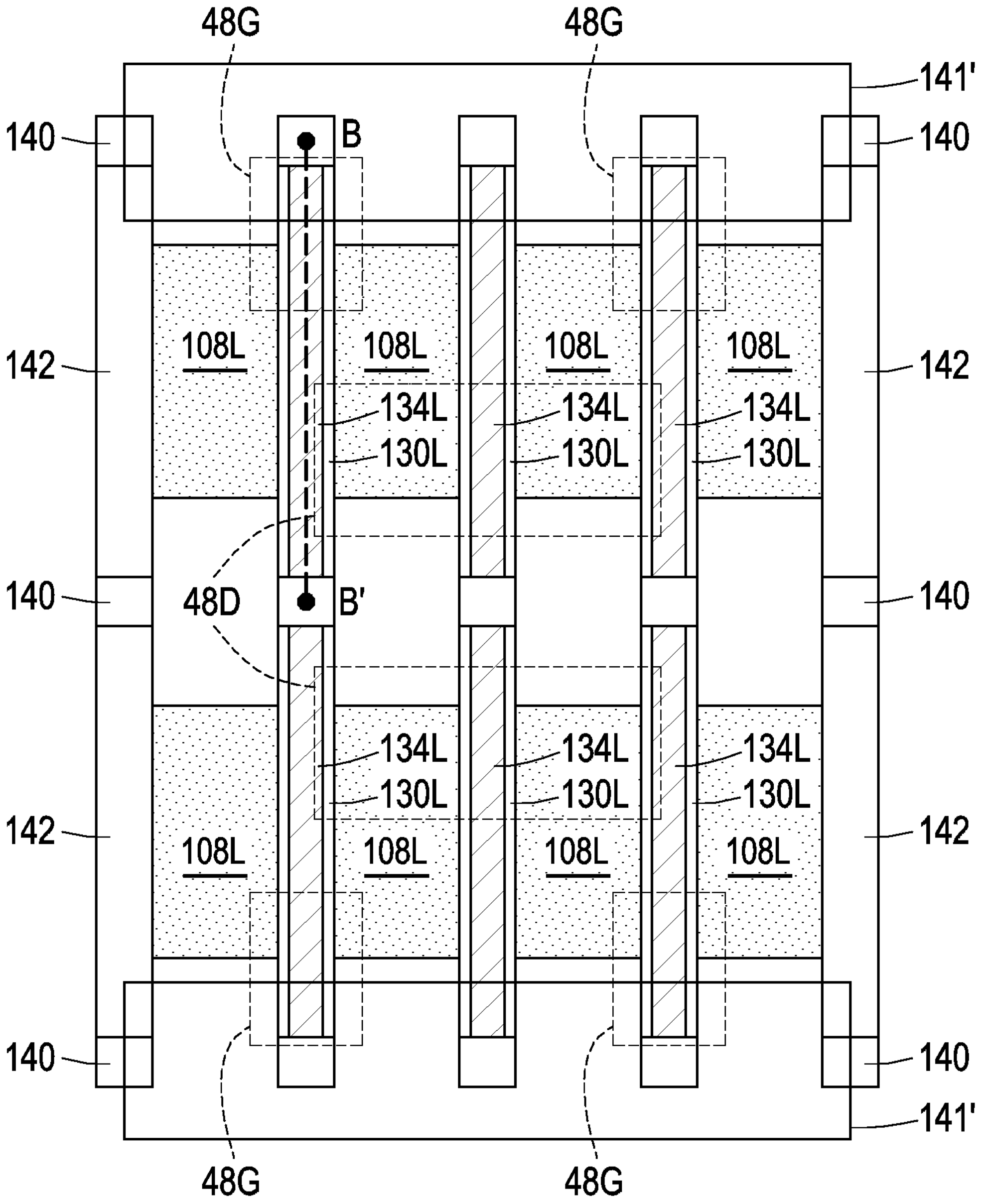
Figure 35B:
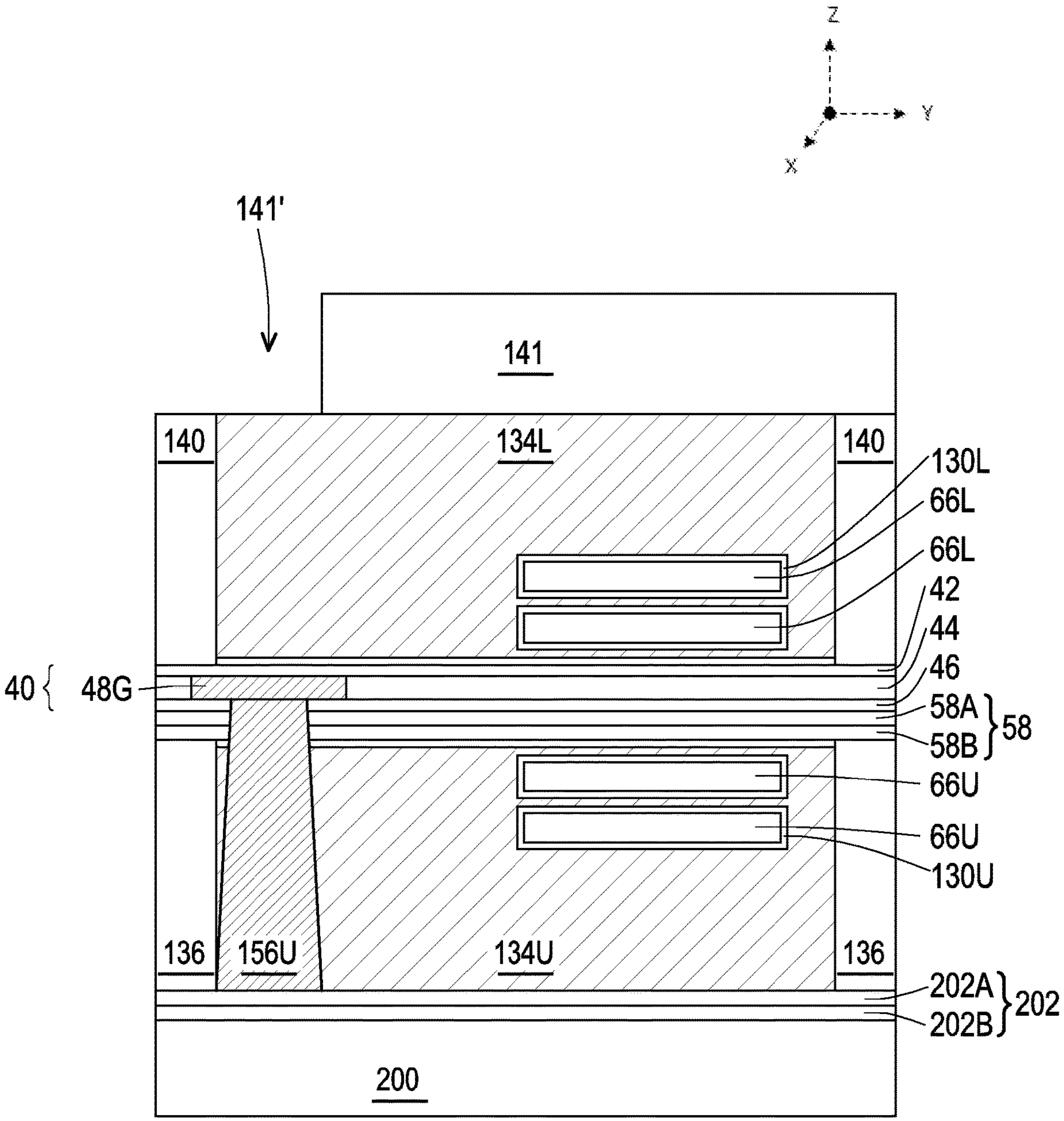

In FIGS. 35A-35B, a mask 141 is formed over the lower gate electrode 134L, the ILD 124, the CESL 122, and the lower gate spacers 90L. FIG. 35A illustrates a top-down view of the gate structures, and FIG. 35B illustrates a cross-sectional view along line B-B' of FIGS. 1 and 35A. In FIG. 35A, the position of underlying conductive lines 48 of the intermetal structure 40 is illustrated in dashed lines. The conductive lines 48 includes conductive lines 48G that interconnect gate contacts of the upper and lower transistors and conductive lines 48D that interconnect source/drain contacts of the upper and lower transistors.

The masks 141 may be deposited by PVD, CVD, sputter deposition, or other techniques for depositing the selected material. The mask 141 may include, for example, silicon nitride, silicon oxynitride, or the like. After deposition, the mask 141 may be patterned using acceptable photolithography and etching techniques to define openings 141' that expose the lower gate stacks 130L/134L. The openings 141' may further overlap with locations of the underlying the conductive lines 48G. In some embodiments, the openings 141' may further overlap with locations of the underlying upper gate contacts 156U.

In FIGS. 35A-35B, the openings 141' are slot patterns, and each of the openings 141' exposes a plurality of the lower gate stacks 130L/134L, the ILD 124, and the CESL 122. The openings 141' may further expose portions of the dielectric material 140 in some embodiments. In other embodiments, the openings 141' may not expose any of the dielectric material 140. A pattern of the openings 141' may be defined by photolithography using a 193 nm immersion lithography tool, for example. As will be explained subsequently in greater detail, the slot patterns of the openings 141' may be used in combination with a self-aligned patterning process to form gate contacts in the lower gate stacks 130L/134L.

Figure 36A:
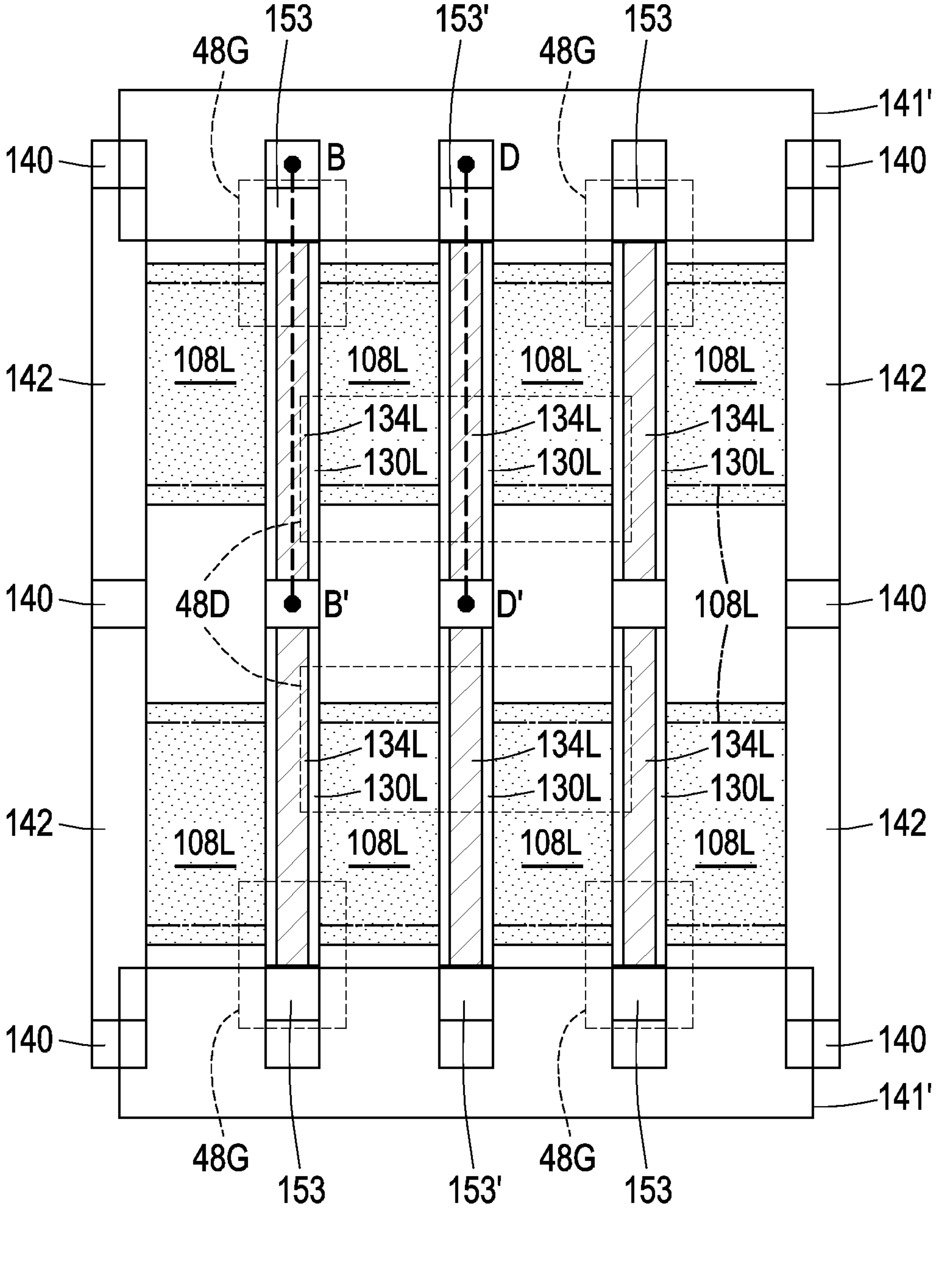
Figure 36B:
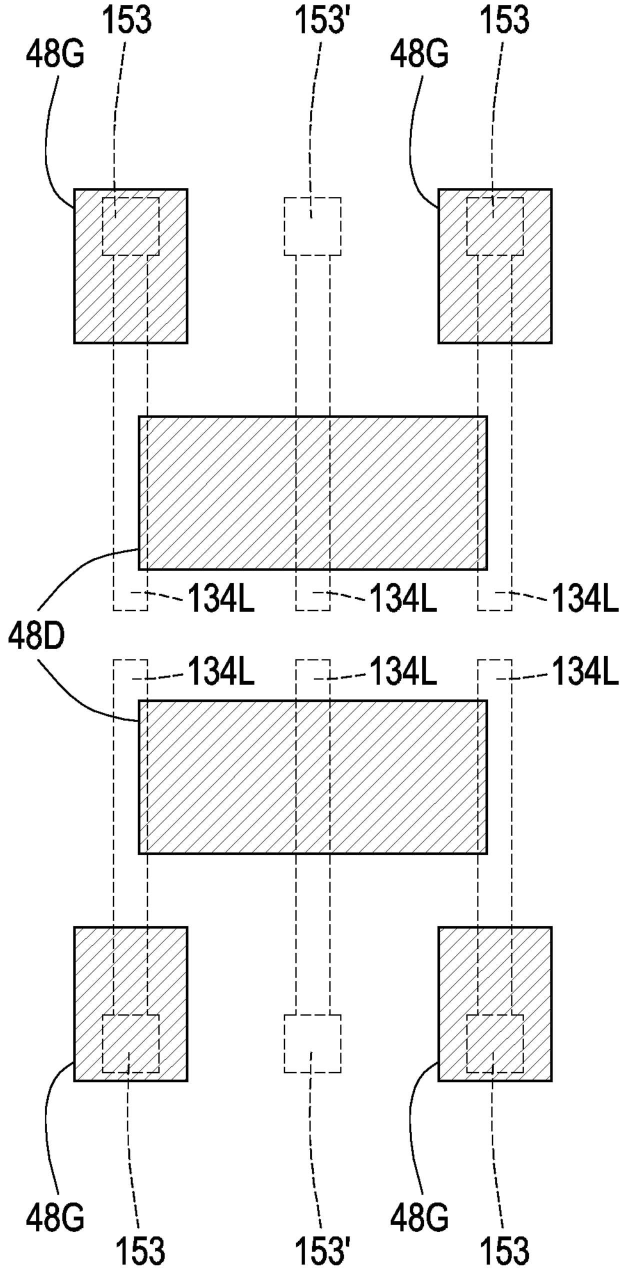
Figure 36C:
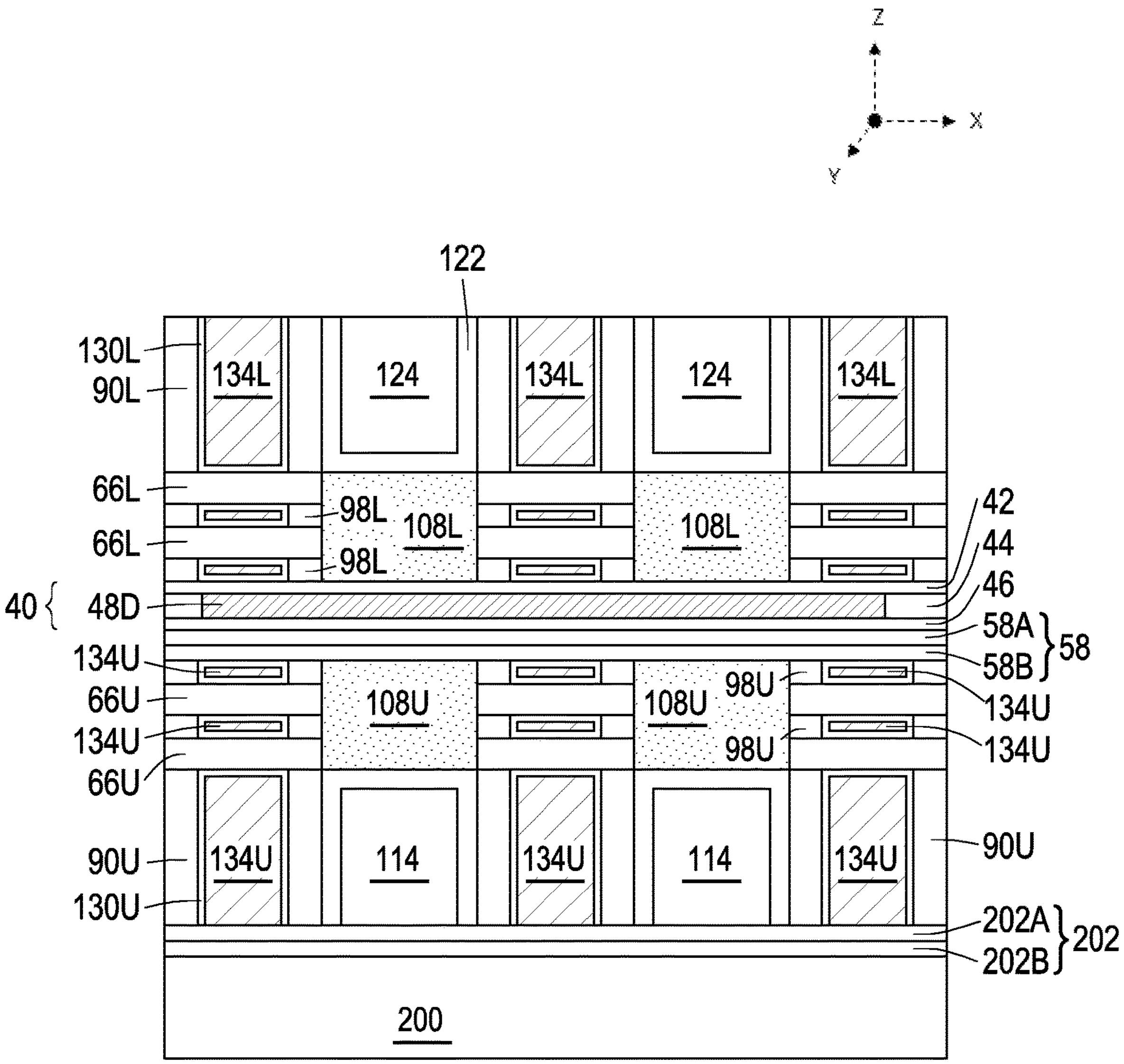
Figure 36D:
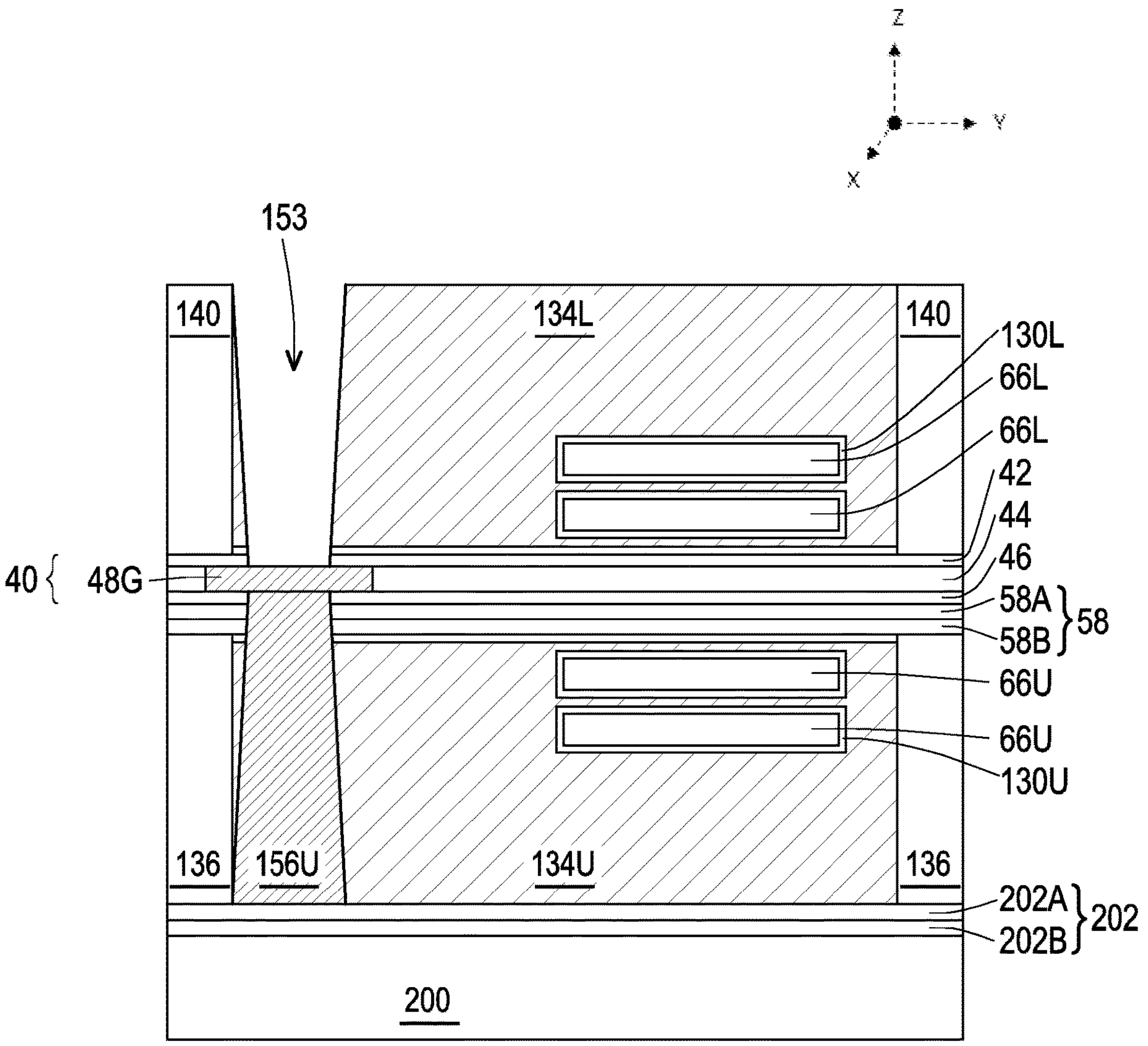
Figure 36E:
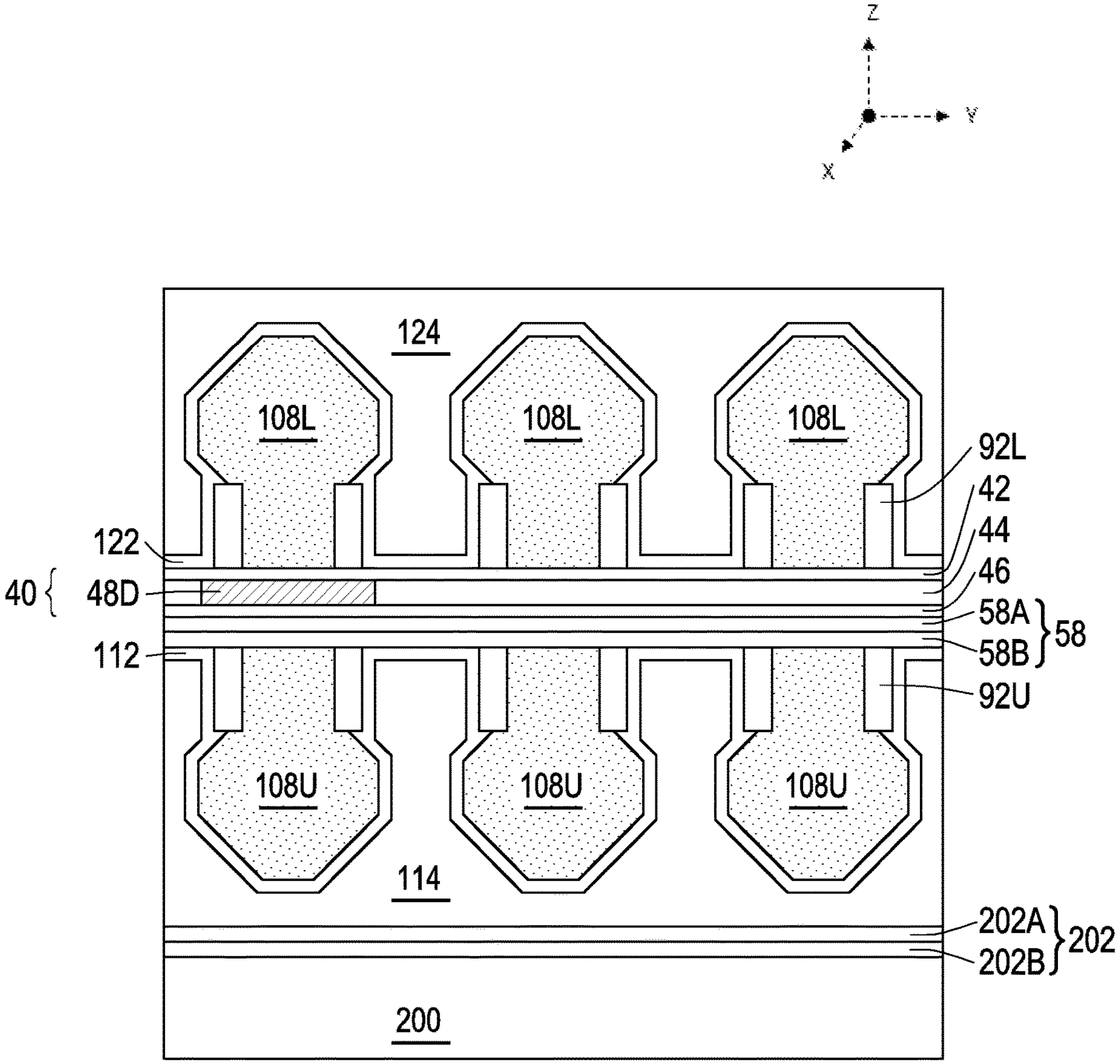
Figure 36F:
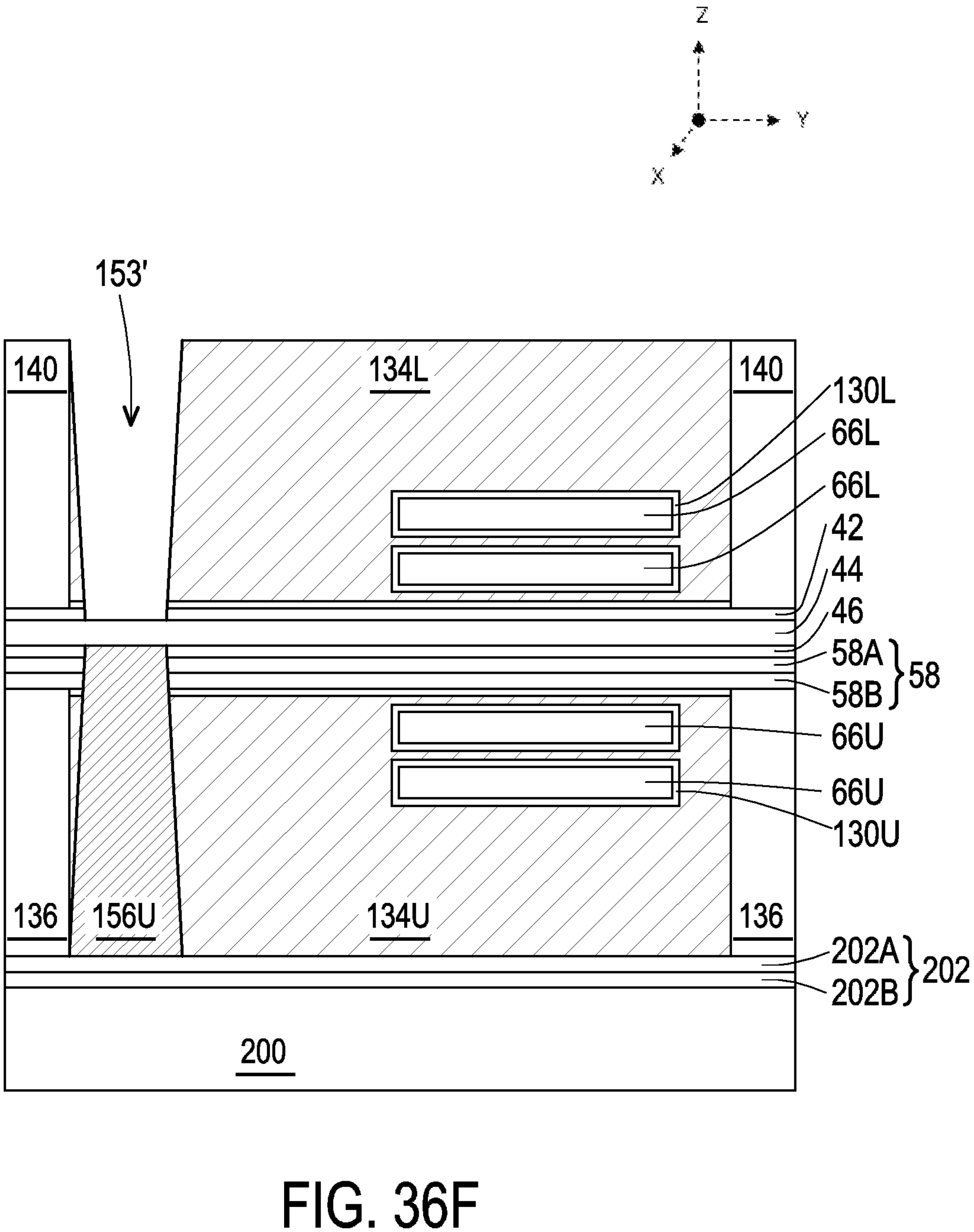

In FIGS. 36A-36F, openings 153 and 153' for lower gate contacts may be formed through the lower gate stacks 130L/134L. FIG. 36A illustrates a top-down view of the gate structures, and FIG. 36B illustrates a top-down view of the conductive lines 48 of the intermetal structure 40. Certain features are omitted from FIGS. 36A and 36B for clarity. In FIG. 36A, the position of underlying conductive lines 48 of the intermetal structure 40 is illustrated in dashed lines, and in FIG. 36B, the positions of overlying gate electrodes 134L and openings 153/153' are illustrated in dashed lines. The conductive lines 48 includes conductive lines 48G that interconnect gate contacts of the upper and lower transistors and conductive lines 48D that interconnect source/drain contacts of the upper and lower transistors. FIG. 36C illustrates a cross-sectional view along line A-A' of FIG. 1; FIG. 36D illustrates a cross-sectional view along line B-B' of FIGS. 1 and 36A; FIG. 36E illustrates a cross-sectional view along line C-C' of FIG. 1; and FIG. 36F illustrates a cross-sectional view along line D-D' of FIG. 36A.

The openings 153 and 153' may be formed using acceptable etching techniques using the mask 141 to define the patterns of the openings 153 and 153'. Specifically, the mask 141 exposes portions of the gate stacks 130L/134L, and one or more etching processes may be applied to etch through the gate stacks 130L/134L. The etching processes may be a selective process that etches the material of the gate electrodes 134L and the gate dielectrics 130L at a faster rate than the CESL 122, the ILD 124, the gate spacers 90L, and the dielectric material 140. As a result, the openings 153 and 153' may be selectively formed in the gate stacks even when the openings 141' of the mask 141 also expose the CESL 122, the ILD 124, the gate spacers 90L, and the dielectric material 140.

After the gate stacks 130L/134L are patterned, the openings 153 and 153' may be extended through the etch stop layer 42. In some embodiments, etching the etch stop layer 42 may be a selective etching process that selectively removes the etch stop layer 42 at a faster rate than the dielectric layer 44.

The openings 153 exposes the conductive lines 48G while bottom surfaces of the openings 153' are completely covered by the dielectric layer 44. FIG. 36D illustrates cross-sectional views of the openings 153, and FIG. 36F illustrates cross-sectional views of the openings 153'. The openings 153 are formed in lower gate stacks 130L/134L that will be electrically connected to corresponding upper gate stacks 130U/134U through the conductive lines 48G (also referred to as a common gate configuration). Further, the openings 153' are formed in lower gate stacks 130L/134L that will be isolated from subsequently corresponding upper gate stacks 130U/134U (also referred to as a split gate configuration). Hence, the openings 153' do not expose any conductive lines in the intermetal structure 40. Although FIGS. 36A-36F illustrate particular locations for the openings 153 and 153', the specific location of the openings 153 and 153' may vary depending on circuit design.

Figure 37A:
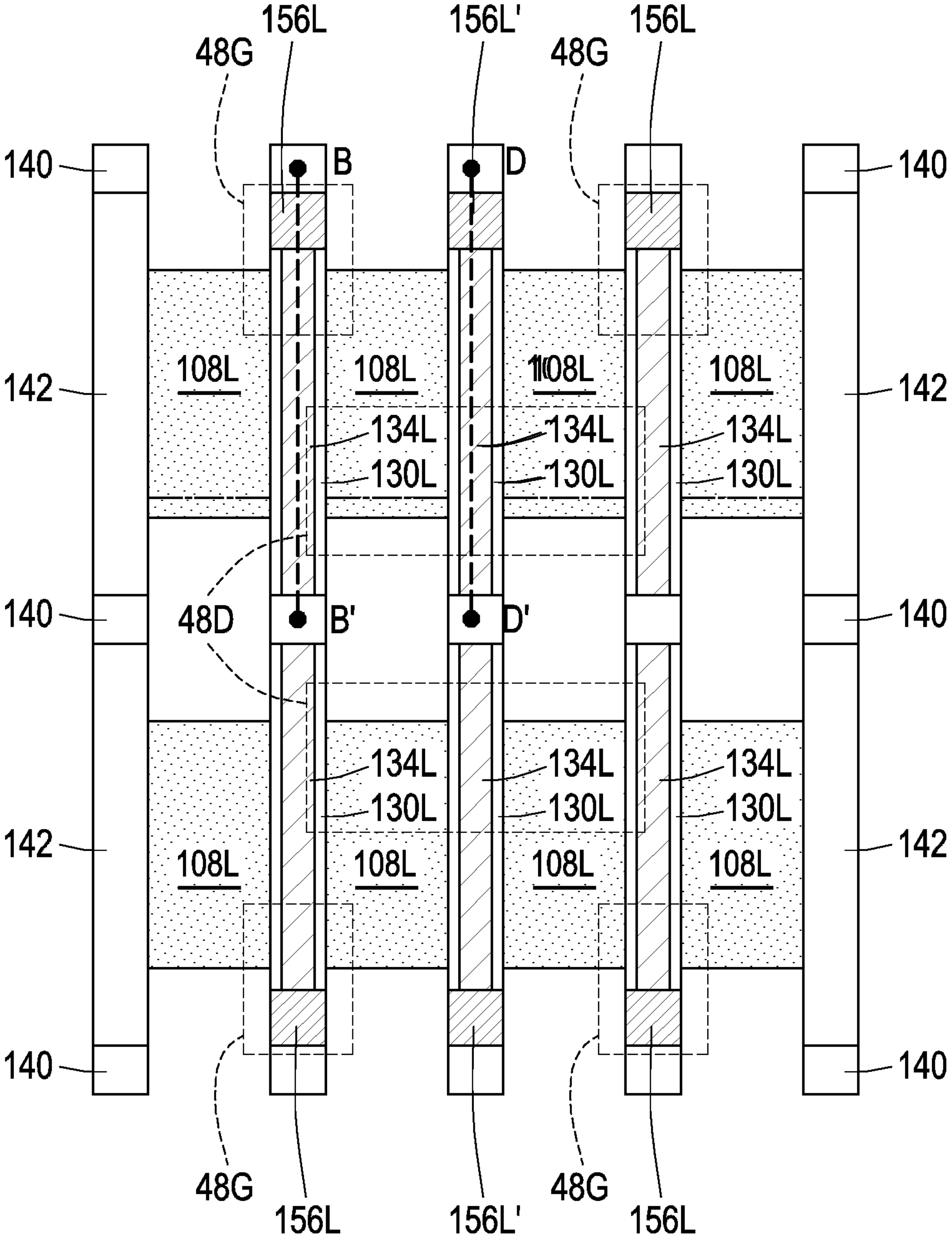
Figure 37B:
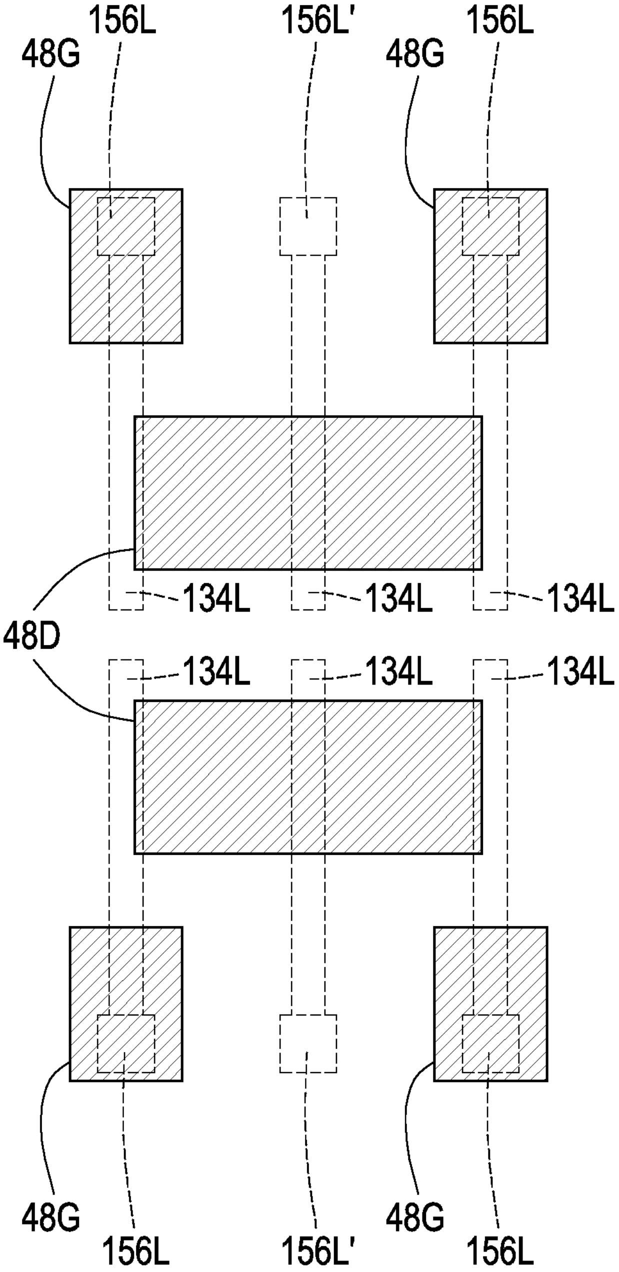
Figure 37C:
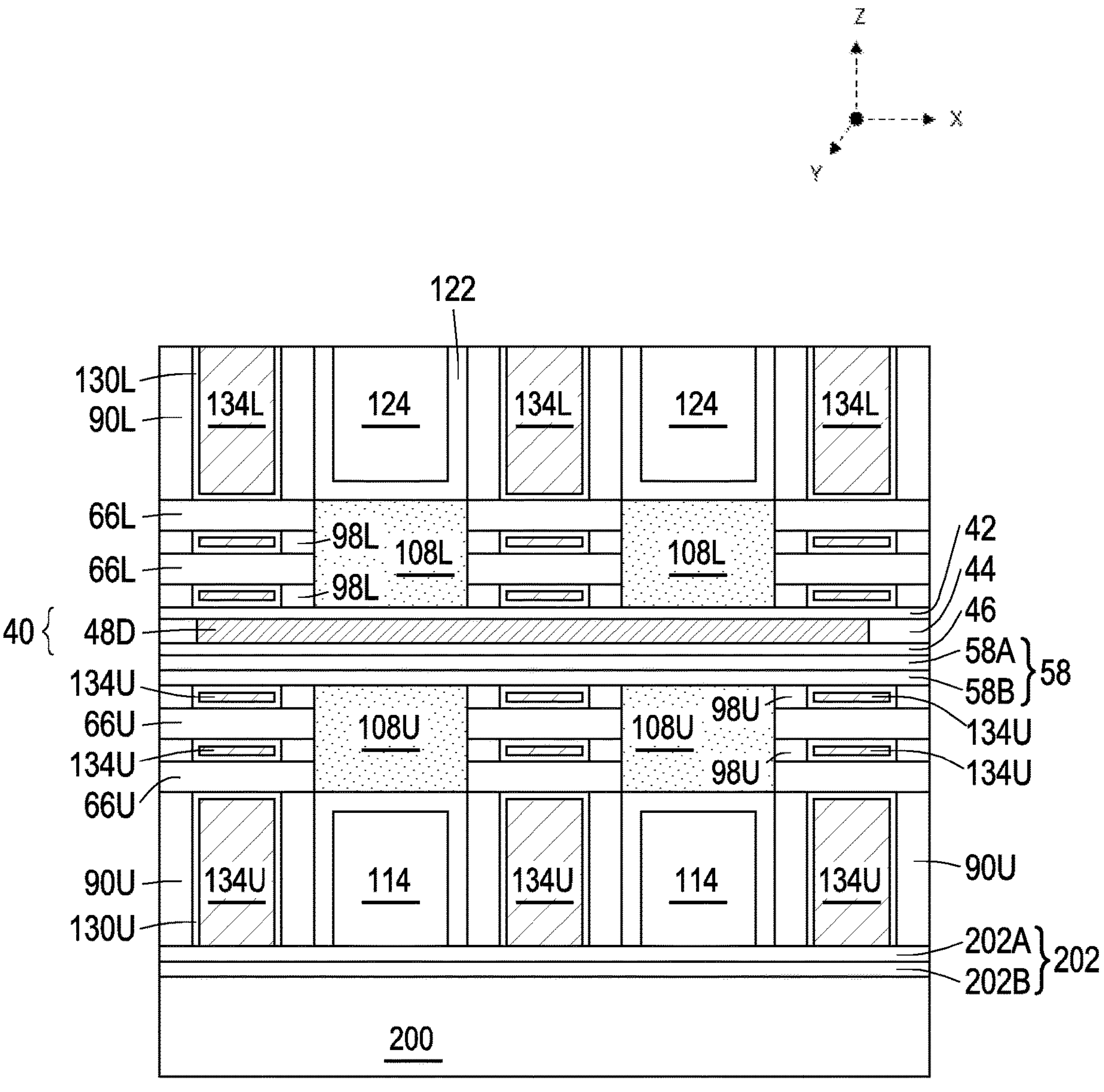
Figure 37D:
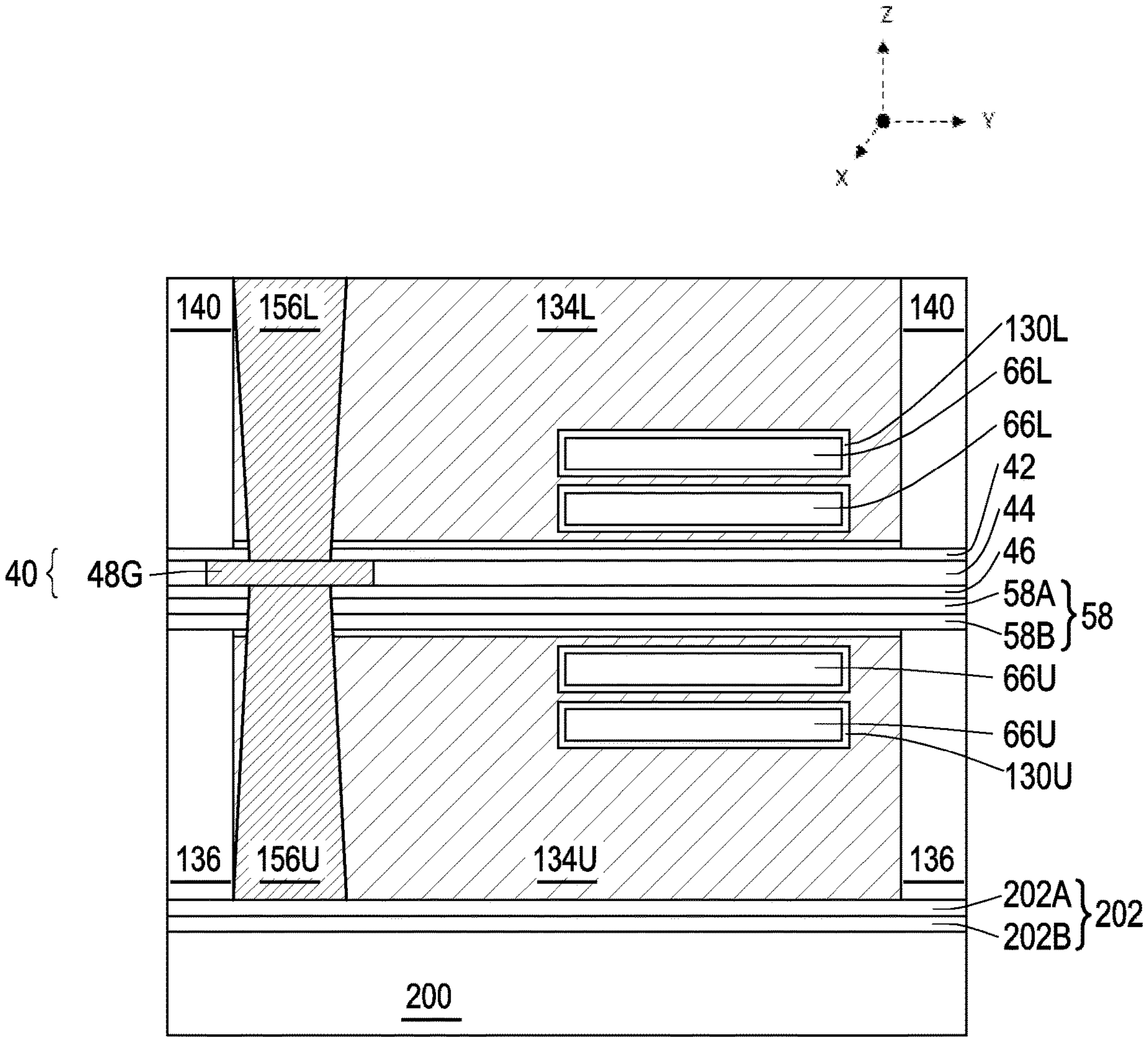
Figure 37E:
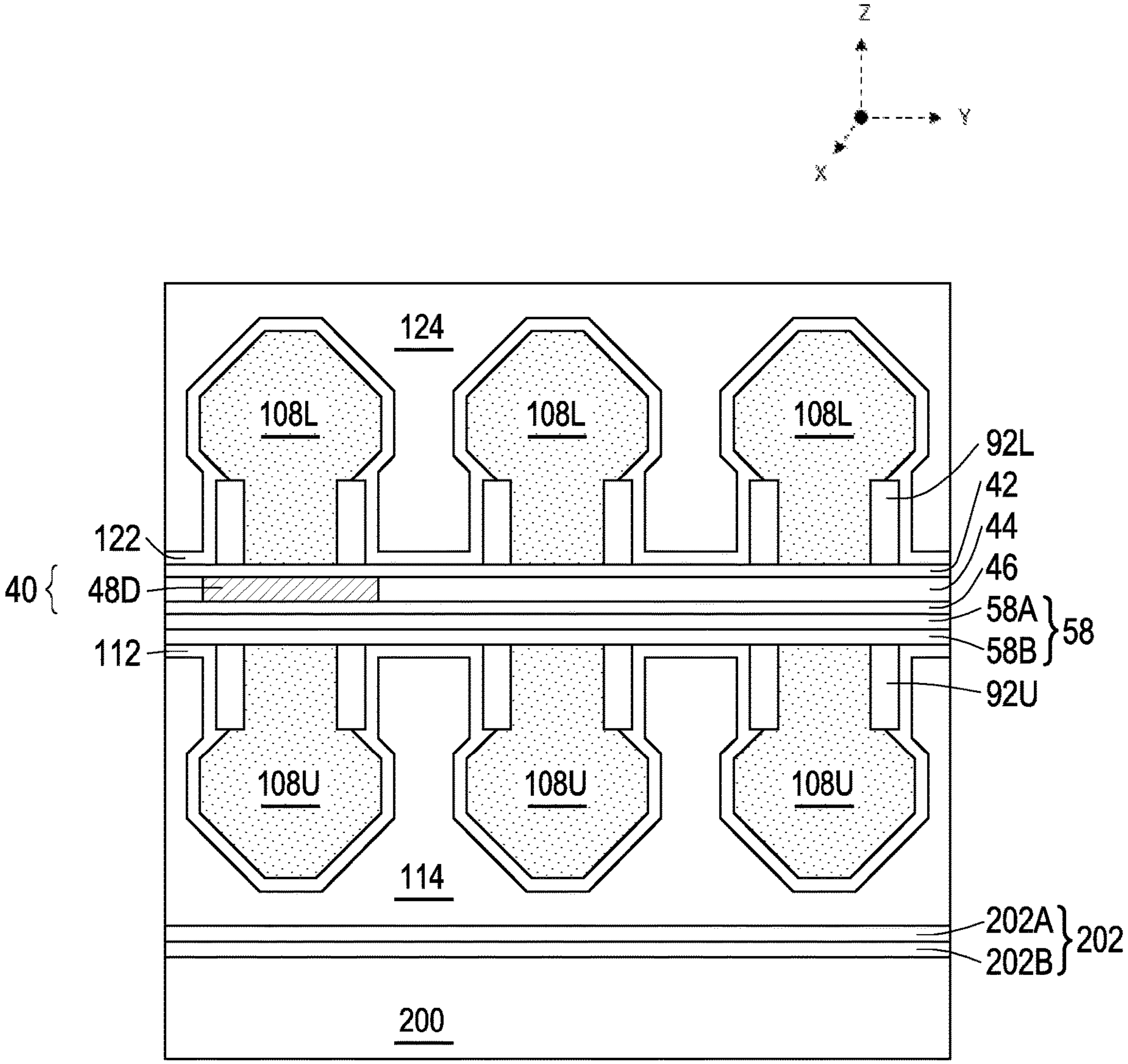
Figure 37F:
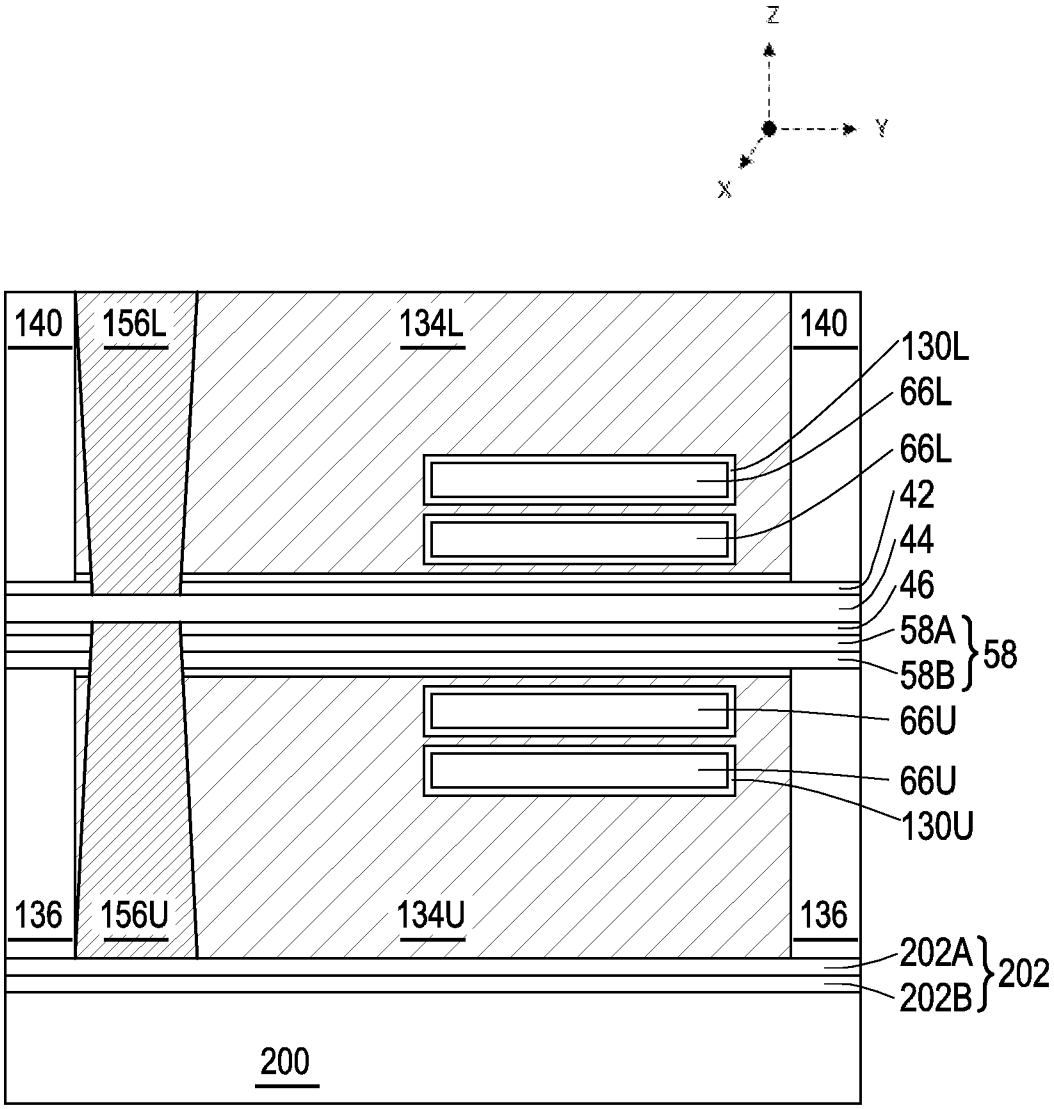

In FIGS. 37A-37F, lower gate contacts 156L and lower gate contacts 156L' are formed in the openings 153 and 153', respectively. The lower gate contacts 156L/156L' may extend along sidewalls of the lower gate electrodes 134L from top surfaces of the lower gate electrodes 134L to the conductive line 48G. FIG. 37A illustrates a top-down view of the gate structures, and FIG. 37B illustrates a top-down view of the conductive lines 48 of the intermetal structure 40. Certain features are omitted from FIGS. 37A and 37B for clarity. In FIG. 37A, the position of underlying conductive lines 48 of the intermetal structure 40 is illustrated in dashed lines, and in FIG. 37B, the positions of overlying gate electrodes 134L, the lower gate contacts 156L, and the lower gate contacts 156L' are illustrated in dashed lines. The conductive lines 48 includes conductive lines 48G that interconnect the upper gate contacts 156U of the upper transistors to the lower gate contacts 156L of the lower transistors. FIG. 37C illustrates a cross-sectional view along line A-A' of FIG. 1; FIG. 37D illustrates a cross-sectional view along line B-B' of FIGS. 1 and 37A; FIG. 37E illustrates a cross-sectional view along line C-C' of FIG. 1; and FIG. 37F illustrates a cross-sectional view along line D-D' of FIG. 37A.

In some embodiments, a liner (not separately illustrated), such as a diffusion barrier layer, an adhesion layer, or the like, and a conductive material are formed in the openings 153 and 153'. The liner may include titanium, titanium nitride, tantalum, tantalum nitride, or the like, which may be deposited by PVD, CVD, ALD, electroplating or the like. Then, a conductive material is deposited over the liner. The conductive material may be a relatively low resistance material, such as tungsten, cobalt, ruthenium, or the like, which may be deposited by PVD, CVD. ALD, electroplating or the like. A planarization process, such as a CMP, may be performed to remove excess material from the top surfaces of the ILD 124. The planarization process may further remove the mask 141 in some embodiments. The remaining liner and conductive material form the lower gate contacts 156L and the lower gate contacts 156L'. By forming the lower gate contacts 156L of a relatively low resistance material (e.g., tungsten, cobalt, ruthenium, or the like), contact resistance of the gate connection can be advantageously reduced.

The lower gate contacts 156L are electrically connected to the conductive lines 48G. In contrast, the lower gate contacts 156L' are not electrically connected to any features in the intermetal structure 40, and bottom surfaces of the lower gate contacts 156L' are completely covered by the dielectric layer 44. The dielectric layer 44 electrically insulates the lower gate contacts 156L' from the overlapping upper gate contacts 156U'. FIG. 37D illustrates cross-sectional views of the lower gate contacts 156L, and FIG. 37F illustrates cross-sectional views of the lower gate contacts 156L'. The lower gate contacts 156L, the conductive lines 48G, and the upper gate contacts 156U electrically connect lower gate stacks 130L/134L to corresponding upper gate stacks 130U/134U (also referred to as a common gate configuration). Further, the lower gate contacts 156L' are formed in lower gate stacks 130L/134L that will be isolated from overlapping upper gate stacks 130U/134U (also referred to as a split gate configuration). Thus, using a combination of selective etching processes and a layout of conductive lines in the intermetal structure 40, the gates of the upper and lower transistors can be electrically interconnected by gate contacts formed by a self-aligned process with slot-type masks.

Although FIGS. 37A-37F illustrate particular locations for the gate contacts 156L and 156L', the specific location of the gate contacts 156L and 156L' may vary depending on circuit design. For example, in the illustrated configuration, the lower gate contacts 156L and the lower gate contacts 156L' overlaps the upper gate contacts 156U and the upper gate contacts 156U', respectively. In other embodiments, the lower gate contacts 156L and the lower gate contacts 156L' may not overlap the upper gate contacts 156U and the upper gate contacts 156U', respectively.

Figure 38A:
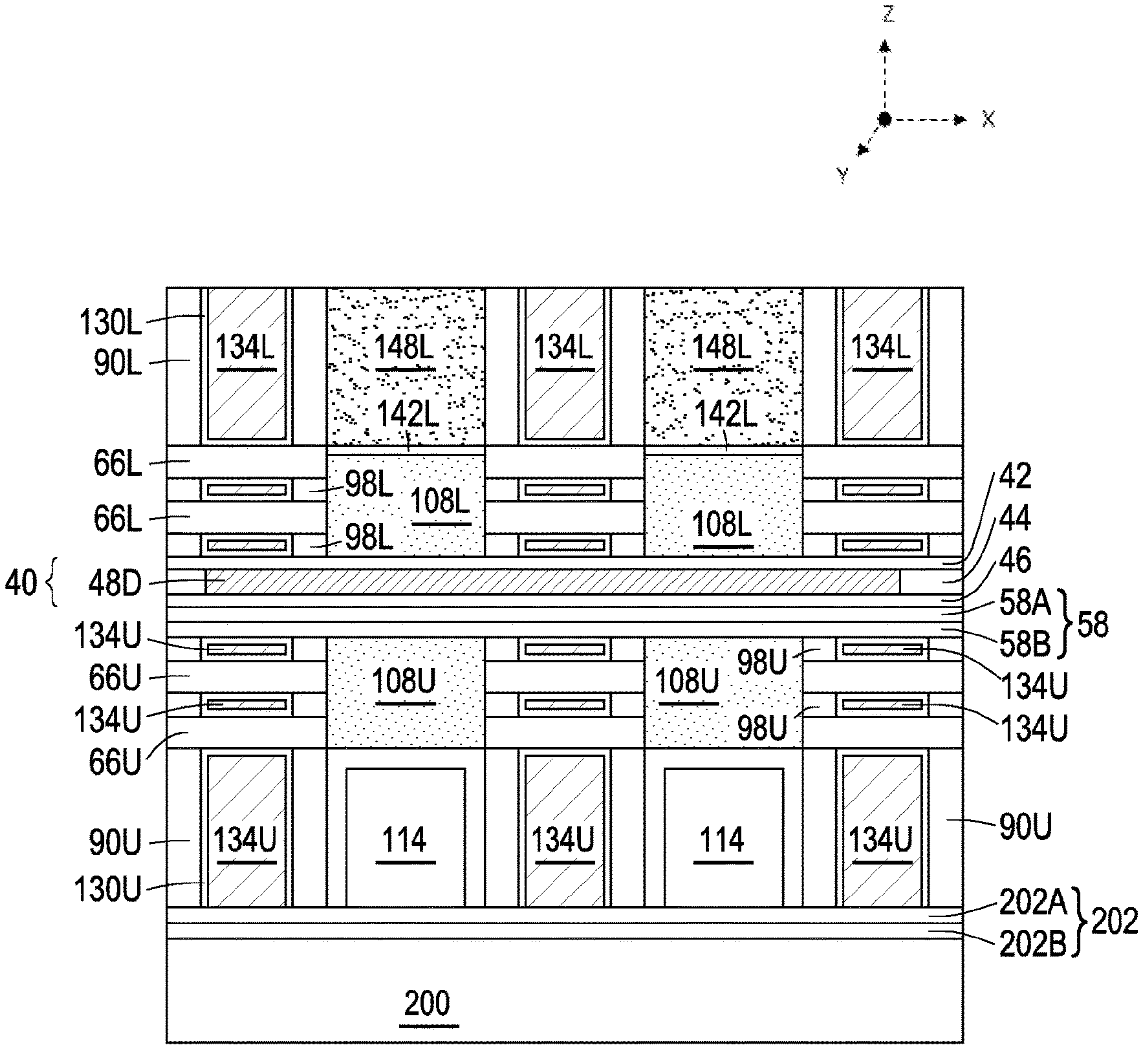
Figure 38B:
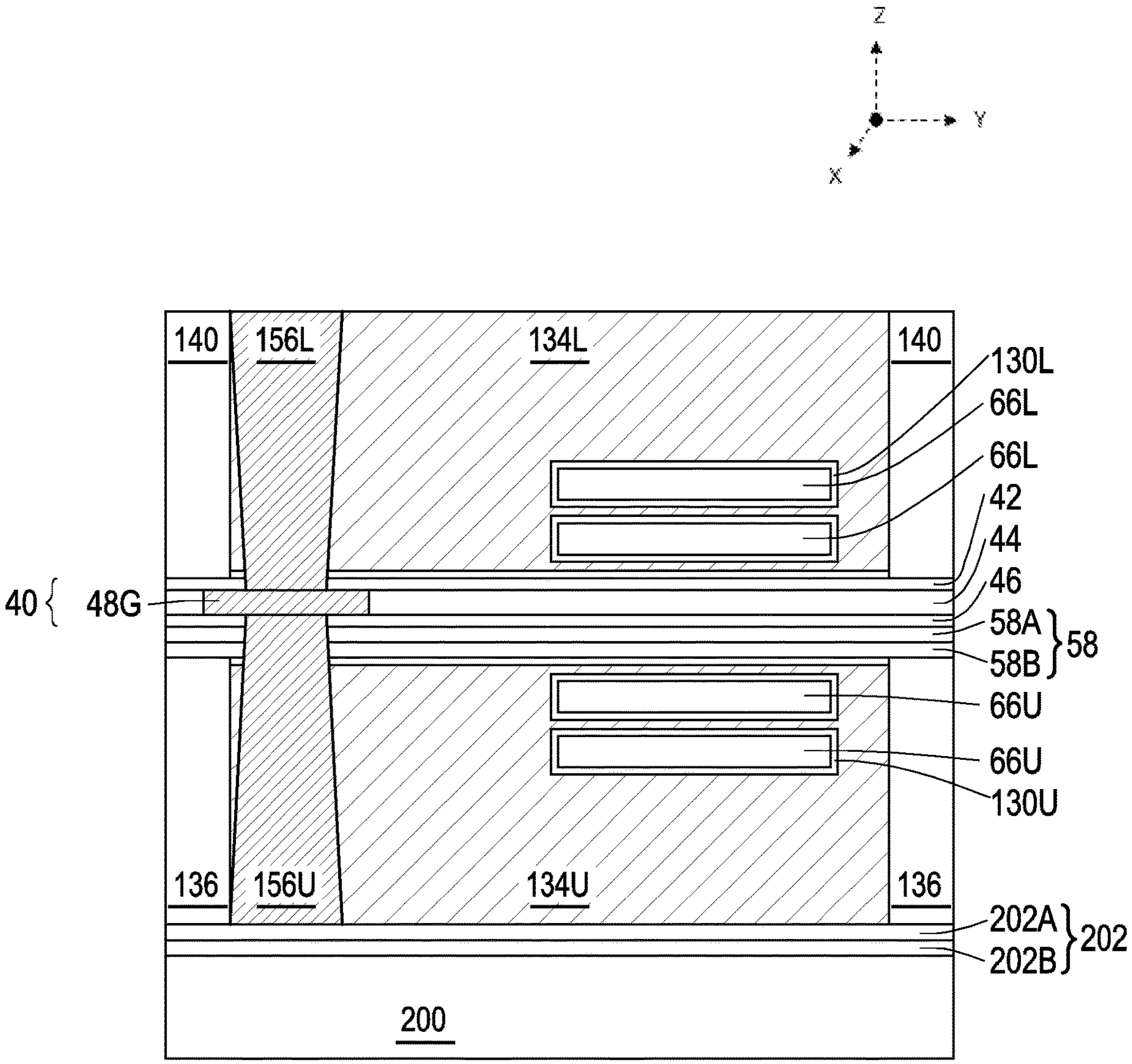
Figure 38C:
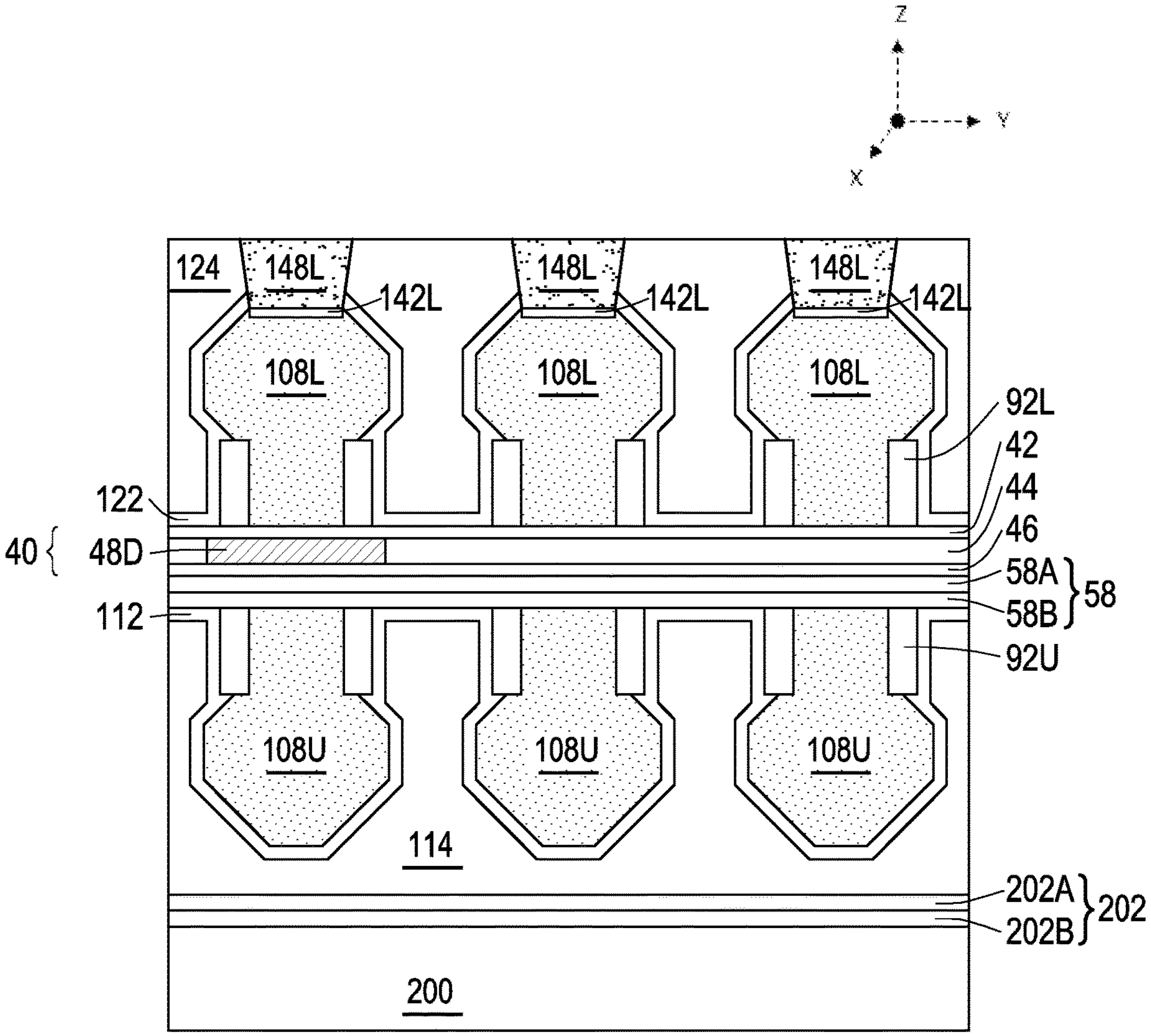

In FIGS. 38A-40E, lower source/drain contacts 148L and 144L are formed to the lower source/drain regions 108L. Referring first to FIGS. 38A-38C, the lower source/drain contacts 148L are formed through the ILD 124 and the CESL 122 to electrically connect to the lower source/drain regions 108L. Specifically, recesses may be formed in the ILD 124 and the CESL 122 that expose the lower source/drain regions 108L. Lower silicide regions 142L are formed over the lower source/drain regions 108L in the bottom of the recesses. In some embodiments, the lower silicide regions 142L are formed by first depositing a metal (not separately illustrated) capable of reacting with the semiconductor materials of the underlying lower source/drain regions 108L (e.g., silicon, silicon germanium, or germanium) to form silicide or germanide regions, such as nickel, cobalt, titanium, tantalum, platinum, tungsten, other noble metals, other refractory metals, rare earth metals or their alloys, over the exposed portions of the lower source/drain regions 108L, then performing a thermal anneal process to form the lower silicide regions 142L. The un-reacted portions of the deposited metal are then removed, e.g., by an etching process.

Then, the lower source/drain contacts 148L are deposited to fill remaining portions of the recesses over the lower silicide 142L. The lower source/drain contacts 148L may each comprise one or more layers, such as barrier layers, diffusion layers, and fill materials. For example, in some embodiments, the lower source/drain contacts 148L include a barrier layer and a conductive material. The lower source/drain contacts 148L are electrically coupled to the lower silicide regions 142L. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the ILD 124.

Figure 39A:
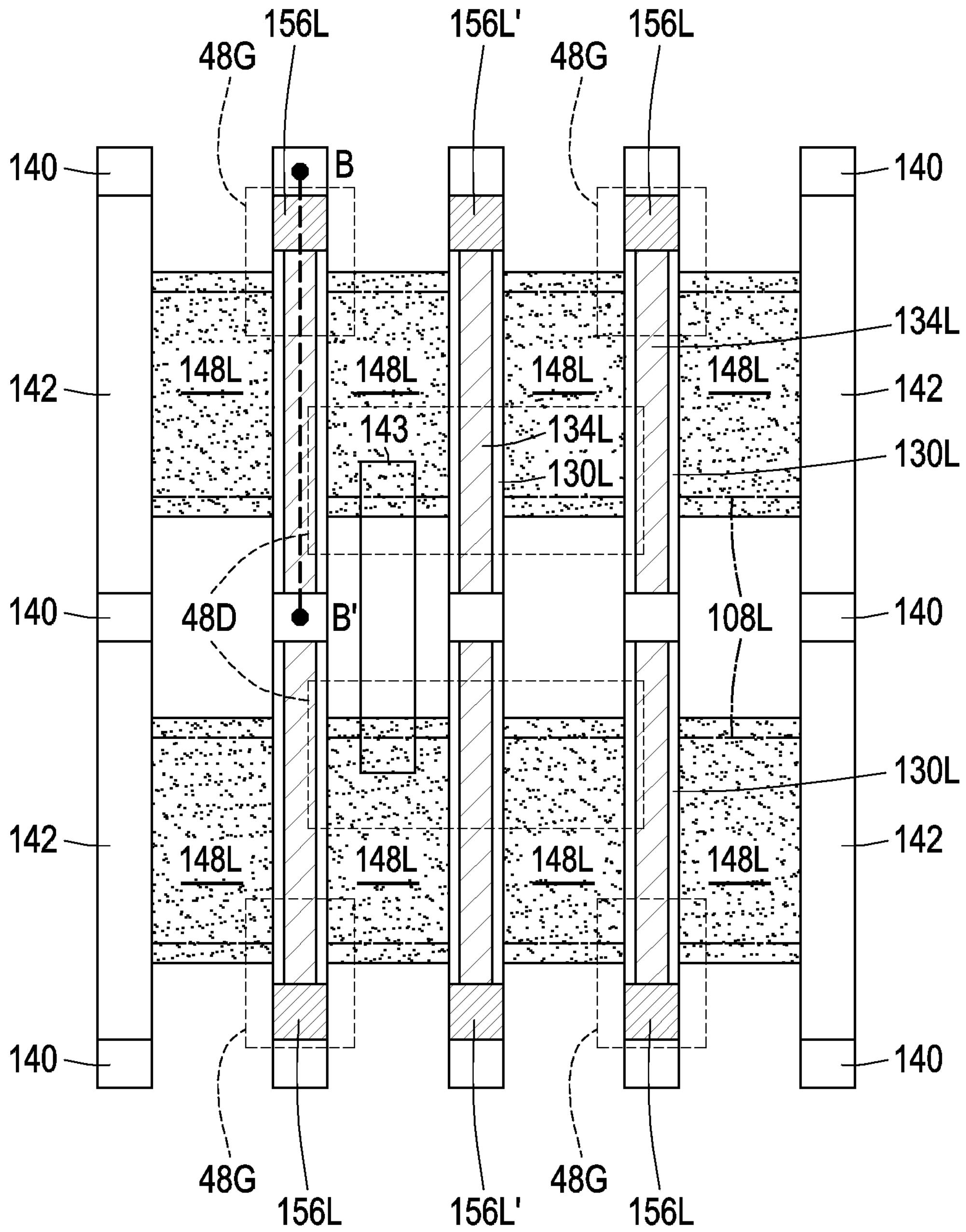

In FIGS. 39A-40E, lower source/drain contacts 144L are formed extending through desired ones of the lower source/drain contacts 148L and desired ones of the lower source/drain regions 108L to physically touch the conductive line 48D. The lower source/drain contacts 144L may be formed from similar materials and using a similar process as described above with respect to the upper gate contacts 156U and the lower gate contacts 156L. Specifically, a mask may be formed over ILD 124 and the lower source/drain regions 108L as illustrated by the top down views of FIGS. 39A-39B. Certain features may be omitted from FIGS. 39A-39B for simplicity. FIGS. 39A and 39B illustrate top-down views of the gate of the lower gate structures, and the locations of conductive lines 48 (including conductive lines 48G and 48D) and the lower source/drain regions 108L are indicated by dashed lines for reference.

Figure 39B:
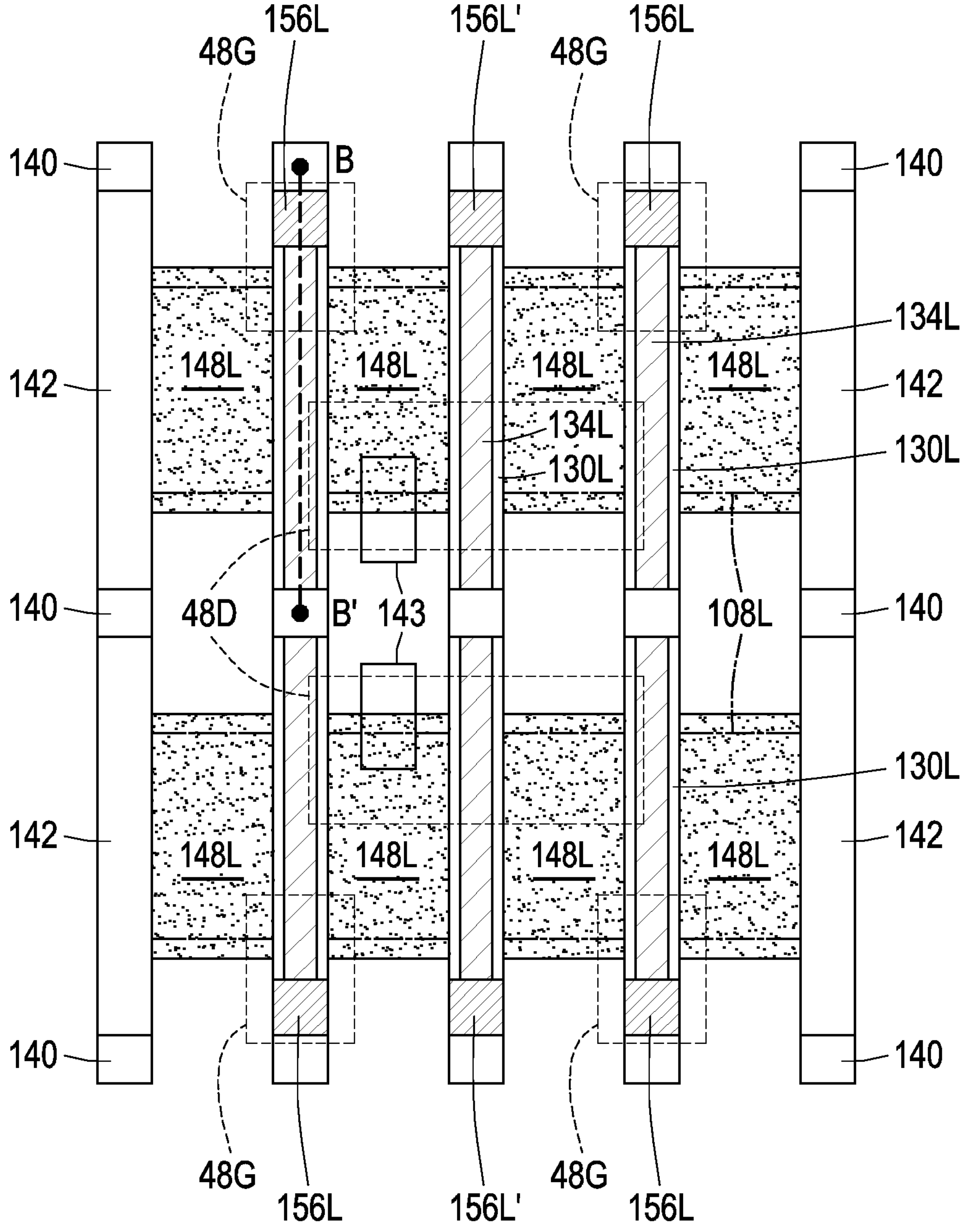

In FIGS. 39A-39B, the location of openings 143 in the mask are illustrated. Areas other than the openings 143 may be covered by the mask. The mask may be formed of a similar material using a similar process as described above with respect to masks 139 and 141. Each of the openings 143 may overlap with the conductive lines 48D and one or more of the lower source/drain regions 108L and lower source/drain contacts 148L. Specifically, FIG. 39A illustrates embodiments where the opening 143 of the mask overlaps multiple lower source/drain regions 108L and multiple lower source/drain contacts 148L. For example, the openings 143 can extend across multiple transistors or ever across multiple cells (e.g., memory cells, logic cells, or the like). In other embodiments, illustrated by FIG. 39B, each of the openings 143 only overlaps a single one of the lower source/drain regions 108L and lower source/drain contacts 148L. The openings 143 may be formed by a combination of photolithography (e.g., using a 193 nm immersion lithography tool, an extreme ultraviolet lithography (EUV) tool, or the like) and etching.

A pattern of the openings 143 may then be transferred to the underlying lower source/drain regions 108L and lower source/drain contacts 148L using one or more suitable etching processes, for example. In some embodiments, the etching processes may be selective to the material of the lower source/drain contacts 148L and the lower source/drain regions 108L. For example, the etching processes may etch exposed portion of the lower source/drain contacts 148L and the lower source/drain regions 108L without significantly etching the ILD 124 or the CESL 122. The patterning of the openings 143 may further be extended through the etch stop layer 42 (see FIGS. 40C and 40E) to expose the conductive line 48D. In some embodiments, etching the etch stop layer 42 may be a selective etching process that selectively removes the etch stop layer 42 at a faster rate than the dielectric layer 44.

Figure 40A:
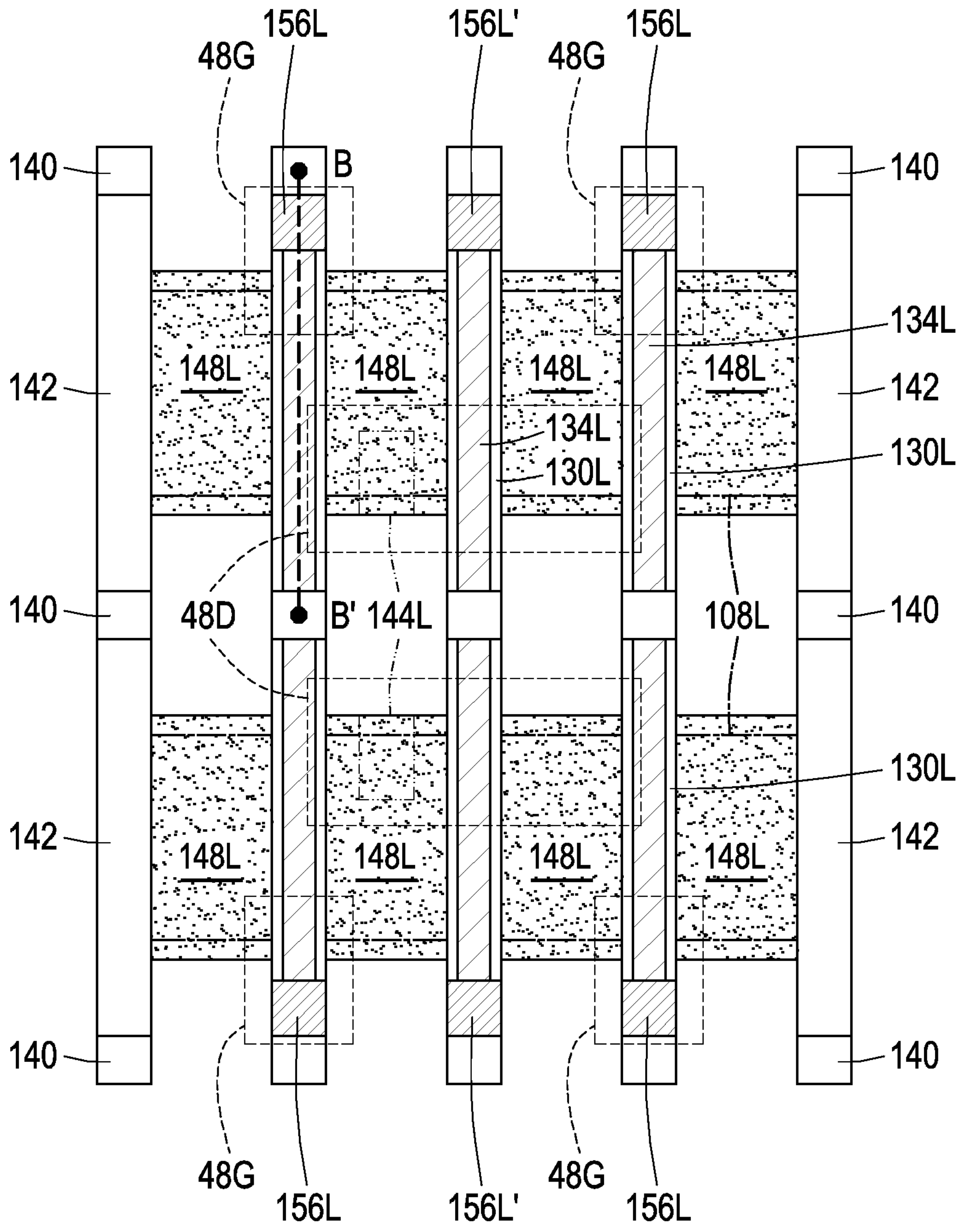
Figure 40B:
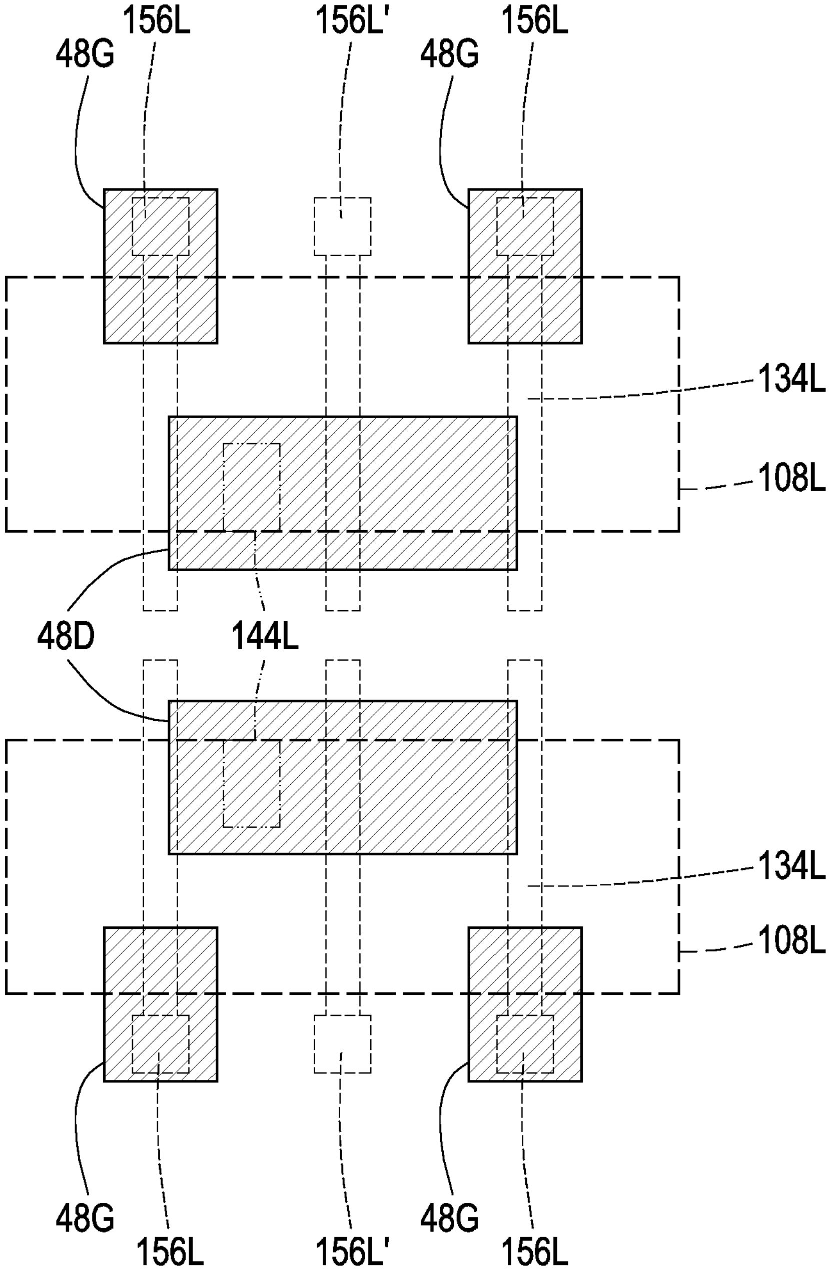
Figure 40C:
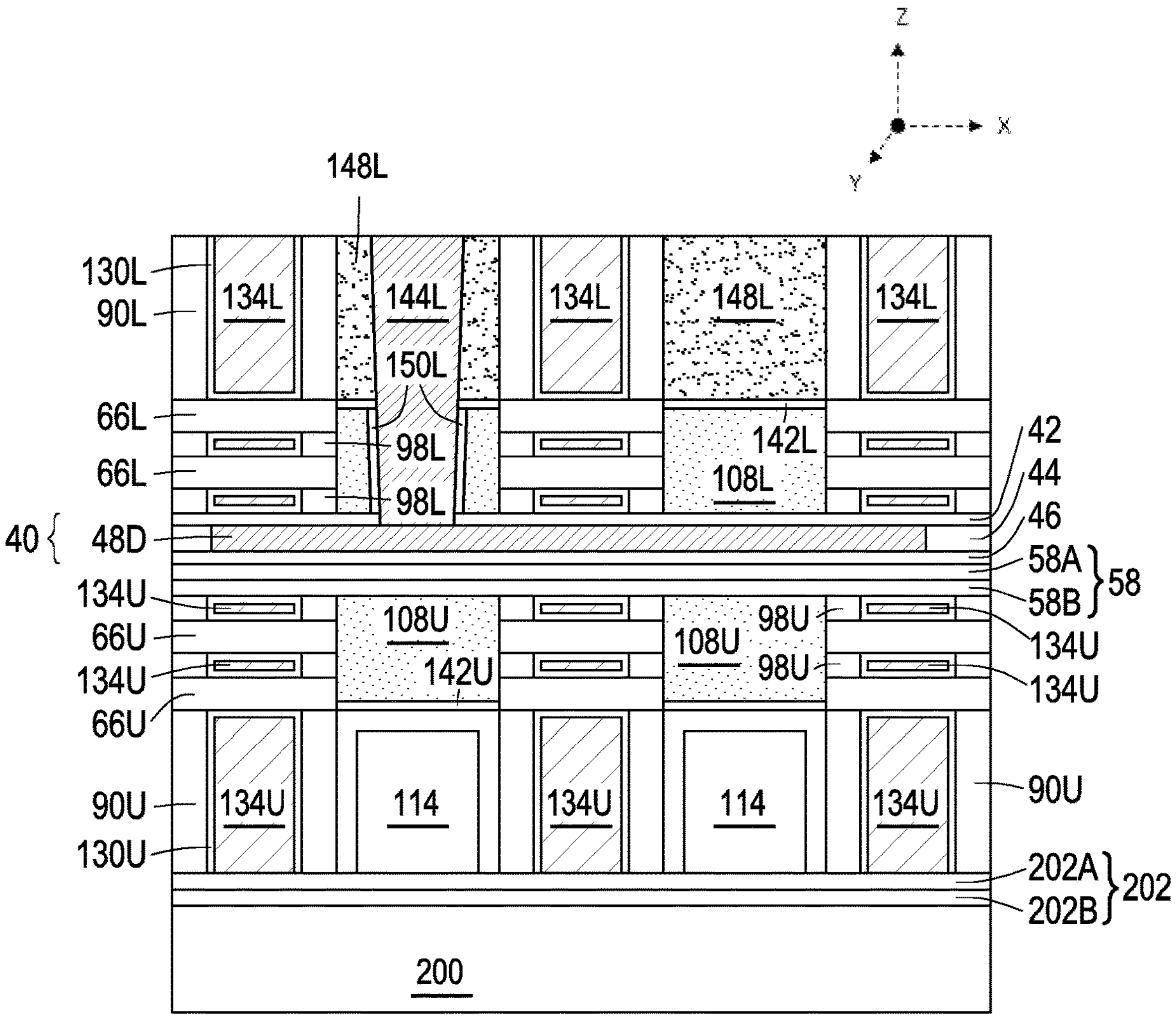
Figure 40D:
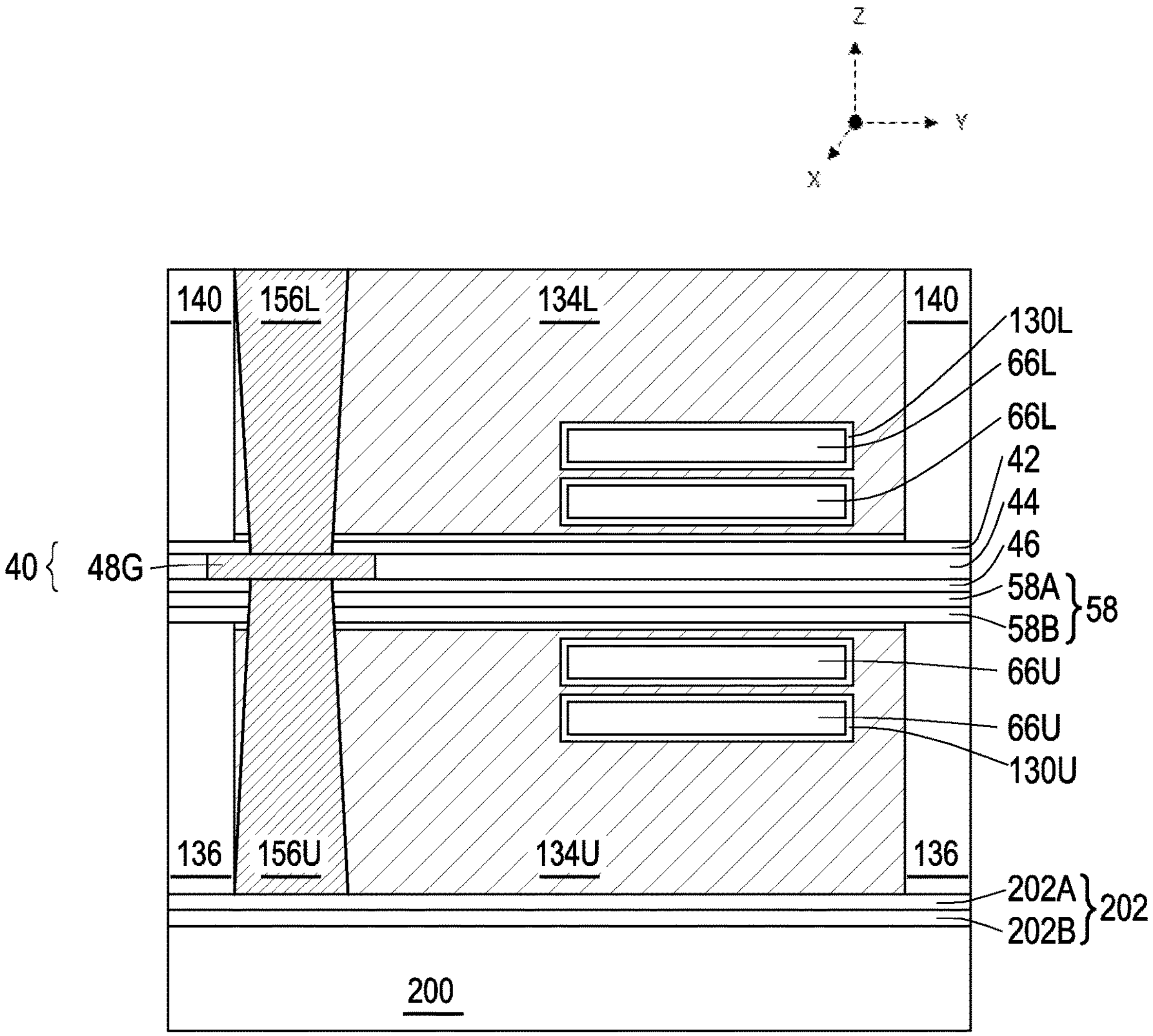
Figure 40E:
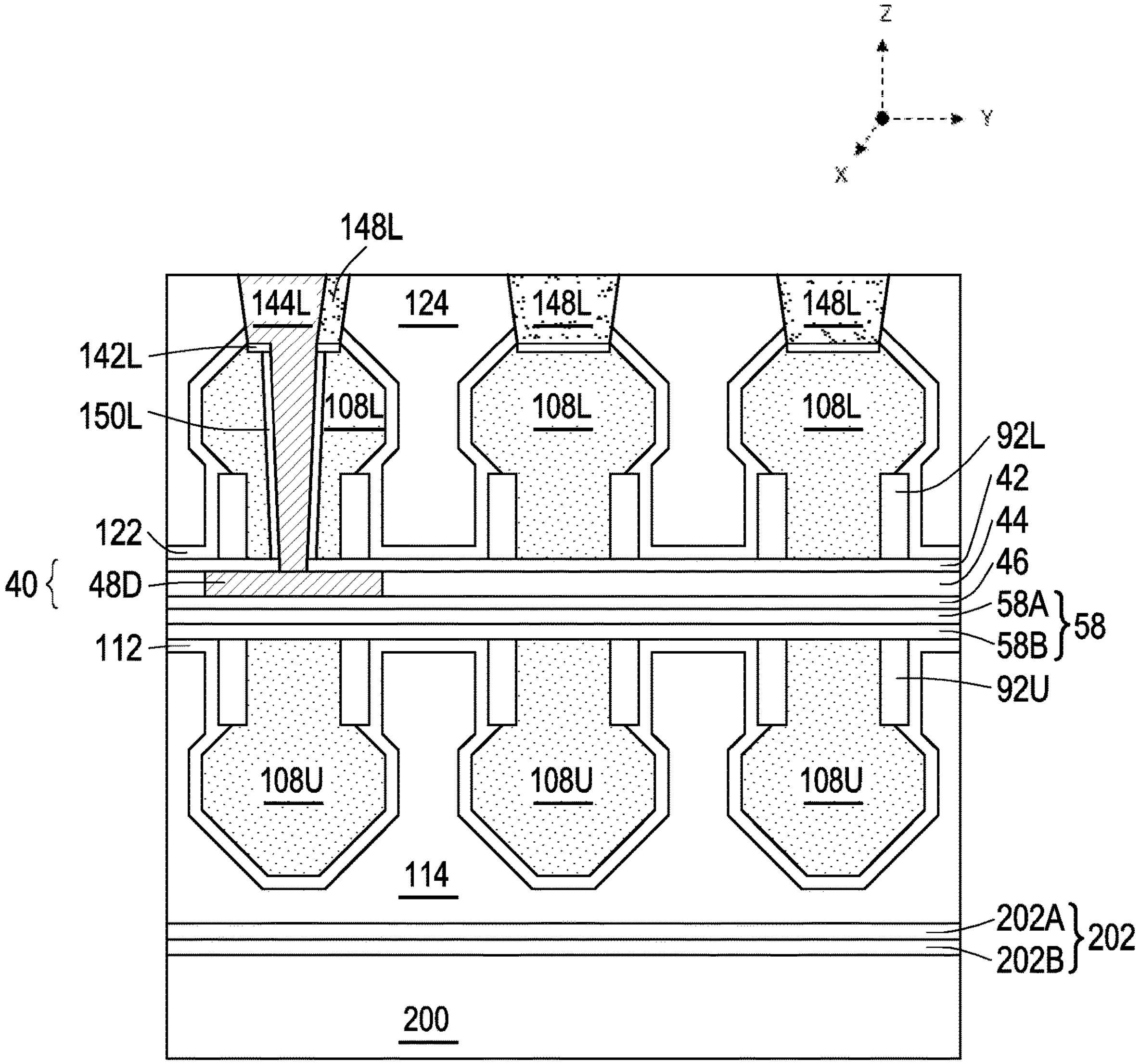

In FIGS. 40A-40E, lower source/drain contacts 144L are formed extending through the lower source/drain contacts 148L, the lower source/drain regions 108L, and the etch stop layer 42 to electrically connect to the conductive line 48D. FIG. 40A illustrates a top-down view of the gate structures, and FIG. 40B illustrates a top-down view of the conductive lines 48 of the intermetal structure 40. Certain features are omitted from FIGS. 40A and 40B for clarity. In FIG. 40A, the position of underlying conductive lines 48 of the intermetal structure 40 is illustrated in dashed lines, and in FIG. 40B, the positions of overlying gate electrodes 134L, the lower gate contacts 156L, the lower gate contacts 156L', lower source/drain regions 108L, and lower source/drain contacts 144L are illustrated in dashed lines. The conductive lines 48 includes conductive lines 48D that interconnect the lower gate contacts 144L of the lower transistors to source/drain regions of the upper transistors. FIG. 40C illustrates a cross-sectional view along line A-A' of FIG. 1; FIG. 40D illustrates a cross-sectional view along line B-B' of FIGS. 1 and 40A; and FIG. 40E illustrates a cross-sectional view along line C-C' of FIG. 1.

Lower silicide regions 150L are formed on sidewalls of the lower source/drain regions 108L in the openings defined by the mask described above. The lower silicide regions 150L may be made of a similar material using a similar process described above with respect to the lower silicide regions 142L. Further because the gate dielectric layers 130U and 130L are already formed, the damage to the lower silicide regions 142L and/or 150L from gate dielectric annealing steps can be advantageously avoided. Accordingly, device reliability and performance can be improved.

After the lower silicide regions 150L are formed, the lower source/drain contacts 144L are deposited over the lower silicide 150L. The lower source/drain contacts 144L may each comprise one or more layers, such as barrier layers, diffusion layers, and fill materials. For example, in some embodiments, the lower source/drain contacts 144L include a barrier layer and a conductive material. The lower source/drain contacts 144L are electrically coupled to the lower silicide regions 150L. The barrier layer may include titanium, titanium nitride, tantalum, tantalum nitride, or the like. The conductive material may be a relatively low resistance material, such as, tungsten, cobalt, ruthenium, or the like, which may be deposited by PVD, CVD, ALD, electroplating or the like. A planarization process, such as a CMP, may be performed to remove excess material from surfaces of the ILD 124. The planarization process may further remove the mask in some embodiments. The remaining liner and conductive material form the lower source/drain contacts 144L. In some embodiments, the lower source/drain contacts 144L has a different material composition, for example, having a lower resistance, than the lower source/drain contacts 148L. By forming the lower source/drain contacts 144L of a relatively low resistance material (e.g., tungsten, cobalt, ruthenium, or the like), contact resistance of the source/drain connection can be advantageously reduced.

Figure 41A:
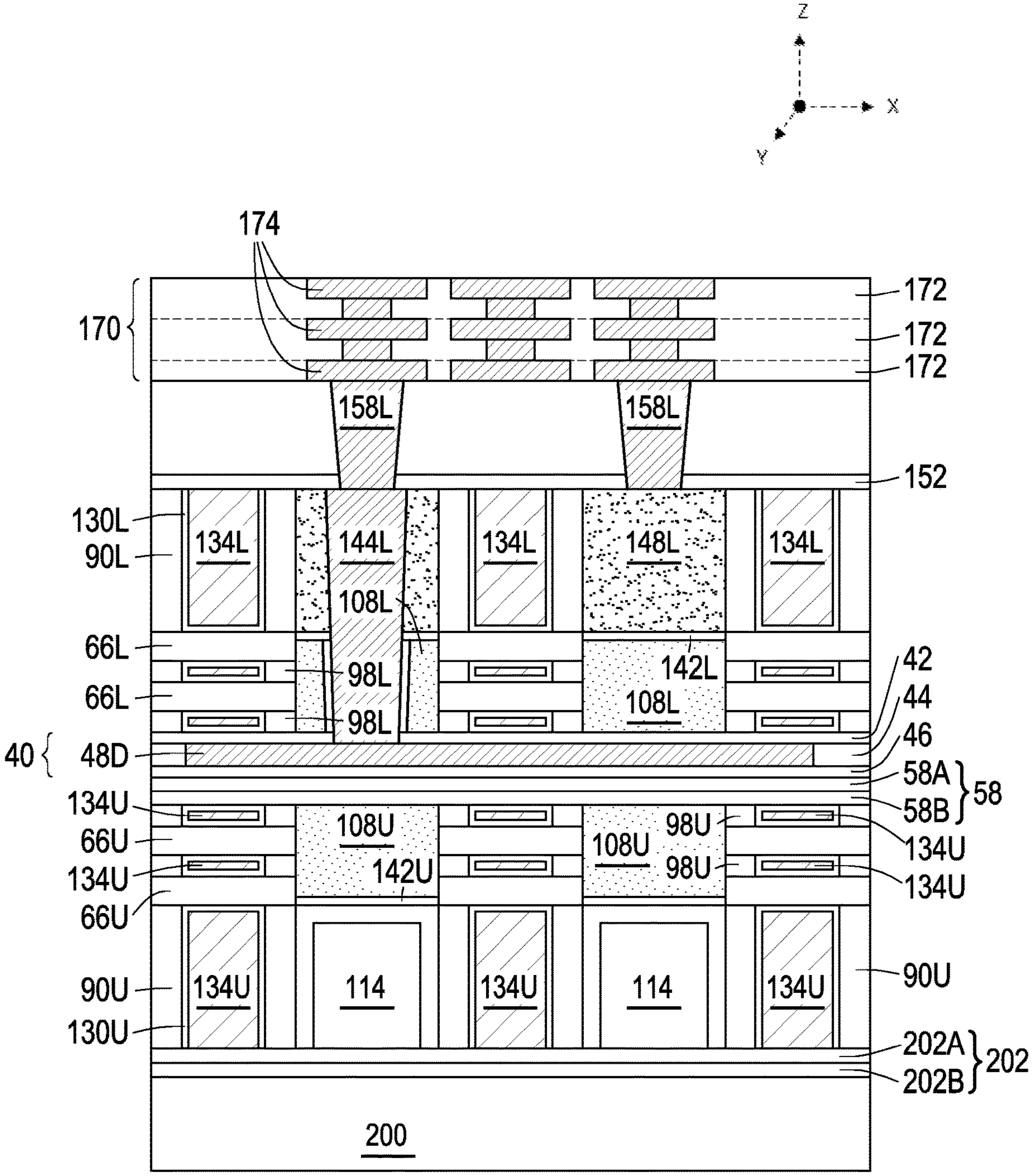
Figure 41B:
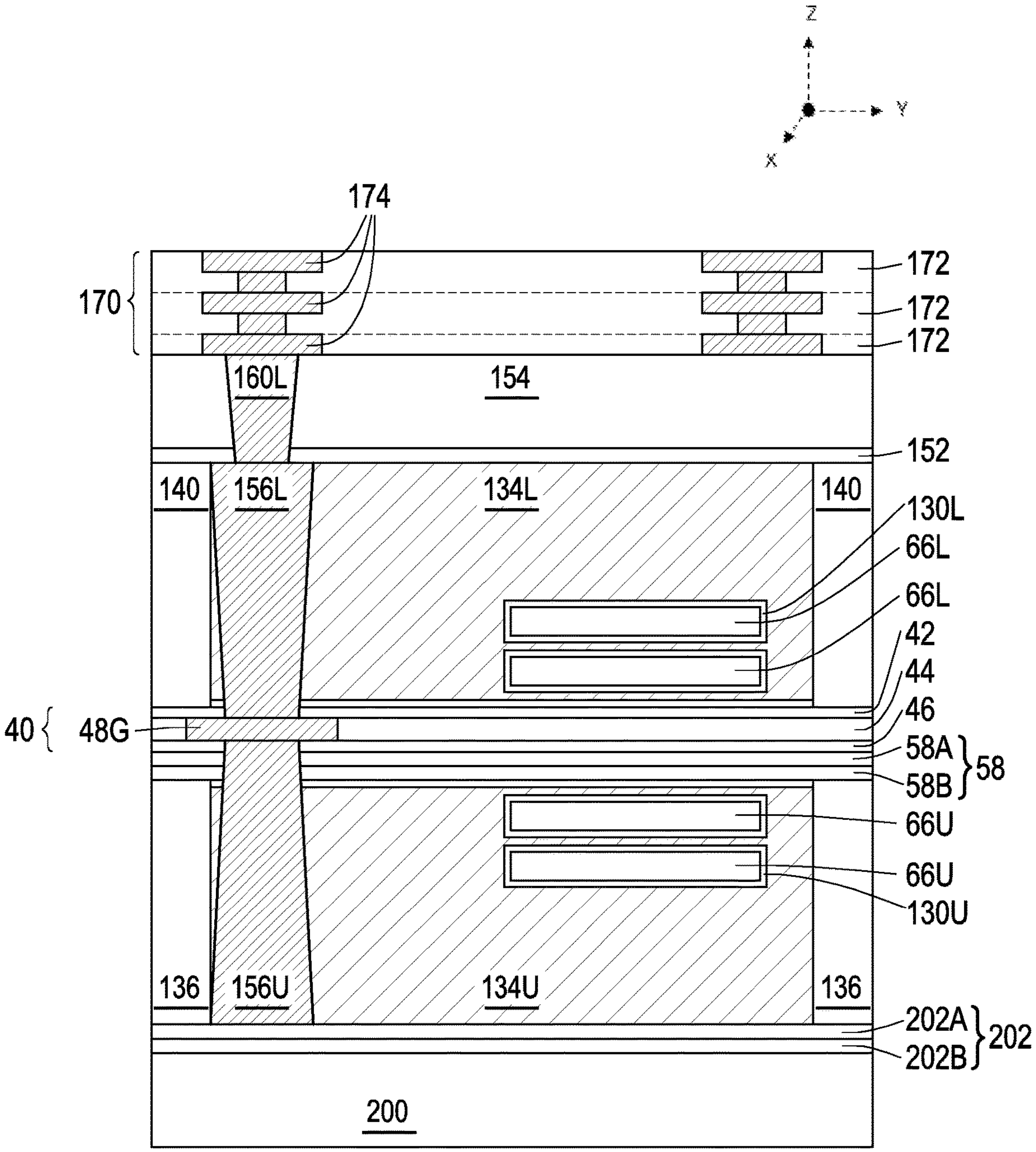
Figure 41C:
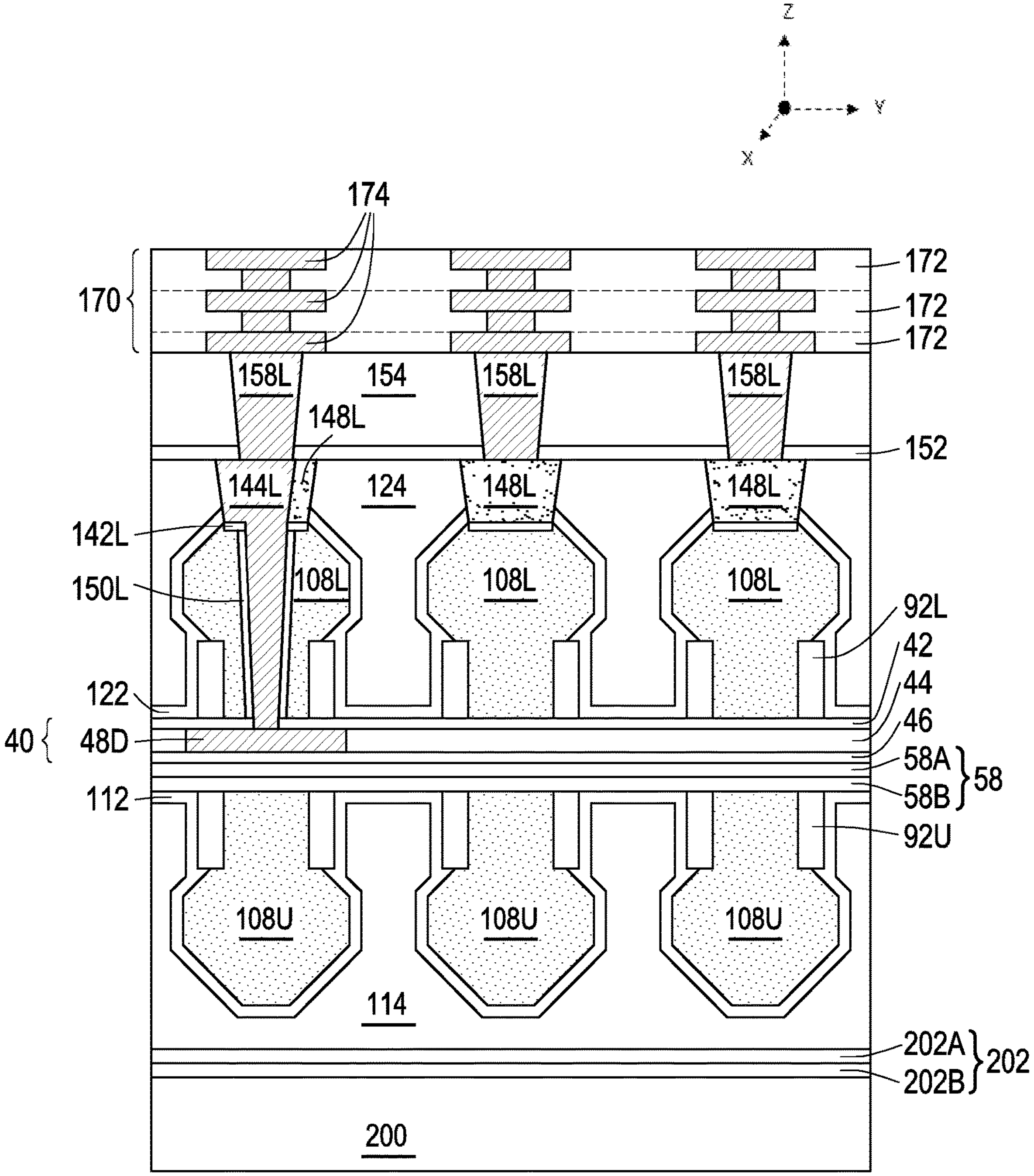
Figure 42A:
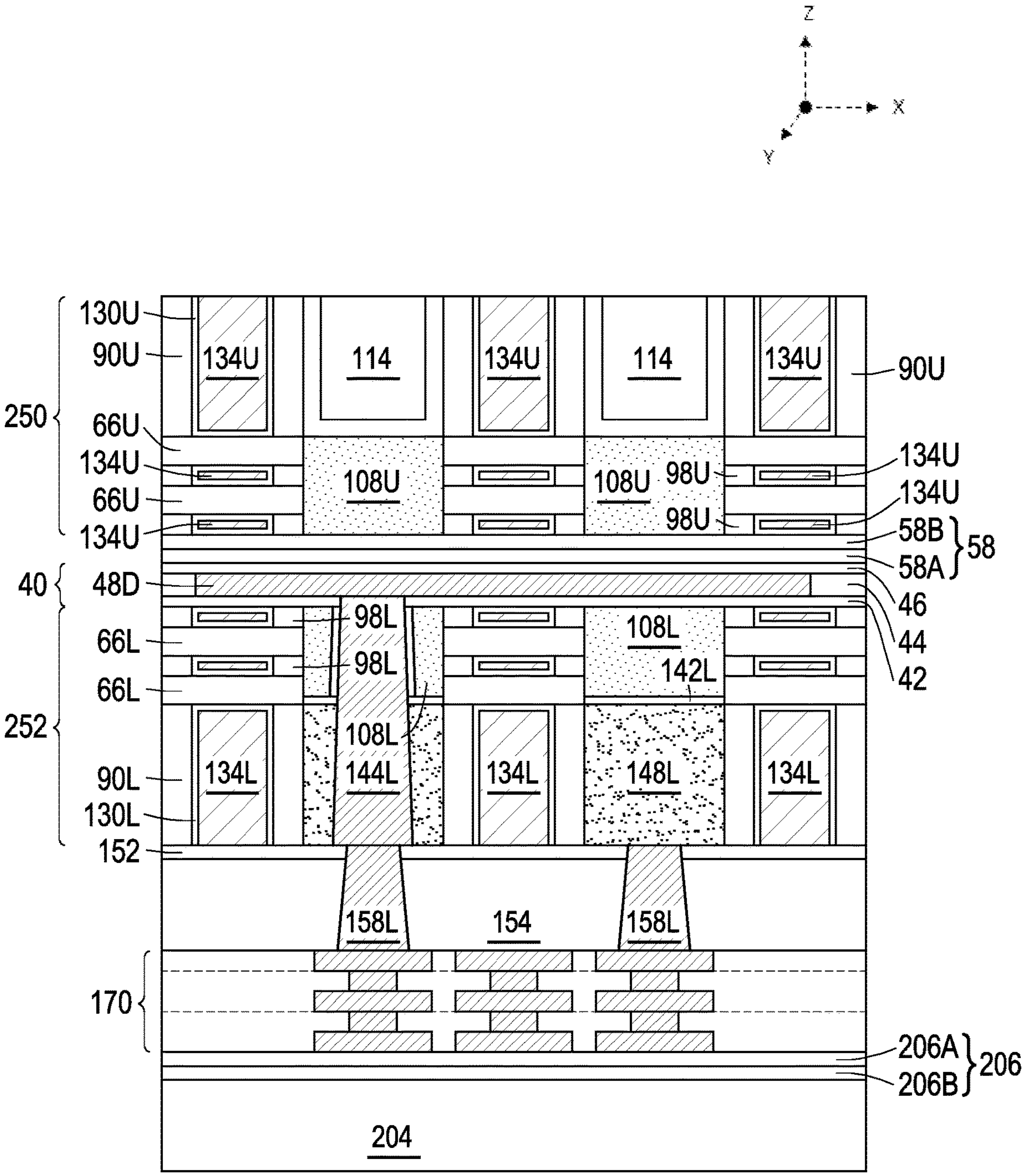
Figure 42B:
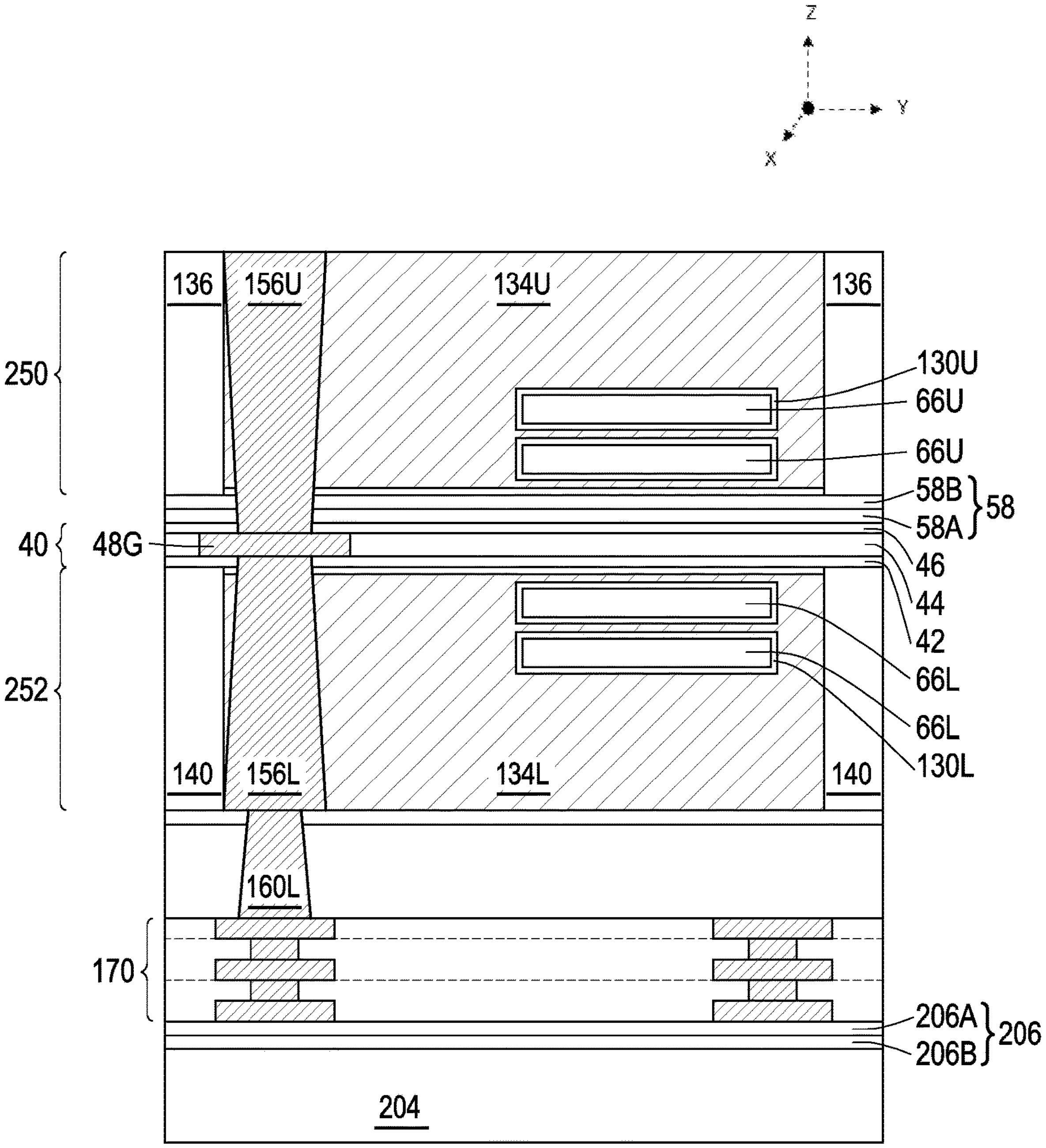
Figure 42C:
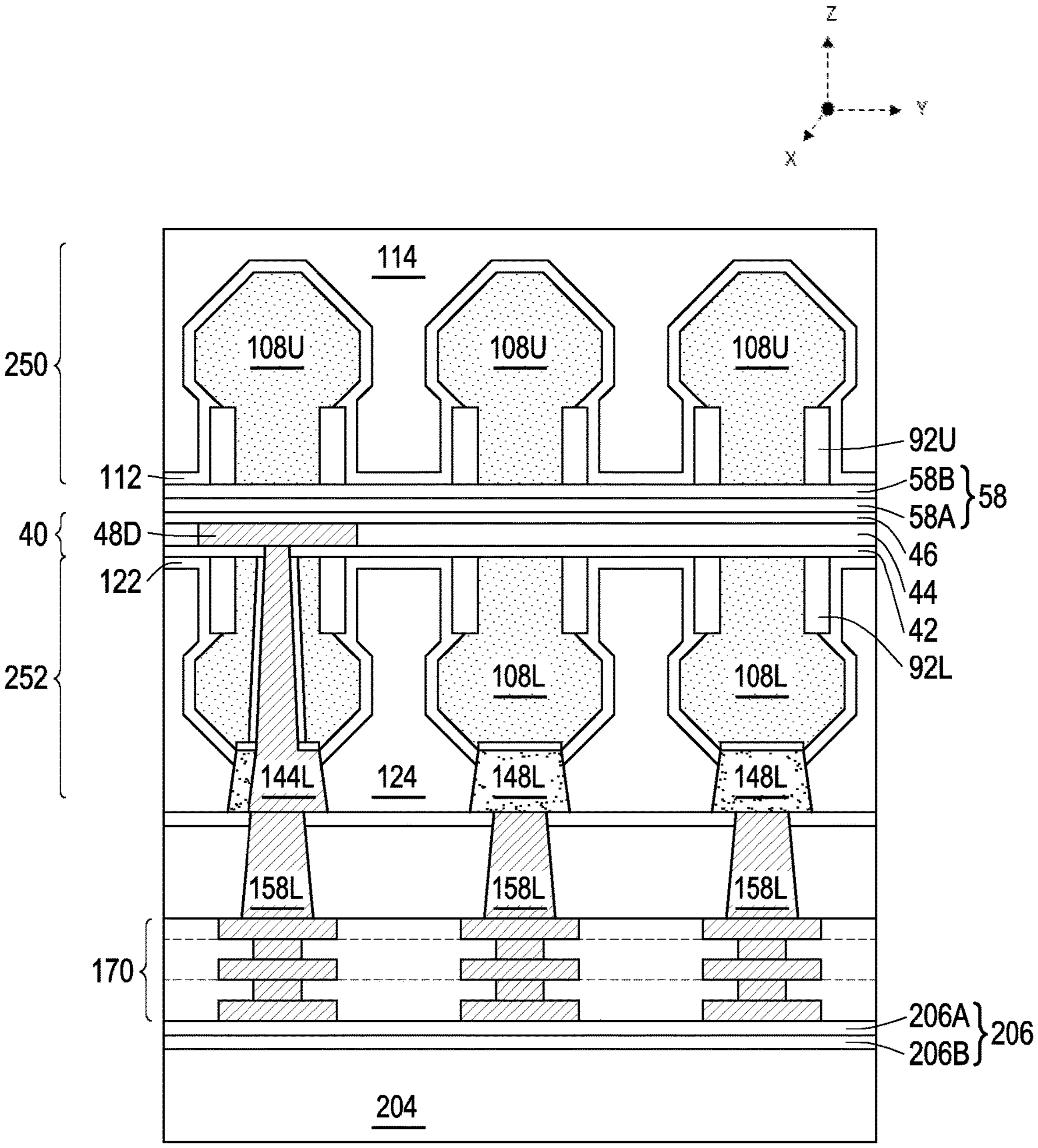

In FIGS. 41A-41C, an ILD 154 is deposited over the lower gate spacers 90L, the ILD 124, the lower gate electrodes 134L, the lower source/drain contacts 144L, and the lower gate contacts 156L. In some embodiments, the ILD 154 is a flowable film formed by a flowable CVD method. In some embodiments, the ILD 154 is formed of a dielectric material such as PSG, BSG, BPSG, USG, or the like, which may be deposited by any suitable method, such as CVD, PECVD, or the like.

In some embodiments, an ESL 152 is formed between the ILD 154 and the lower gate spacers 90L, the ILD 124, the lower gate electrodes 134L, the lower source/drain contacts 144L, and the lower gate contacts 156L. The ESL 152 may include a dielectric material having a high etching selectivity from the etching of the ILD 154, such as, silicon nitride, silicon oxide, silicon oxynitride, or the like.

Lower gate vias 160L and lower source/drain vias 158L are formed to contact, respectively, the lower gate contacts 156L and the lower source/drain contacts 144L/148L. The lower gate vias 160L may be physically and electrically coupled to the lower gate contacts 156L. The lower source/drain vias 158L may be physically and electrically coupled to the lower source/drain contacts 144L/148L. Although not explicitly illustrated, lower gate vias 160L may also be made to gate contacts 156L' to provide backside electrical contact to respective gate stacks that the gate contacts 156L' extend through.

As an example to form the lower gate vias 160L and the lower source/drain vias 158L, openings for the lower gate vias 160L and the lower source/drain vias 158L are formed through the ILD 154 and the ESL 152. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A planarization process, such as a CMP, may be performed to remove excess material from the top surface of the ILD 154. The remaining liner and conductive material form the lower gate vias 160L and the lower source/drain vias 158L in the openings. The lower gate vias 160L and the lower source/drain vias 158L may be formed in distinct processes, or may be formed in the same process.

Further, an interconnect structure 170 is formed on the lower transistor layer 252, e.g., over the ILD 154. The interconnect structure 170 includes dielectric layers 172 and layers of conductive features 174 in the dielectric layers 172.

The dielectric layers 172 may be formed of a dielectric material. Acceptable dielectric materials include silicon oxide, phosphosilicate glass (PSG), borosilicate glass (BSG), boron-doped phosphosilicate glass (BPSG), or the like, which may be formed by CVD, ALD, or the like. The dielectric layers 172 may be formed of a low-k dielectric material having a k-value lower than about 3.0. The dielectric layers 172 may be formed of an extra-low-k (ELK) dielectric material having a k-value of less than about 2.5.

The conductive features 174 may include conductive lines and vias. The conductive vias may extend through respective ones of the dielectric layers 172 to provide vertical connections between layers of conductive lines. The conductive features 174 may be formed by a damascene process, such as a single damascene process, a dual damascene process, or the like. In a damascene process, a dielectric layer 172 is patterned utilizing photolithography and etching techniques to form trenches and via openings corresponding to the desired pattern of the conductive features 174. The trenches and via openings may then be filled with a conductive material. Suitable conductive materials include copper, aluminum, tungsten, cobalt, gold, combinations thereof, or the like, which may be formed by electroplating or the like.

The interconnect structure 170 includes any desired number of layers of the conductive features 174. The conductive features 174 are connected to features of the underlying devices (e.g., the lower gate electrodes 134L and the lower epitaxial source/drain regions 108L) through the lower gate vias 160L and the lower source/drain vias 158L to form functional circuits. In other words, the conductive features 174 interconnect the lower nanostructure-FETs of the lower device layer.

After the interconnect structure 170 is formed, a carrier substrate 204 is bonded to a top surface of the interconnect structure 170 by a first bonding layer 206A and a second bonding layer 206B. After bonding, the first bonding layer 206A and the second bonding layer 206B may be collectively referred to as a bonding layer 206. It should be appreciated that the bonding layer 206 may include an internal interface where the first bonding layer 206A and the second bonding layer 206B meet.

The carrier substrate 204 may be a glass carrier substrate, a ceramic carrier substrate, a wafer (e.g., a silicon wafer), or the like. The carrier substrate 204 may provide structural support during subsequent processing steps and in the completed device. The first bonding layer 206A and the second bonding layer 206B may be formed of a similar material using similar processes as those discussed above with respect to the bonding layers 58A and 58B. The first bonding layer 206A and the second bonding layer 206B may be deposited on the interconnect structure 170 and the carrier substrate 204, respectively. The second bonding layer 206B may have a same or different thickness than the first bonding layer 206A. After the second bonding layer 206B is deposited on the carrier substrate 204, the carrier substrate 204 may be bonded to interconnect structure 170 using a suitable technique, such as dielectric-to-dielectric bonding, or the like. The dielectric-to-dielectric bonding process may be substantially similar to that described above with respect to FIG. 5. Subsequently, the structure is flipped over and the carrier substrate 200 and the bonding layer 202 are removed by one or more planarization (e.g., CMP) and/or etching processes, thereby exposing the upper transistor layer 250.

Figure 43A:
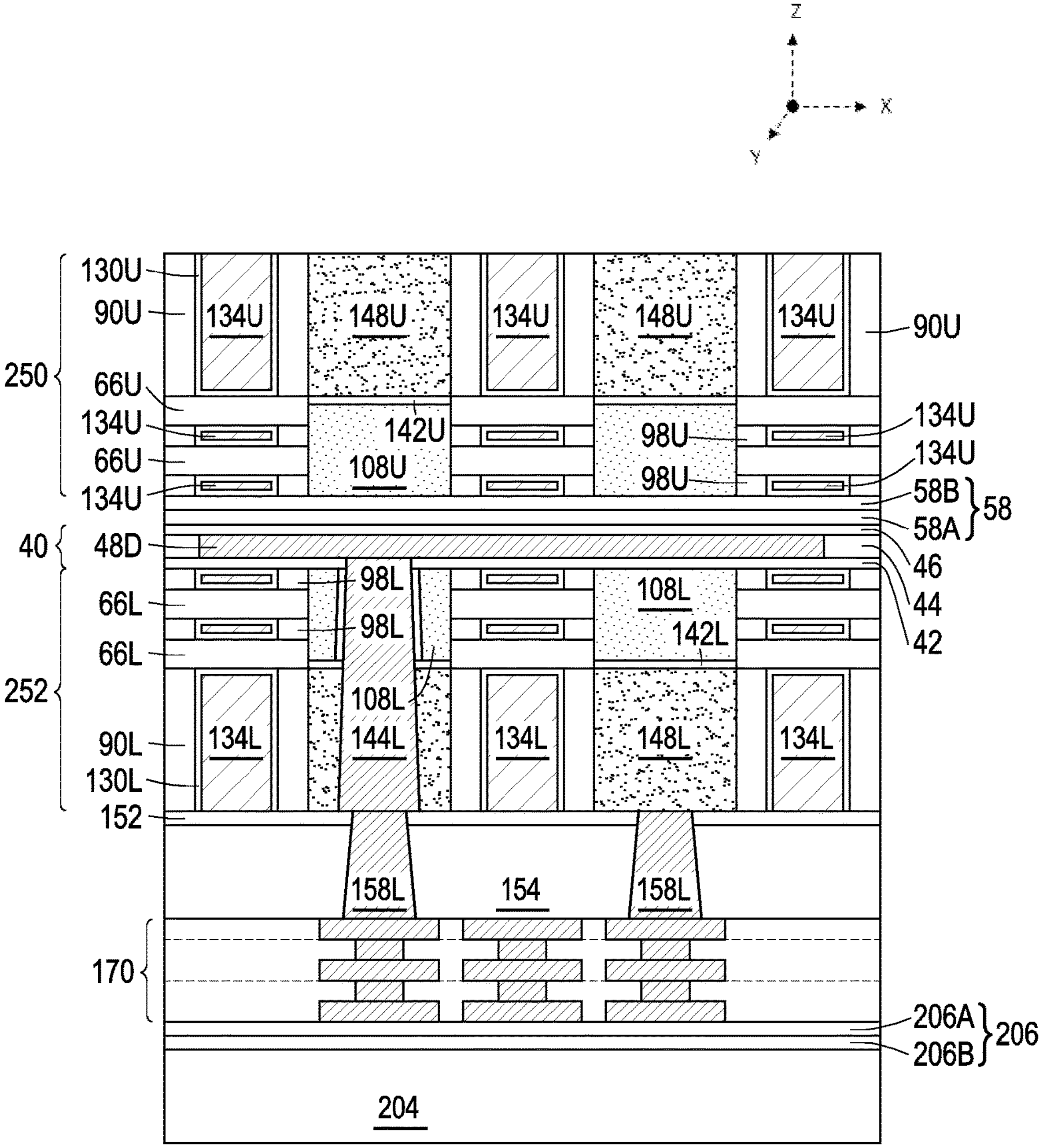
Figure 43B:
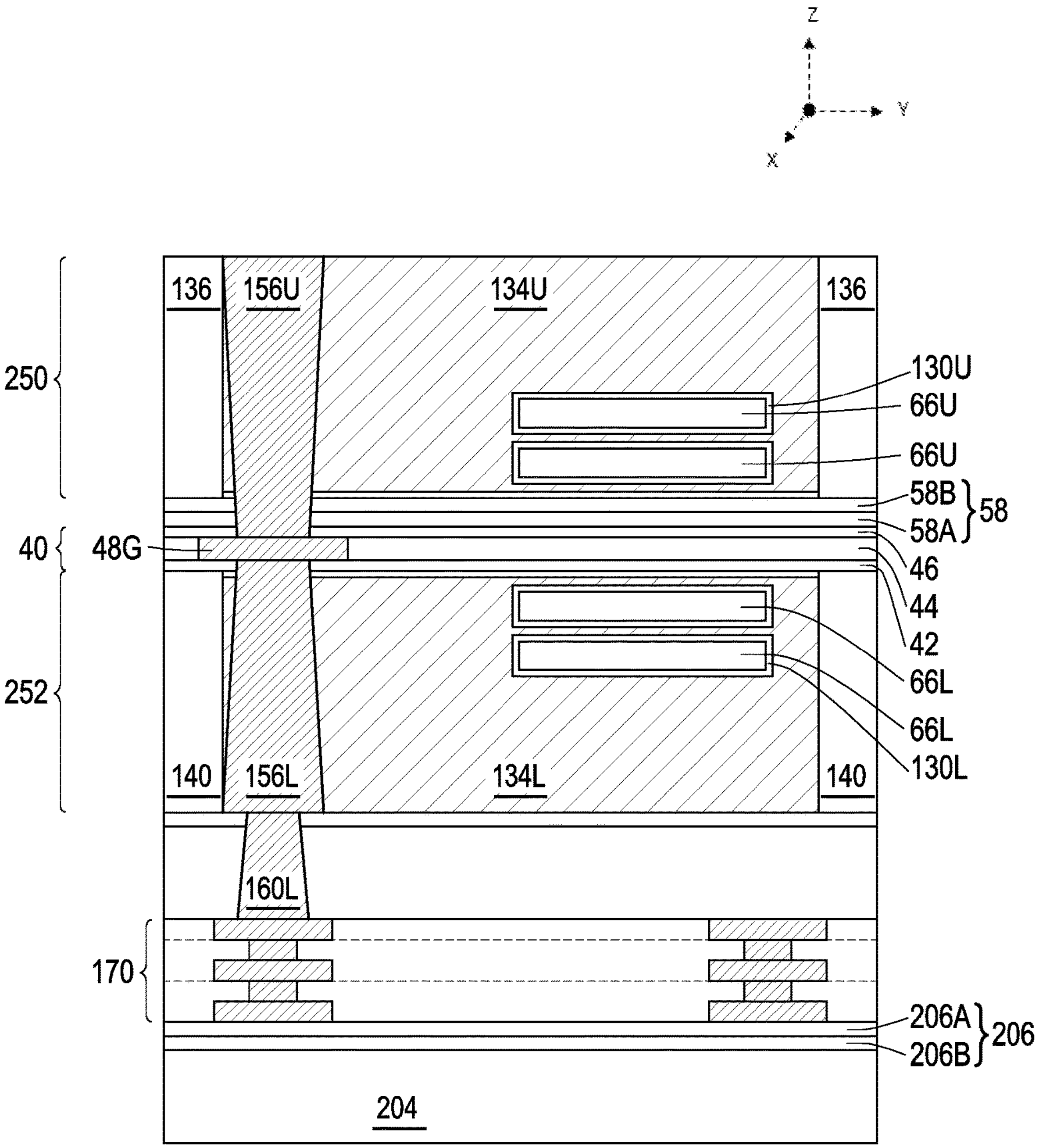
Figure 43C:
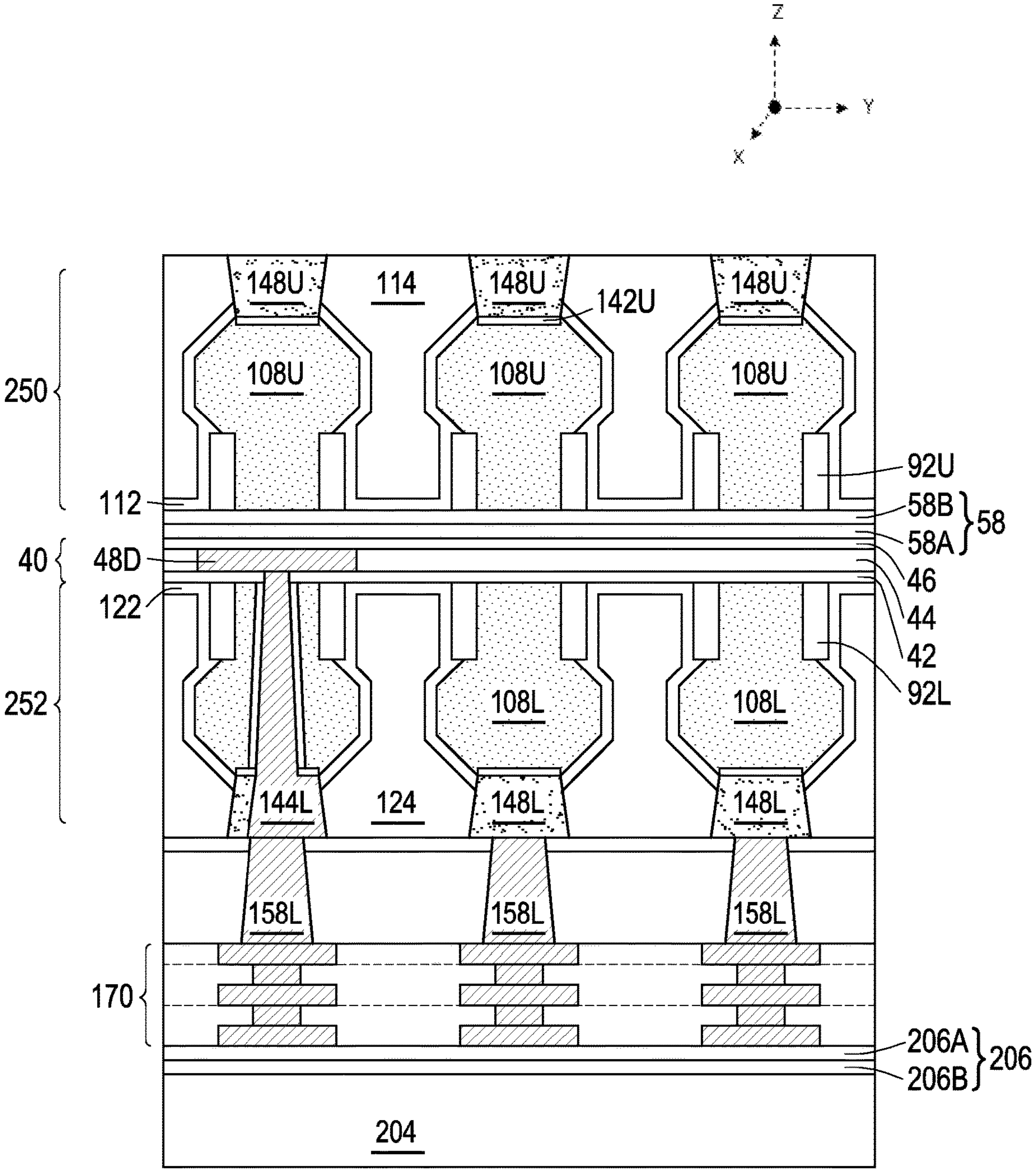

In FIGS. 43A-45E, upper source/drain contacts 148U and 144U are formed to the upper source/drain regions 108U. Referring first to FIGS. 43A-43C, the upper source/drain contacts 148U are formed through the ILD 114 and the CESL 112 to electrically connect to the upper source/drain regions 108U, and upper silicide regions 142U are formed over the upper source/drain regions 108U between the upper source/drain contacts 148U and the upper source/drain regions 108U. The upper source/drain contacts 148U and the upper silicide regions 142U may be made of a substantially similar material using a substantially similar process as the lower source/drain contacts 148L and the lower silicide regions 142L, respectively, described above.

Figure 44A:
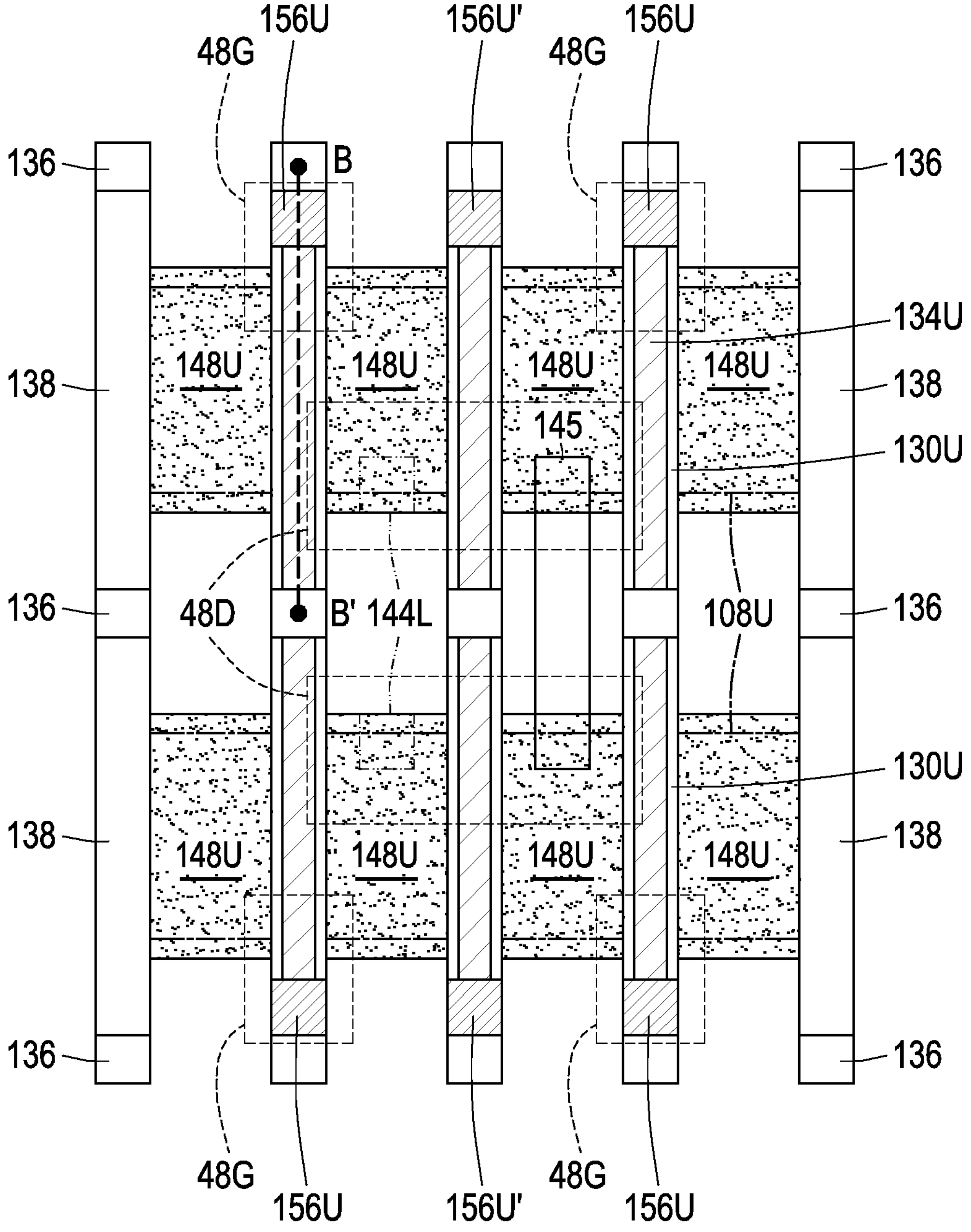

In FIGS. 44A-45E, upper source/drain contacts 144U are formed extending through desired ones of the upper source/drain contacts 148U and desired ones of the upper source/drain regions 108U to physically touch the conductive lines 48D. The upper source/drain contacts 144U may be formed from similar materials and using a similar process as described above with respect to the lower source/drain contacts 144L. Specifically, a mask may be formed over ILD 114 and the upper source/drain regions 108U as illustrated by the top down views of FIGS. 44A-44B. Certain features may be omitted from FIGS. 44A-44B for simplicity. FIGS. 44A and 44B illustrate top-down views of the gate of the upper gate structures, and the locations of conductive lines 48 (including conductive lines 48G and 48D) and the upper source/drain regions 108U are indicated by dashed lines for reference.

Figure 44B:
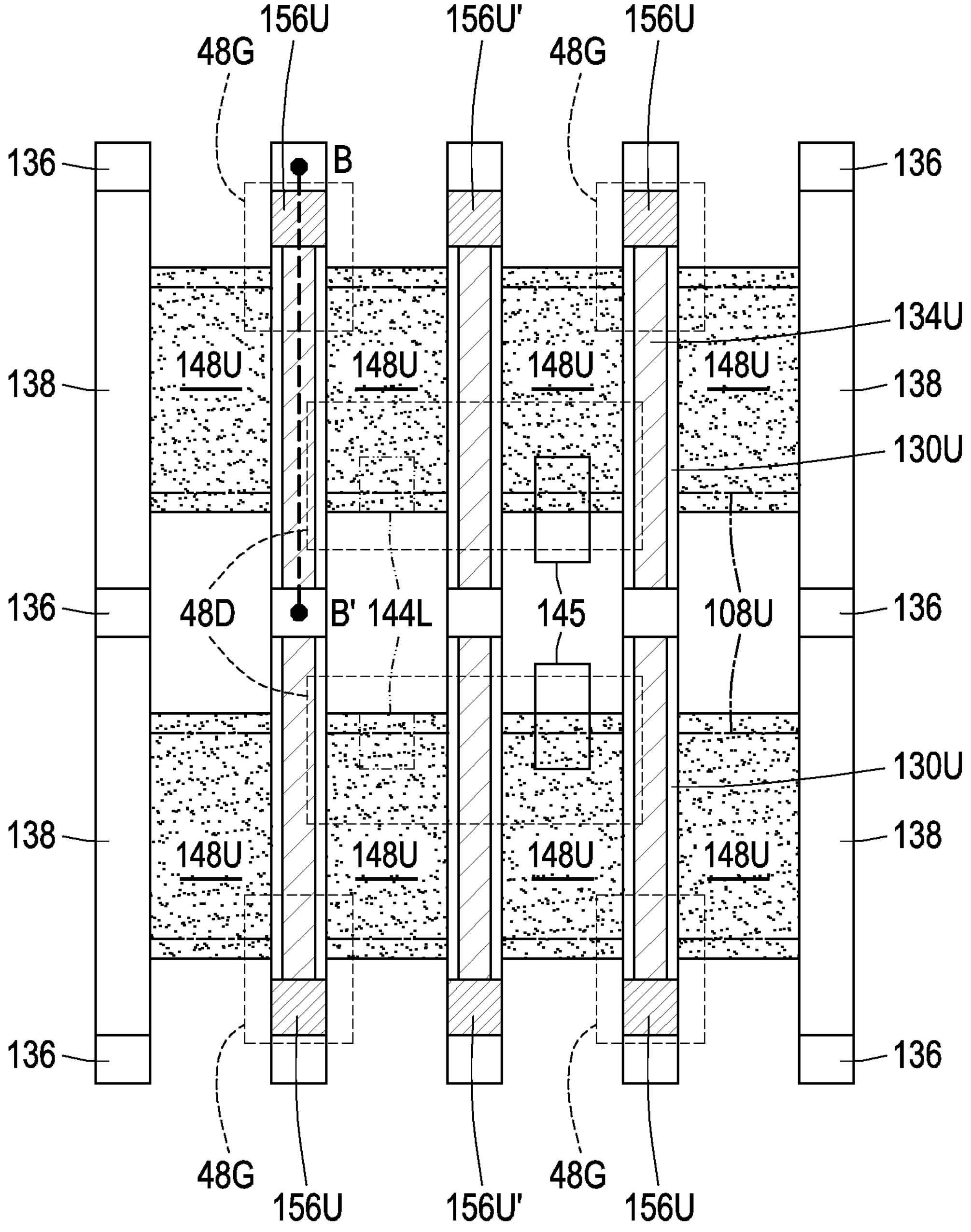

In FIGS. 44A-44B, the location of openings 145 of the mask are illustrated. Areas other than the openings 145 may be covered by the mask. The mask may be formed of a similar material using a similar process as described above with respect to masks 139 and 141. Each of the openings 145 may overlap with the conductive lines 48D and one or more of the upper source/drain regions 108U and upper source/drain contacts 148U. Specifically, FIG. 44A illustrates embodiments where the opening 145 of the mask overlaps multiple upper source/drain regions 108U and multiple upper source/drain contacts 148U. For example, the openings 145 can extend across multiple transistors or ever across multiple cells (e.g., memory cells, logic cells, or the like). In other embodiments, illustrated by FIG. 44B, each of the openings 145 only overlaps a single one of the upper source/drain regions 108U and upper source/drain contacts 148U. The openings 145 may be formed by a combination of photolithography (e.g., using a 193 nm immersion lithography tool, an extreme ultraviolet lithography (EUV) tool, or the like) and etching.

A pattern of the openings 145 may then be transferred to the underlying upper source/drain regions 108U and upper source/drain contacts 148U using one or more suitable etching processes, for example. In some embodiments, the etching processes may be selective to the material of the upper source/drain regions 108U and upper source/drain contacts 148U. For example, the etching processes may etch exposed portion of the upper source/drain contacts 148U and the upper source/drain regions 108U without significantly etching the ILD 114 or the CESL 112. The patterning of the openings 145 may further be extended through the etch stop layer 46 and the bonding layer 58 (see FIGS. 45C and 45E) to expose the conductive line 48D. In some embodiments, etching the etch stop layer 46 may be a selective etching process that selectively removes the etch stop layer 46 at a faster rate than the dielectric layer 44.

Figure 45A:
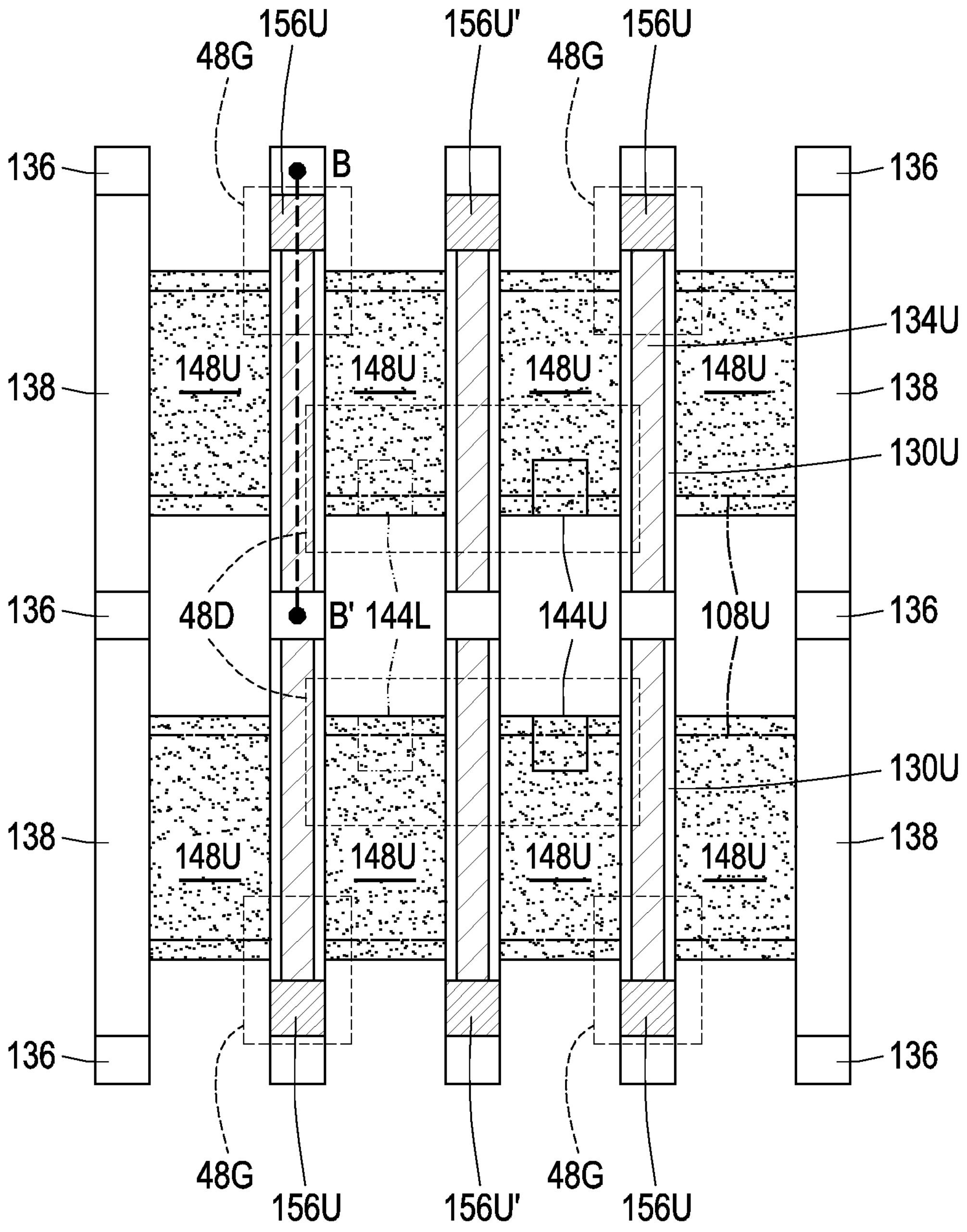
Figure 45B:
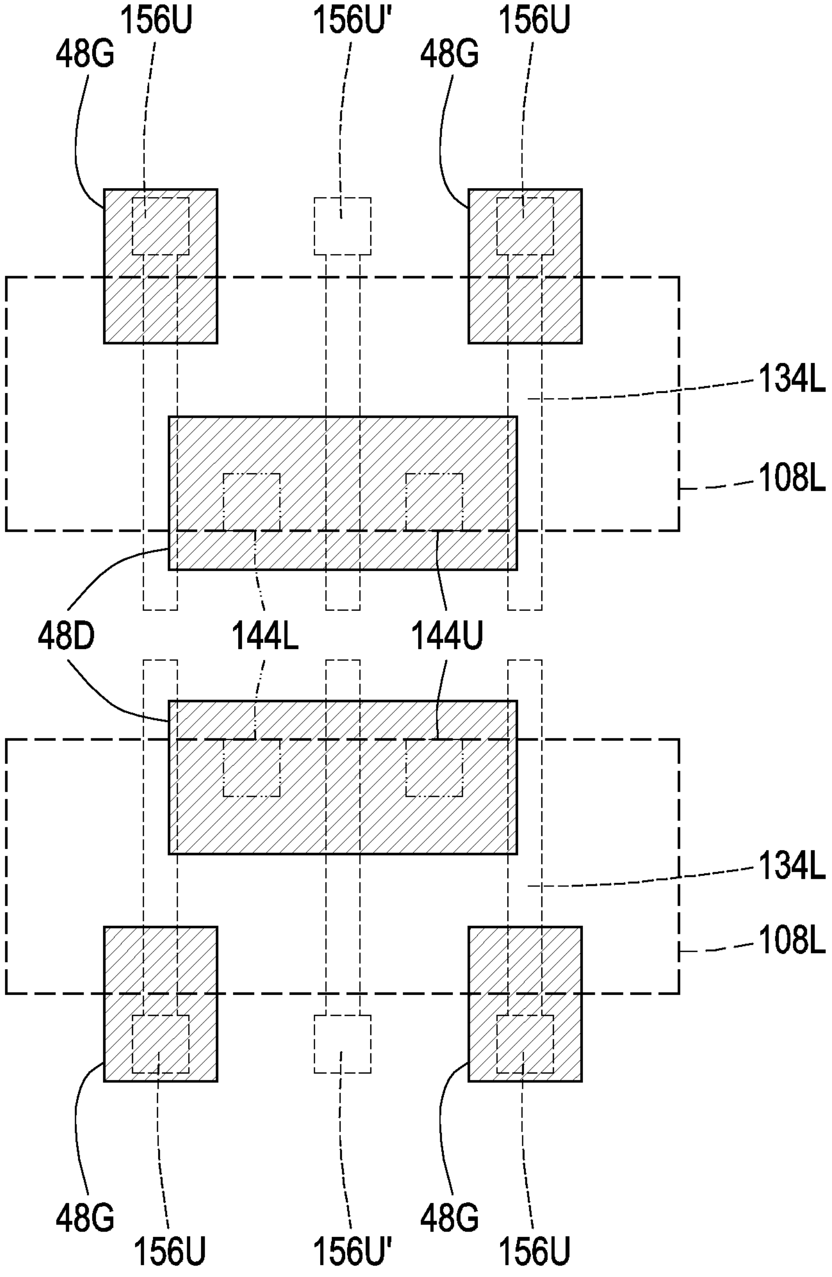
Figure 45C:
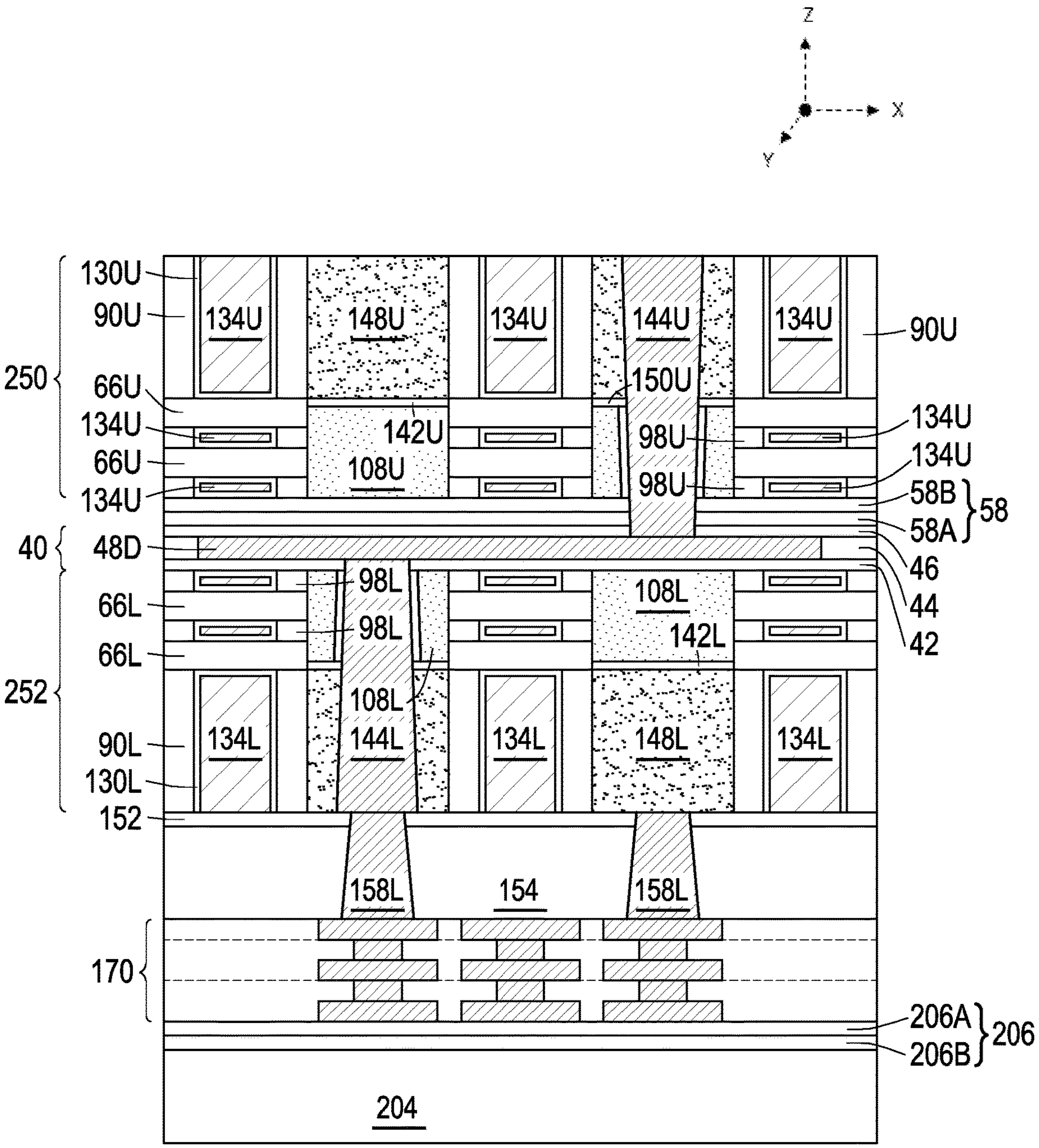
Figure 45D:
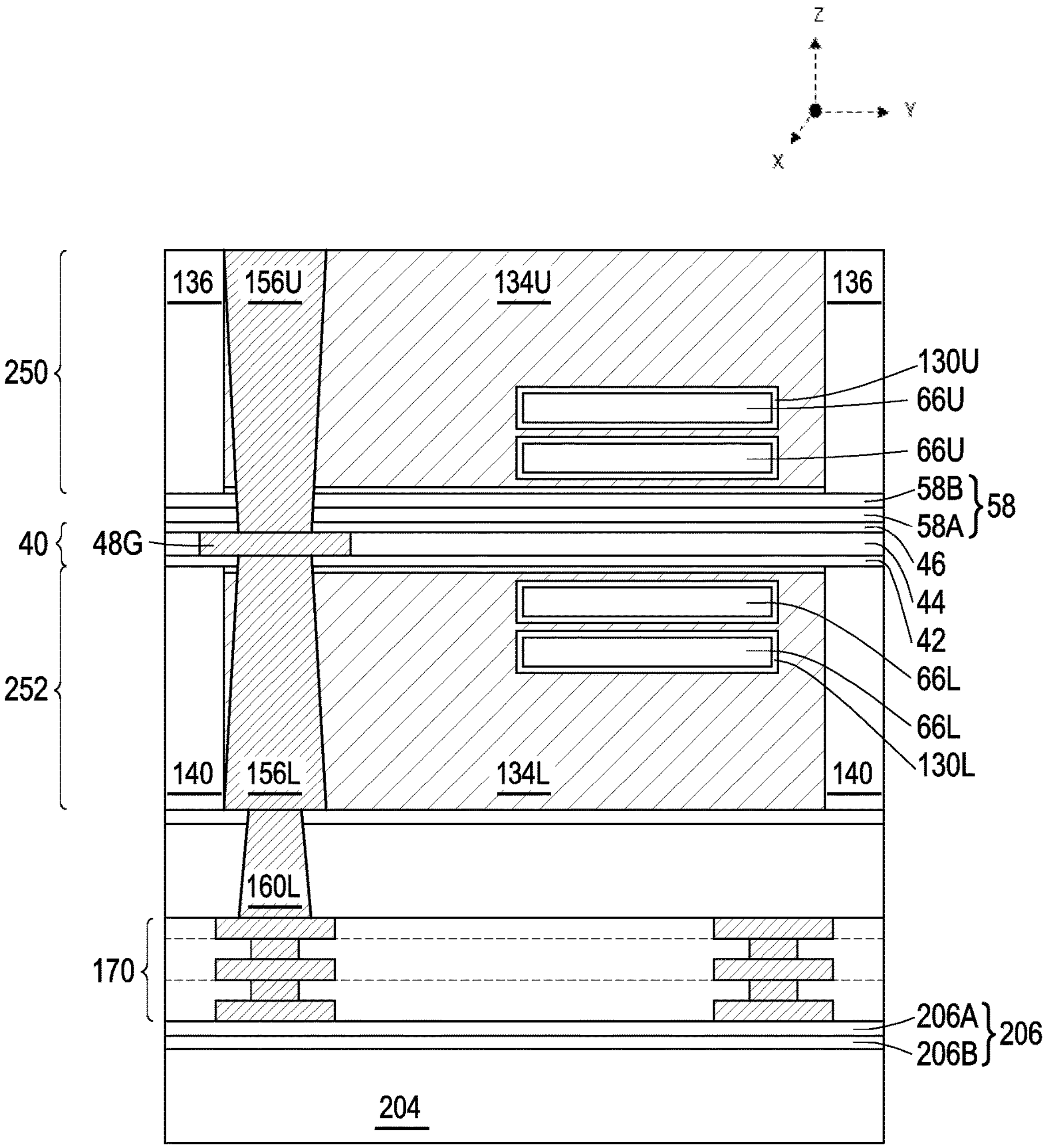
Figure 45E:
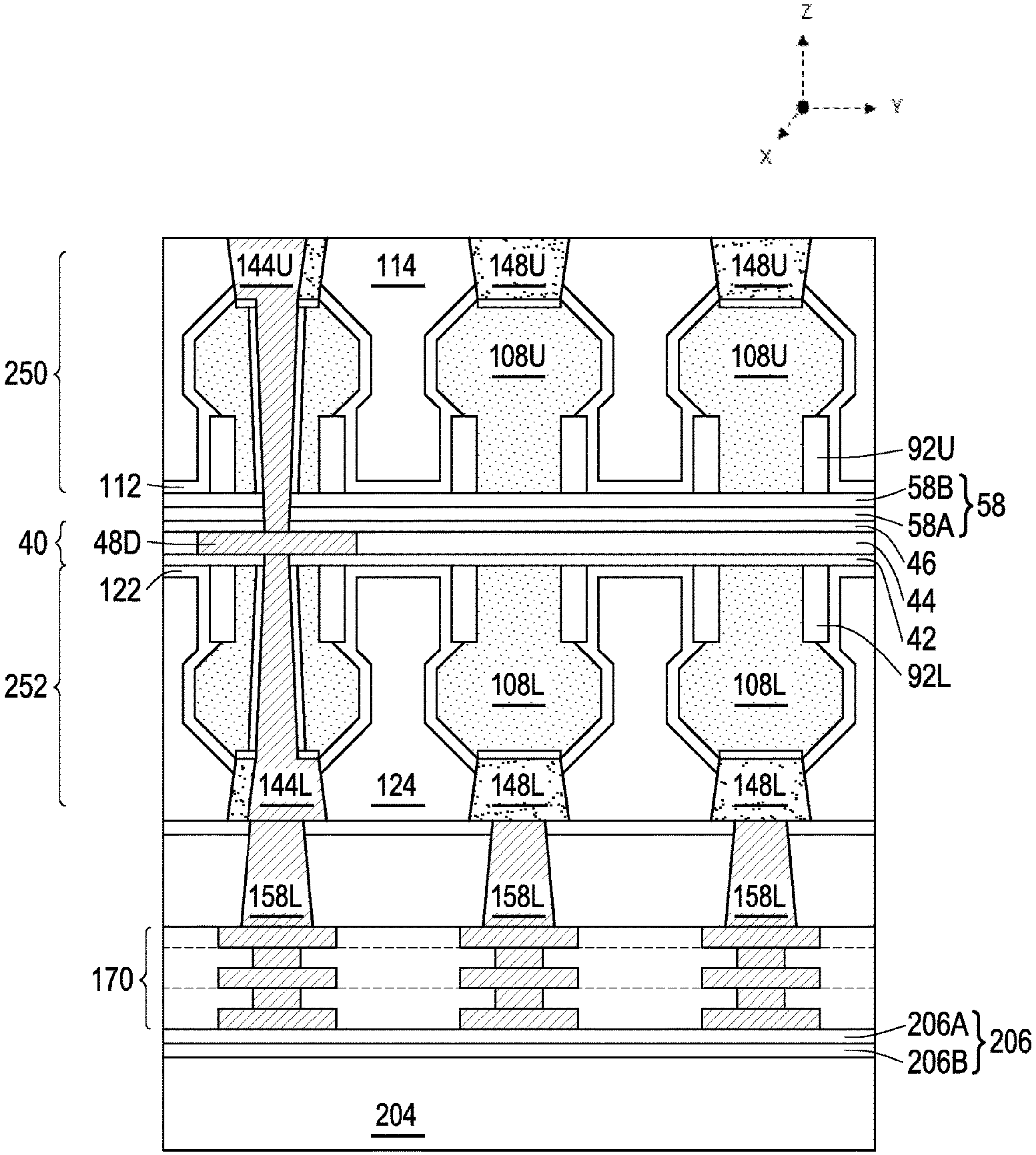

In FIGS. 45A-45E, upper source/drain contacts 144U are formed extending through the upper source/drain contacts 148U, the upper source/drain regions 108U, the etch stop layer 46, and the bonding layer 58 to electrically connect to the conductive line 48D. FIG. 45A illustrates a top-down view of the gate structures, and FIG. 45B illustrates a top-down view of the conductive lines 48 of the intermetal structure 40. Certain features are omitted from FIGS. 45A and 45B for clarity. In FIG. 45A, the position of underlying conductive lines 48 of the intermetal structure 40 and the lower source/drain contact 144L are illustrated in dashed lines, and in FIG. 45B, the positions of overlying gate electrodes 134L, the lower gate contacts 156L, the lower gate contacts 156L', lower source/drain regions 108L, and lower source/drain contacts 144L are illustrated in dashed lines. The conductive lines 48 includes conductive lines 48D that interconnect the lower gate contacts 144L of the lower transistors to source/drain regions of the upper transistors. FIG. 45C illustrates a cross-sectional view along line A-A' of FIG. 1; FIG. 45D illustrates a cross-sectional view along line B-B' of FIGS. 1 and 45A; and FIG. 45E illustrates a cross-sectional view along line C-C' of FIG. 1.

Upper silicide regions 150U are formed on sidewalls of the upper source/drain regions 108U in the openings 145 defined by the mask described above. The upper silicide regions 150U may be made of a similar material using a similar process described above with respect to the upper silicide regions 142U. Further because the gate dielectric layers 130U and 130L are already formed, the damage to the upper silicide regions 142U and/or 150U from gate dielectric annealing steps can be advantageously avoided. Accordingly, device reliability and performance can be improved.

After the upper silicide regions 150U are formed, the upper source/drain contacts 144U are deposited over upper silicide regions 150U. The upper source/drain contacts 144U may each comprise one or more layers, such as barrier layers, diffusion layers, and fill materials. For example, in some embodiments, the upper source/drain contacts 144U include a barrier layer and a conductive material. The upper source/drain contacts 144U are electrically coupled to the upper silicide regions 150U. The barrier layer may include titanium, titanium nitride, tantalum, tantalum nitride, or the like. The conductive material may be tungsten, cobalt, ruthenium, or the like, which may be deposited by PVD, CVD, ALD, electroplating or the like. A planarization process, such as a CMP, may be performed to remove excess material from surfaces of the ILD 124. The planarization process may further remove the mask in some embodiments. The remaining liner and conductive material form the upper source/drain contacts 144U. In some embodiments, the upper source/drain contacts 144U has a different material composition, for example, having a lower resistance, than the upper source/drain contacts 148U. By forming the upper source/drain contacts 144U of a relatively low resistance material (e.g., tungsten, cobalt, ruthenium, or the like), contact resistance of the source/drain connection can be advantageously reduced.

In various embodiments, source/drain connections between upper and lower transistors is achieved by a combination of upper source/drain contacts 144U that extend through the upper source/drain regions 108U, conductive lines 48D in the intermetal structure 40, and lower source/drain contacts 144L that extend through the lower source/drain regions 108L. The intermetal structure 40 is disposed between the upper transistor layer 250 and the lower transistor layer 252. By routing source/drain connections through the source/drain regions of the stacked transistors and the intermetal structure 40, a routing distance between source/drain contacts can be reduced, which advantageously reduces contact resistance. Additionally, certain circuit related layout penalties can also be avoided. For example, the channel widths (e.g., the upper and lower nanostructures 66U and 66L) of the upper and lower transistors are not limited by a minimum size of the source/drain contact for meeting drain voltage (DV) design specifications.

Figure 46A:
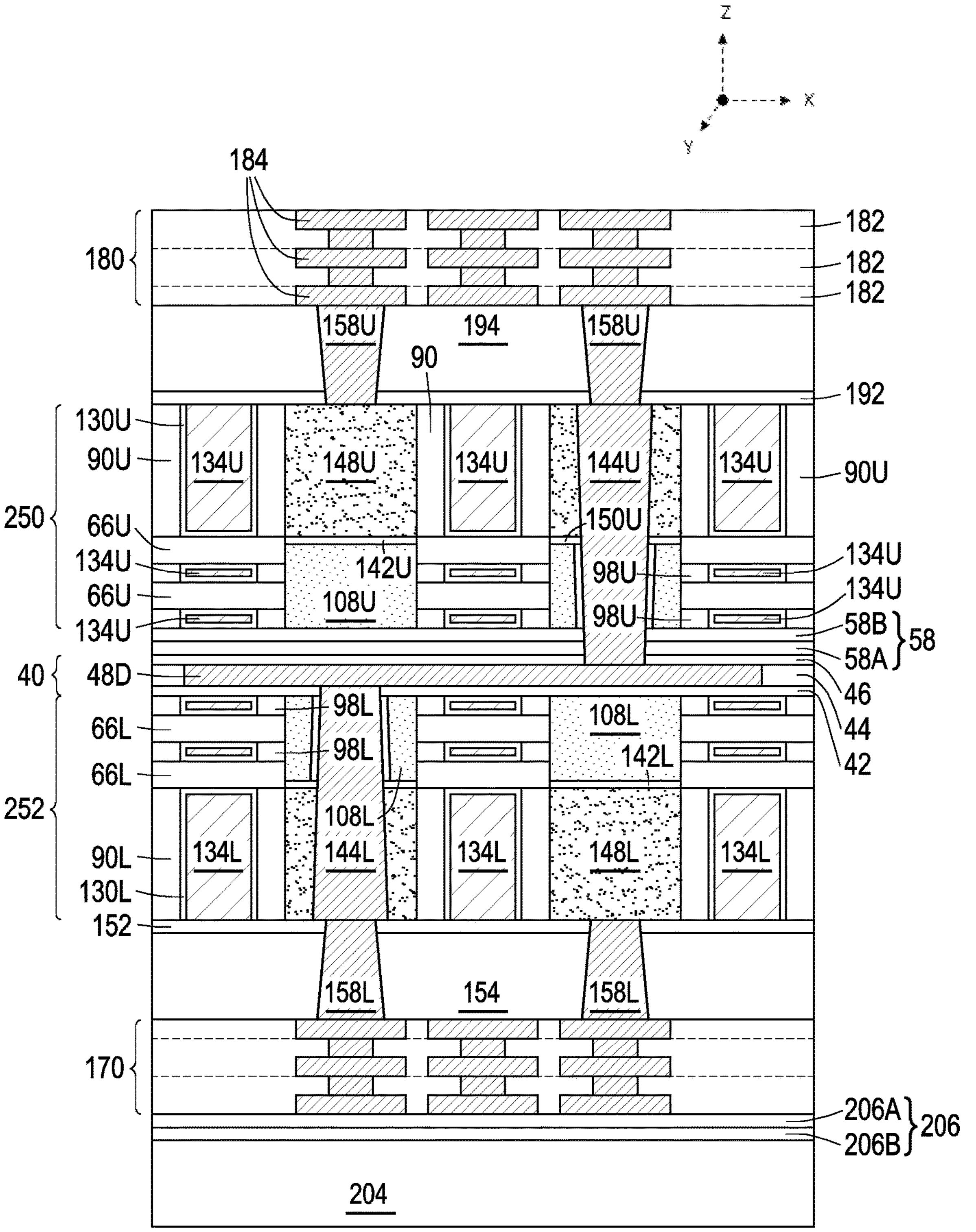
Figure 46B:
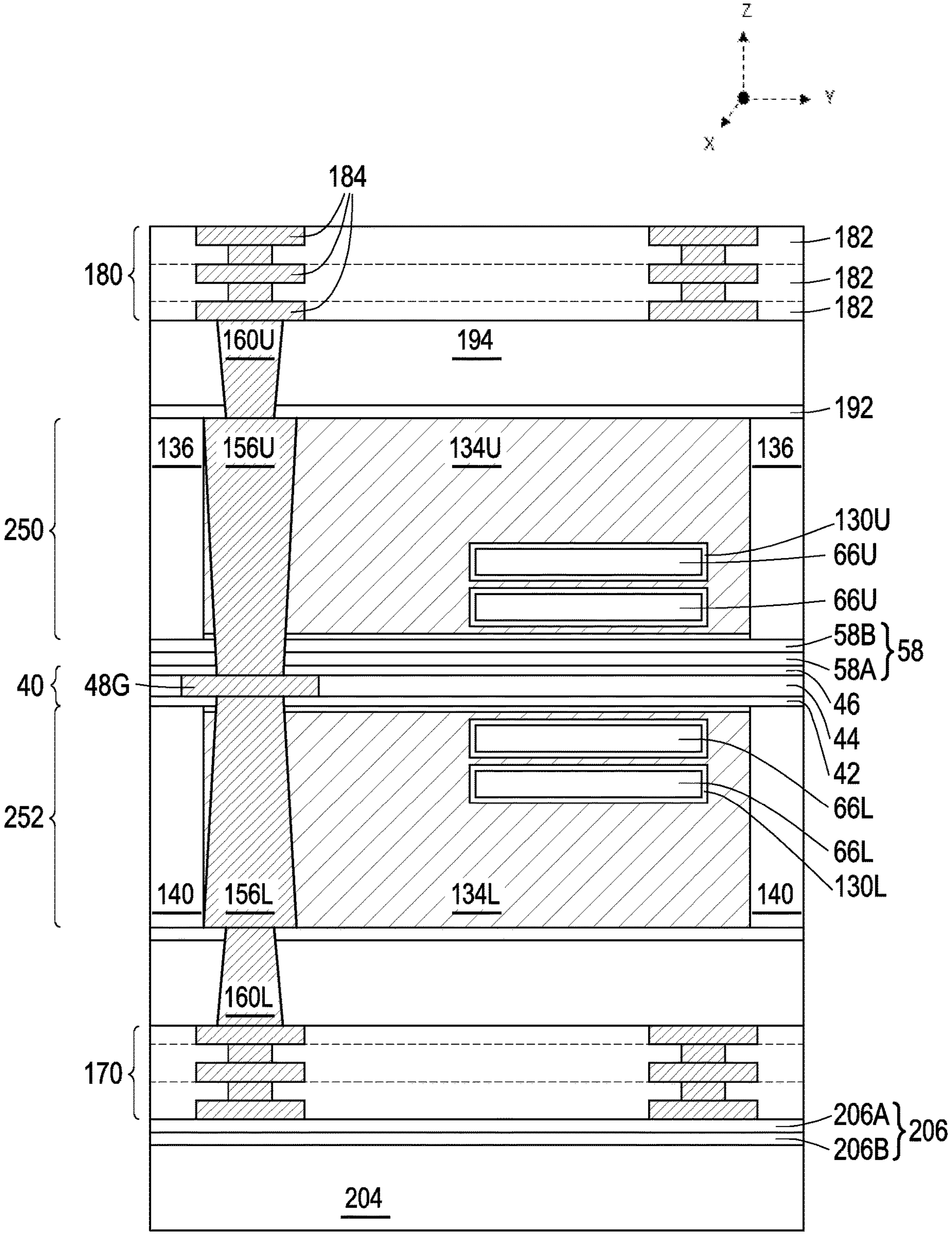
Figure 46C:
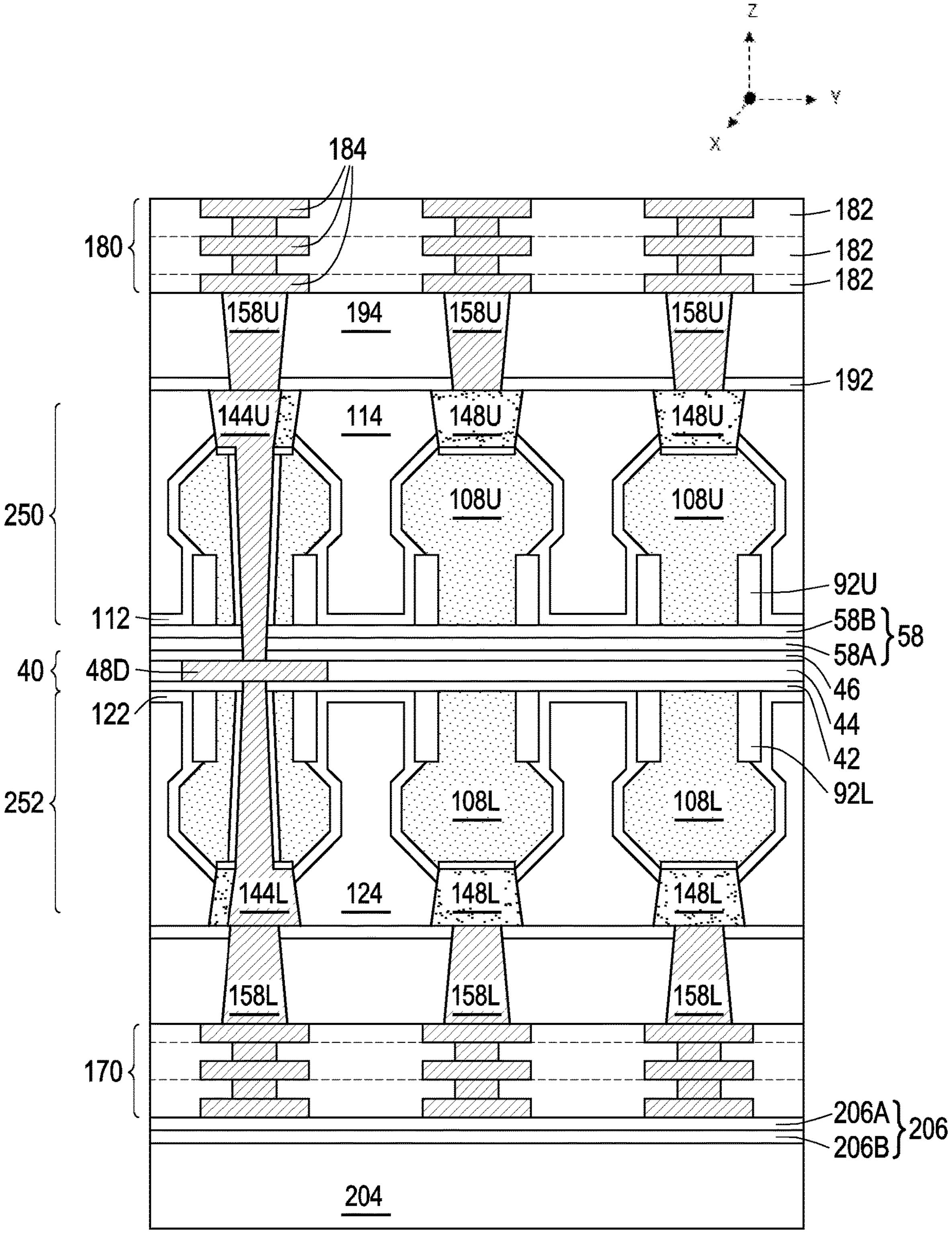

In FIGS. 46A-46C, an ILD 194 is deposited over the upper gate spacers 90U, the ILD 114, the upper gate electrodes 134U, the upper source/drain contacts 144U, and the upper gate contacts 156U. In some embodiments, the ILD 194 is a flowable film formed by a flowable CVD method. In some embodiments, the ILD 194 is formed of a dielectric material such as PSG, BSG, BPSG, USG, or the like, which may be deposited by any suitable method, such as CVD, PECVD, or the like.

In some embodiments, an ESL 192 is formed between the ILD 194 and the upper gate spacers 90U, the ILD 114, the upper gate electrodes 134U, the upper source/drain contacts 144U, and the upper gate contacts 156U. The ESL 192 may include a dielectric material having a high etching selectivity from the etching of the ILD 194, such as, silicon nitride, silicon oxide, silicon oxynitride, or the like.

Upper gate vias 160U and upper source/drain vias 158U are formed to contact, respectively, the upper gate contacts 156U and the upper source/drain contacts 144U/148U. The upper gate vias 160U may be physically and electrically coupled to the upper gate contacts 156U. The upper source/drain vias 158U may be physically and electrically coupled to the upper source/drain contacts 144U/148U. Although not explicitly illustrated, upper gate vias 160U may also be made to gate contacts 156U' to provide frontside electrical contact to respective gate stacks that the gate contacts 156U' extend through.

As an example to form the upper gate vias 160U and the source/drain vias 158U, openings for the upper gate vias 160U and the source/drain vias 158U are formed through the ILD 194 and the ESL 192. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A planarization process, such as a CMP, may be performed to remove excess material from the top surface of the ILD 194. The remaining liner and conductive material form the upper gate vias 160U and the source/drain vias 158U in the openings. The upper gate vias 160U and the source/drain vias 158U may be formed in distinct processes, or may be formed in the same process.

Further, an interconnect structure 180 is formed on the upper transistor layer 250, e.g., over the ILD 194. The interconnect structure 180 includes dielectric layers 182 and layers of conductive features 184 in the dielectric layers 182. The dielectric layers 182 and conductive features 184 may be made of a similar material using similar processes as the dielectric layers 172 and conductive features 174, respectively, as described above. The conductive features 184 may include conductive lines and vias. The conductive vias may extend through respective ones of the dielectric layers 182 to provide vertical connections between layers of conductive lines. The conductive features 184 may be formed by a damascene process, such as a single damascene process, a dual damascene process, or the like. In a damascene process, a dielectric layer 182 is patterned utilizing photolithography and etching techniques to form trenches and via openings corresponding to the desired pattern of the conductive features 184. The trenches and via openings may then be filled with a conductive material. Suitable conductive materials include copper, aluminum, tungsten, cobalt, gold, combinations thereof, or the like, which may be formed by electroplating or the like.

The interconnect structure 180 includes any desired number of layers of the conductive features 184. The conductive features 184 are connected to features of the underlying devices (e.g., the upper gate electrodes 134U and the upper epitaxial source/drain regions 108U) through the upper gate vias 160U and the upper source/drain vias 158U to form functional circuits. In other words, the conductive features 184 interconnect the upper nanostructure-FETs of the upper device layer.

Thus, as described above, a device comprising CFETs is provided. The CFETs include stacked nanostructure-FETs. Interconnections between gates of the stacked nanostructure-FETs are made through gate contacts that extend through gate electrodes of the CFETs and conductive lines of an intermetal layer between the stacked transistors. Interconnections between source/drain of the stacked nanostructure-FETs are made through source/drain contacts that extend through source/drain regions of the CFETs and conductive lines of the intermetal layer between the stacked transistors. In this manner, contact resistance of gate and/or source/drain connections can be advantageously reduced. Further, silicide regions of the CFETs are made after gate dielectrics of both transistor layers are formed. Thus, annealing processes for forming the gate dielectrics may not affect or damage subsequently formed silicide regions.

Figure 47A:
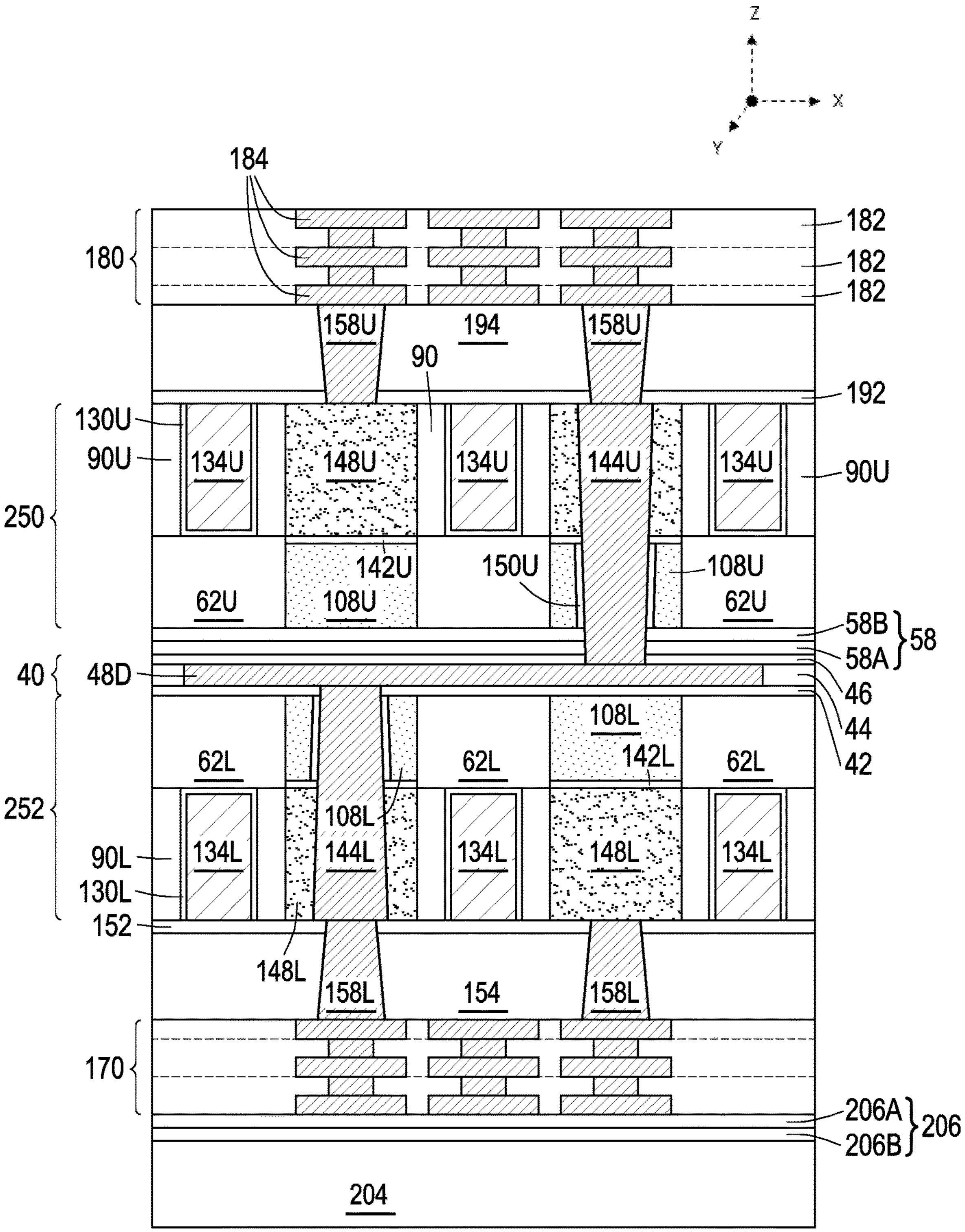
FIGS. 47A, 47B, and 47C illustrate cross-sectional views of a CFET device in accordance with some embodiments.
Figure 47B:
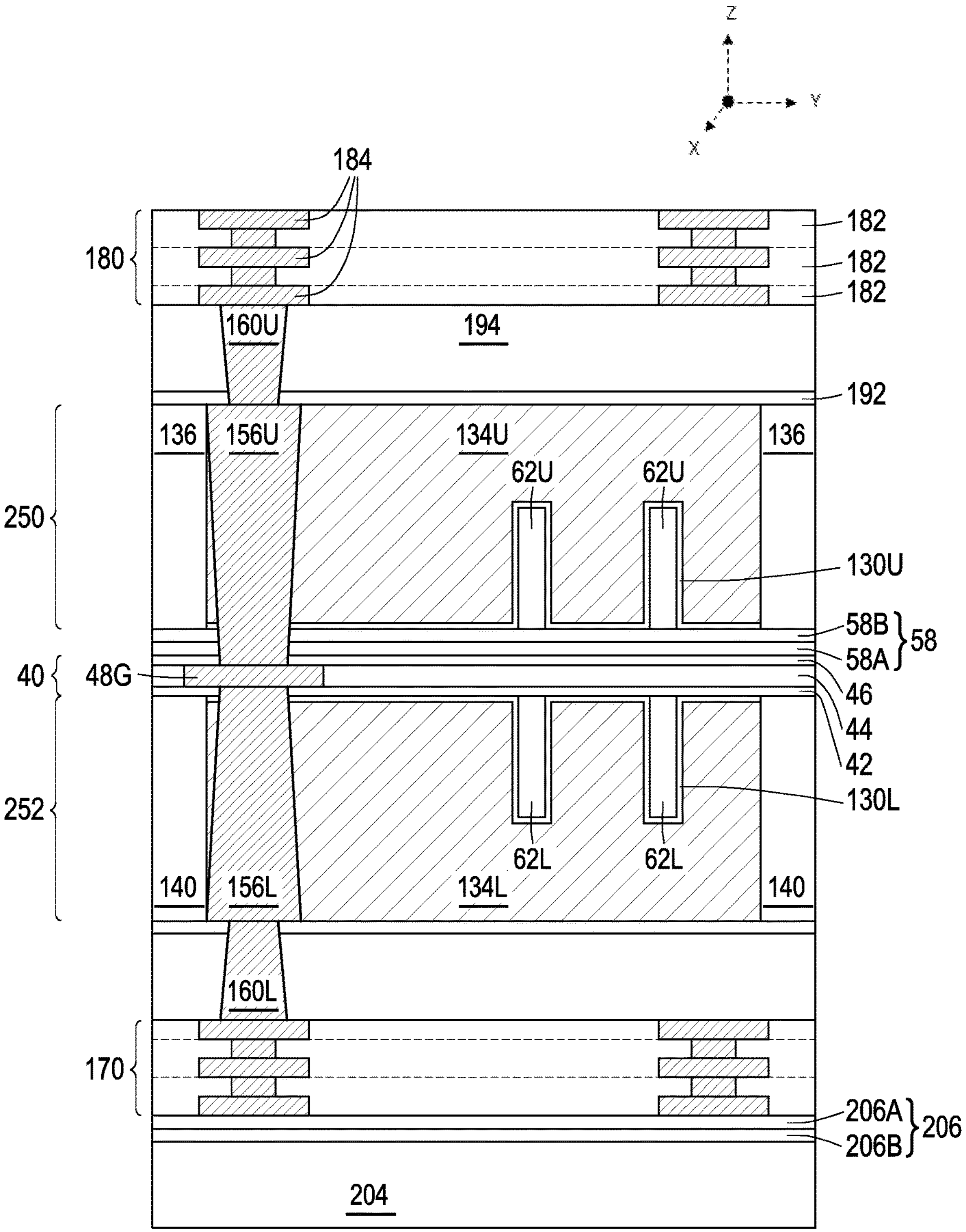
Figure 47C:
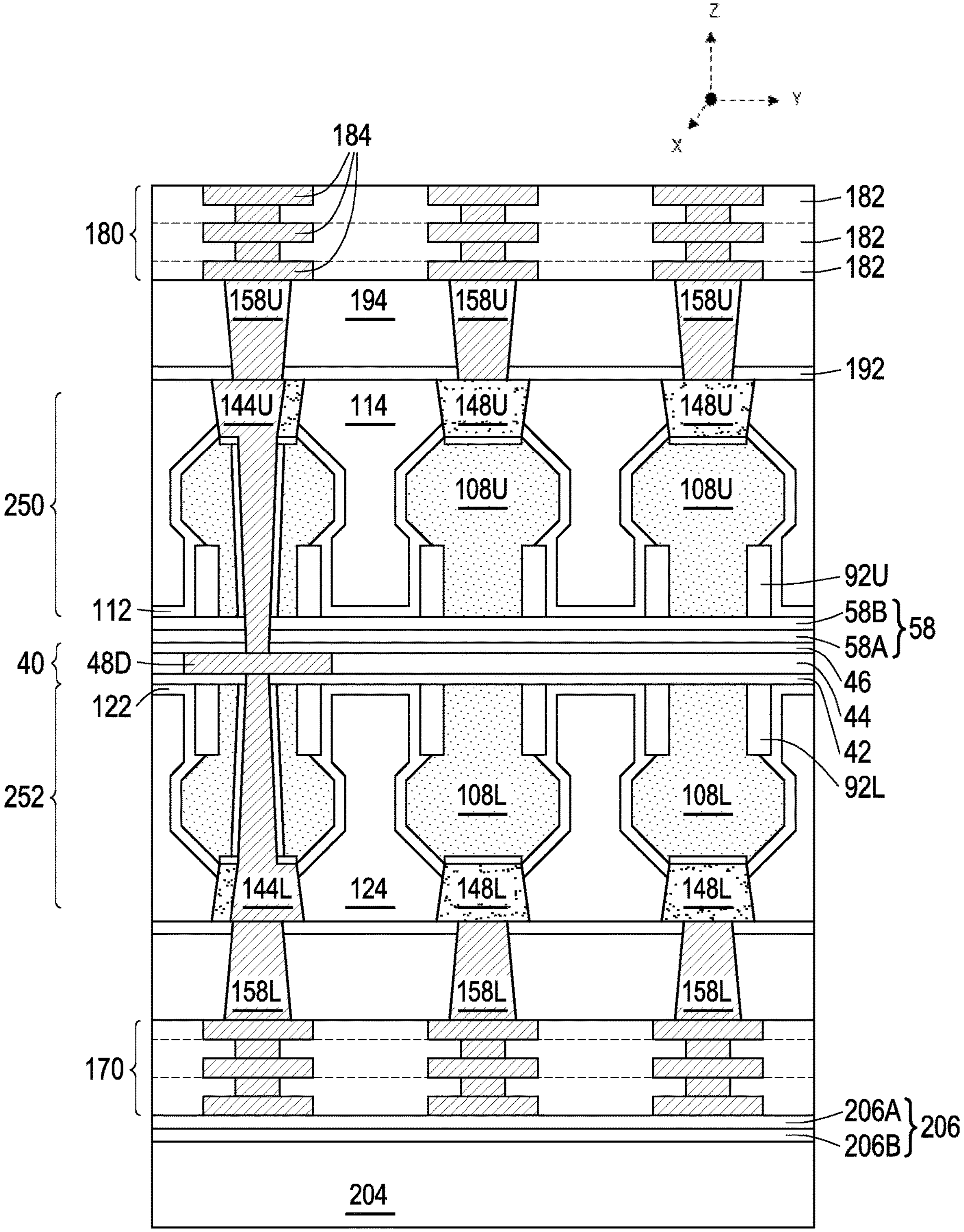

The above embodiments are described in the context of nanostructure-FETs. Specifically, the CFETs include nanostructure-FETs that are vertically stacked. Other embodiments may be applied to other types of transistors. For example, FIGS. 47A-47C illustrate cross-sectional views of a CFET with stacked finFETs. FIG. 47A illustrates a cross-sectional view that is analogous to line A-A' of FIG. 1; FIG. 47B illustrates a cross-sectional view that is analogous to line B-B' of FIG. 1; and FIG. 47C illustrates a cross-sectional view that is analogous to line C-C' of FIG. 1. The structure of FIGS. 47A-47C may be substantially similar to the structure of FIGS. 46A-46C where like reference numerals indicate like elements formed by like process steps unless otherwise noted. However, in the finFET scheme, the upper nanostructures 66U and the lower nanostructures 66L are replaced by upper fins 62U and lower fins 62L, respectively. The upper fins 62U and the lower fins 62L provide channel regions for the upper and lower transistors, respectively. The upper fins 62U and the lower fins 62L may be patterned from a bulk substrate (e.g., the substrates 60U and 60L described above) without forming or patterning any multi-layer stacks of alternating semiconductor materials (e.g., the multi-layer stacks 52U and 52L). An upper gate electrode 134U is disposed along sidewalls and a top surface of the upper fin 62U, and a lower gate electrode 134L is disposed along a top surface and sidewalls of the lower fins 62L.

The intermetal structure 40 is disposed between the upper fins 62U and the lower fins 62L. Similar to the embodiments described above, the upper and lower gate electrodes 134U/134L are electrically connected by upper gate contacts 156U, conductive lines 48G in the intermetal structure 40, and lower gate contacts 156L. The upper and lower gate contacts 156U and 156L extend through a respective upper gate electrode 134U and lower gate electrode 134L, and the upper and lower gate contacts 156U and 156L may each be made of a low resistance material (e.g., W, Co, Ru, or the like). Further, the upper and lower source/drain regions 108U and 108L are electrically connected by upper source/drain contacts 144U, conductive lines 48D in the intermetal structure 40, and lower source/drain contacts 144L. The upper and lower source/drain contacts 144U and 144L extend through a respective upper source/drain region 108U and lower source/drain region 108L, and the upper and lower source/drain contacts 144U and 144L may each be made of a low resistance material (e.g., W, Co, Ru, or the like). As such, relatively low contact resistance can be achieved by reducing routing distance and selecting low resistivity materials. In some embodiments, silicide regions may not be formed for various source/drain contacts until after both gate dielectrics 130U and 130L are formed to reduce an impact on gate dielectric annealing processes on the silicide regions of the completed device.

Figure 48:
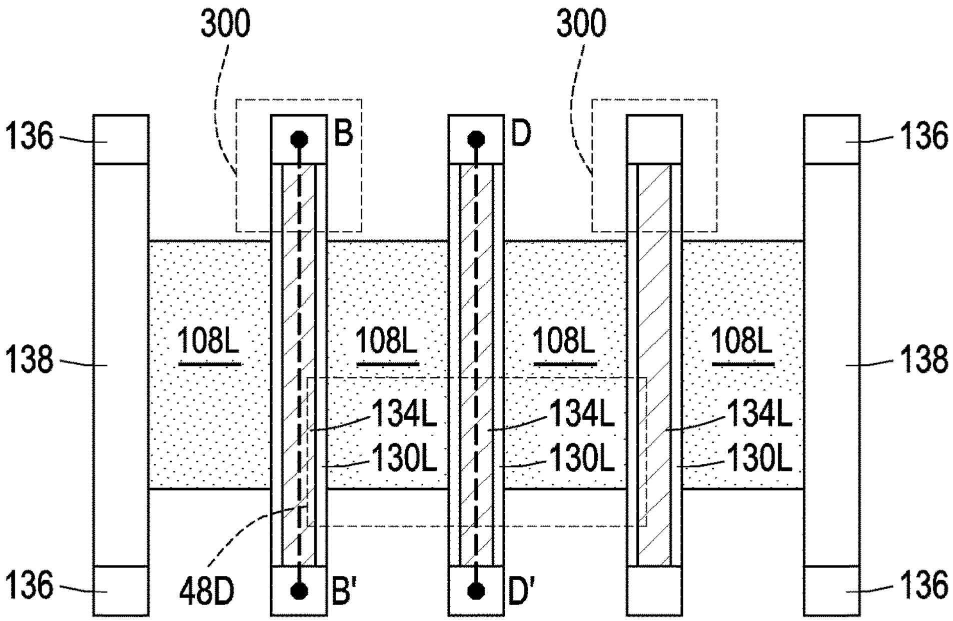
FIGS. 48, 49A, 49B, 49C, 49D, 49E, and 49F illustrate various views of intermediary stages of manufacturing a CFET device in accordance with some embodiments.

Various embodiments described above include embodiments where the mask for making gate contacts (e.g., the gate contacts 156U/156L) define slot type openings which expose a plurality of gate structures. As a result, gate contacts are made separately through the upper and lower gate stacks, and conductive lines (e.g., conductive lines 48G) are used to interconnect desired ones of the upper and lower gate stacks. In other embodiments, for example, with the aid of advanced lithography tools (e.g., EUV lithography tools), more targeted mask openings are possible. For example, FIGS. 48 through 49F illustrate cross-sectional views of an embodiment where gate contact masks include more targeted openings, and upper and lower gate stacks are interconnected without relying on conductive lines in the intermetal structure 40. FIGS. 48 through 49F illustrate similar features as the embodiment of FIGS. 2A through 46C where like reference numerals indicate like elements formed by like processes unless otherwise noted.

FIG. 48 illustrates a top-down view of a gate contact mask with openings 300. Certain features are omitted from FIG. 48 for clarity. In FIG. 48, the position of the conductive lines 48 of the intermetal structure 40 is illustrated in dashed lines. As can be seen by FIG. 48, each of the openings 300 overlaps a single gate stack, and openings 300 do not expose any gate stacks where connections between stacked gates are not desired (e.g., split gate configurations). Further, the conductive lines 48G may be omitted from the intermetal structure 40 because the openings 300 do not expose any gate structures where electrical interconnections are not desired. The openings 300 may be achieved, for example, with advanced lithography tools, such as EUV.

Figure 49A:
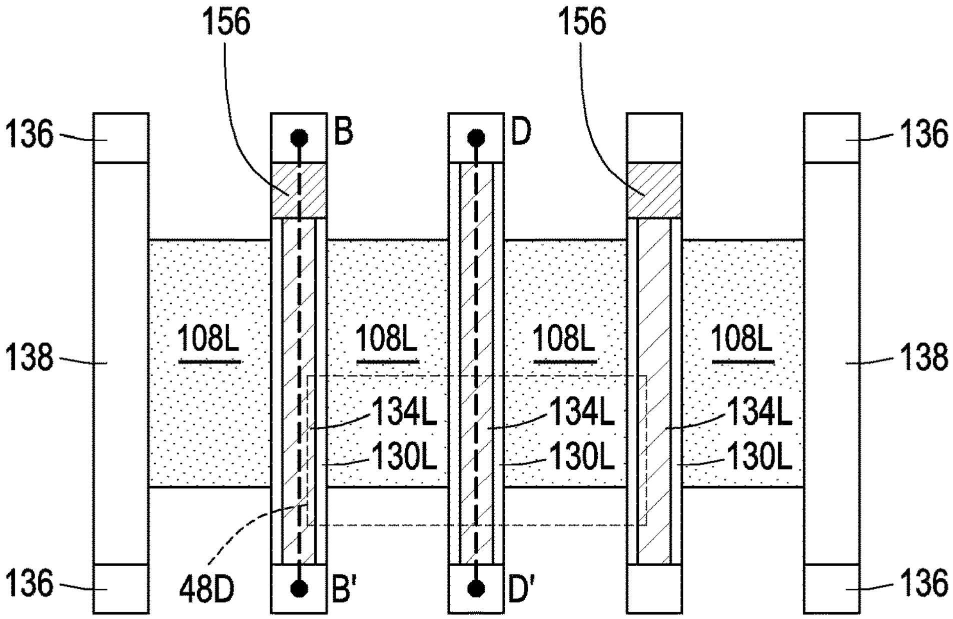
Figure 49B:
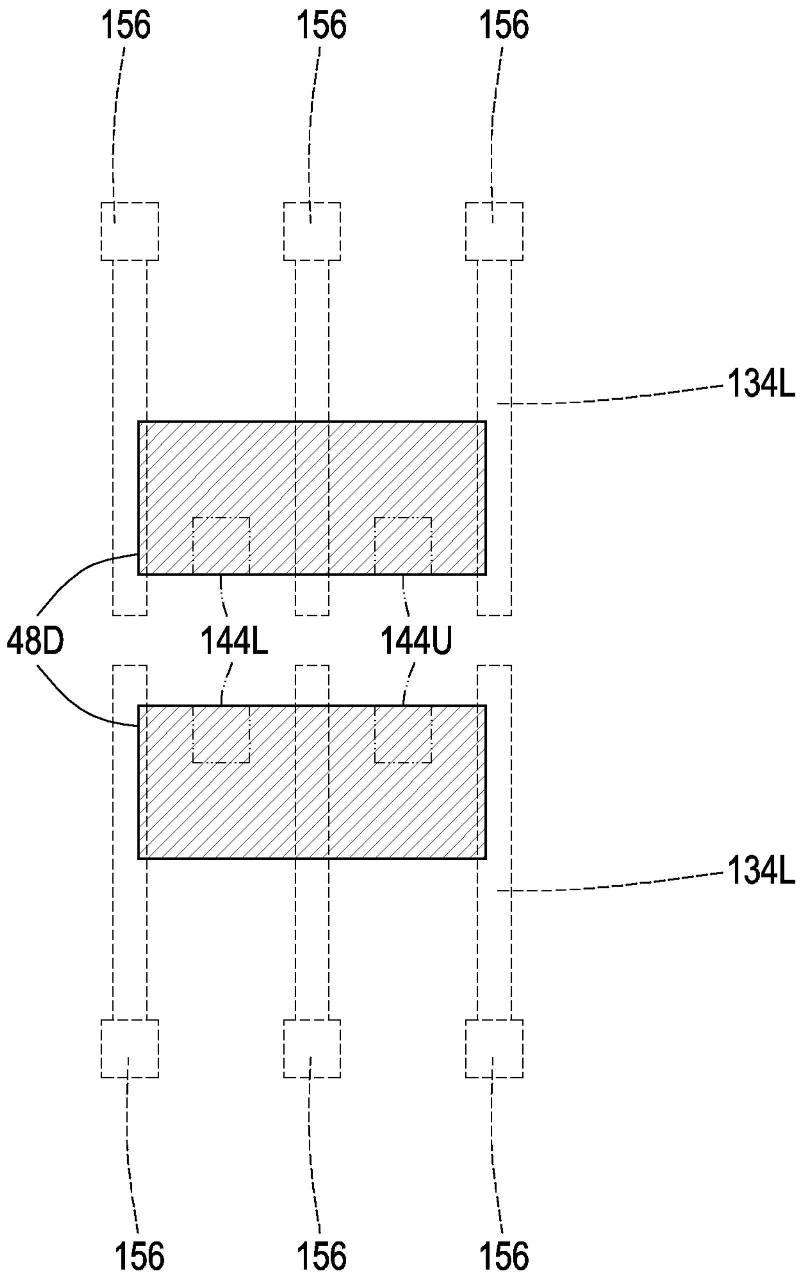
Figure 49C:
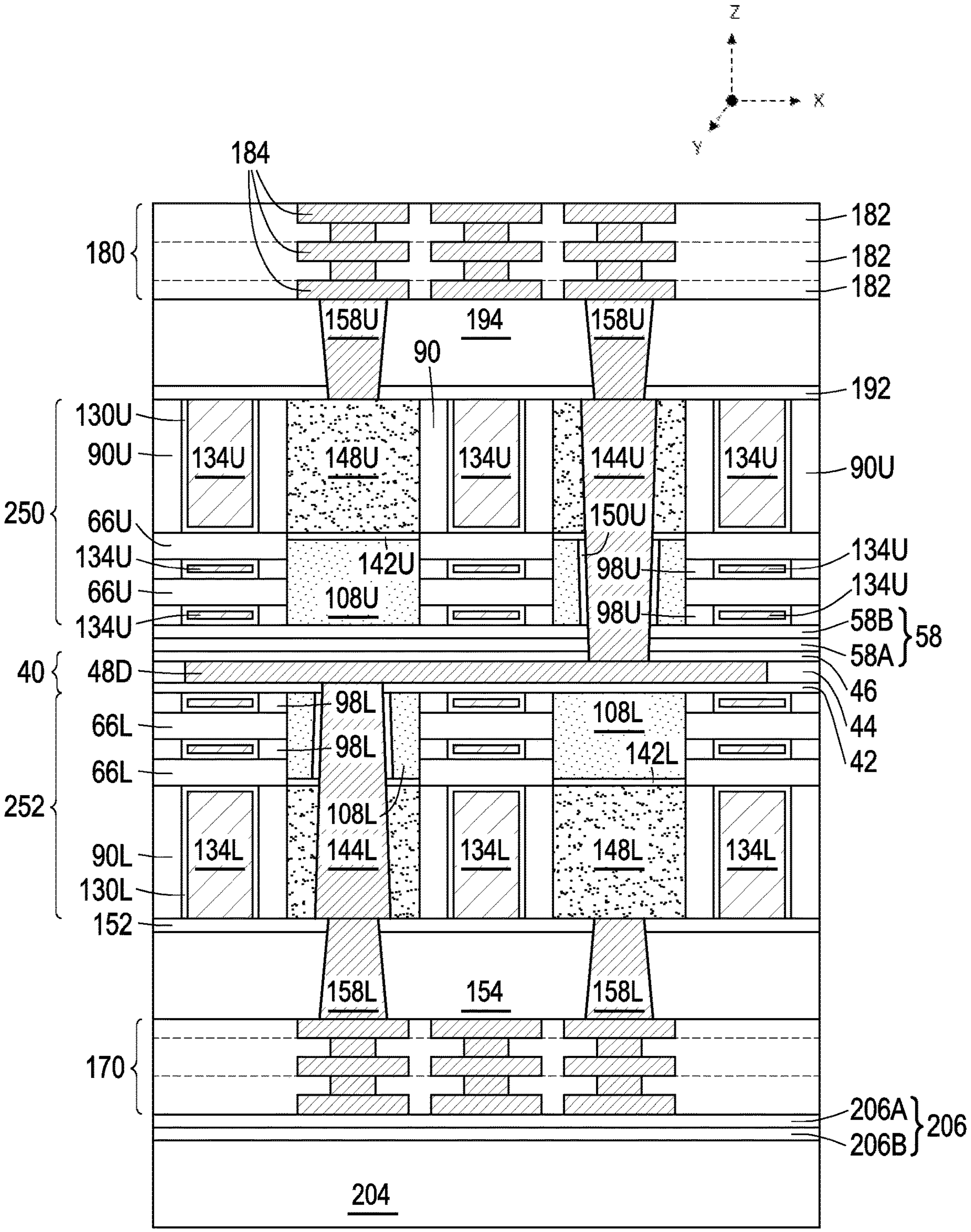
Figure 49D:
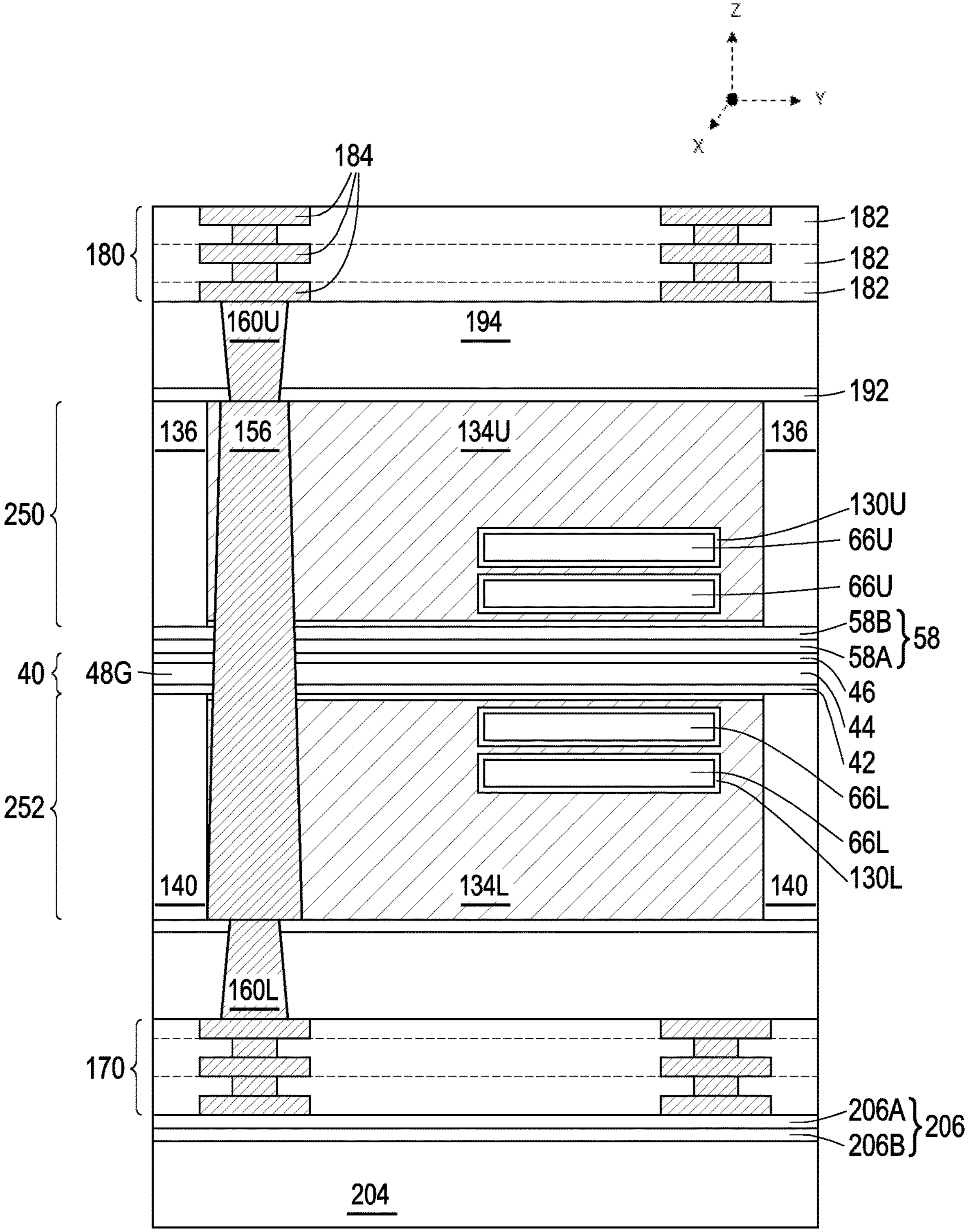
Figure 49E:
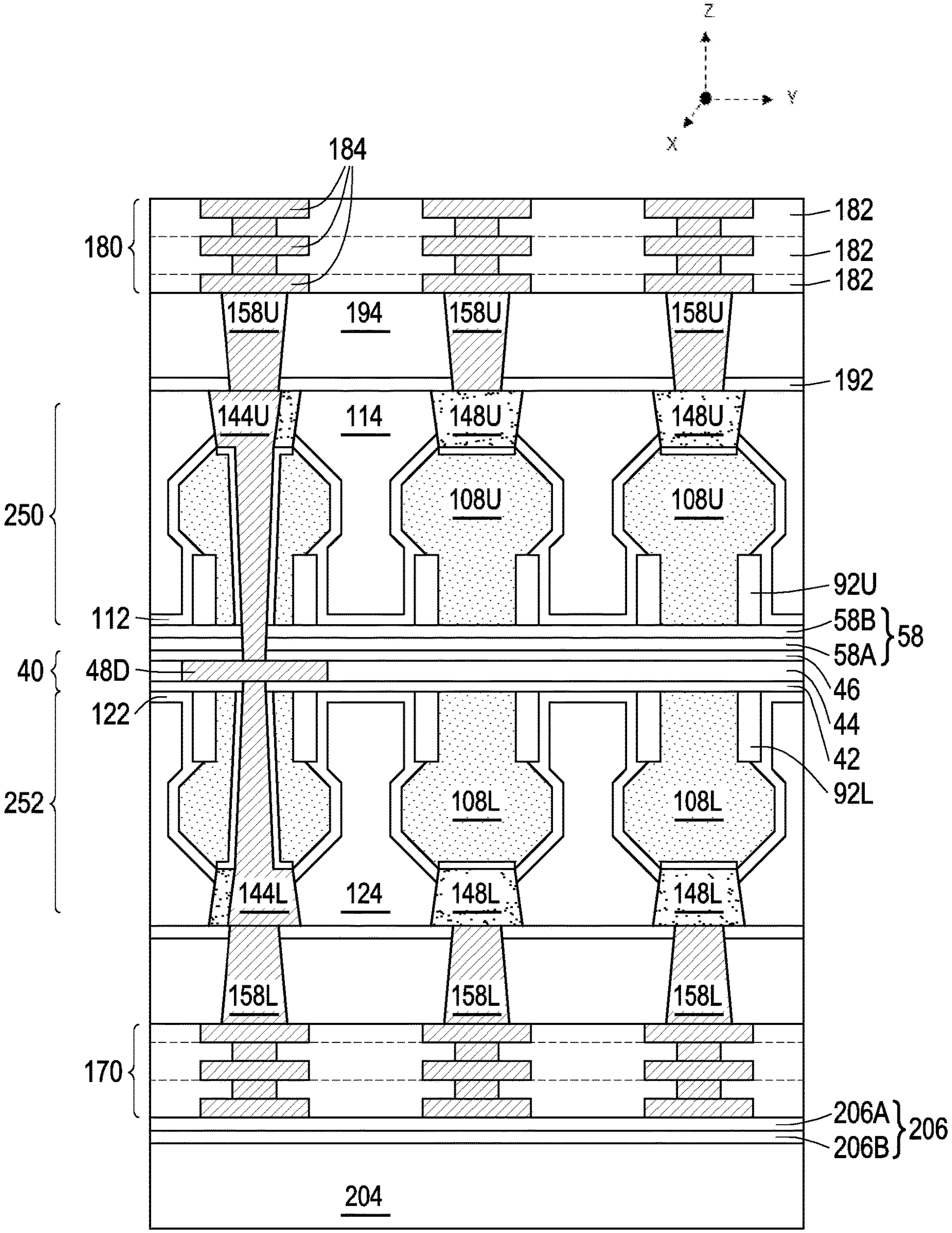
Figure 49F:
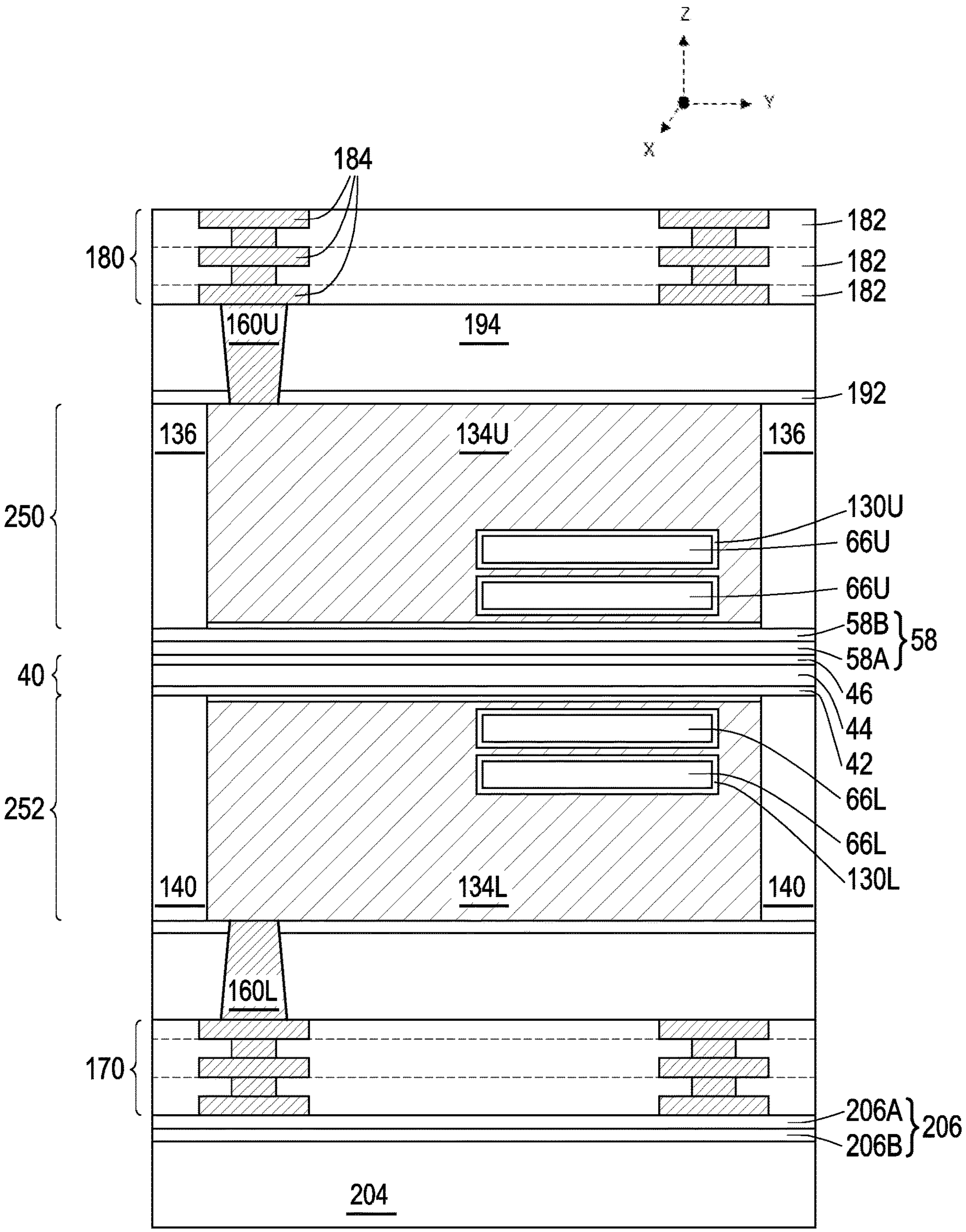

FIGS. 49A-49F illustrate the completed structure after gate contacts are formed with the mask described in FIG. 48. FIG. 49A illustrates a top-down view of gate structures after the gate contacts 156 are formed. FIG. 49B illustrates a top-down view of the intermetal structure 40. In FIGS. 49A and 49B, certain features are omitted for clarity. In FIG. 49A, the position of conductive lines in the intermetal structure 40 are illustrated by dashed lines, and in FIG. 49B, the positions of gate electrodes 134L, gate contacts 156, source/drain contacts 144U and 144L are illustrated in dashed lines. The conductive lines 48 do not include any conductive lines 48G that interconnect the upper gate stacks to lower gate stacks. FIG. 49C illustrates a cross-sectional view along line A-A' of FIG. 1; FIG. 49D illustrates a cross-sectional view along line B-B' of FIGS. 1 and 49A; FIG. 49E illustrates a cross-sectional view along line C-C' of FIG. 1; and FIG. 49F illustrates a cross-sectional view along line D-D' of FIG. 49A.

In some embodiments, a single gate contact 156 may extend through the upper gate electrode 134U, the bonding layers 58, the etch stop layer 46, the intermetal dielectric layer 44, the etch stop layer 42, and the lower gate electrode 134L. The single gate contact 156 provides electrical connection between the upper gate stacks 130U/134U and the lower gate stacks 130L/134L without the aide of conductive lines in the intermetal structure 40. Further, as illustrated by FIG. 49E, no gate contacts 156 may be formed in split gate configurations where no electrical connection between overlapping gate stacks is desired.

Various embodiments described above describe a particular sequence in which features of CFETs are formed. For example, as described above, a first replacement gate process is performed for the upper transistors to form the upper gate stacks 130U/134U and, subsequently, a second replacement gate process is performed for the lower transistors to form the lower gate stacks 130L/134L. In other embodiments, a different sequence of steps may be performed to mitigate potential thermal budget issues. For example, in some embodiments, the gate electrodes 134L and 134U are only formed after both gate dielectrics 130U and 130L are deposited and annealed. As a result, the risk of threshold voltage shifting due to gate dielectric annealing steps is reduced.

FIGS. 50A through 63C illustrate cross-sectional views of various intermediary steps of forming CFETs, in accordance with some embodiments. FIGS. 50A, 51A, 52A, 53A, 54A, 55A, 58A, 59A, 60A, and 63A illustrate cross-sectional views along a similar cross-section as reference cross-section A-A' in FIG. 1. FIGS. 50B, 51B, 52B, 53B, 54B, 55B, 56B, 58B, 59B, 60B, 61B, and 63B illustrate cross-sectional views along a similar cross-section as reference cross-section B-B' in FIG. 1. FIGS. 50C, 51C, 52C, 53C, 54C, 55C, 58C, 59C, 60C, and 63C illustrate cross-sectional views along a similar cross-section as reference cross-section C-C' in FIG. 1. FIGS. 56A, 57, 61A, and 62 illustrate top-down views. FIGS. 50A through 63C illustrate similar features as the embodiment of FIGS. 2 through 46C where like reference numerals indicate like elements formed by like processes unless otherwise noted.

Figure 50A:
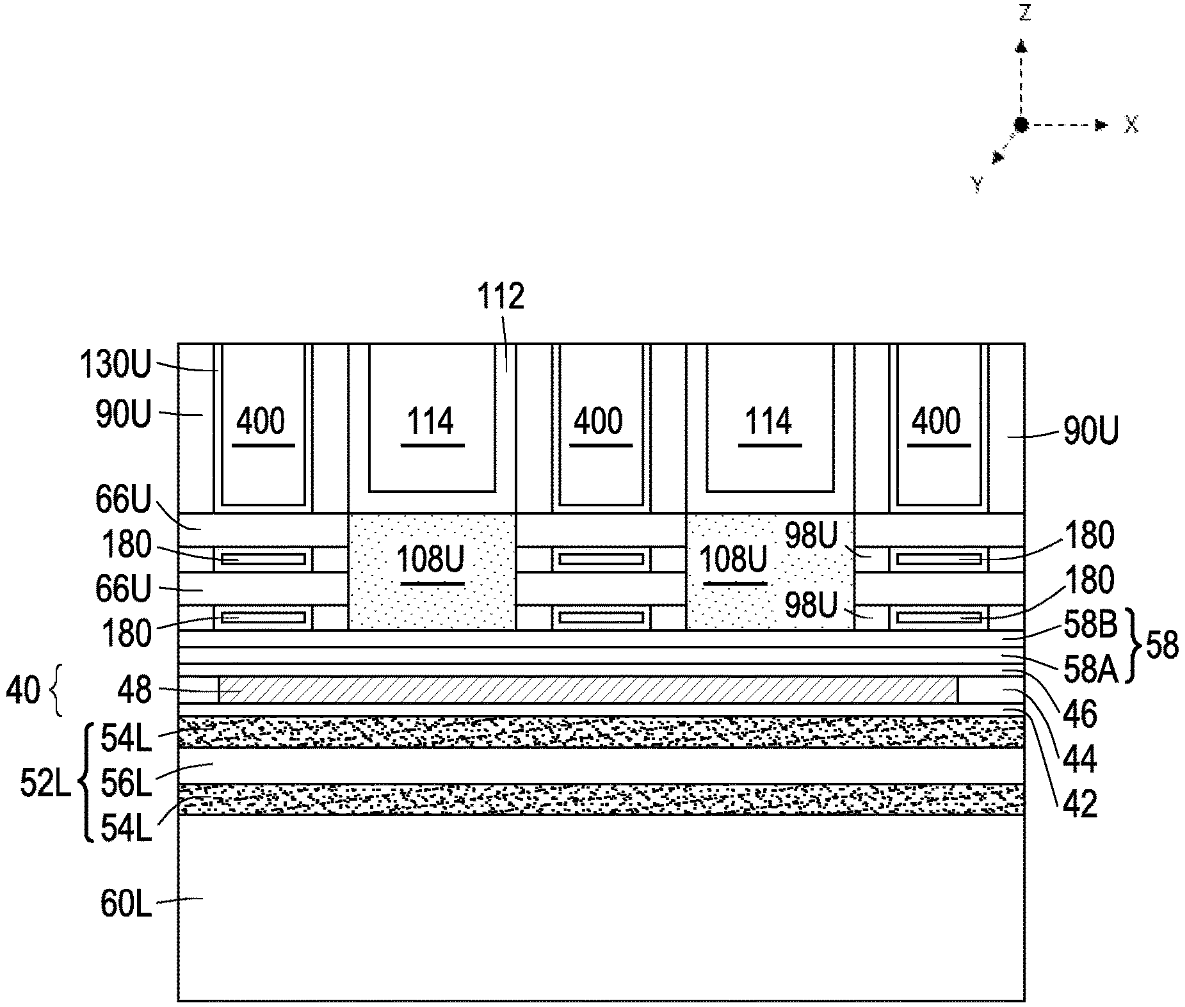
FIGS. 50A, 50B, 50C, 51A, 51B, 51C, 52A, 52B, 52C, 53A, 53B, 53C, 54A, 54B, 54C, 55A, 55B, 55C, 56A, 56B, 57, 58A, 58B, 58C, 59A, 59B, 59C, 60A, 60B, 60C, 61A, 61B, 62, 63A, 63B, and 63C illustrate various views of intermediary stages of manufacturing a CFET device in accordance with some embodiments.
Figure 50B:
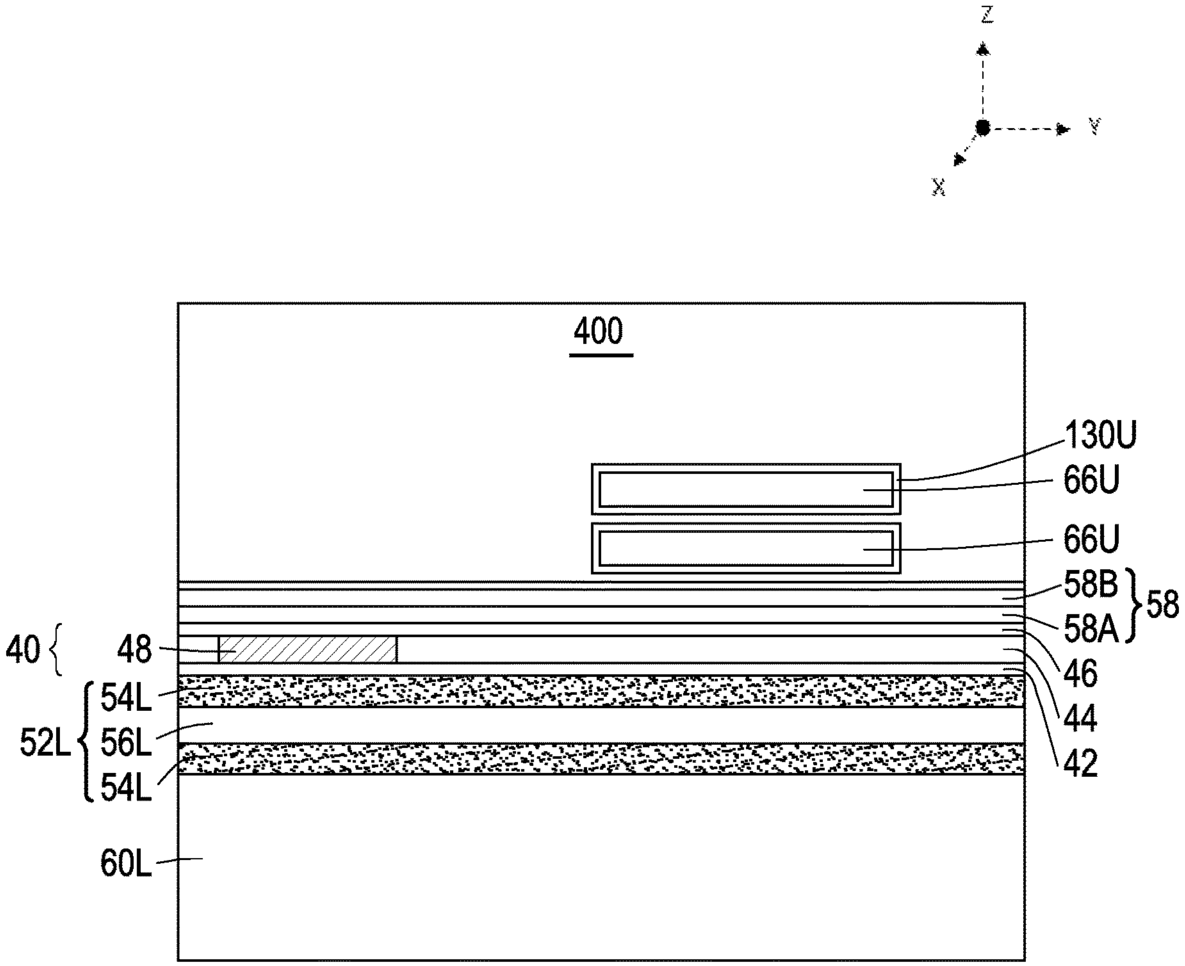
Figure 50C:
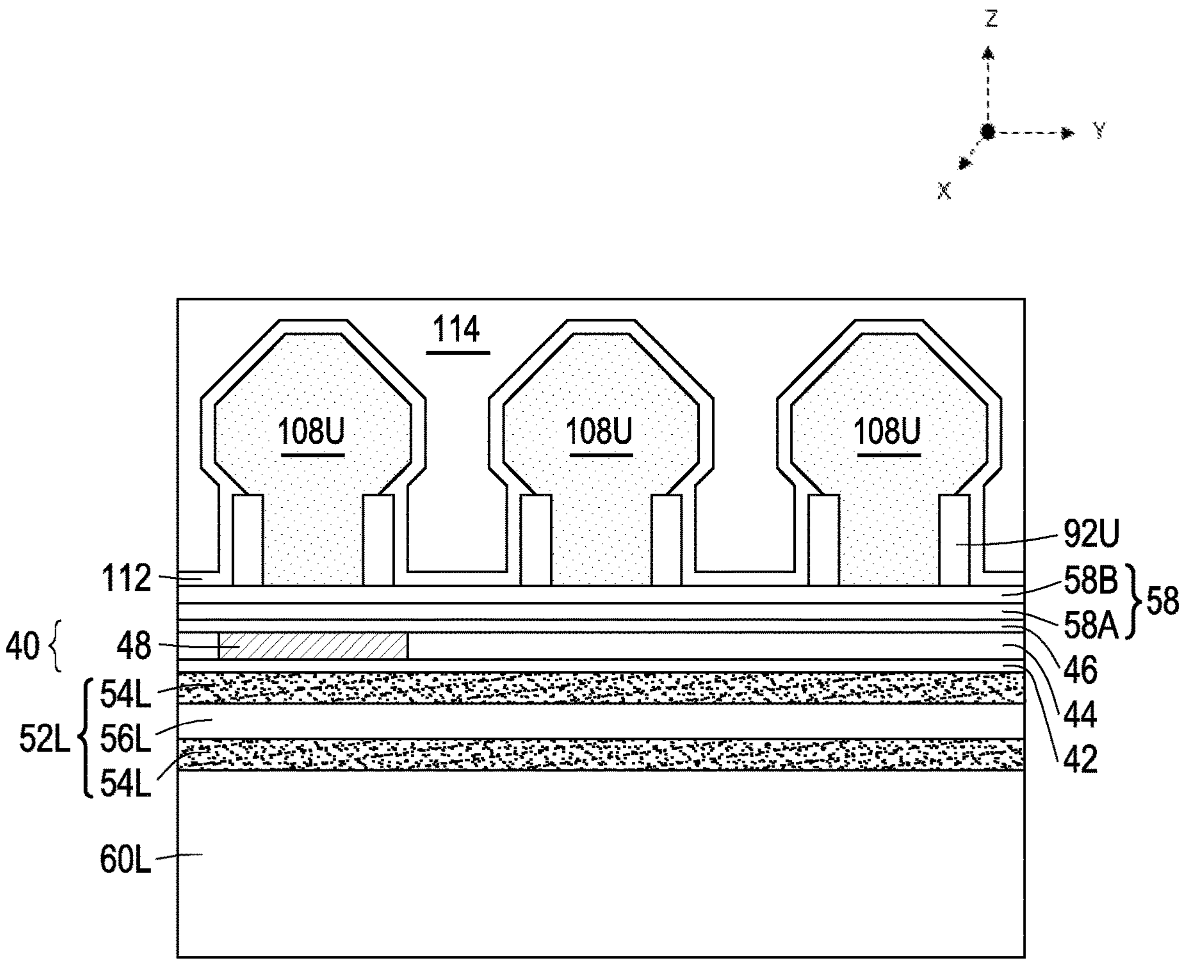

Referring first to FIGS. 50A through 50C, cross-sectional views a CFET at an intermediary stage of manufacture are illustrated. Specifically, a replacement gate process for the upper gate stacks are illustrated, where a dummy gate and dummy nanostructures for the upper transistors have been removed and an upper gate dielectric layer 130U is deposited. In some embodiments, forming the upper gate dielectric layer 130U includes a relatively high temperature annealing process (e.g., in a range of 800° C. to 900° C.) is performed to improve a film quality of the upper gate dielectric layer 130U, thereby improving device reliability of the resulting CFET device. The process steps used to arrive at the structure of FIGS. 50A-50C are described above with respect to FIGS. 2A-17C, and details are not repeated again herein for brevity.

Also illustrated by FIGS. 50A-50C, a sacrificial gate material 400 is deposited over the upper gate dielectric 130U, around the upper nanostructures 66U, and between the upper gate spacers 90U. The sacrificial gate material 400 may be formed in lieu of an upper gate electrode, and the sacrificial gate material 400 may be replaced by the upper gate electrode in subsequent process steps. For example, the sacrificial gate material 400 may be replaced by the upper gate electrode 134U after the lower gate dielectric annealing process to reduce an impact of the annealing process on device performance. In some embodiments, the sacrificial gate material 400 is a polar material which does not significantly impact the electrical properties of the upper gate dielectric 130U. For example, the sacrificial gate material 400 may comprise silicon oxycarbide (SiOC), or the like that is deposited by PVD, CVD, ALD, or the like. After the sacrificial gate material 400 is deposited, a planarization process (e.g., a CMP) may be performed to level top surfaces of the sacrificial gate material 400, the upper gate dielectric 130U, the upper gate spacers 90U, the CESL 112, and the ILD 114.

Figure 51A:
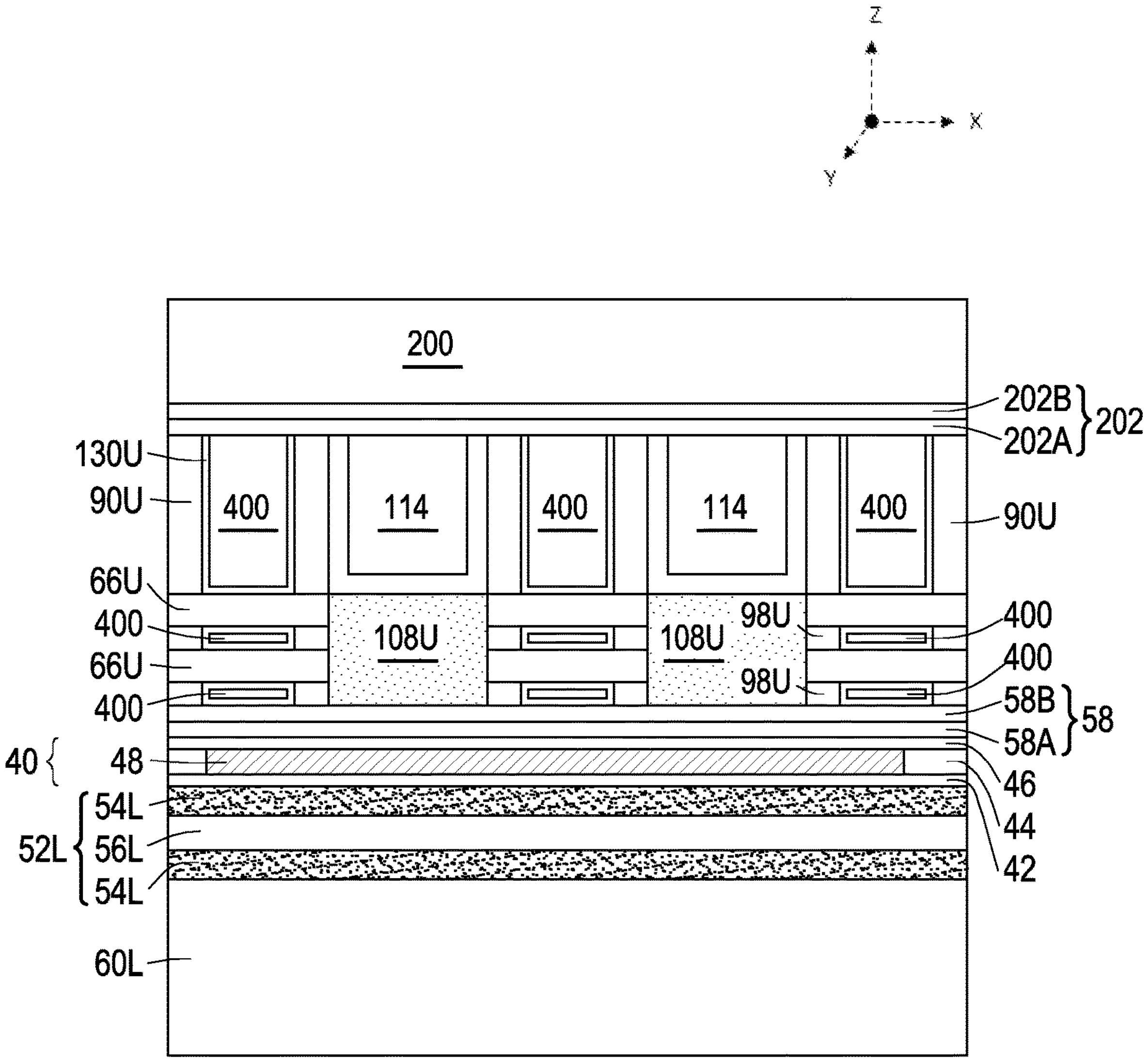
Figure 51B:
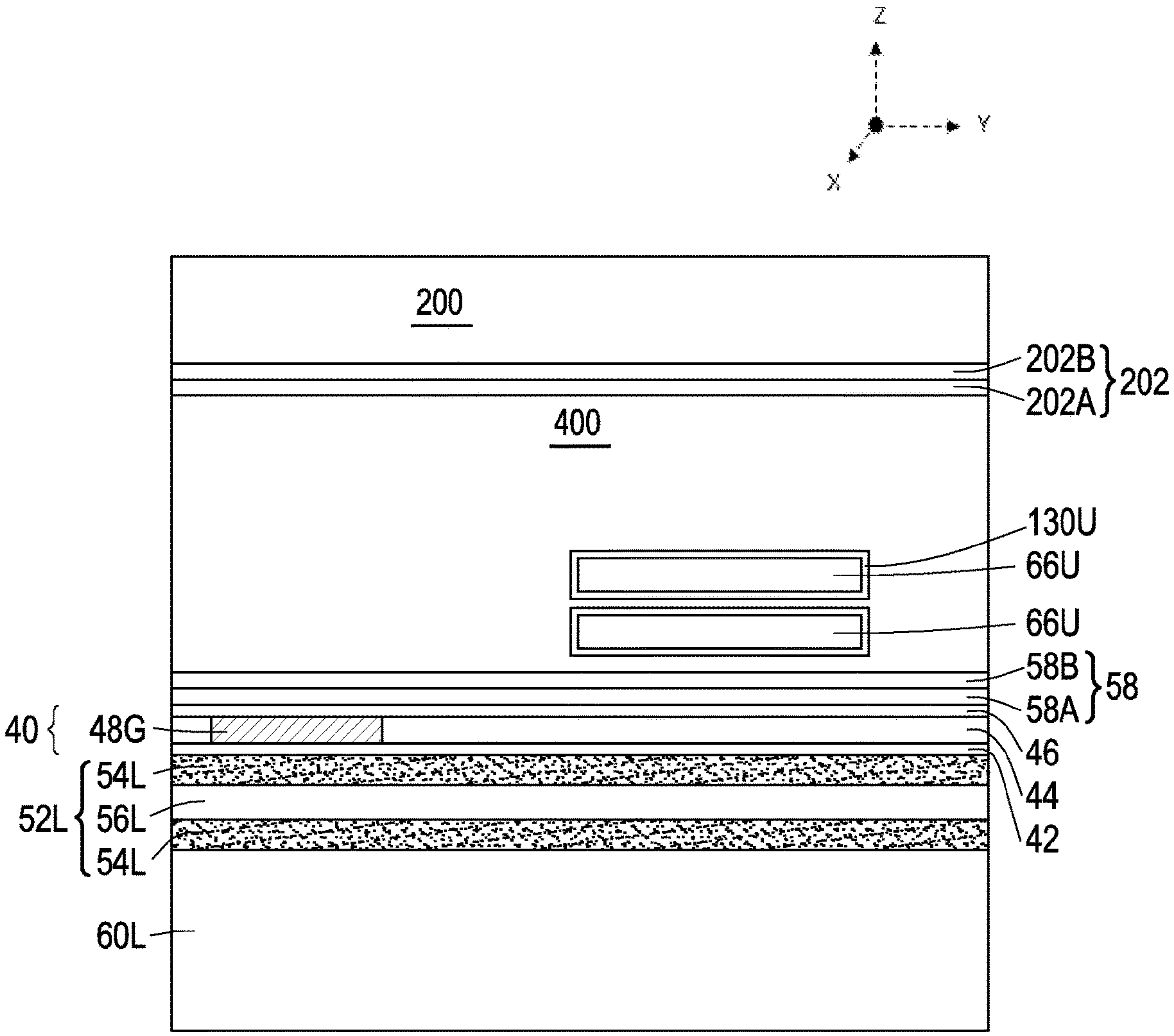
Figure 51C:
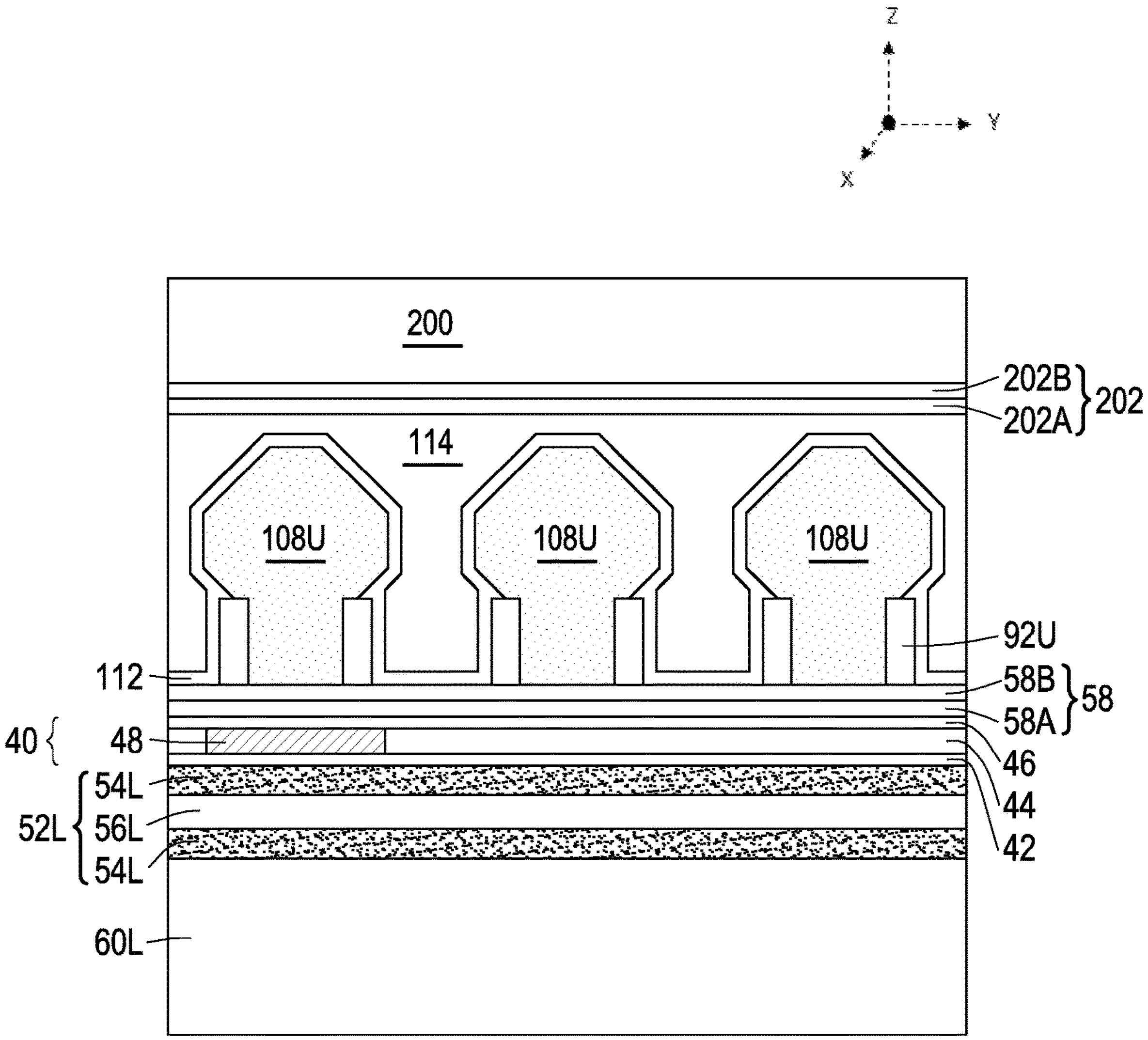

Next, in FIGS. 51A-51C, a carrier substrate 200 is bonded to a top surface of the sacrificial gate material 400 and the ILD 114 by a bonding layer 202. Bonding the carrier substrate 200 with the bonding layer 202 may be similar to the process described above with respect to FIGS. 24A-24C, and details are not repeated again herein for brevity.

Figure 52A:
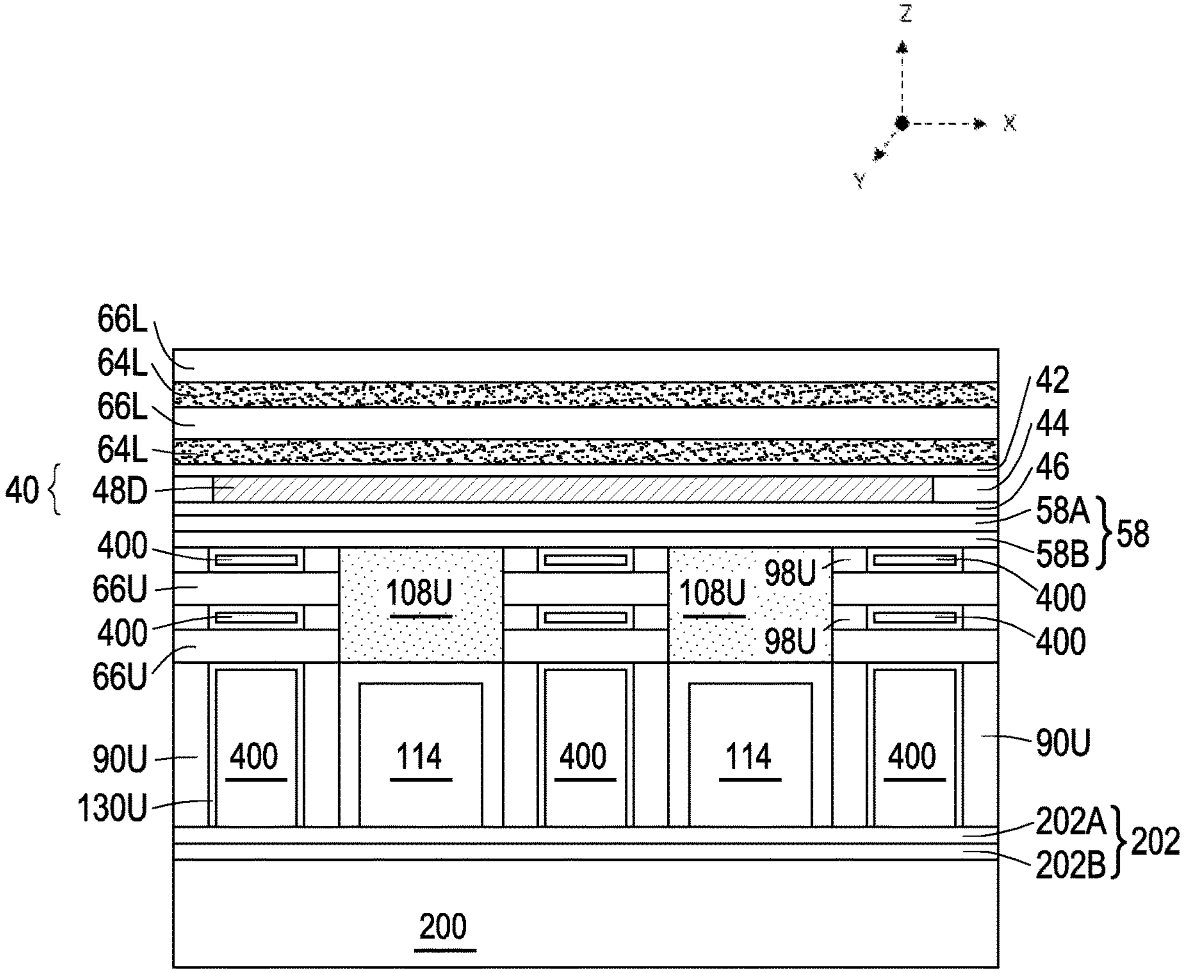
Figure 52B:
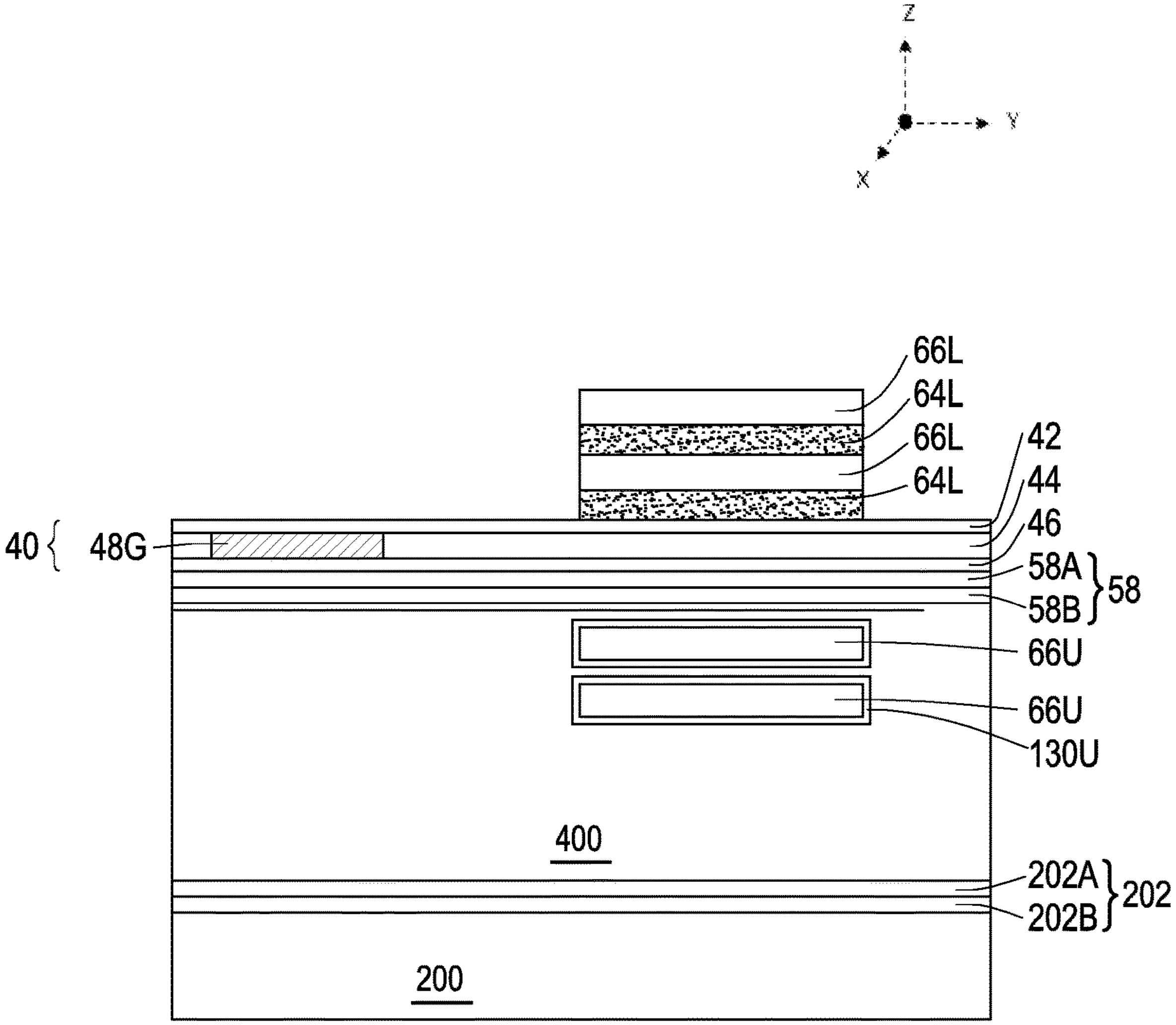
Figure 52C:
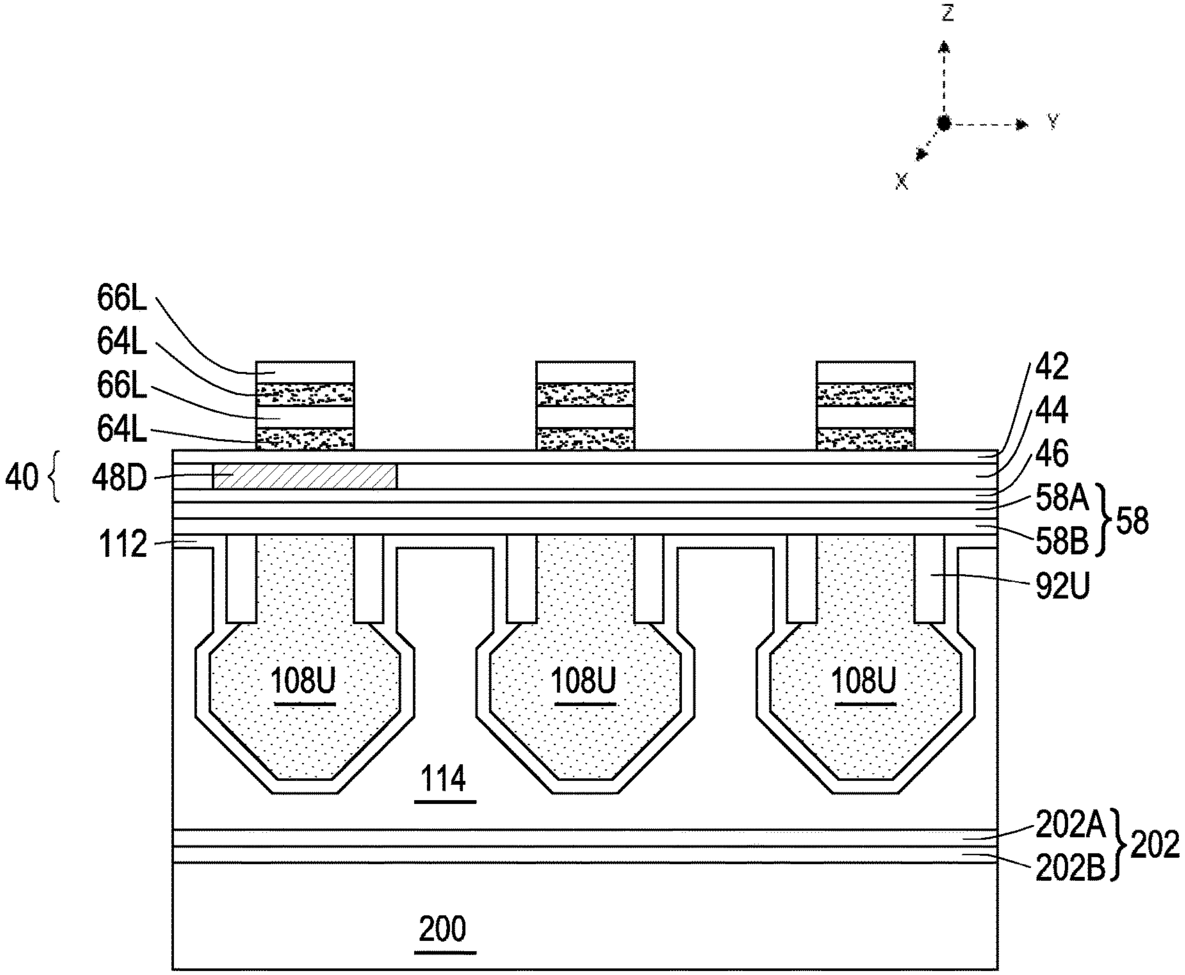

In FIGS. 52A-52C, an orientation of the device is flipped, the lower substrate 60L is thinned, and the lower multi-layer stack 52L is patterned to provide lower semiconductor nanostructures 66L and lower dummy nanostructures 64L. Forming the lower semiconductor nanostructures 66L and lower dummy nanostructures 64L may be achieved through similar process steps as described above with respect to FIGS. 25A-26C, and details are not repeated again herein for brevity.

Figure 53A:
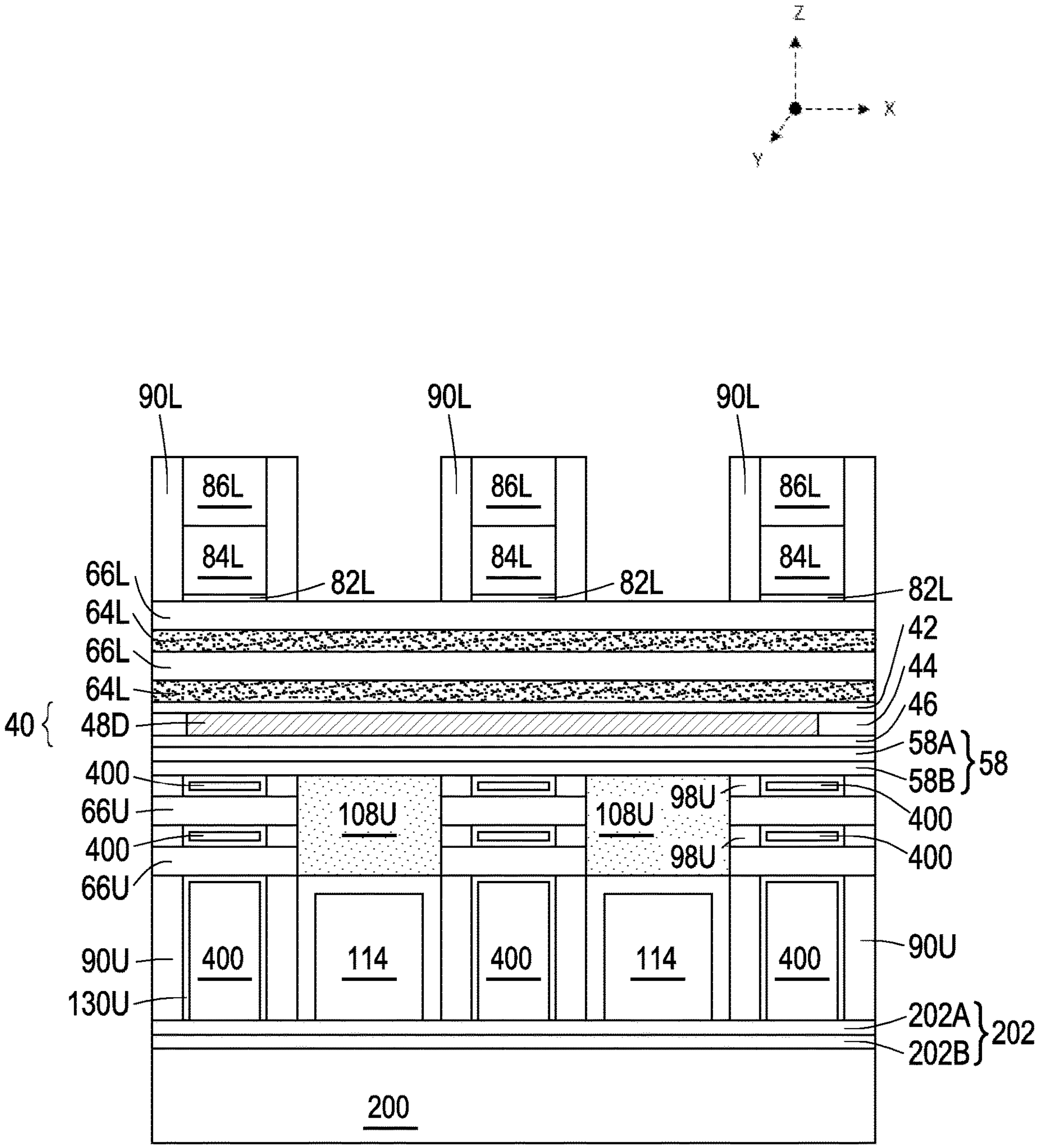
Figure 53B:
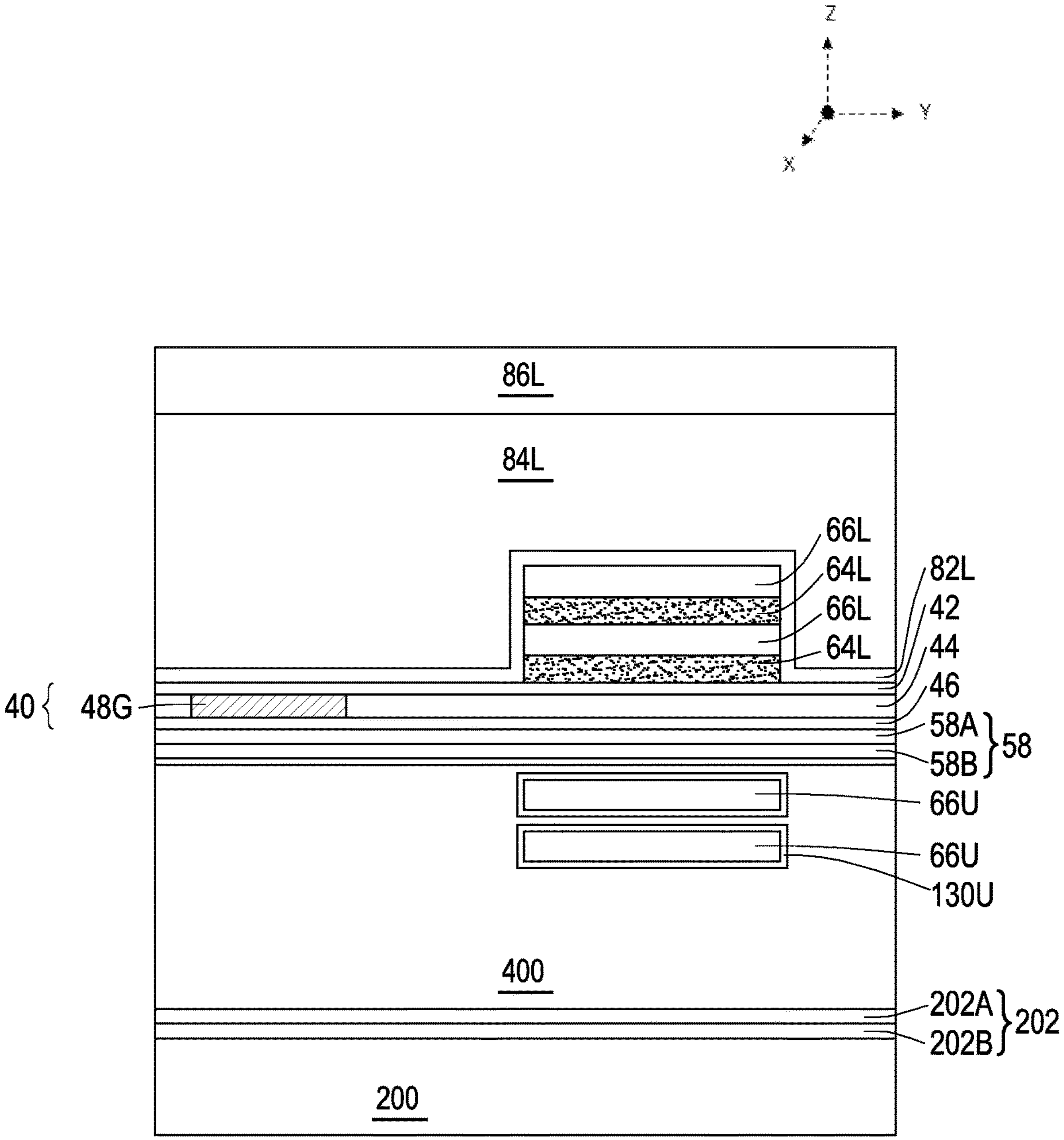
Figure 53C:
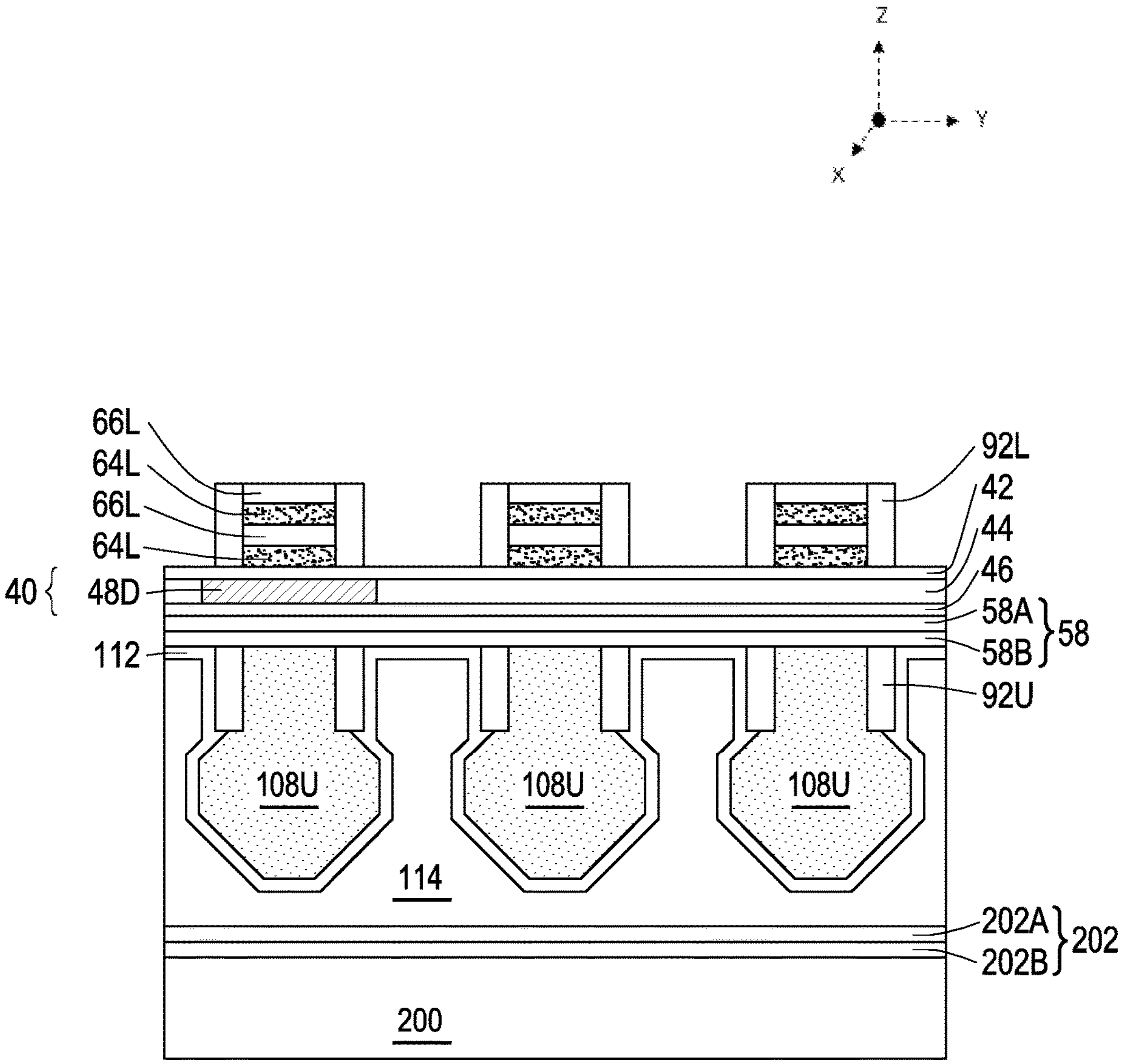

In FIGS. 53A-53C, lower dummy gate stacks are formed over and along sidewalls of the lower semiconductor nanostructures 66L and lower dummy nanostructures 64L. The lower dummy gate stacks include the lower dummy dielectric 82L, the lower dummy gates 84L, and the masks 86L. Further, lower gate spacers 90L may be formed along sidewalls of the lower dummy gate stacks, and optional lower fin spacers 92L are formed on sidewalls of the lower semiconductor nanostructures 66L and lower dummy nanostructures 64L. Forming the lower dummy gate stacks, the lower gate spacers 90L, and the lower fin spacers 92L may be achieved through similar process steps as described above with respect to FIGS. 27A-27C, and details are not repeated again herein for brevity.

Figure 54A:
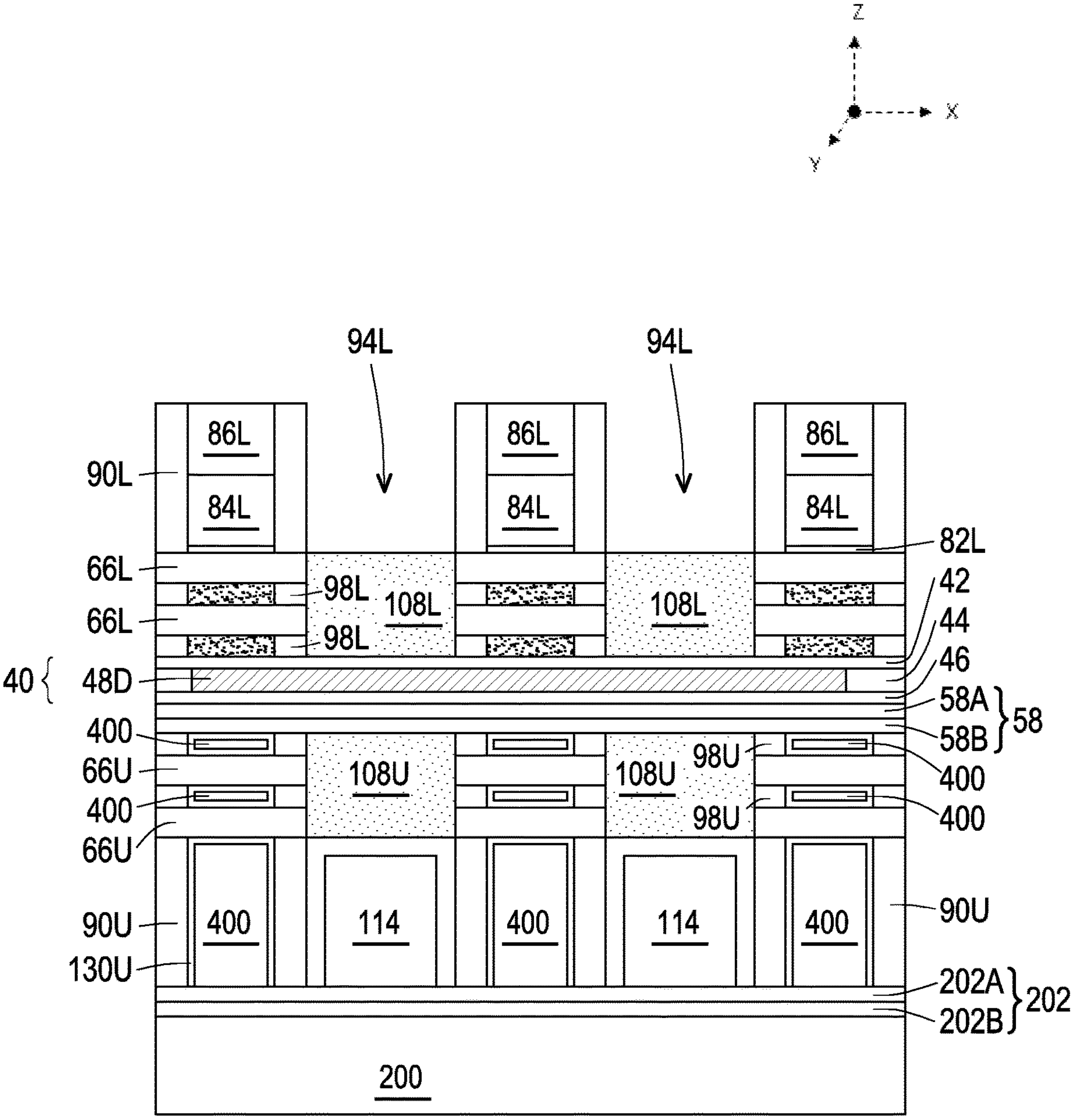
Figure 54B:
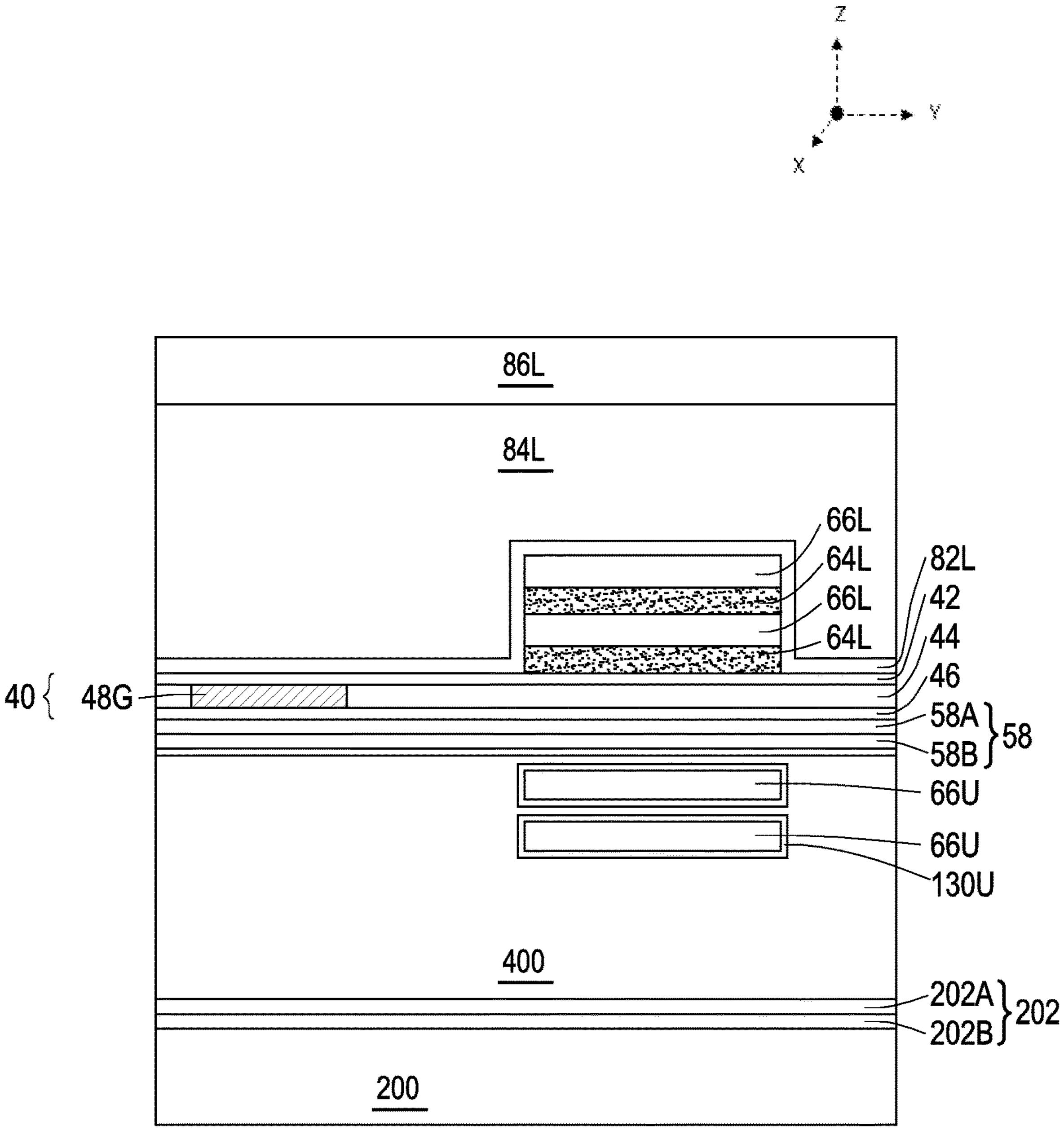
Figure 54C:
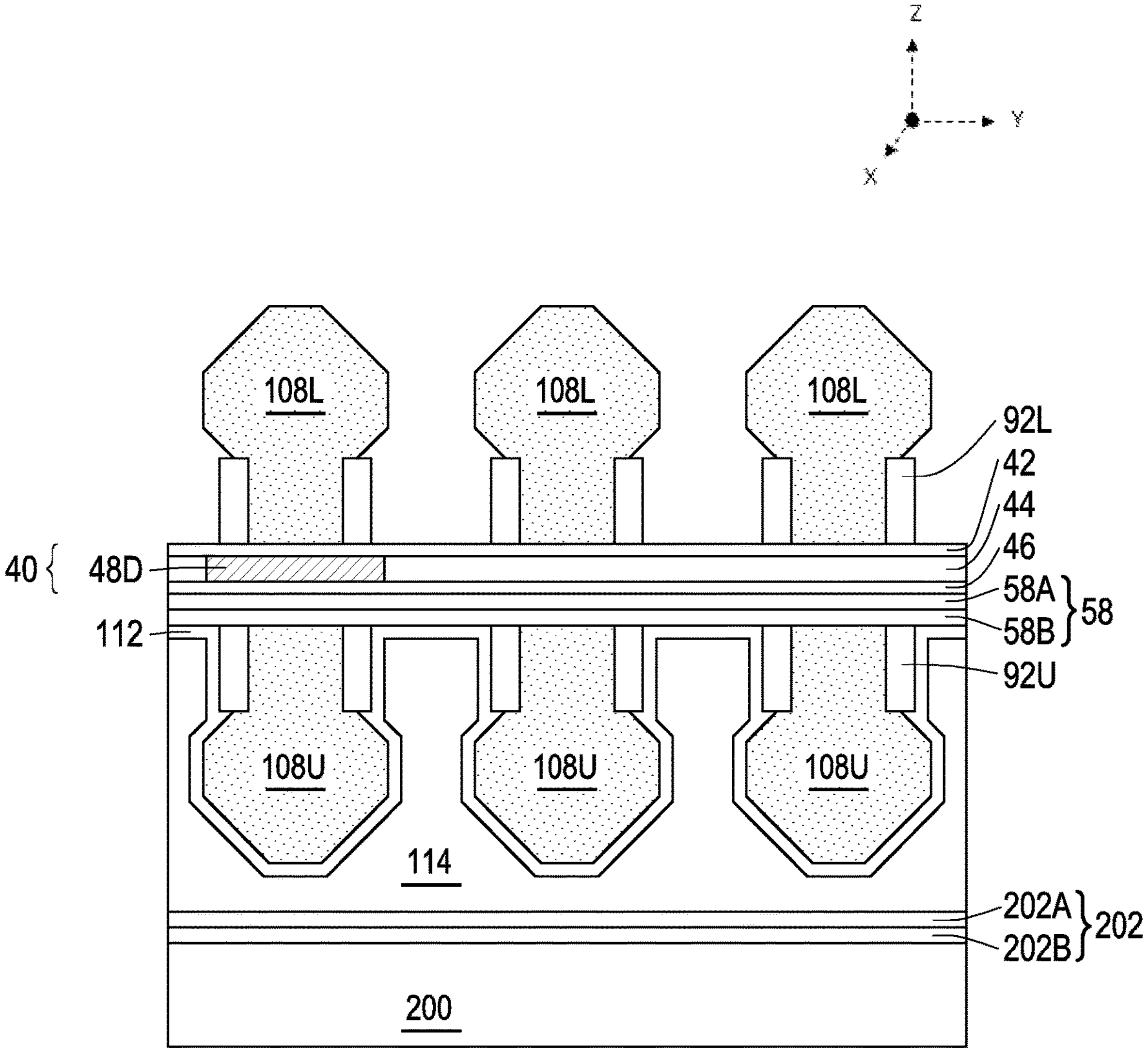

In FIGS. 54A-54C, lower inner spacers 98L and lower source/drain regions 108L are formed. The lower inner spacers 98L may be formed on recessed sidewalls of the lower dummy nanostructures 64L, and the lower source/drain regions 108L may be formed in source/drain recesses that extend through the lower semiconductor nanostructures 66L and lower dummy nanostructures 64L. Forming the lower inner spacers 98L and the lower source/drain regions 108L may be achieved through similar process steps as described above with respect to FIGS. 28A-30C, and details are not repeated again herein for brevity.

Figure 55A:
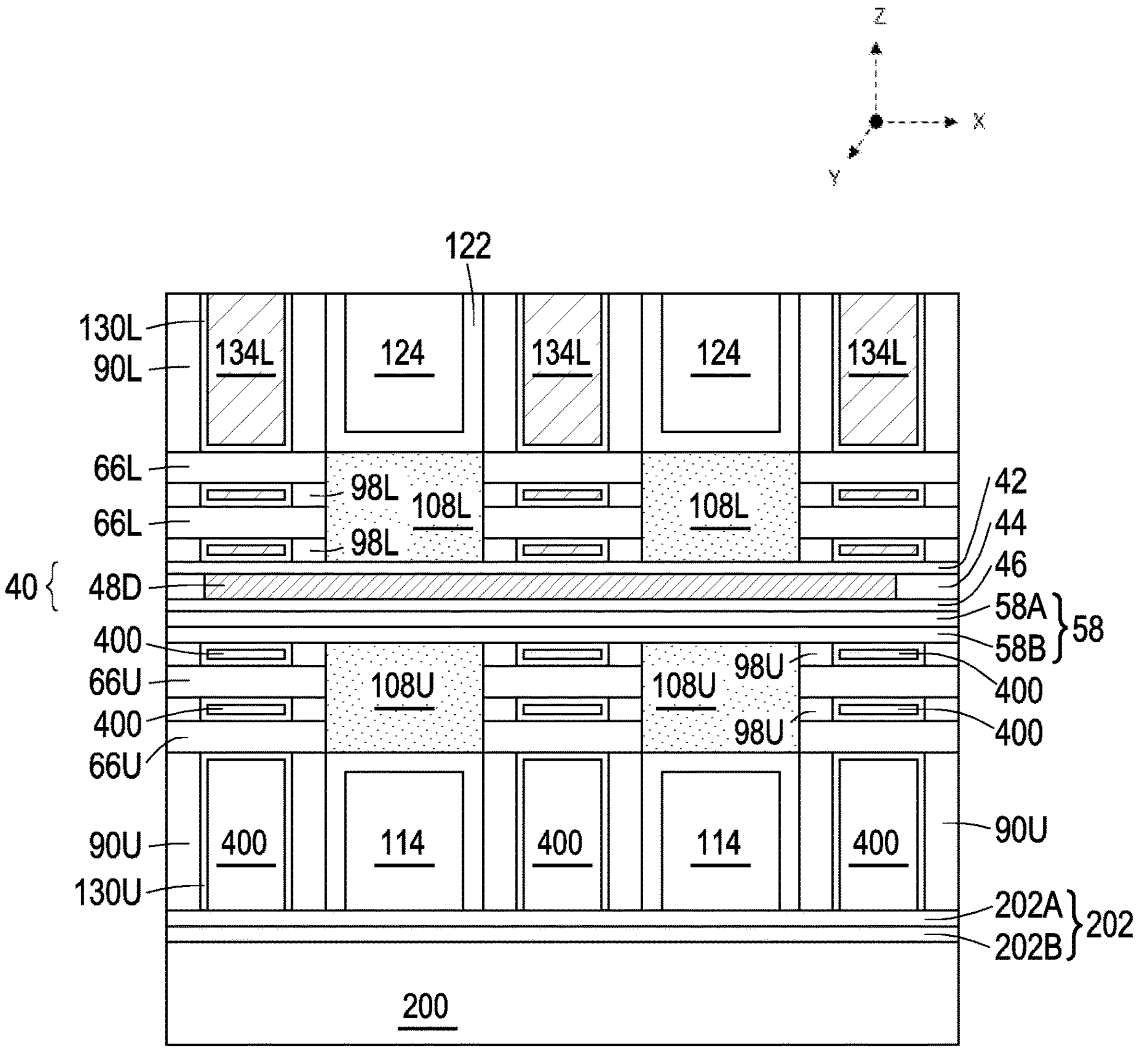
Figure 55B:
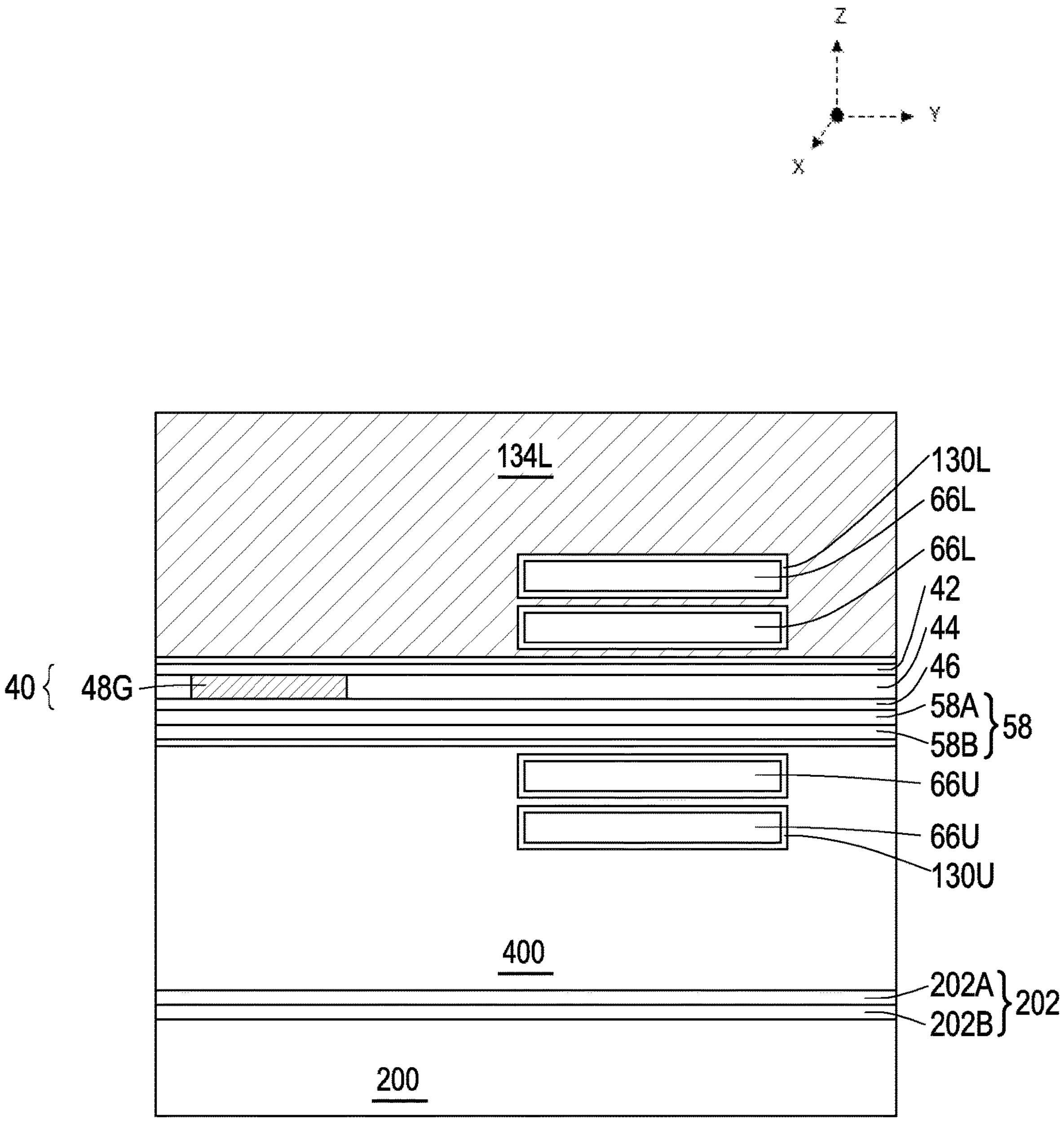
Figure 55C:
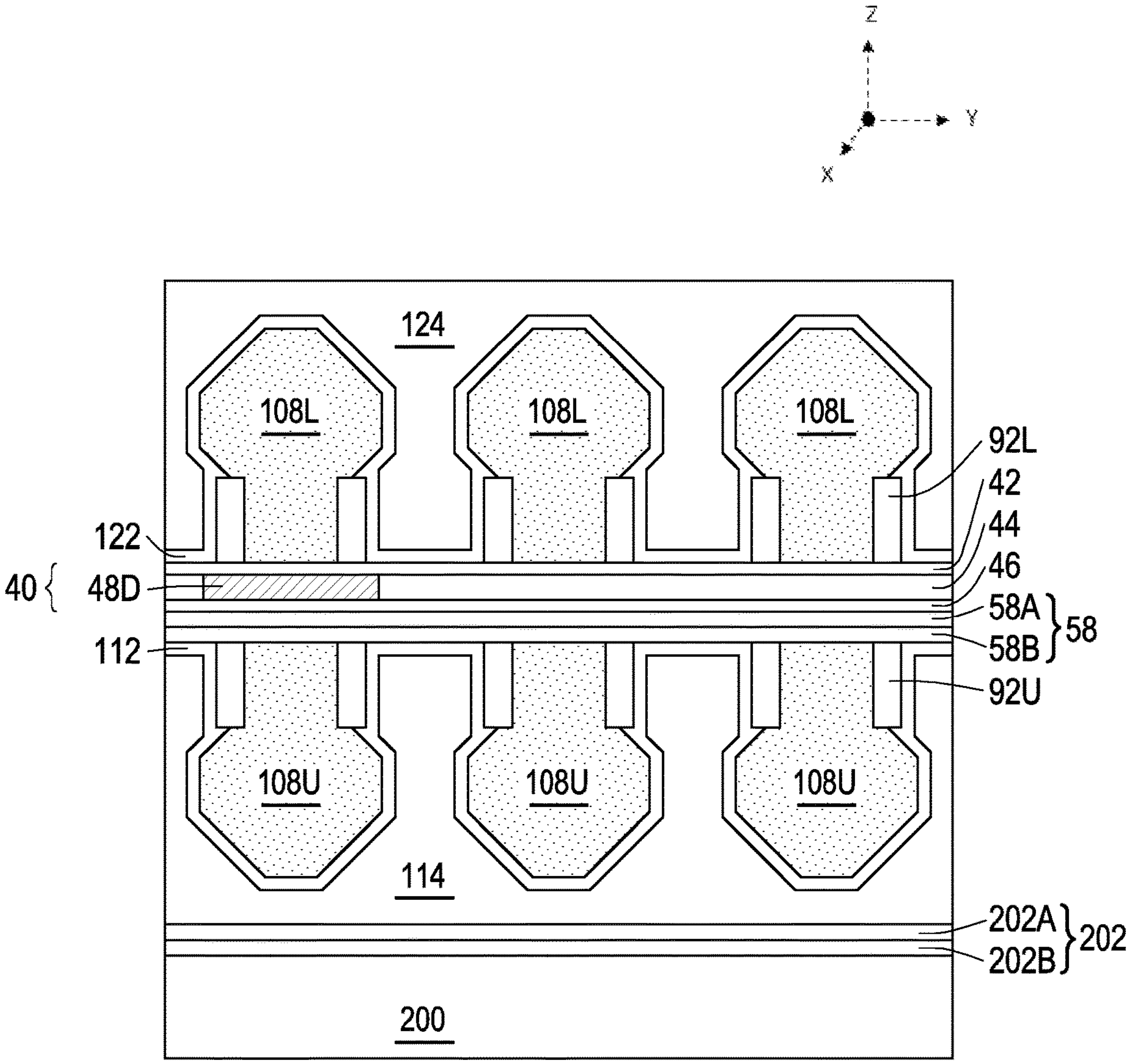

In FIGS. 55A-55C, a replacement gate process is performed to replace the lower dummy gate stacks and the lower dummy nanostructures 64L with lower gate dielectrics 130L and a lower gate electrode 134L (collectively referred to as a lower gate stack 130L/134L). In some embodiments, forming the lower gate dielectrics 130L includes a relatively high temperature annealing process (e.g., in a range of 800° C. to 900° C.) is performed to improve a film quality of the lower gate dielectric layer 130L, thereby improving device reliability of the resulting CFET device. Because the lower gate electrode 134L is formed after the anneal processes for both the upper gate dielectric 130U and the lower gate dielectric 130L, the risk of threshold voltage shift due to these anneal processes can be avoided. A CESL 122 and an ILD 124 may then be deposited over the lower source/drain regions 108L and the lower gate stacks 130L/134L. The lower gate stacks 130L/134L, the CESL 122, and the ILD 124 may be formed using a similar process as described above with respect to FIGS. 32A-32C, and details are not repeated again for brevity.

Figure 56A:
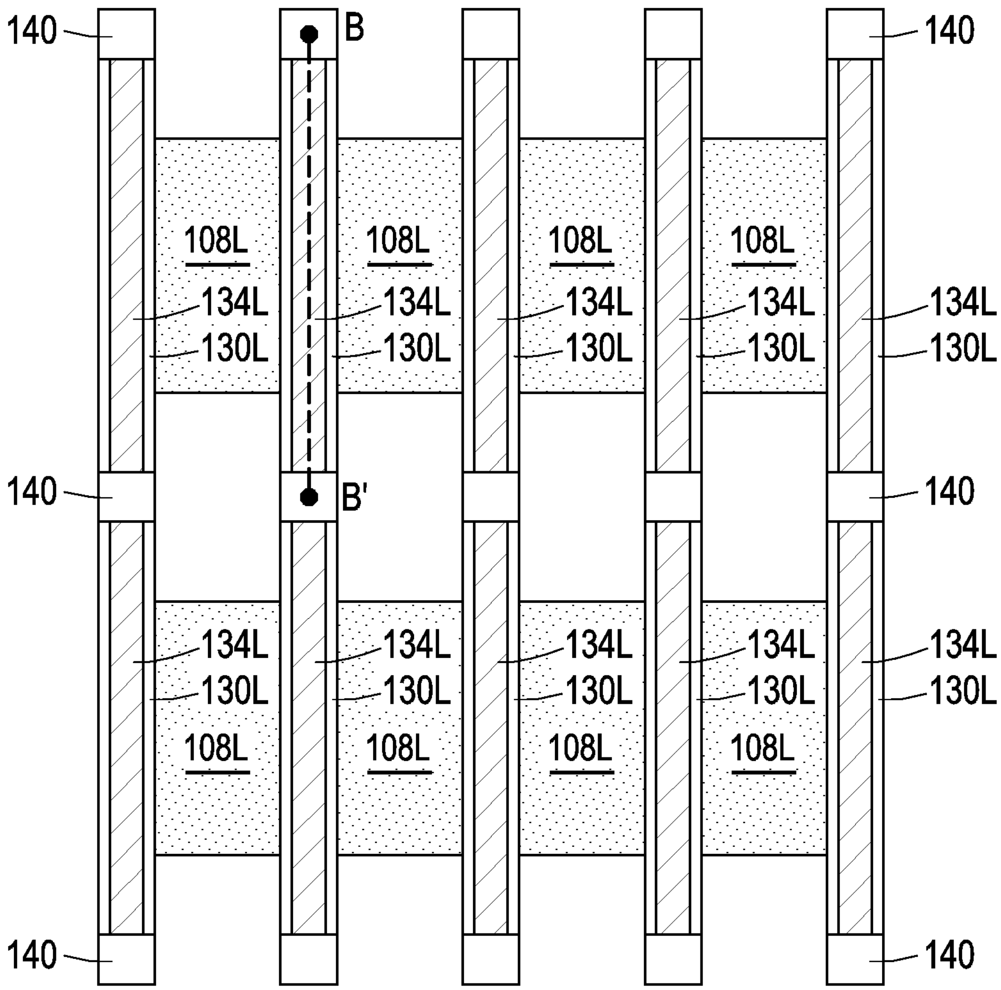
Figure 56B:
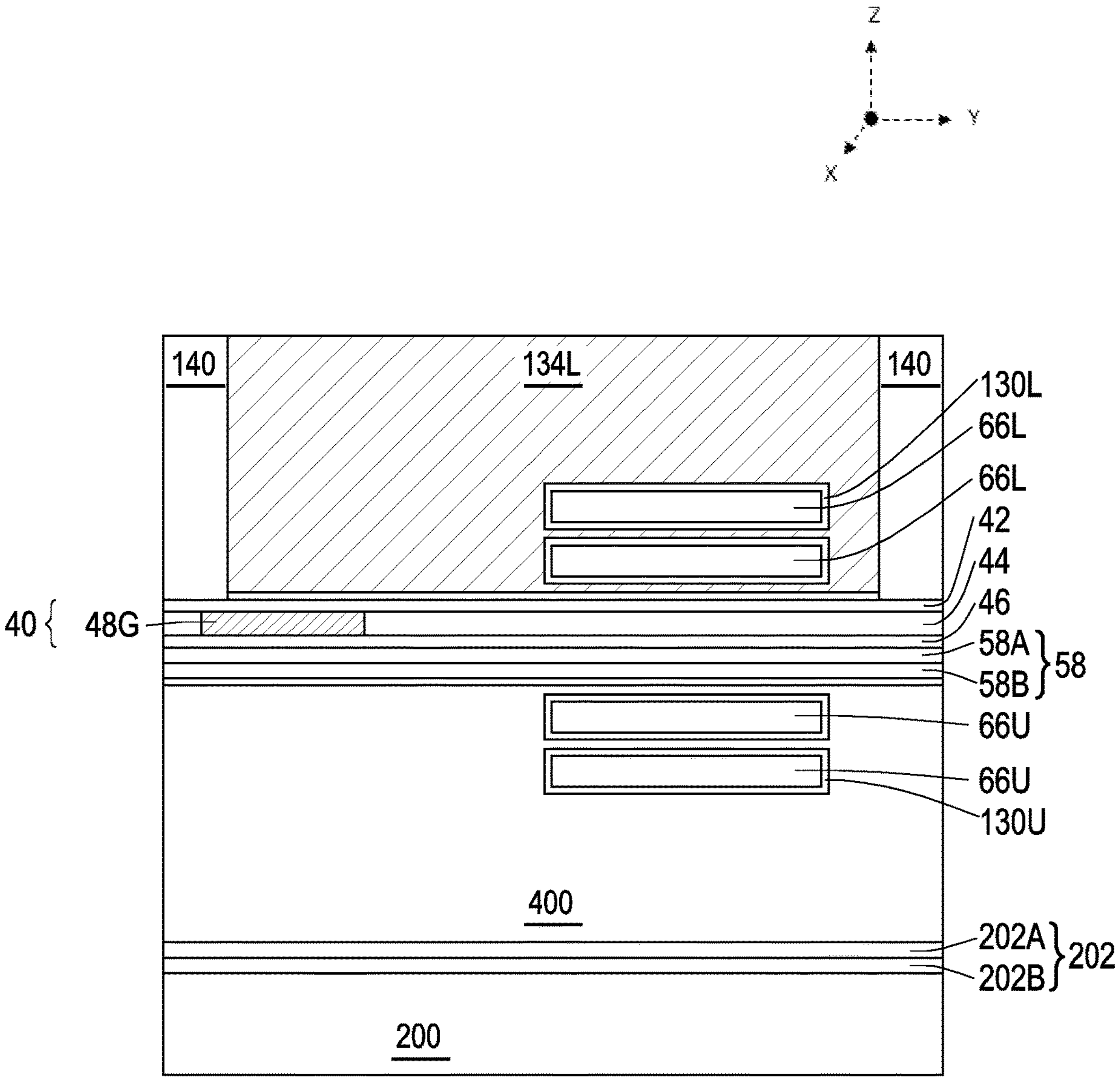
Figure 57:
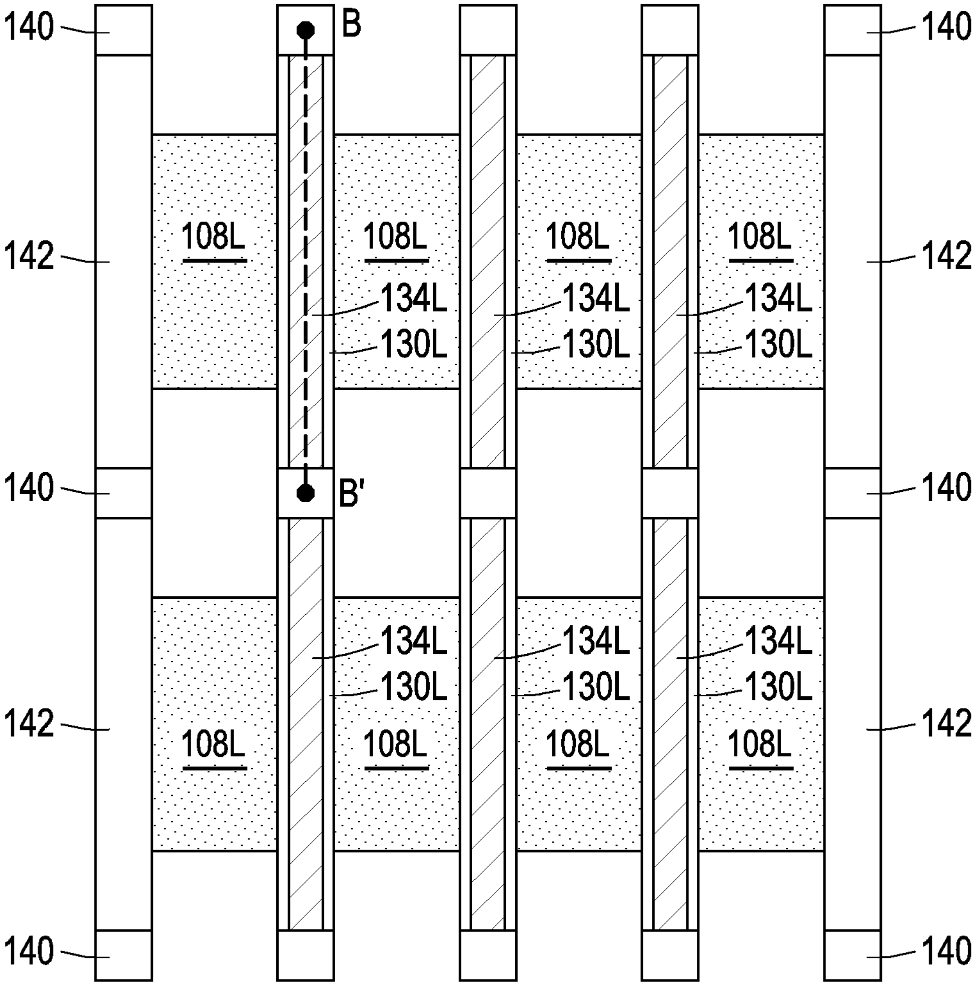

In FIGS. 56A, 56B, and 57, a CMG process is performed to form a dielectric material 140 through the lower gate stacks 130L/134L, and excess gate stacks 130L/134L are removed and replaced with the dielectric material 142. The CMG process and removing the excess gate stacks 130L/134L may be performed using a similar process as described above with respect to FIGS. 33A-34, and details are not repeated again for brevity.

Figure 58A:
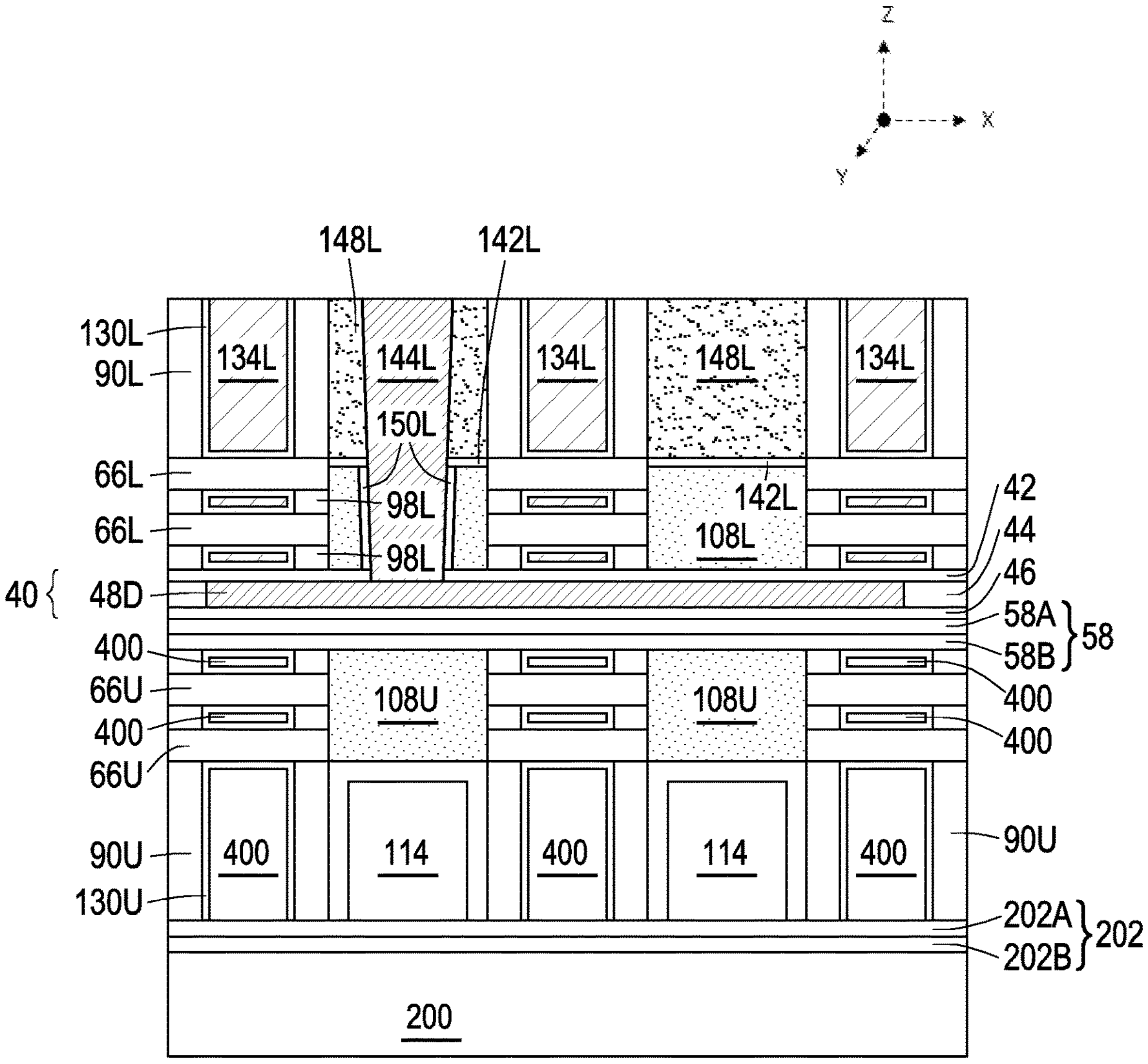
Figure 58B:
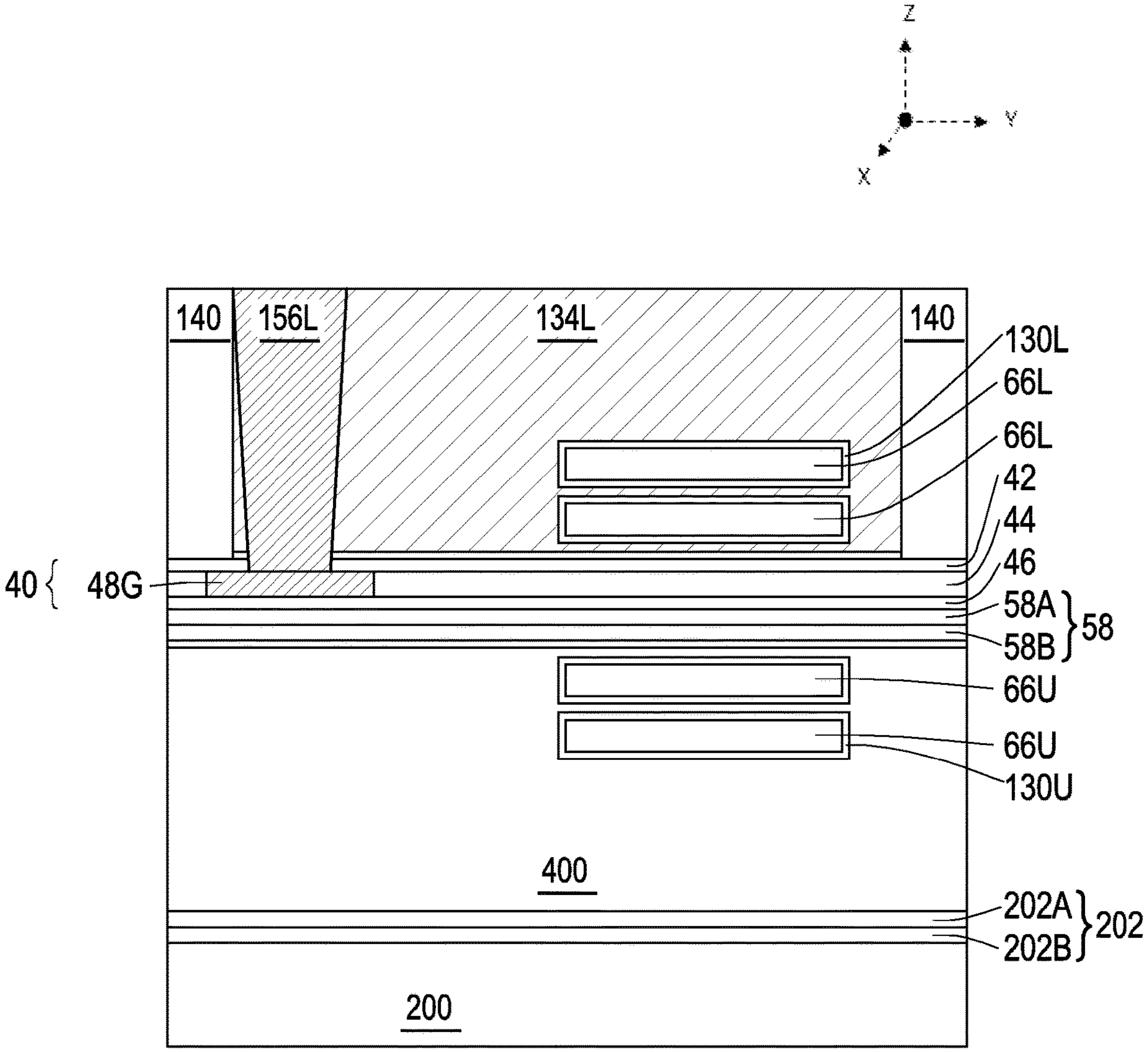
Figure 58C:
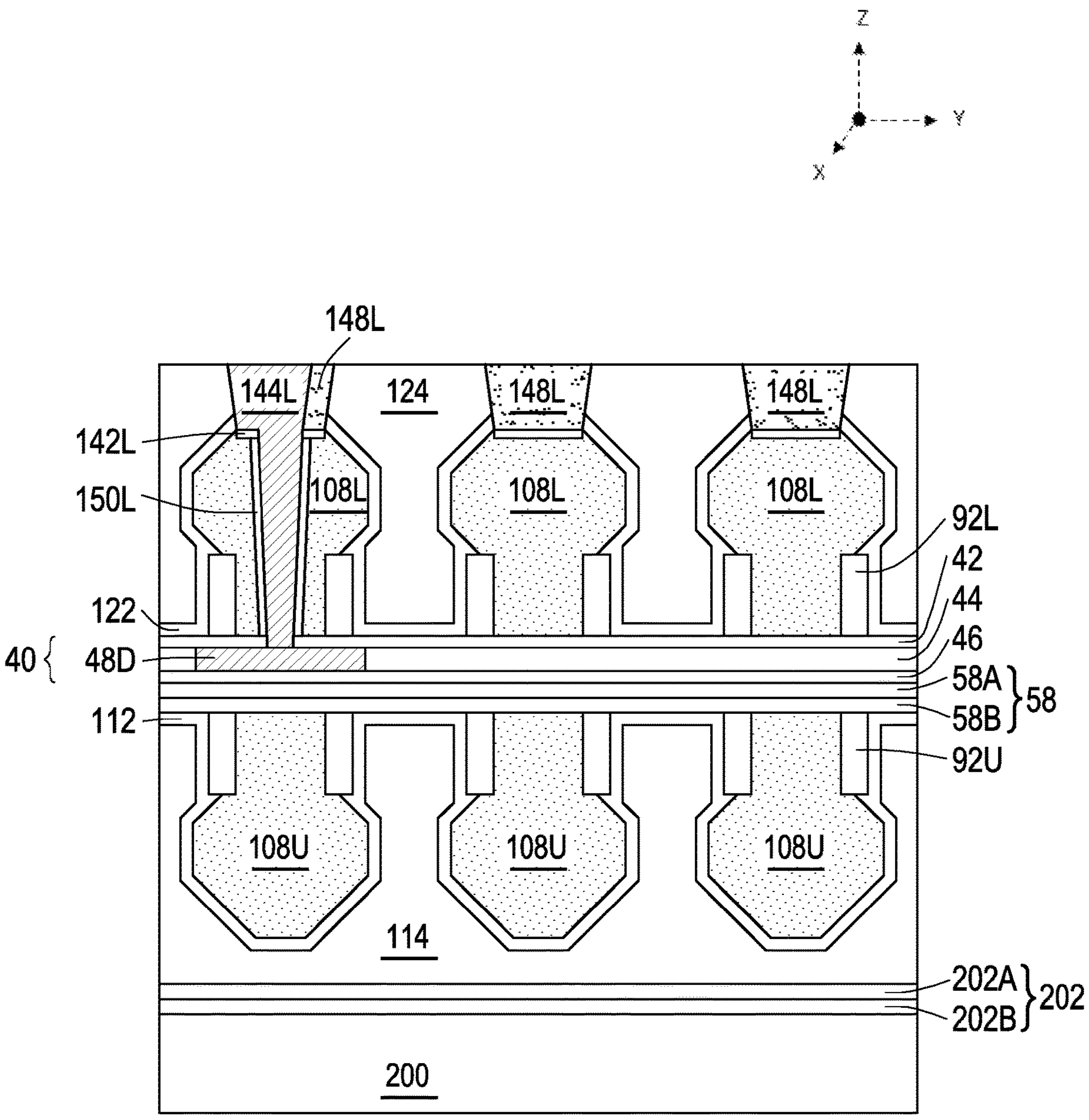

In FIGS. 58A-58C, lower gate contacts 156L, source/drain contacts 148L, and source/drain contacts 144L are formed. The lower gate contacts 156L may extend through the lower gate electrodes 134L to contact conductive lines 48G in the intermetal structure 40. The source/drain contacts 148L may be electrically connected to the lower source/drain regions 108L through lower silicides 142L, and the source/drain contacts 144L may extend through the source/drain contacts 148L and the lower source/drain regions 108L to contact conductive lines 48D of the intermetal structure 40. Lower silicides 150L may be formed on sidewalls of the lower source/drain regions 108L, and the lower source/drain contacts 144L may be electrically connected to the lower source/drain regions 108L through the lower silicides 150L. The lower gate contacts 156L, source/drain contacts 148L, and source/drain contacts 144L may be formed using a similar process as described above with respect to FIGS. 35A-40E, and details are not repeated again for brevity.

Figure 59A:
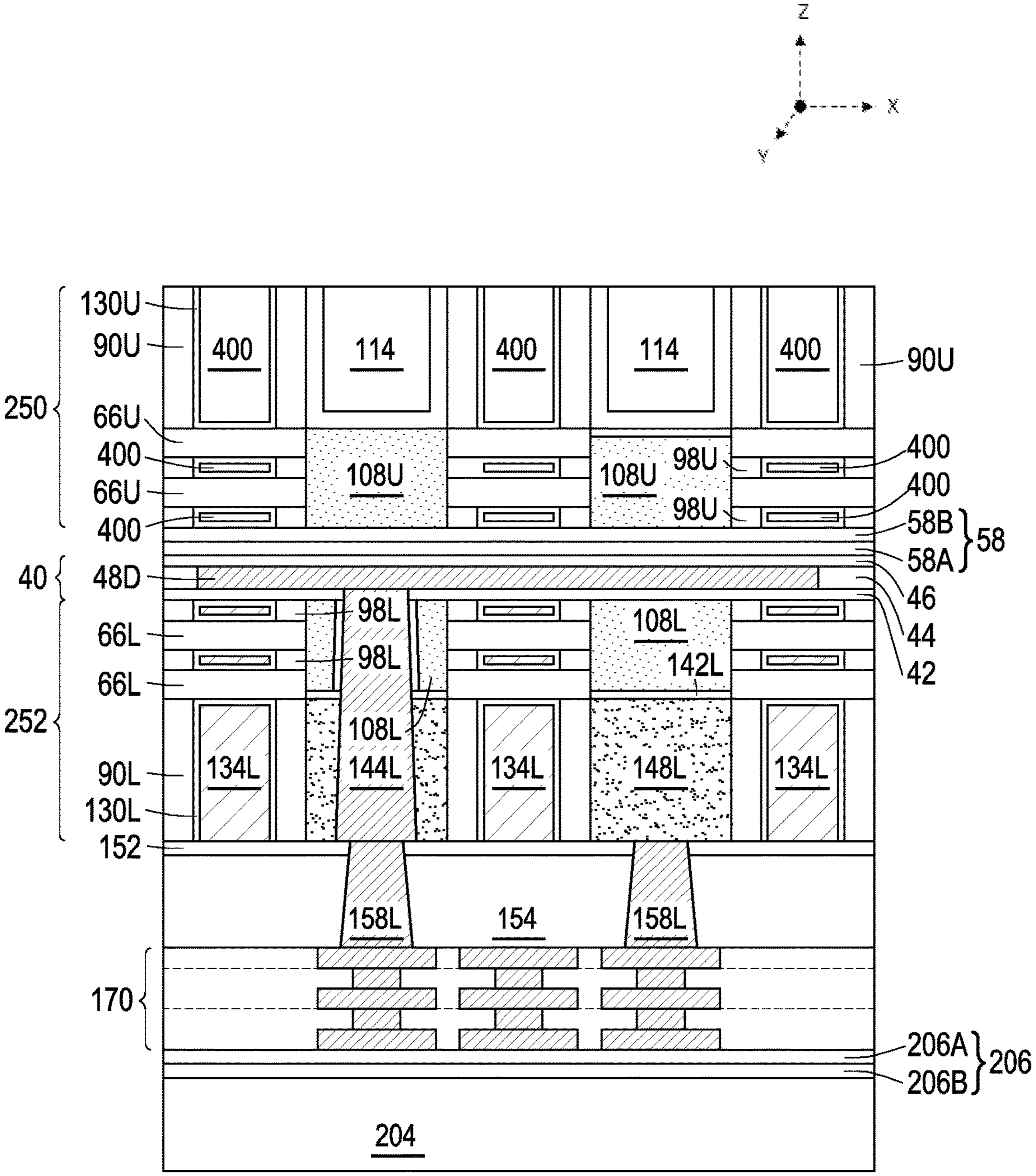
Figure 59B:
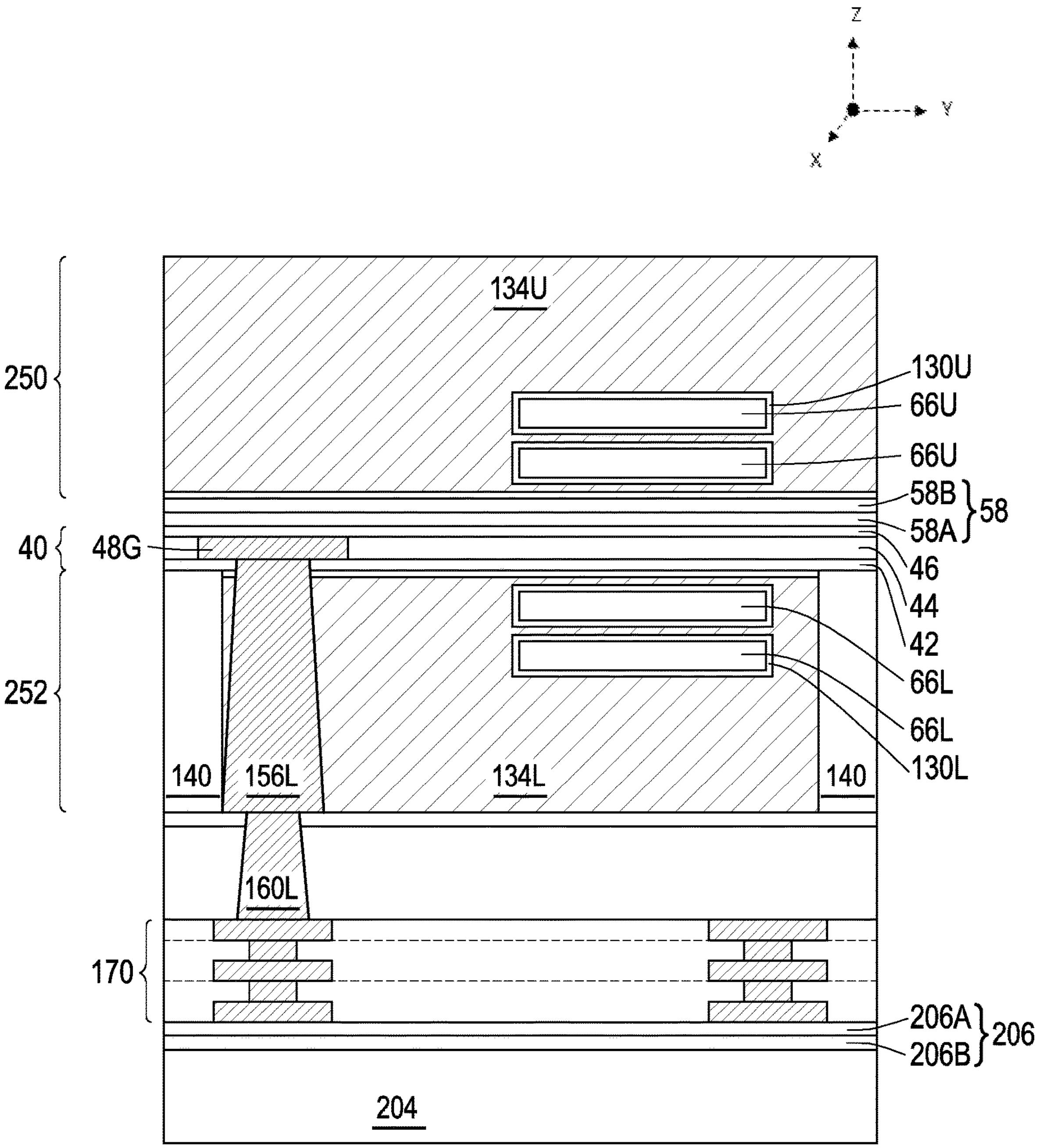
Figure 59C:
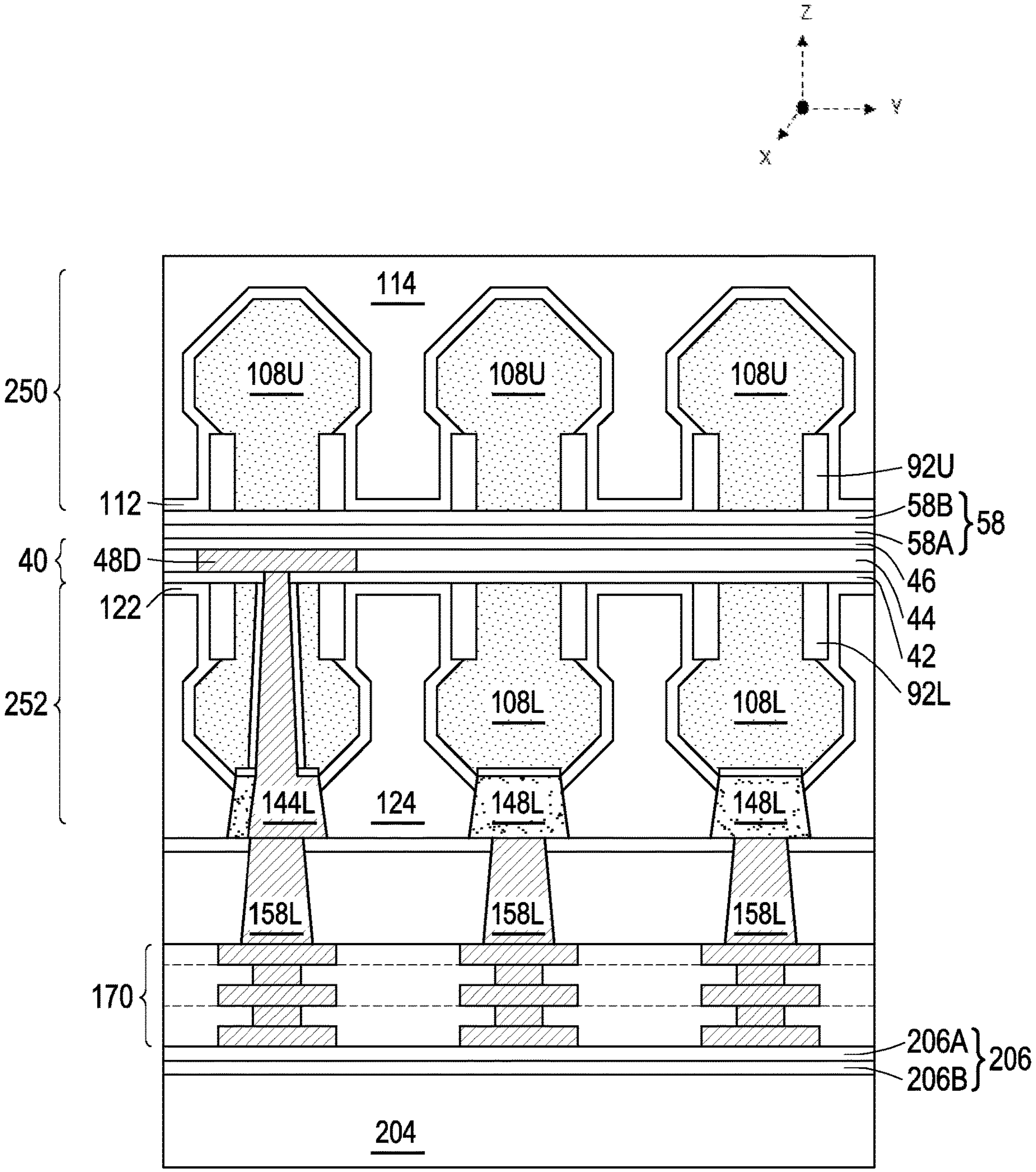

In FIGS. 59A-59C, lower gate vias 160L and lower source/drain vias 158L are formed in an ILD 154. Additionally, the interconnect structure 170 having dielectric layers 172 and layers of conductive features 174 in the dielectric layers 172 are formed over the lower gate stacks 130L/134L. Then, a carrier 204 is bonded to the interconnect structure 170 by bonding layer 206; the orientation of the device is flipped; and the carrier 200 and bonding layer 202 are removed to expose the sacrificial gate material 400. The structure of FIGS. 59A-59C may be formed using a similar process as described above with respect to FIGS. 41A-42C, and details are not repeated again for brevity.

Figure 60A:
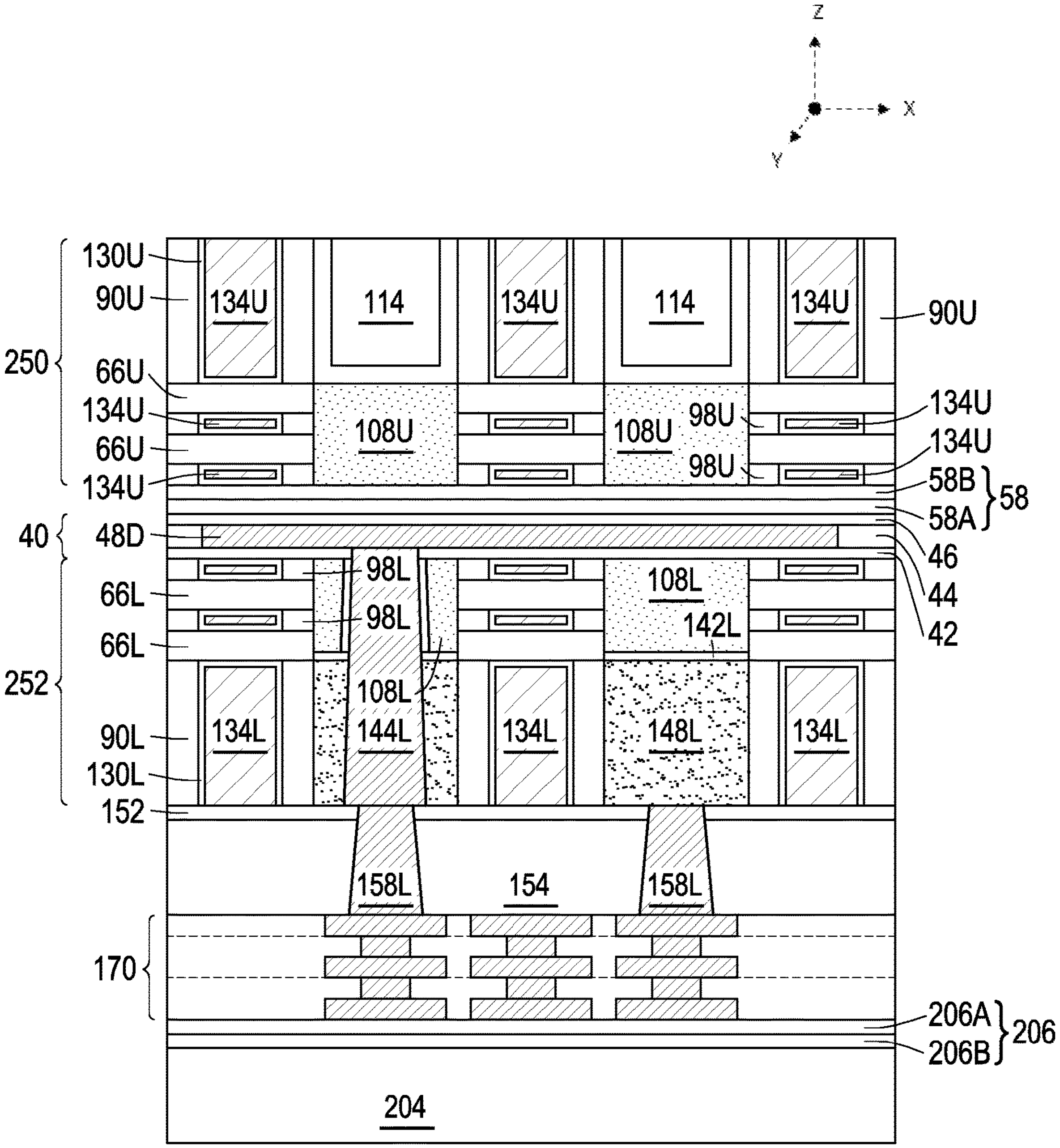
Figure 60B:
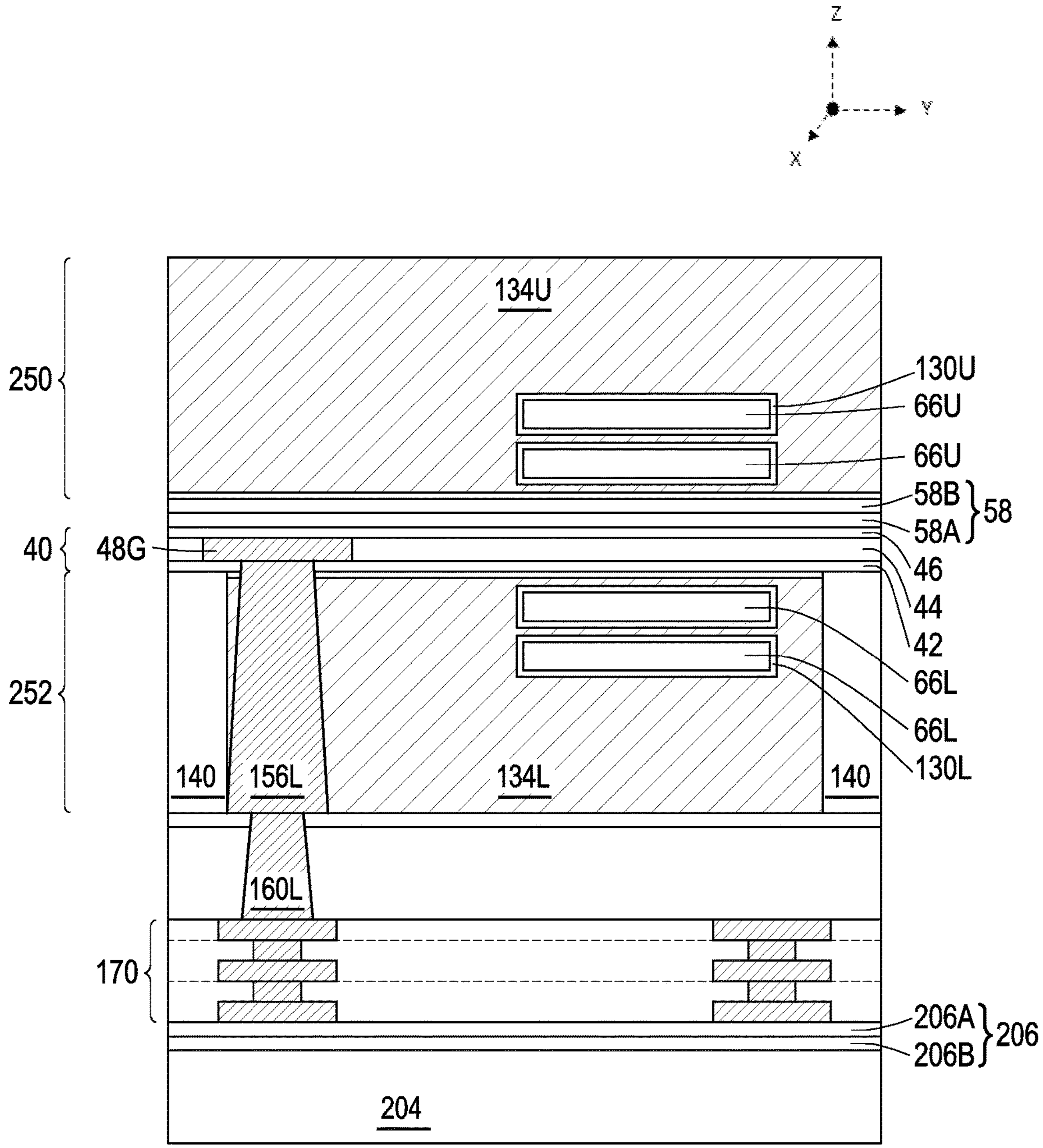
Figure 60C:
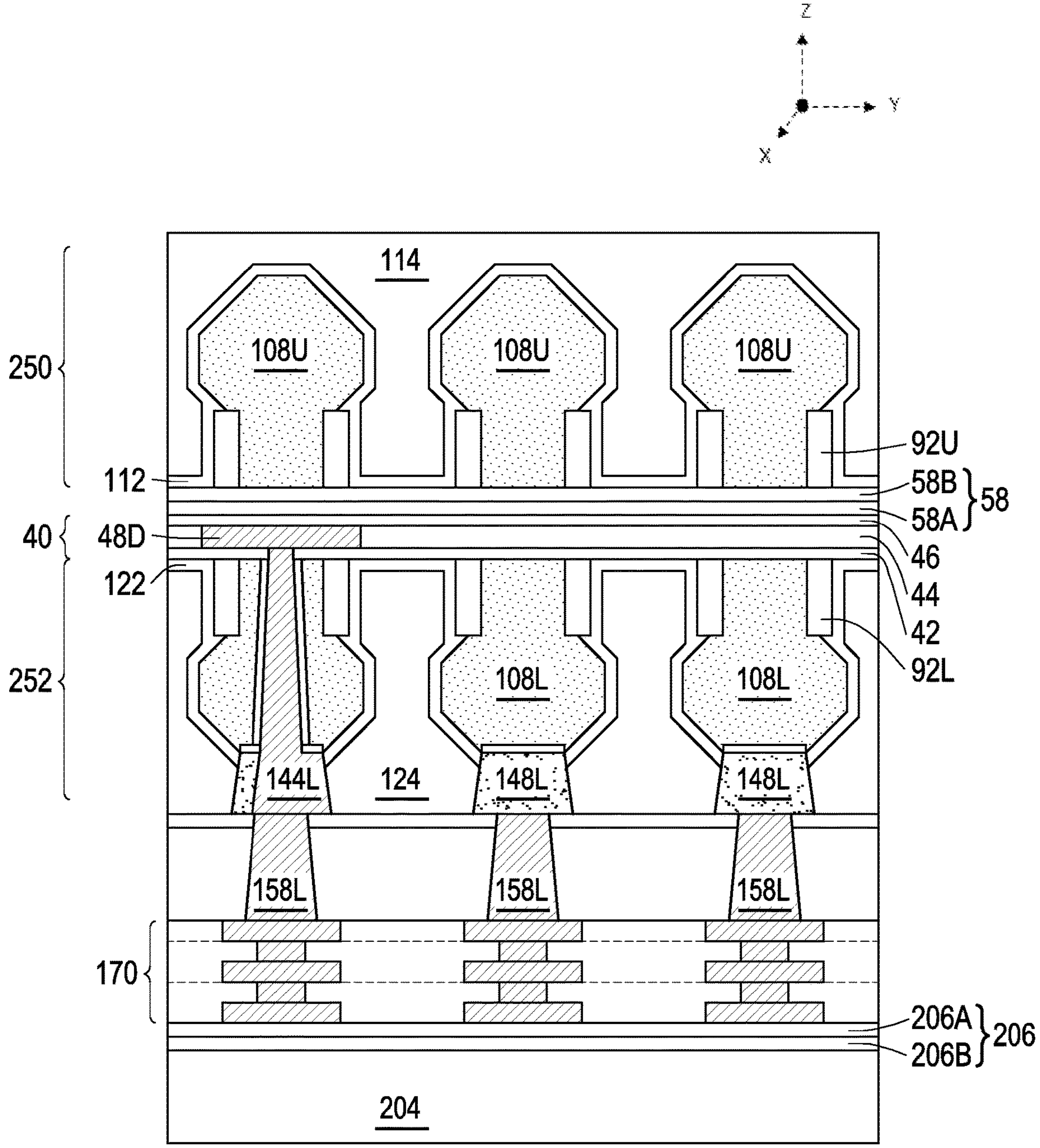

In FIGS. 60A-60C, the sacrificial gate material 400 is replaced by the upper gate electrode 134U. For example, the sacrificial gate material 400 may be removed by one or more etching processes that selectively removes the sacrificial gate material 400. Then, the upper gate electrode 134U may be formed around the upper semiconductor nanostructures 66U. The upper gate electrodes 134U may be formed of a metal-containing material such as tungsten, titanium, titanium nitride, tantalum, tantalum nitride, tantalum carbide, aluminum, ruthenium, cobalt, combinations thereof, multilayers thereof, or the like. Although single-layered gate electrodes are illustrated, the upper gate electrodes 134U may include any number of work function tuning layers, any number of barrier layers, any number of glue layers, and a fill material.

The upper gate electrodes 134U are formed of material(s) that are suitable for the device type of the lower nanostructure-FETs. For example, the upper gate electrodes 134U may include one or more work function tuning layer(s) formed of material(s) that are suitable for the device type of the lower nanostructure-FETs. In some embodiments, the upper gate electrodes 134U include an n-type work function tuning layer, which may be formed of titanium aluminum, titanium aluminum carbide, tantalum aluminum, tantalum carbide, combinations thereof, or the like. In some embodiments, the upper gate electrodes 134U include a p-type work function tuning layer, which may be formed of titanium nitride, tantalum nitride, combinations thereof, or the like. Additionally or alternatively, the upper gate electrodes 134U may include a dipole-inducing element that is suitable for the device type of the lower nanostructure-FETs. Acceptable dipole-inducing elements include lanthanum, aluminum, scandium, ruthenium, zirconium, erbium, magnesium, strontium, and combinations thereof.

The upper gate electrodes 134U may be formed by conformally depositing one or more gate electrode layer(s) using any acceptable process, such as CVD, ALD, or the like. Then, a removal process is preformed to remove the excess portions of the gate electrode layer(s), which excess portions are over the top surfaces of the gate spacers 90U and the ILD 114. In some embodiments, a planarization process such as a chemical mechanical polish (CMP), an etch-back process, combinations thereof, or the like is utilized. Each respective pair of a gate dielectric 130U and a gate electrode 134U may be collectively referred to as an upper gate structure 130U/134U. Each upper gate structure 130U/134U extends along three sides (e.g., a top surface, a sidewall, and a bottom surface) of a channel region of a semiconductor nanostructure 66U. Because the upper gate electrode 134U is only formed after both the lower gate dielectrics 130L and the upper gate dielectrics 130U are annealed, the risk of the anneal process affecting the electrical properties of the upper gate electrode 134U (e.g., the threshold voltage) may be advantageously avoided. As a result, device performance and reliability can be improved.

Figure 61A:
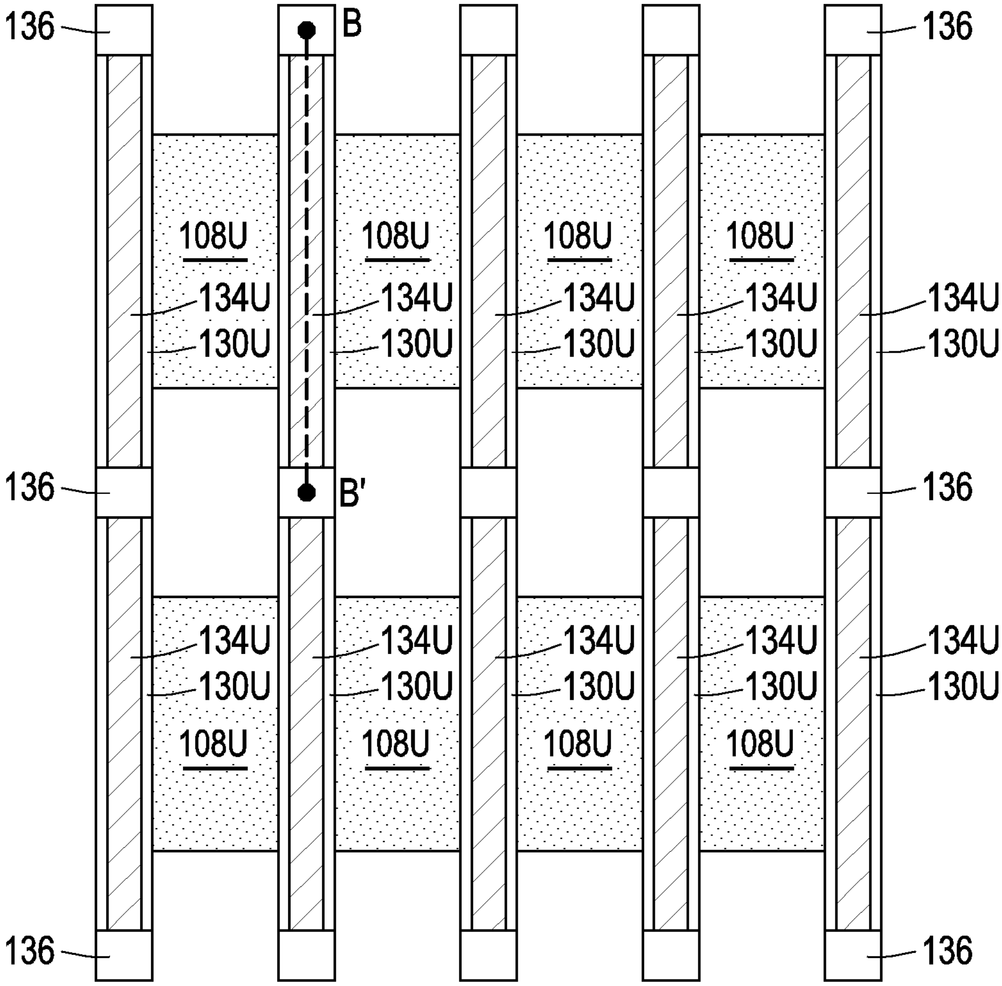
Figure 61B:
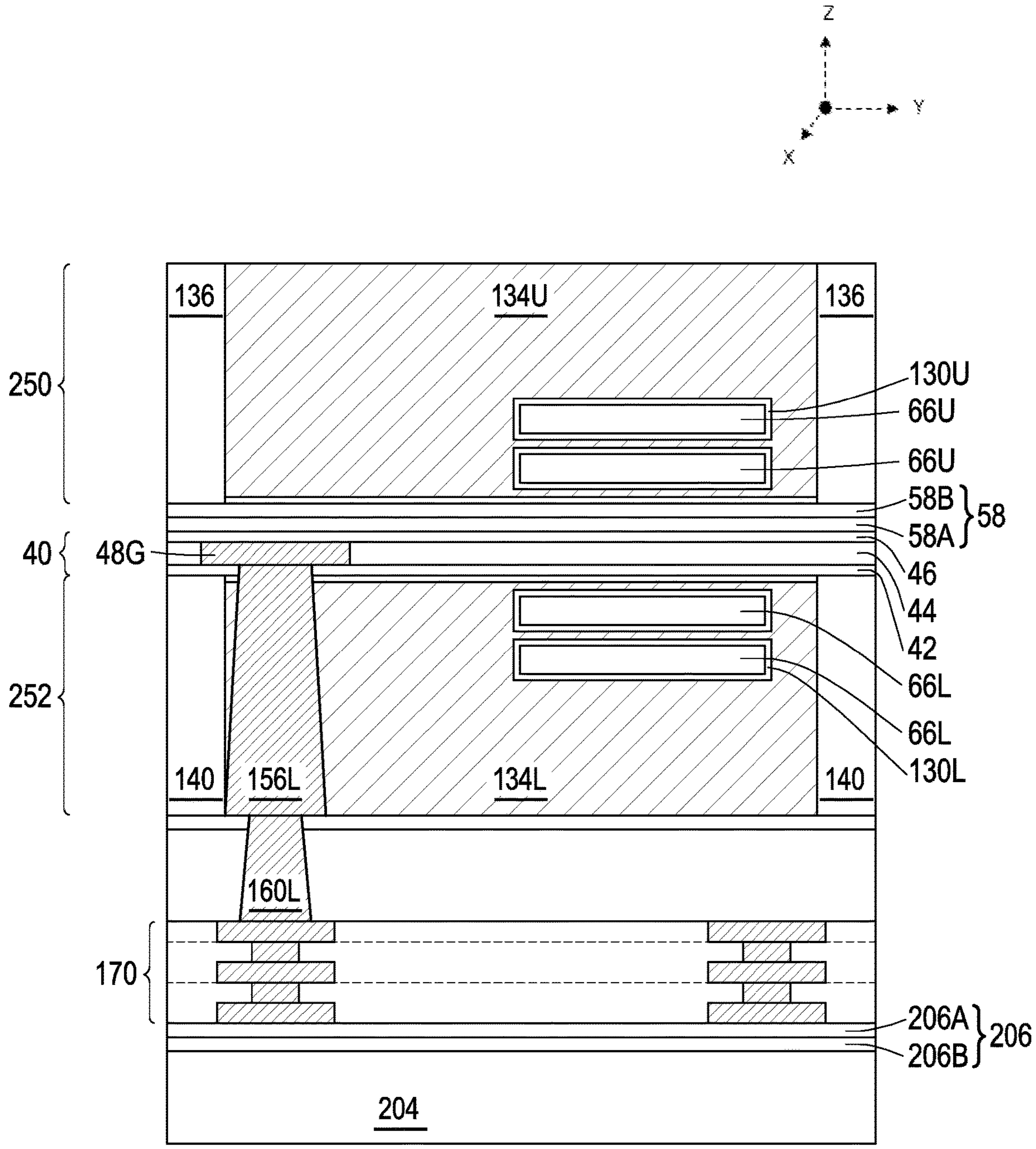
Figure 62:
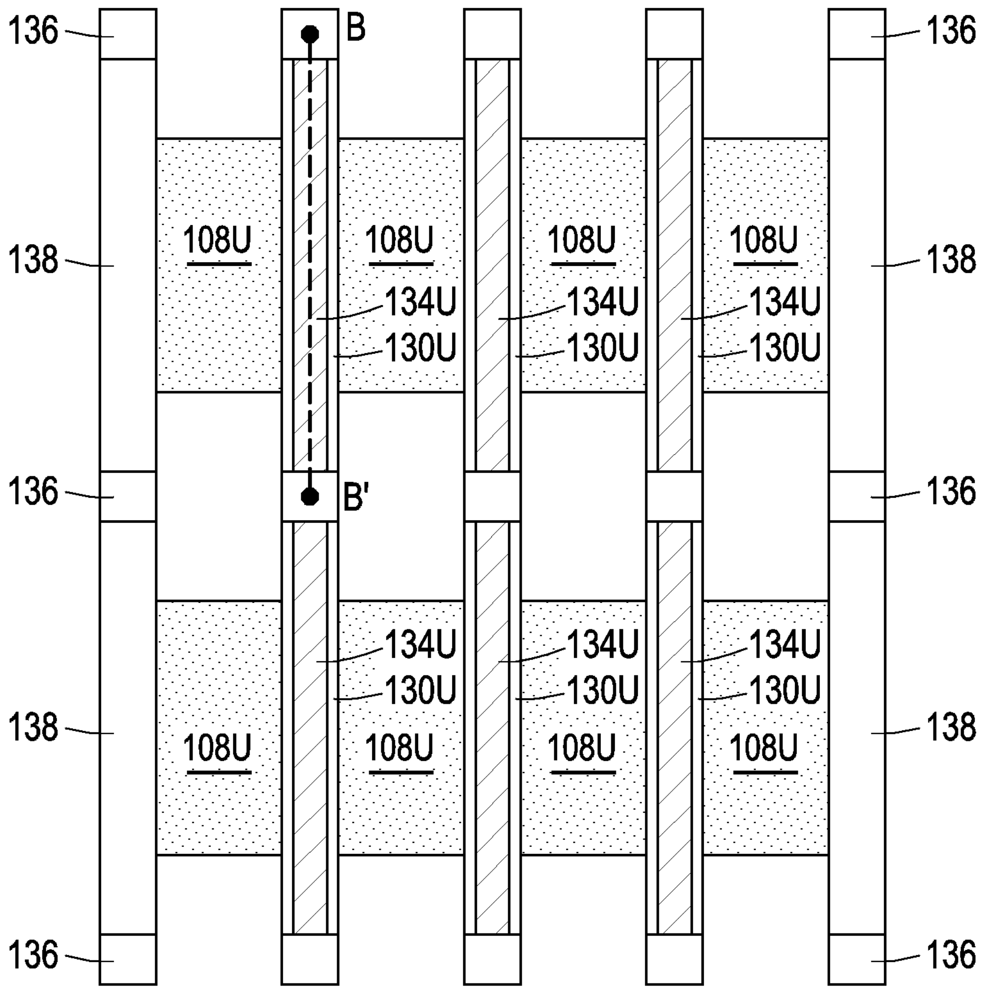

In FIGS. 61A, 61B, and 62, a CMG process is performed to form a dielectric material 136 through the upper gate stacks 130U/134U, and excess gate stacks 130U/134U are removed and replaced with the dielectric material 138. The CMG process and removing the excess gate stacks 130U/134U may be performed using a similar process as described above with respect to FIGS. 19A-20, and details are not repeated again for brevity.

Figure 63A:
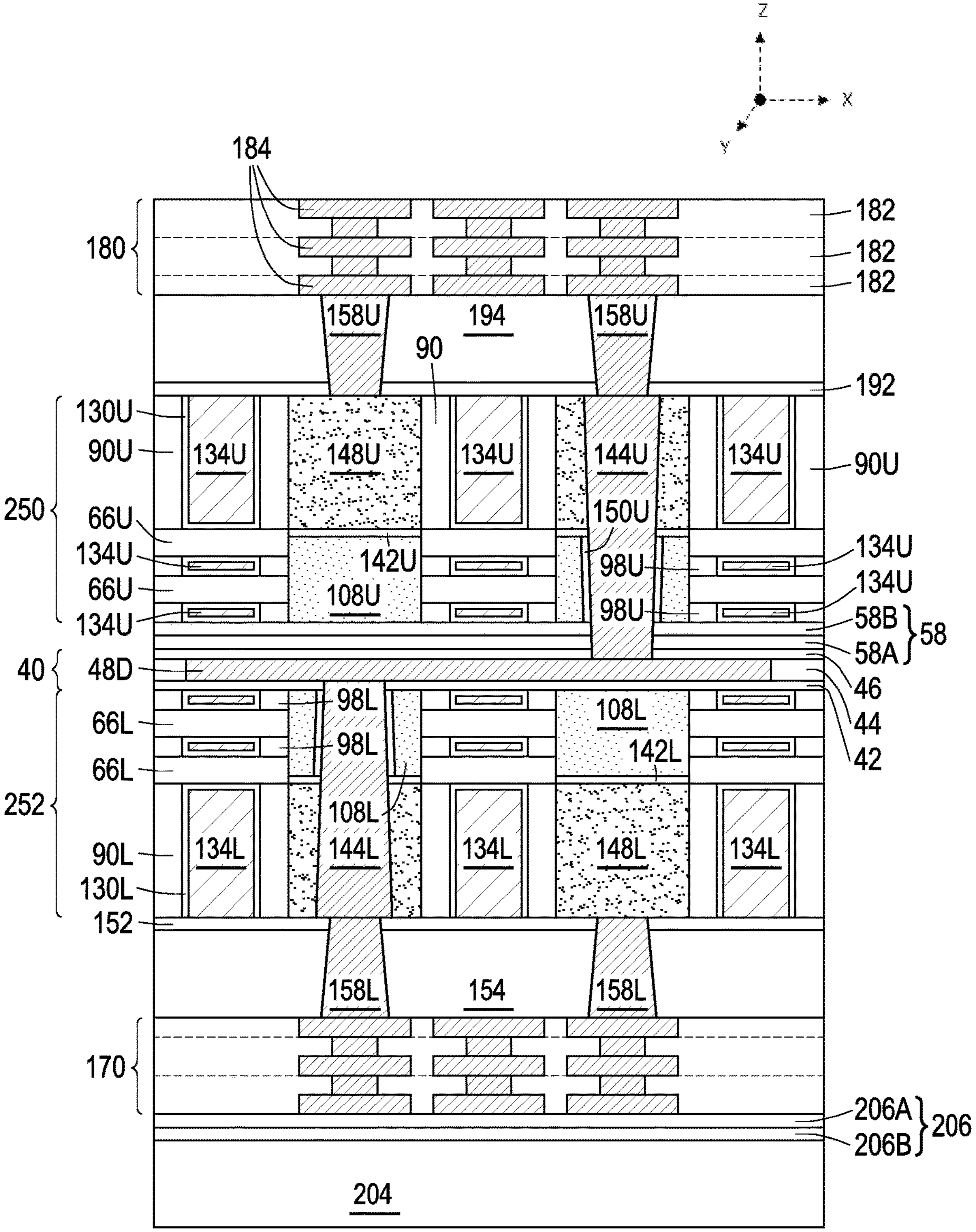
Figure 63B:
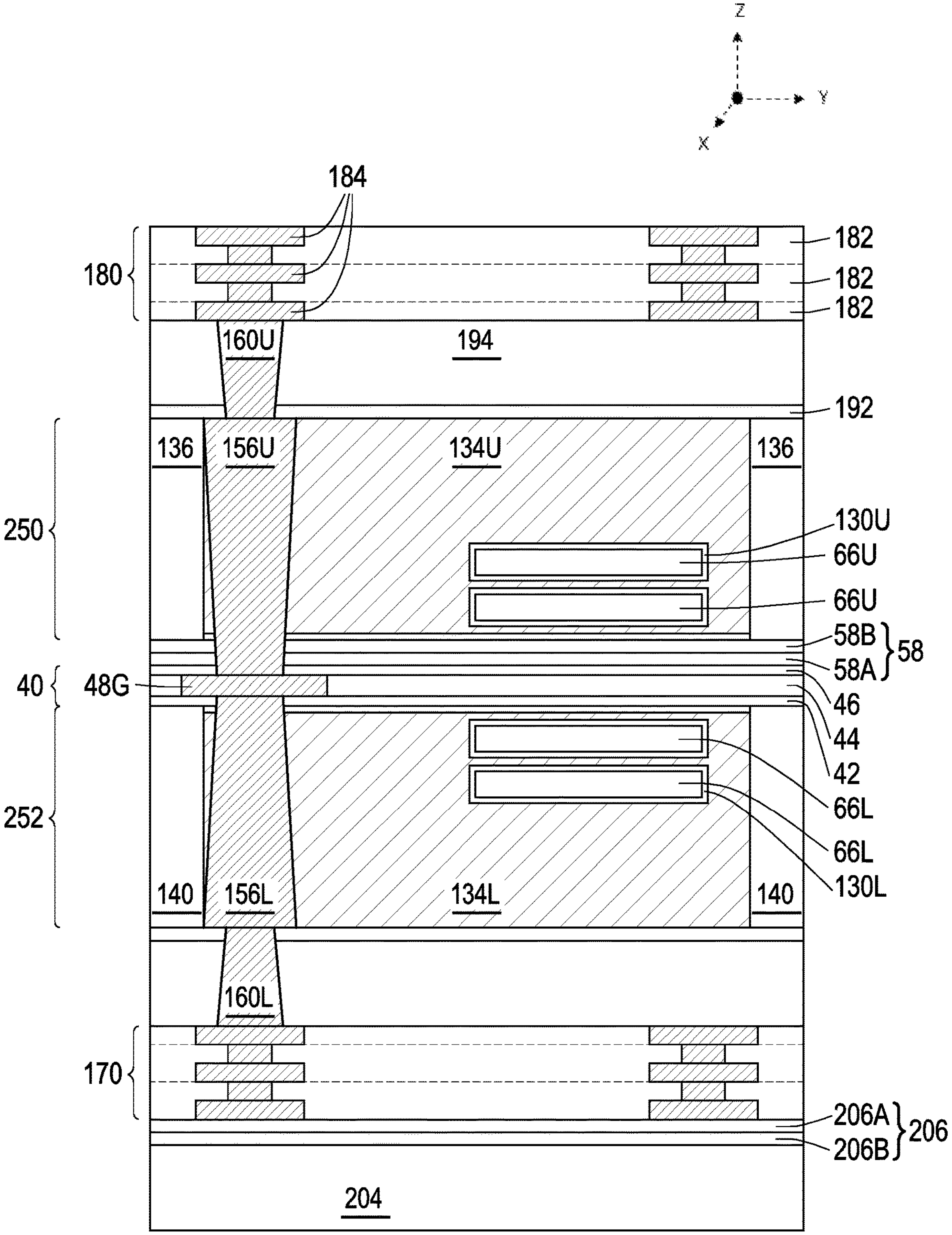
Figure 63C:
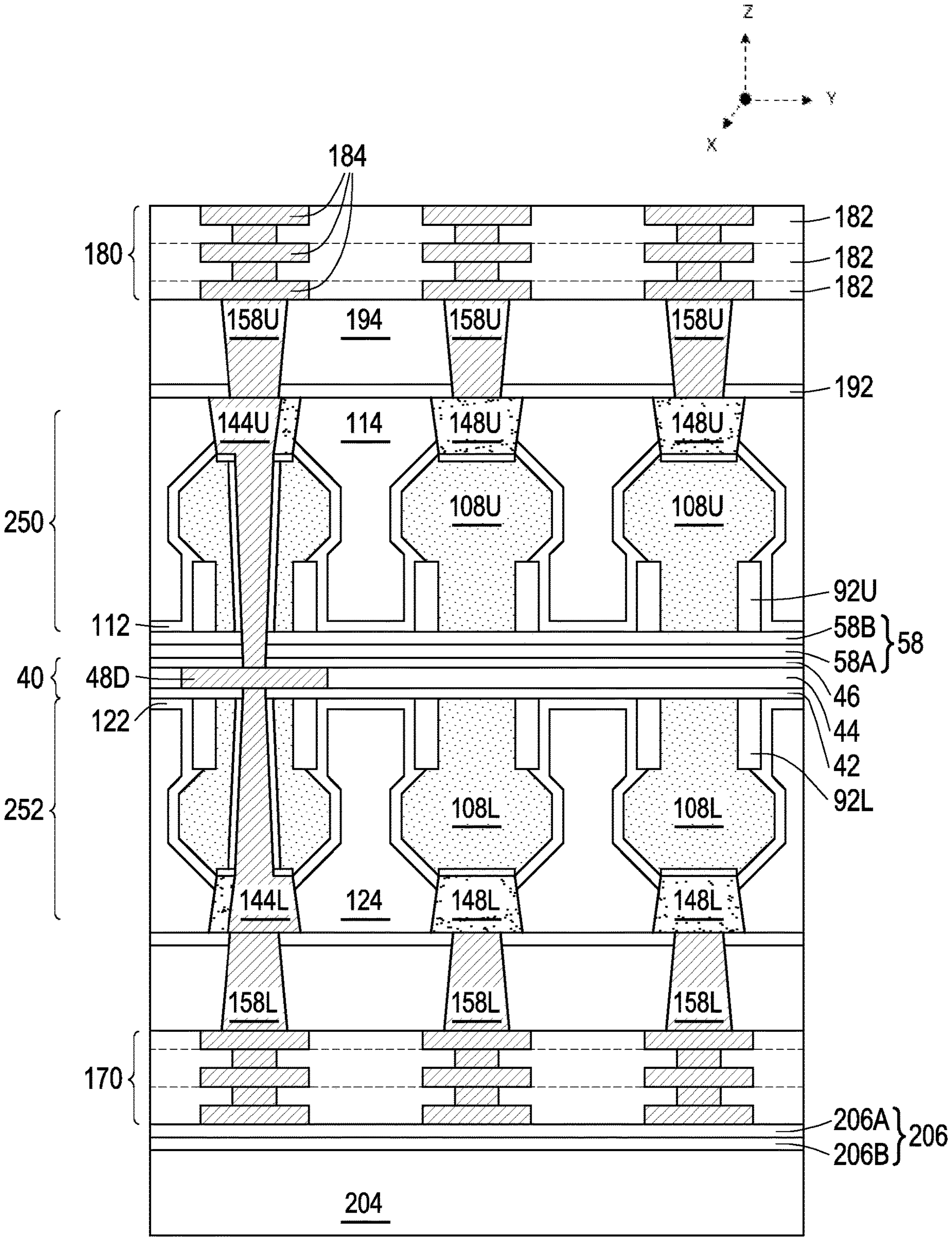

In FIGS. 63A-63C, upper gate contacts 156U, source/drain contacts 148U, and source/drain contacts 144U are formed. The upper gate contacts 156U may extend through the upper gate electrodes 134U to contact conductive lines 48G in the intermetal structure 40. In this manner, the upper and lower gate electrodes 134U/134L are electrically connected by the conductive lines 48G and the upper and lower gate contacts 156U/156L. The upper gate contacts 156U may be formed using a similar process as described above with respect to FIGS. 21A-23F, and details are not repeated again for brevity.

The source/drain contacts 148U may be electrically connected to the upper source/drain regions 108U through upper silicides 142U, and the source/drain contacts 144U may extend through the source/drain contacts 148U and the upper source/drain regions 108U to contact conductive lines 48D of the intermetal structure 40. In this manner, the upper and lower source/drain regions 108U/108L may be electrically connected by the conductive lines 48D and the upper and lower source/drain contacts 144U/144L. Upper silicides 150U may be formed on sidewalls of the upper source/drain regions 108U, and the upper source/drain contacts 144U may be electrically connected to the upper source/drain regions 108U through the upper silicides 150U. The source/drain contacts 148U and source/drain contacts 144U may be formed using a similar process as described above with respect to FIGS. 44A-45E, and details are not repeated again for brevity.

In FIGS. 63A-63C, upper gate vias 160U and upper source/drain vias 158U are formed in an ILD 194. Additionally, the interconnect structure 180 having dielectric layers 182 and layers of conductive features 184 in the dielectric layers 182 are formed over the lower gate stacks 130U/134U. Process details for forming the upper gate vias 160U, upper source/drain vias 158U, the ILD 194, and the interconnect structure 180 may be similar to those described above with respect to FIGS. 49A-49C and are not repeated herein for brevity. Thus, a CFET device may be manufactured where gate electrodes are only formed after all gate dielectric annealing steps are performed, reducing the risk of annealing damage to the gate electrodes.

Figure 64A:
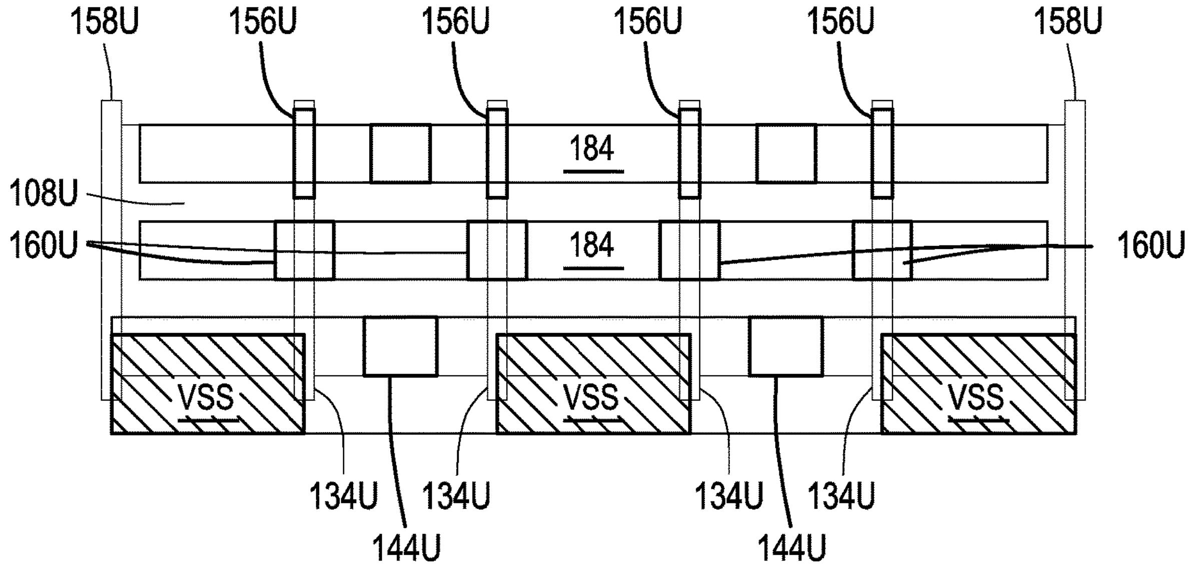
FIGS. 64A, 64B, 64C, and 64D illustrate top-down views and a circuit of a CFET device in accordance with some embodiments.
Figure 64B:
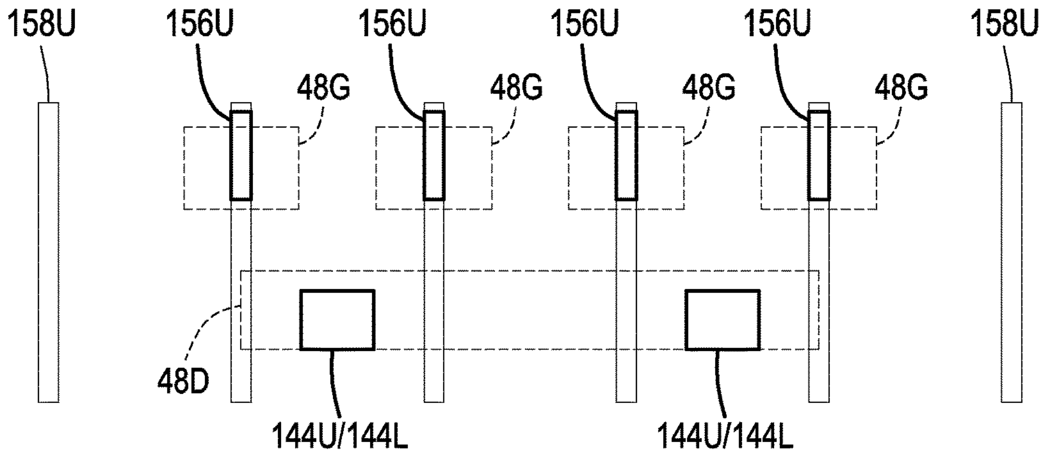
Figure 64C:
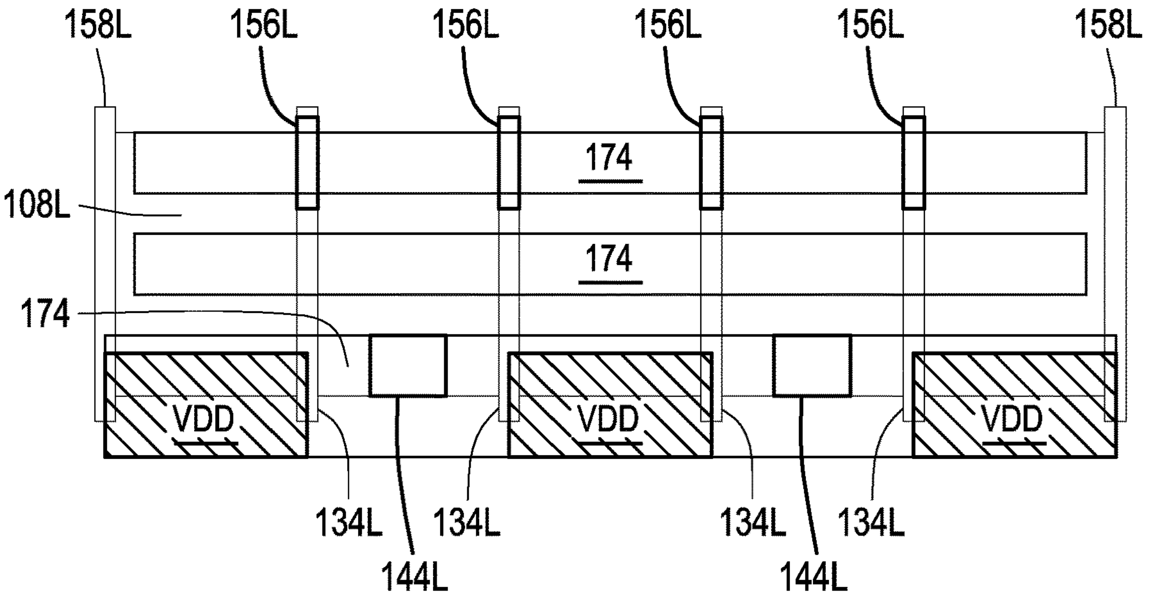
Figure 64D:
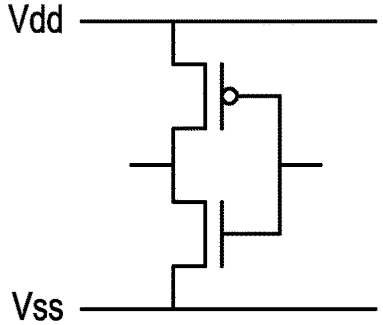

Various embodiments described above illustrate a particular layout for the gate contacts, source/drain contacts, gate vias, and source/drain vias. However, it should be understood that any layout is feasible depending on circuit design. For example, FIGS. 64A-64D illustrate an example layout of the gate contacts 156U/156L, the source/drain contacts 144U/144L, the gate vias 160U/160L, and the source/drain vias 158U/158L. FIG. 64A illustrates a top-down view of features in the upper transistor layer (e.g., upper transistor layer 250 described above) and the interconnect structure 180; FIG. 64B illustrates a top-down view of features in the intermetal structure 40 (e.g., the conductive lines 48G and 48D); and FIG. 64C illustrates a top-down view of features in the lower transistor layer (e.g., the lower transistor layer 252) and the interconnect structure 180. FIG. 64D illustrates a circuit layout of an invertor that can be achieved by the layout of FIGS. 64A-64C.

As illustrated, a PMOS transistor of the invertor can be provided in the lower transistor layer 252, and an NMOS transistor of the invertor can be provided in the upper transistor layer 250. Gates 134U/134L of the NMOS and PMOS transistors are electrically tied together by the gate contacts 156U/156L and the conductive lines 48G of the intermetal structure 40. First source/drain regions of the NMOS and PMOS transistors are electrically tied together by the source/drain contacts 144U/144L and the conductive line 48D. A second source/drain region of the PMOS transistor is electrically connected to supply voltage (Vdd) by source/drain vias 158L and conductive features 174 (e.g., a conductive line in MO) of the interconnect structure 170. A second source/drain region of the NMOS transistor is electrically connected to ground voltage (Vss) by source/drain vias 158U and conductive features 184 (e.g., a conductive line in MO) of the interconnect structure 180. As such, various embodiments can be adapted to provide functional circuits. Other layouts are possible in other embodiments.

According to various embodiments, CFETs are formed. A CFET includes a n-type transistor and a p-type transistor that are vertically stacked together. An intermetal structure is formed between the n-type transistor and the p-type transistor to facilitate electrical connections between the stacked transistors. In some embodiments, gate contacts may be formed along sidewalls of gate electrodes of the n-type transistor and the p-type transistor, and a conductive line in the intermetal structure may electrically connect the gate contacts together. Likewise, source/drain contacts may be formed through source/drain regions of the n-type transistor and the p-type transistor, and a conductive line in the intermetal structure may electrically connect the source/drain contacts together. In this manner, routing distance between gates and/or source/drain regions of the stacked transistors can be reduced, and contact resistance can be reduced. The gate and/or source/drain contacts can be made of a low resistance material, which further reduces contact resistance. Further, by forming contacts that extend directly through each of the gate electrodes or source/drain regions of the stacked devices, high aspect ratio connections (and accompanying deep via induced layout penalties) can be avoided. Still further, certain circuit related layout penalties can also be avoided. For example, the channel widths of the transistor devices are not limited by a minimum size of the source/drain contact for meeting DV design specifications. Various embodiments provide reduced contact resistance and increased manufacturing and design case.

In some embodiments, the n-type transistors and the p-type transistors are sequentially formed from bonded semiconductor layers. Various embodiments mitigate thermal budget concerns in sequentially formed, stacked transistors by delaying certain process steps until other features are made. For example, source/drain contacts and silicide regions for the n-type and p-type transistors are formed after the high-k gate dielectric layers are formed in both the n-type and p-type transistors. As another example, gate electrodes in the n-type and p-type transistors are formed after the high-k gate dielectric layers are formed in both the n-type and p-type transistors. By delaying the formation of certain features until after forming the high-k gate dielectric layers, the risk of damage (e.g., threshold voltage shift or silicide diffusion) during high-k gate dielectric annealing is reduced. As a result, high quality high-k gate dielectrics may be formed without damaging other device elements (e.g., the source/drain contacts and/or work function metal layers), and device performance of the resulting CFETs can be improved.

In some embodiments, a device includes a first transistor layer comprising a first gate electrode; a second transistor layer comprising a second gate electrode; an intermetal structure between the first transistor layer and the second transistor layer, the intermetal structure comprising a first conductive line; a first gate contact extending along a sidewall of the first gate electrode from a top surface of the first gate electrode to the first conductive line; and a second gate contact extending along a sidewall of the second gate electrode from a top surface of the second gate electrode to the first conductive line, wherein the first gate electrode is electrically connected to the second gate electrode by the first gate contact, the second gate contact, and the first conductive line. In some embodiments, the first gate contact and the second gate contact each comprise tungsten (W), cobalt (Co), or ruthenium (Ru). In some embodiments, the first conductive line is disposed in a dielectric layer, wherein the first transistor layer further comprises a third gate electrode, and wherein the device further comprises a third gate contact extending along a sidewall of the third gate electrode from a top surface of the third gate electrode to the dielectric layer. In some embodiments, the dielectric layer covers an enter lateral surface of the third gate contact. In some embodiments, the first transistor layer further comprises a first source/drain region, wherein the second transistor layer further comprises a second source/drain region, wherein the intermetal structure comprises a second conductive line, and wherein the device further includes a first source/drain contact extending through the first source/drain region to the second conductive line; and a second source/drain contact extending through the second source/drain region to the second conductive line, wherein the first source/drain region is electrically connected to the second source/drain region by the first source/drain contact, the second conductive line, and the second source/drain contact. In some embodiments, the intermetal structure includes a dielectric layer, wherein the first conductive line is disposed in the dielectric layer; a first etch stop layer, wherein the first gate contact extends through the first etch stop layer; and a second etch stop layer, wherein the second gate contact extends through the second etch stop layer, and wherein the dielectric layer is disposed between the first etch stop layer and the second etch stop layer. In some embodiments, the device further includes a first bonding layer directly bonded to a second bonding layer by a dielectric-to-dielectric bond, the first bonding layer and the second bonding layer being disposed between the first transistor layer and the intermetal structure.

A device includes a first source/drain region in a first transistor layer; a first conductive line in a dielectric layer over the first source/drain region; a second source/drain region over the first conductive line, the second source/drain region being disposed in a second transistor layer; a first source/drain contact extending through the first source/drain region and touching the first conductive line; and a second source/drain contact extending through the second source/drain region and touching the first conductive line, wherein the first source/drain region is electrically connected to the second source/drain region by the first source/drain contact, the second source/drain contact, and the first conductive line. In some embodiments, the first source/drain contact and the second source/drain contact each comprises tungsten (W), cobalt (Co), or ruthenium (Ru). In some embodiments, the device further includes a third source/drain contact electrically connected to the first source/drain region, wherein the first source/drain contact extends through the third source/drain contact; and a fourth source/drain contact electrically connected to the second source/drain region, wherein the second source/drain contact extends through the fourth source/drain contact. In some embodiments, the first source/drain contact has a different material composition than the third source/drain contact, and wherein the second source/drain contact has a different material composition than the fourth source/drain contact. In some embodiments, the device further includes a first silicide region on a sidewall of the first source/drain contact and a sidewall of the first source/drain region; and a second silicide region on a sidewall of the second source/drain contact and a sidewall of the second source/drain region. In some embodiments, the device further includes a first gate electrode in the first transistor layer; a second gate electrode in the second transistor layer; a second conductive line in the dielectric layer; a first gate contact extending through the first gate electrode to the second conductive line; and a second gate contact extending through the second gate electrode to the second conductive line, wherein the first gate electrode is electrically connected to the second gate electrode by the first gate contact, the second gate contact, and the second conductive line. In some embodiments, the device further includes a first gate electrode in the first transistor layer; a second gate electrode in the second transistor layer; and a gate contact extending through the first gate electrode, the dielectric layer, and the second gate electrode, wherein the first gate electrode is electrically connected to the second gate electrode by the gate contact.

In some embodiments, a method includes patterning a first mask over a first gate electrode, the first gate electrode being disposed in a first transistor layer; patterning a first opening using the first mask as a patterning mask, wherein the first opening exposes a first conductive line under the first gate electrode, and wherein patterning the first opening comprises etching the first gate electrode; forming a first gate contact in the first opening and electrically connected to the first conductive line; patterning a second mask over a second gate electrode, the second gate electrode being disposed in a second transistor layer; patterning a second opening using the second mask as a patterning mask, wherein the second opening exposes the first conductive line, and wherein patterning the second opening comprises etching the second gate electrode; and forming a second gate contact in the second opening and electrically connected to the first conductive line. In some embodiments, the method further includes depositing a first gate dielectric, the first gate dielectric being disposed in the first transistor layer; annealing the first gate dielectric; depositing a second gate dielectric, the second gate dielectric being disposed in the second transistor layer; and annealing the second gate dielectric. In some embodiments, the first gate electrode and the second gate electrode are each deposited after annealing the first gate dielectric and annealing the second gate dielectric. In some embodiments, the method further includes patterning a third mask over a first source/drain region, the first source/drain region being disposed in the first transistor layer; patterning a third opening extending through the first source/drain region and exposing a second conductive line, wherein the second conductive line is disposed at a same level as the first conductive line, and wherein the patterning the third opening comprises using the third mask as a patterning mask; forming a first source/drain contact in the third opening and electrically connected to the second conductive line; patterning a fourth mask over a second source/drain region, the second source/drain region being disposed in the second transistor layer; patterning a fourth opening extending through the second source/drain region and exposing the second conductive line, wherein the patterning the fourth opening comprises using the fourth mask as a patterning mask; and forming a second gate source/drain contact in the fourth opening and electrically connected to the second conductive line. In some embodiments, the method further includes forming a first silicide region on sidewalls of the third opening; and forming a second silicide region on sidewalls of the fourth opening, wherein the first silicide region and the second silicide region are formed after annealing the first gate dielectric and annealing the second gate dielectric. In some embodiments, the first gate electrode is disposed in a first dielectric layer, wherein the second gate electrode is disposed in a second dielectric layer, wherein patterning the first opening comprises selectively etching the first gate electrode at a greater rate than the first dielectric layer, and wherein patterning the second opening comprises selectively etching the second gate electrode at a greater rate than the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:

a first transistor layer comprising a first gate electrode;

a second transistor layer comprising a second gate electrode;

an intermetal structure between the first transistor layer and the second transistor layer, the intermetal structure comprising a first conductive line;

a first gate contact extending along a sidewall of the first gate electrode from a top surface of the first gate electrode to the first conductive line; and a second gate contact extending along a sidewall of the second gate electrode from a top surface of the second gate electrode to the first conductive line, wherein the first gate electrode is electrically connected to the second gate electrode by the first gate contact, the second gate contact, and the first conductive line.

2. The device of claim 1, wherein the first gate contact and the second gate contact each comprise tungsten (W), cobalt (Co), or ruthenium (Ru).

3. The device of claim 1, wherein the first conductive line is disposed in a dielectric layer, wherein the first transistor layer further comprises a third gate electrode, and wherein the device further comprises a third gate contact extending along a sidewall of the third gate electrode from a top surface of the third gate electrode to the dielectric layer.

4. The device of claim 3, wherein the dielectric layer covers an entire lateral surface of the third gate contact.

5. The device of claim 1, wherein the first transistor layer further comprises a first source/drain region, wherein the second transistor layer further comprises a second source/drain region, wherein the intermetal structure comprises a second conductive line, and wherein the device further comprises:

a first source/drain contact extending through the first source/drain region to the second conductive line; and a second source/drain contact extending through the second source/drain region to the second conductive line, wherein the first source/drain region is electrically connected to the second source/drain region by the first source/drain contact, the second conductive line, and the second source/drain contact.

6. The device of claim 1, wherein the intermetal structure comprises:

a dielectric layer, wherein the first conductive line is disposed in the dielectric layer;

a first etch stop layer, wherein the first gate contact extends through the first etch stop layer; and a second etch stop layer, wherein the second gate contact extends through the second etch stop layer, and wherein the dielectric layer is disposed between the first etch stop layer and the second etch stop layer.

7. The device of claim 1 further comprising a first bonding layer directly bonded to a second bonding layer by a dielectric-to-dielectric bond, the first bonding layer and the second bonding layer being disposed between the first transistor layer and the intermetal structure.

8. A device comprising:

a first source/drain region in a first transistor layer;

a first conductive line in a dielectric layer over the first source/drain region;

a second source/drain region over the first conductive line, the second source/drain region being disposed in a second transistor layer;

a first source/drain contact extending through the first source/drain region and touching the first conductive line;

a first silicide region on a sidewall of the first source/drain contact and a sidewall of the first source/drain region;

a second source/drain contact extending through the second source/drain region and touching the first conductive line, wherein the first source/drain region is electrically connected to the second source/drain region by the first source/drain contact, the second source/drain contact, and the first conductive line; and a second silicide region on a sidewall of the second source/drain contact and a sidewall of the second source/drain region.

9. The device of claim 8, wherein the first source/drain contact and the second source/drain contact each comprises tungsten (W), cobalt (Co), or ruthenium (Ru).

10. The device of claim 8, further comprising:

a third source/drain contact electrically connected to the first source/drain region, wherein the first source/drain contact extends through the third source/drain contact; and a fourth source/drain contact electrically connected to the second source/drain region, wherein the second source/drain contact extends through the fourth source/drain contact.

11. The device of claim 10, wherein the first source/drain contact has a different material composition than the third source/drain contact, and wherein the second source/drain contact has a different material composition than the fourth source/drain contact.

12. The device of claim 8 further comprising:

a first gate electrode in the first transistor layer;

a second gate electrode in the second transistor layer;

a second conductive line in the dielectric layer;

a first gate contact extending through the first gate electrode to the second conductive line; and a second gate contact extending through the second gate electrode to the second conductive line, wherein the first gate electrode is electrically connected to the second gate electrode by the first gate contact, the second gate contact, and the second conductive line.

13. The device of claim 8 further comprising:

a first gate electrode in the first transistor layer;

a second gate electrode in the second transistor layer; and a gate contact extending through the first gate electrode, the dielectric layer, and the second gate electrode, wherein the first gate electrode is electrically connected to the second gate electrode by the gate contact.

14. A device comprising:

a first gate electrode disposed in a first transistor layer;

a second gate electrode disposed in a second transistor layer, wherein the first transistor layer and the second transistor layer are vertically stacked;

an interconnect structure between the first transistor layer and the second transistor layer, the interconnect structure comprising a first conductive line;

a first gate contact electrically connected to the first gate electrode, wherein the first gate contact extends through the first gate electrode; and a second gate contact electrically connected to the second gate electrode, wherein the first conductive line extends from a surface of the first gate contact to a surface of the second gate contact, and wherein the second gate contact extends through the second gate electrode.

15. The device of claim 14, wherein the first gate contact decreases in width in a first direction towards the first conductive line, and wherein the second gate contact decreases in width in a second direction towards the first conductive line.

16. The device of claim 14 further comprising:

a first source/drain region in the first transistor layer;

a second source/drain region in the second transistor layer;

a first source/drain contact electrically connected to the first source/drain region; and a second source/drain contact electrically connected to the second source/drain region, wherein a second conductive line in the interconnect structure electrically connects the first source/drain contact to the second source/drain contact.

17. The device of claim 16, wherein the first source/drain contact extends through the first source/drain region, and wherein the second source/drain contact extends through the second source/drain region.

18. The device of claim 16, wherein the first conductive line and the second conductive line are disposed in a same dielectric layer of the interconnect structure.

19. The device of claim 14 further comprising an isolation structure along a sidewall of the first gate electrode, wherein the first gate contact contacts the isolation structure.

20. The device of claim 14 further comprising:

a first insulating bonding layer on the first transistor layer; and a second insulating bonding layer on the interconnect structure, wherein the first insulating bonding layer is bonded to the second insulating bonding layer by dielectric-to-dielectric bonds.

* * * * *